(12) United States Patent
Bufano et al.

(10) Patent No.: US 9,224,628 B2
(45) Date of Patent: Dec. 29, 2015

(54) REDUCED CAPACITY CARRIER, TRANSPORT, LOAD PORT, BUFFER SYSTEM

(71) Applicant: Brooks Automation, Inc., Chelmsford, MA (US)

(72) Inventors: Michael L. Bufano, Belmont, MA (US); Ulysses Gilchrist, Reading, MA (US); William Fosnight, Saratoga Springs, NY (US); Christopher Hofmeister, Holderness, NH (US); Daniel Babbs, Austin, TX (US); Robert C. May, Austin, TX (US)

(73) Assignee: Brooks Automation. Inc., Chelmsford, MA (US)

( * ) Notice: Subject to any disclaimer, the term of this patent is extended or adjusted under 35 U.S.C. 154(b) by 0 days.

(21) Appl. No.: 13/625,442

(22) Filed: Sep. 24, 2012

(65) Prior Publication Data

US 2013/0089396 A1 Apr. 11, 2013

Related U.S. Application Data

(63) Continuation of application No. 11/891,835, filed on Aug. 13, 2007, now Pat. No. 8,272,827, which is a continuation of application No. 11/803,077, filed on May 11, 2007, now Pat. No. 8,267,634, which is a (Continued)

(51) Int. Cl.
*H01L 21/677* (2006.01)
*H01L 21/67* (2006.01)
*H01L 21/673* (2006.01)

(52) U.S. Cl.
CPC .... *H01L 21/67733* (2013.01); *H01L 21/67017* (2013.01); *H01L 21/6773* (2013.01);

(Continued)

(58) Field of Classification Search
CPC .. B65G 1/0457; B65G 1/0464; B65G 1/0492; B65G 1/08; H01L 21/67733; H01L 21/67736; H01L 21/67739; H01L 21/67769; H01L 21/6773; H01L 21/67715; H01L 21/67727

USPC .............. 414/217.1, 941, 940, 217
See application file for complete search history.

(56) References Cited

U.S. PATENT DOCUMENTS 3,929,076 A 12/1975 McRae, Jr. et al.
5,267,173 A 11/1993 Tanizawa et al.
(Continued)

FOREIGN PATENT DOCUMENTS

JP 63100256 5/1988
JP 03215960 9/1991
(Continued)

OTHER PUBLICATIONS

Chinese Office Action in CN Application No. 0680050581.3 dated Jul. 3, 2009.

(Continued)

*Primary Examiner* — Glenn Myers
(74) *Attorney, Agent, or Firm* — Perman & Green, LLP; Colin C. Durham

(57) ABSTRACT

In accordance with an exemplary embodiment a semiconductor workpiece processing system having at least one processing tool for processing semiconductor workpieces, a container for holding at least one semiconductor workpiece therein for transport to and from the at least one processing tool and a first transport section elongated and defining a travel direction. The first transport section has parts, that interface the container, supporting and transporting the container along the travel direction to and from the at least one processing tool. The container is in substantially continuous transport at a substantially constant rate in the travel direction, when supported by the first transport section. A second transport section is connected to the at least one process tool for transporting the container to and from the at least one processing tool.

17 Claims, 80 Drawing Sheets

Related U.S. Application Data continuation-in-part of application No. 11/787,981, filed on Apr. 18, 2007, now abandoned, which is a continuation-in-part of application No. 11/594,365, filed on Nov. 7, 2006, now Pat. No. 7,798,758, which is a continuation-in-part of application No. 11/556,584, filed on Nov. 3, 2006, now abandoned.

(60) Provisional application No. 60/838,906, filed on Aug. 18, 2006, provisional application No. 60/733,813, filed on Nov. 7, 2005.

(52) U.S. Cl.
CPC .... *H01L21/67126* (2013.01); *H01L 21/67201* (2013.01); *H01L 21/67276* (2013.01); *H01L 21/67376* (2013.01); *H01L 21/67379* (2013.01); *H01L 21/67386* (2013.01); *H01L 21/67715* (2013.01); *H01L 21/67724* (2013.01); *H01L 21/67727* (2013.01); *H01L 21/67736* (2013.01); *H01L 21/67757* (2013.01); *H01L 21/67766* (2013.01); *H01L 21/67769* (2013.01); *H01L 21/67772* (2013.01); *H01L 21/67775* (2013.01); *H01L 21/677* (2013.01)

(56) References Cited

U.S. PATENT DOCUMENTS

| | | |
|---|---|---|
| 5,377,476 A | 1/1995 | Bohmer et al. |
| 5,388,945 A | 2/1995 | Garric et al. |
| 5,411,358 A | 5/1995 | Garric et al. |
| 5,417,537 A | 5/1995 | Miller |
| 5,443,346 A * | 8/1995 | Murata et al. ............ 414/222.13 |
| 5,501,564 A * | 3/1996 | Doche ..................... 414/331.13 |
| 5,517,924 A | 5/1996 | He et al. |
| 5,536,128 A * | 7/1996 | Shimoyashiro et al. ....... 414/273 |
| 5,551,348 A | 9/1996 | Matsumoto |
| 5,653,565 A | 8/1997 | Bonora et al. |
| 5,740,845 A | 4/1998 | Bonora et al. |
| 5,833,426 A | 11/1998 | Marohl |
| 5,904,101 A | 5/1999 | Kuznetsov |
| 5,980,183 A | 11/1999 | Fosnight |
| 6,026,561 A | 2/2000 | Lafond |
| 6,261,044 B1 | 7/2001 | Fosnight et al. |
| 6,281,516 B1 | 8/2001 | Bacchi et al. |
| 6,283,692 B1 * | 9/2001 | Perlov et al. ............ 414/222.01 |
| 6,315,512 B1 | 11/2001 | Tabrizi et al. |
| 6,336,567 B1 | 1/2002 | Hyobu |
| 6,419,438 B1 | 7/2002 | Rosenquist |
| 6,449,530 B1 * | 9/2002 | Yamada et al. ............... 700/214 |
| 6,468,021 B1 * | 10/2002 | Bonora et al. ................. 414/522 |
| 6,473,996 B1 | 11/2002 | Tokunaga |
| 6,494,308 B2 * | 12/2002 | Bonora et al. ............. 198/465.2 |
| 6,540,469 B2 | 4/2003 | Matsunaga et al. |
| 6,604,624 B2 * | 8/2003 | Hirata et al. ................... 198/494 |
| 6,704,998 B1 | 3/2004 | Bonora et al. |
| 6,745,102 B1 | 6/2004 | Liu |
| 6,821,082 B2 | 11/2004 | McGowan |
| 6,871,597 B1 | 3/2005 | Hughes |
| 6,979,168 B2 * | 12/2005 | Uchimaki et al. ......... 414/217.1 |
| 6,990,721 B2 * | 1/2006 | Mariano et al. ................. 29/469 |
| RE39,011 E | 3/2006 | Horst et al. |
| 7,101,138 B2 | 9/2006 | Fosnight et al. |
| 7,145,157 B2 | 12/2006 | Simmons et al. |
| 7,221,993 B2 | 5/2007 | Rice et al. |
| 7,228,218 B2 | 6/2007 | Burke, Jr. |
| 7,232,286 B2 | 6/2007 | Shinozaki |
| 7,249,925 B2 | 7/2007 | del Puerto et al. |
| 7,261,510 B2 * | 8/2007 | Motoori et al. ................ 414/281 |
| 7,281,623 B1 | 10/2007 | Kitazumi et al. |
| 7,325,667 B1 * | 2/2008 | Damick et al. ................ 198/395 |
| 7,379,779 B2 * | 5/2008 | Ekberg ............................ 700/95 |
| 7,413,396 B2 * | 8/2008 | Ito .................................. 414/626 |
| 7,441,999 B2 * | 10/2008 | Nakao et al. .............. 414/217.1 |
| 7,575,406 B2 | 8/2009 | Hofmeister et al. |
| 7,604,449 B1 * | 10/2009 | Kaveh ............................ 414/411 |
| 7,622,006 B2 | 11/2009 | Ishizawa et al. |
| 7,635,244 B2 | 12/2009 | Sakiya |
| 7,677,180 B2 | 3/2010 | Campbell et al. |
| 7,771,151 B2 * | 8/2010 | Bonora et al. ............. 414/217.1 |
| 7,771,153 B2 * | 8/2010 | Doherty et al. .......... 414/331.02 |
| 7,780,020 B2 * | 8/2010 | Yoshitaka ...................... 212/332 |
| 7,798,758 B2 | 9/2010 | Bufano et al. |
| 7,806,643 B2 | 10/2010 | Friedman et al. |
| 7,815,739 B2 | 10/2010 | Matsuura |
| 7,917,245 B2 * | 3/2011 | Murata .......................... 700/224 |
| 8,328,495 B2 | 12/2012 | Bufano et al. |
| 8,529,185 B2 * | 9/2013 | Hirasawa et al. .......... 414/749.6 |
| 2002/0094257 A1 | 7/2002 | Babbs et al. |
| 2002/0119036 A1 * | 8/2002 | Huber et al. ................... 414/626 |
| 2003/0082030 A1 | 5/2003 | del Puerto et al. |
| 2003/0082032 A1 | 5/2003 | McGowan |
| 2003/0235486 A1 * | 12/2003 | Doherty et al. ............ 414/217.1 |
| 2004/0109746 A1 * | 6/2004 | Suzuki ............................ 414/373 |
| 2004/0126208 A1 | 7/2004 | Tawyer et al. |
| 2004/0151562 A1 | 8/2004 | Hofmeister et al. |
| 2004/0181929 A1 | 9/2004 | Mariano et al. |
| 2004/0191030 A1 | 9/2004 | Rice et al. |
| 2004/0193300 A1 | 9/2004 | Rice et al. |
| 2005/0095087 A1 * | 5/2005 | Sullivan et al. ................ 414/217 |
| 2005/0158152 A1 * | 7/2005 | Otaguro ......................... 414/217 |
| 2006/0051188 A1 * | 3/2006 | Hoshino ........................ 414/277 |
| 2006/0088272 A1 | 4/2006 | Gilchrist et al. |
| 2006/0104712 A1 * | 5/2006 | Bufano et al. .................... 404/1 |
| 2007/0081879 A1 * | 4/2007 | Bonora et al. ................. 414/217 |
| 2007/0163461 A1 * | 7/2007 | Shiwaku ........................ 104/89 |
| 2007/0224026 A1 * | 9/2007 | Chang ........................... 414/626 |
| 2008/0063496 A1 | 3/2008 | Bufano et al. |
| 2008/0075564 A1 * | 3/2008 | Tachibana .................... 414/217 |
| 2008/0080963 A1 | 4/2008 | Bufano et al. |
| 2008/0191155 A1 | 8/2008 | Scollay |
| 2009/0196714 A1 | 8/2009 | Sylvestre et al. |
| 2010/0054897 A1 | 3/2010 | Bufano et al. |
| 2011/0008136 A1 | 1/2011 | Bufano et al. |

FOREIGN PATENT DOCUMENTS

| | | |
|---|---|---|
| JP | 04184958 | 7/1992 |
| JP | 05082623 | 2/1993 |
| JP | 06061337 | 3/1994 |
| JP | 11016984 | 1/1999 |
| JP | 11067868 | 9/1999 |
| JP | 2000058616 | 2/2000 |
| JP | 2000188316 | 7/2000 |
| JP | 200268364 | 8/2002 |
| JP | 2003172454 | 6/2003 |
| JP | 2004227060 | 8/2004 |
| JP | 2004274034 | 9/2004 |
| JP | 2004349322 | 12/2004 |
| JP | 2005001886 | 1/2005 |
| JP | 2005101059 | 4/2005 |
| JP | 2005243729 | 9/2005 |
| JP | 2005294280 | 10/2005 |
| JP | 2006103795 | 4/2006 |
| WO | 03105216 | 12/2003 |
| WO | 2006023838 | 3/2006 |

OTHER PUBLICATIONS

Chinese Office Action in CN Application No. 0780026236.0 dated Jun. 21, 2010.

Chinese Office Action in CN Application No. 0780039010.4 dated Jun. 23, 2010.

Chinese Office Action in CN Application No. 0780039010.4 dated Dec. 16, 2011.

Chinese Office Action in CN Application No. 0780026236.0 dated Dec. 26, 2011.

European Office Action in EP Application No. 06837141.8 dated Feb. 7, 2012.

Japanese Office Action in JP Application No. 2008-540154 dated Dec. 27, 2011.

(56) References Cited

OTHER PUBLICATIONS

Japanese Office Action in JP Application No. 2009-509884 dated Jan. 31, 2012.

International Search Report WO Application No. US06043462 dated Dec. 31, 2007.
International Search Report WO Application No. US07011443 dated Sep. 17, 2008.

* cited by examiner

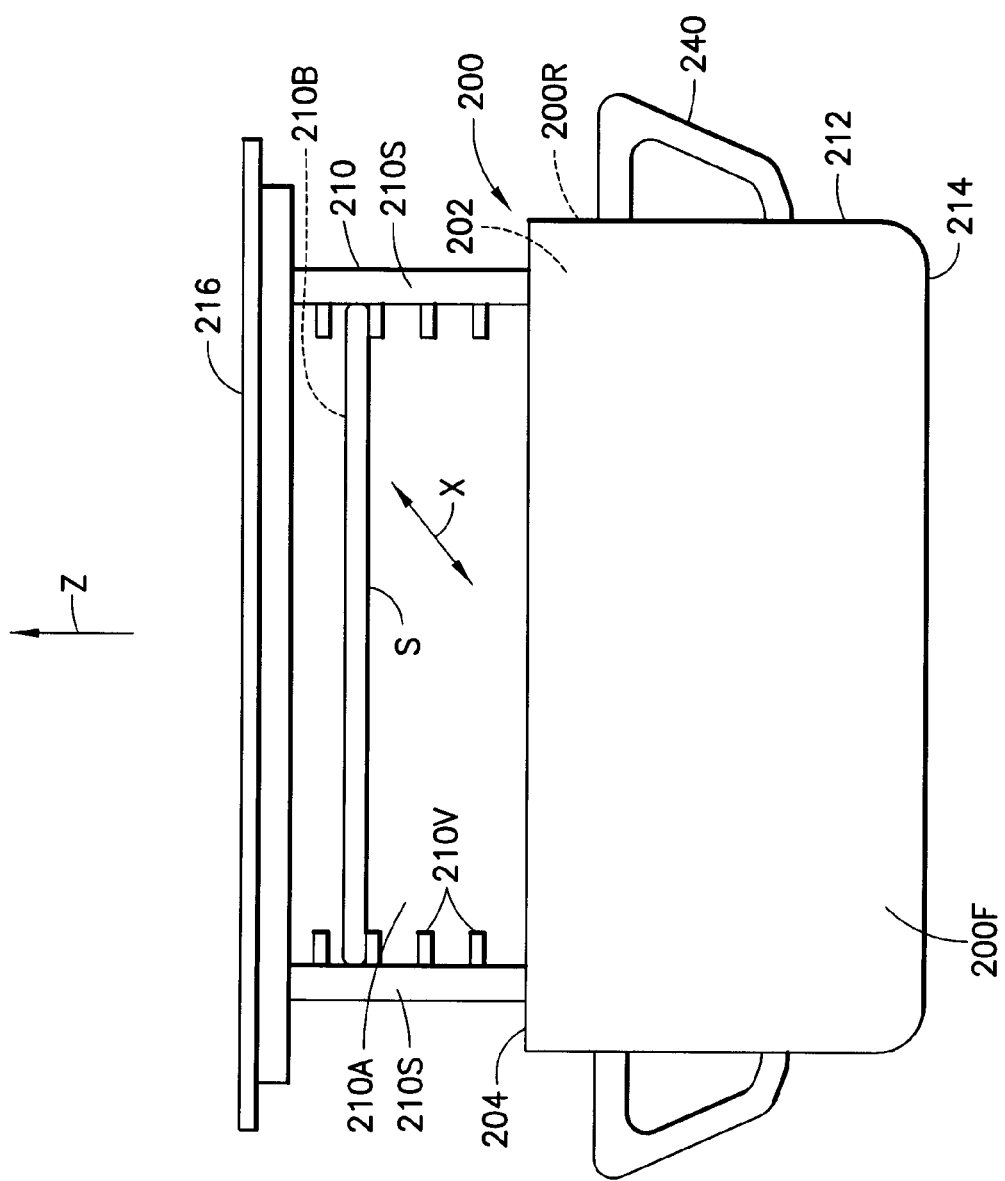
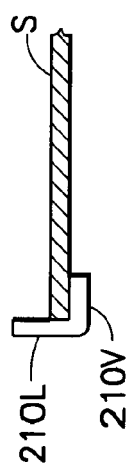

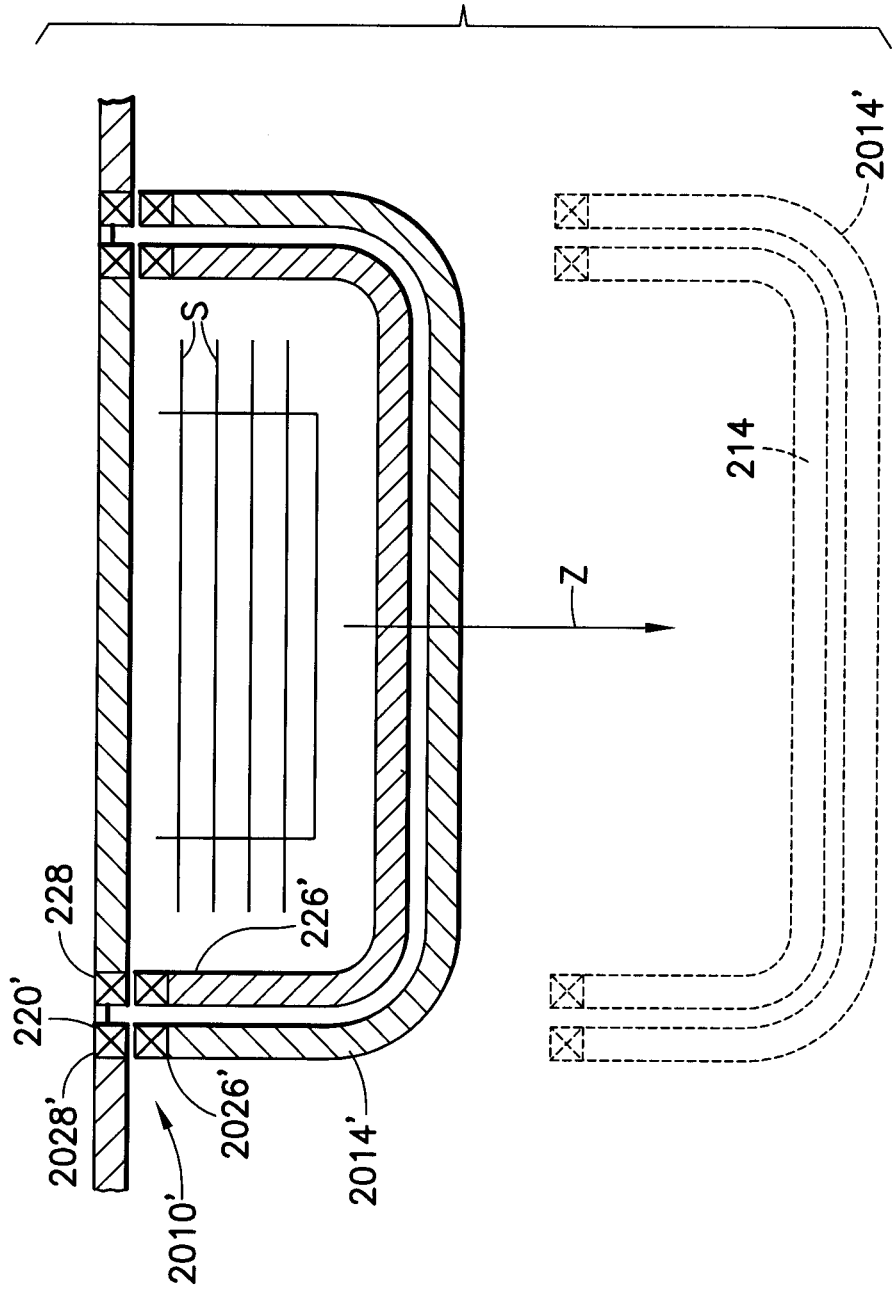

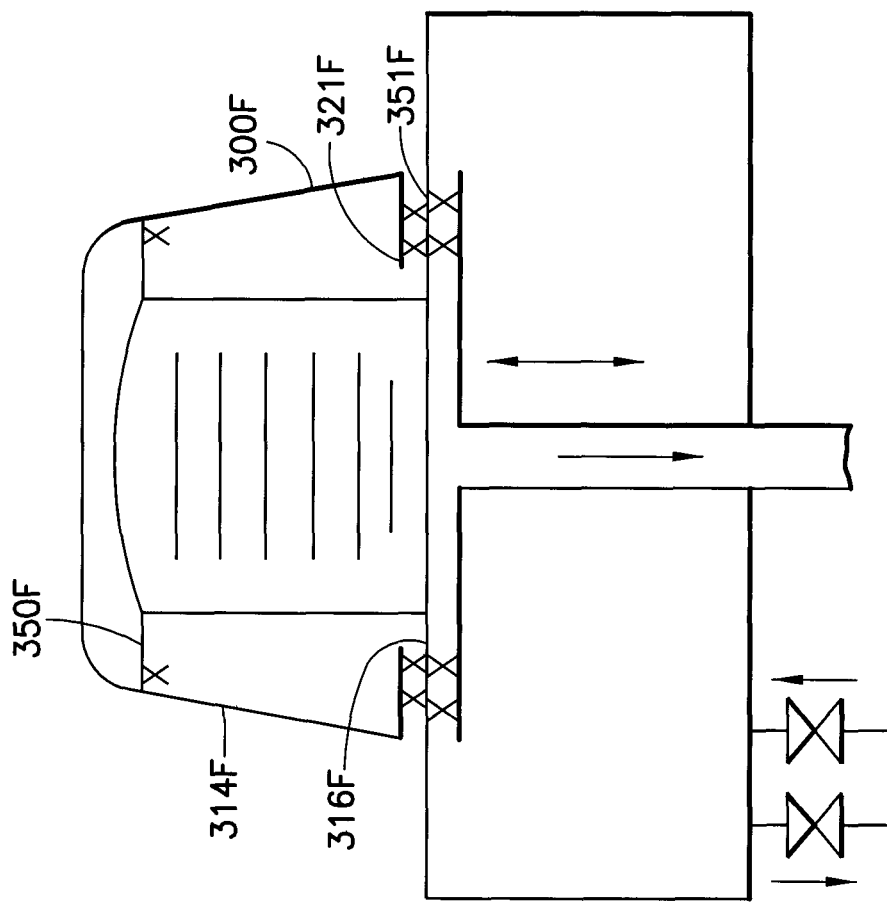

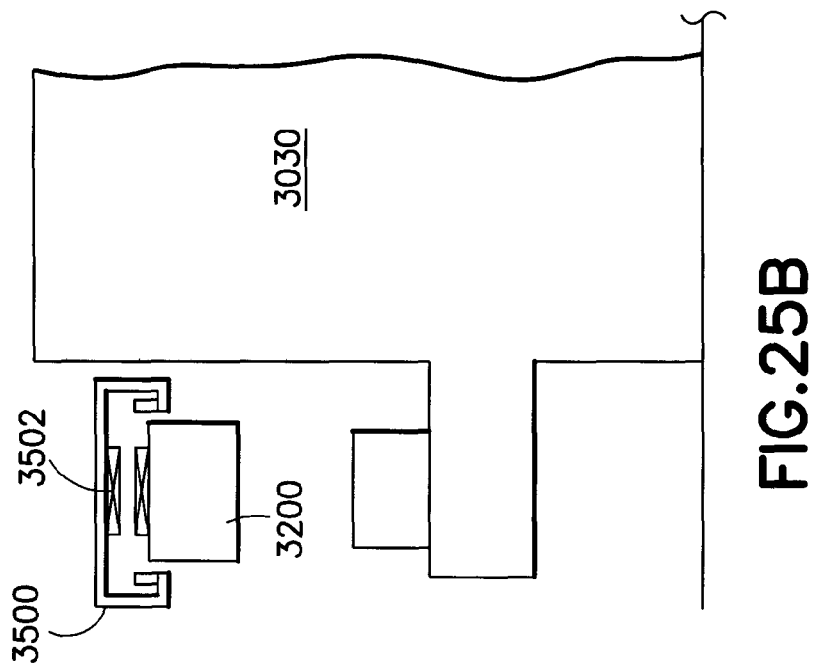
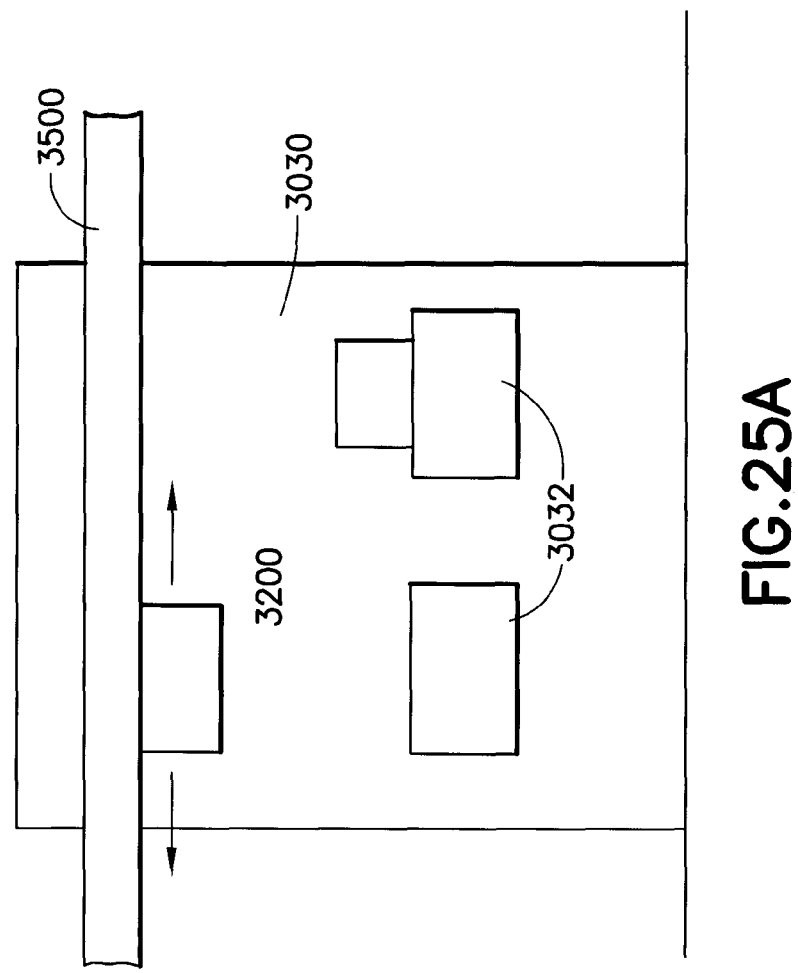

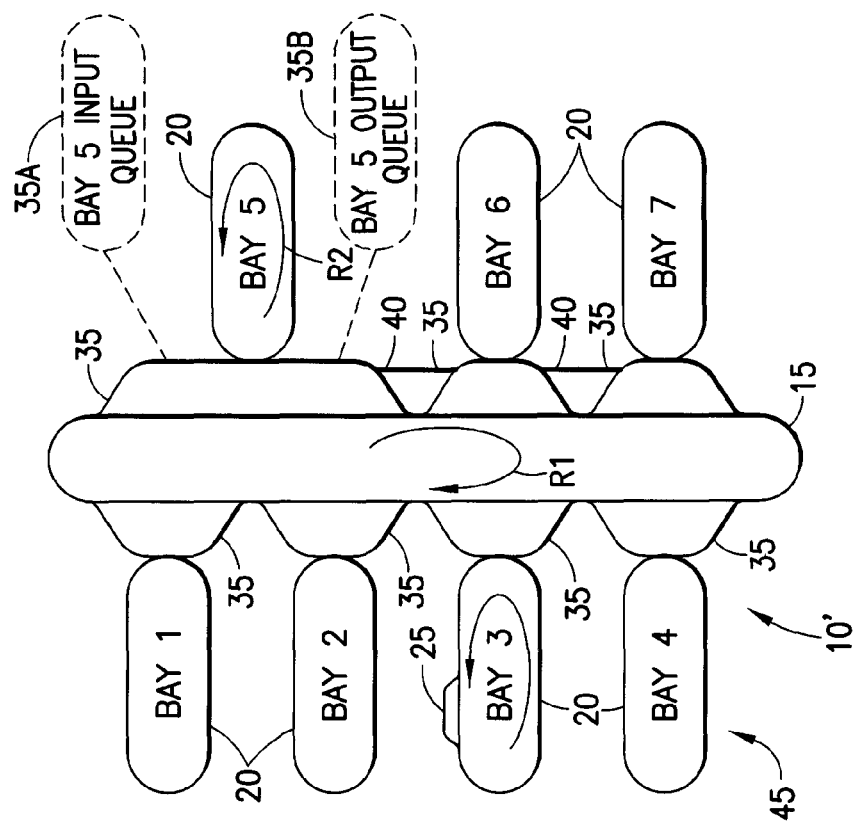
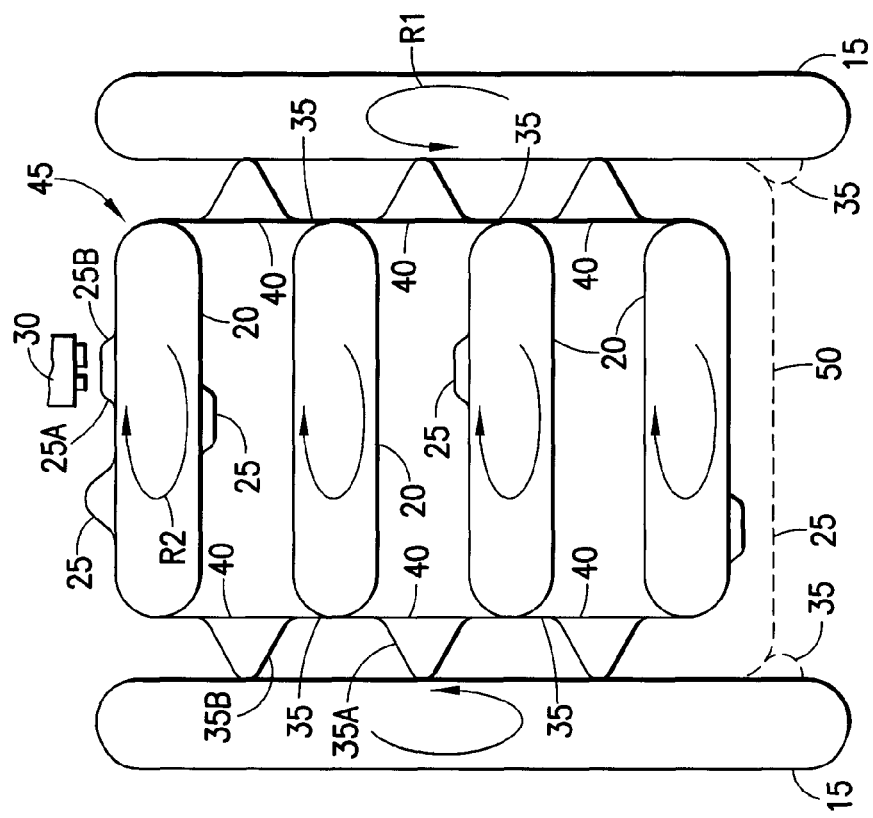

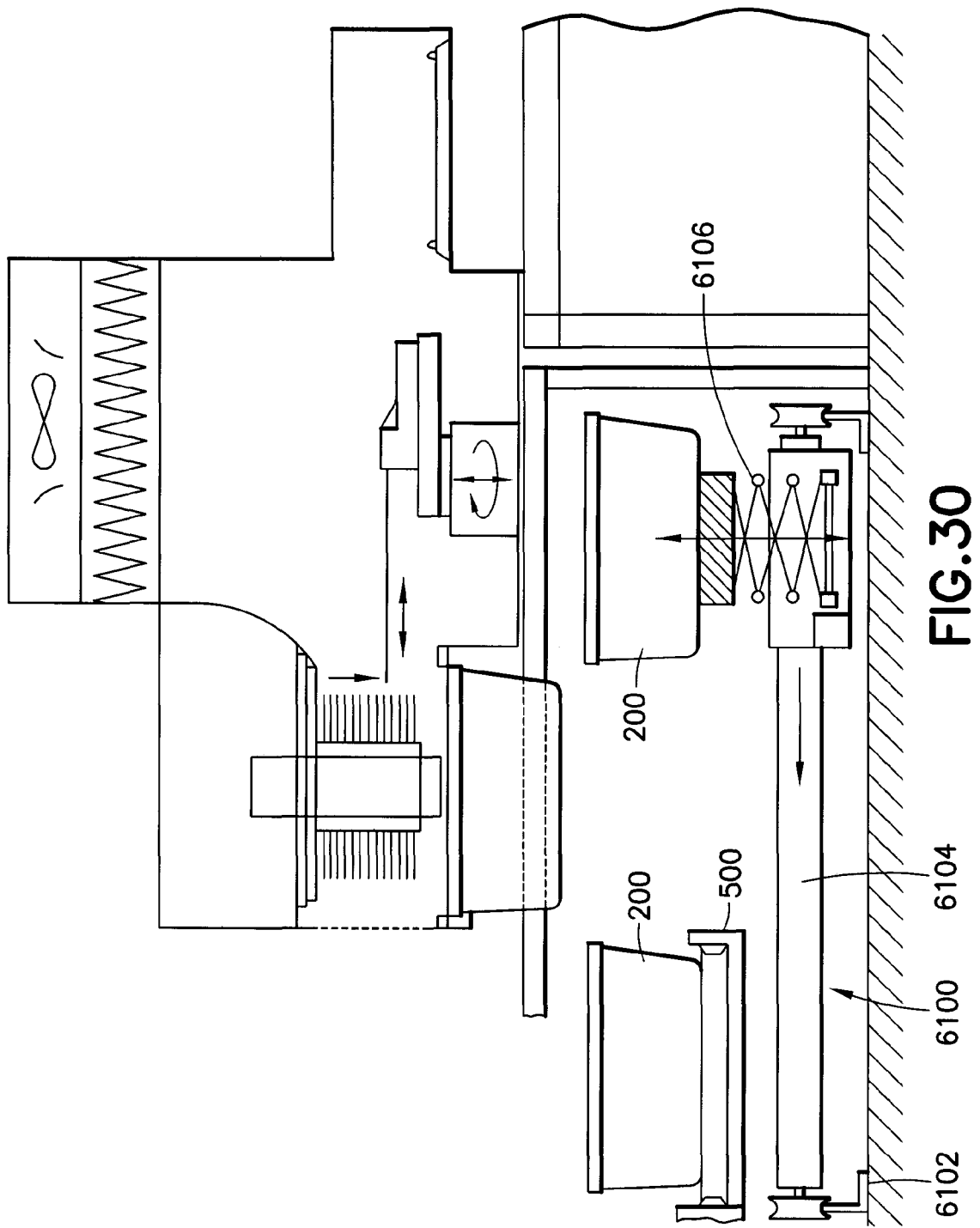

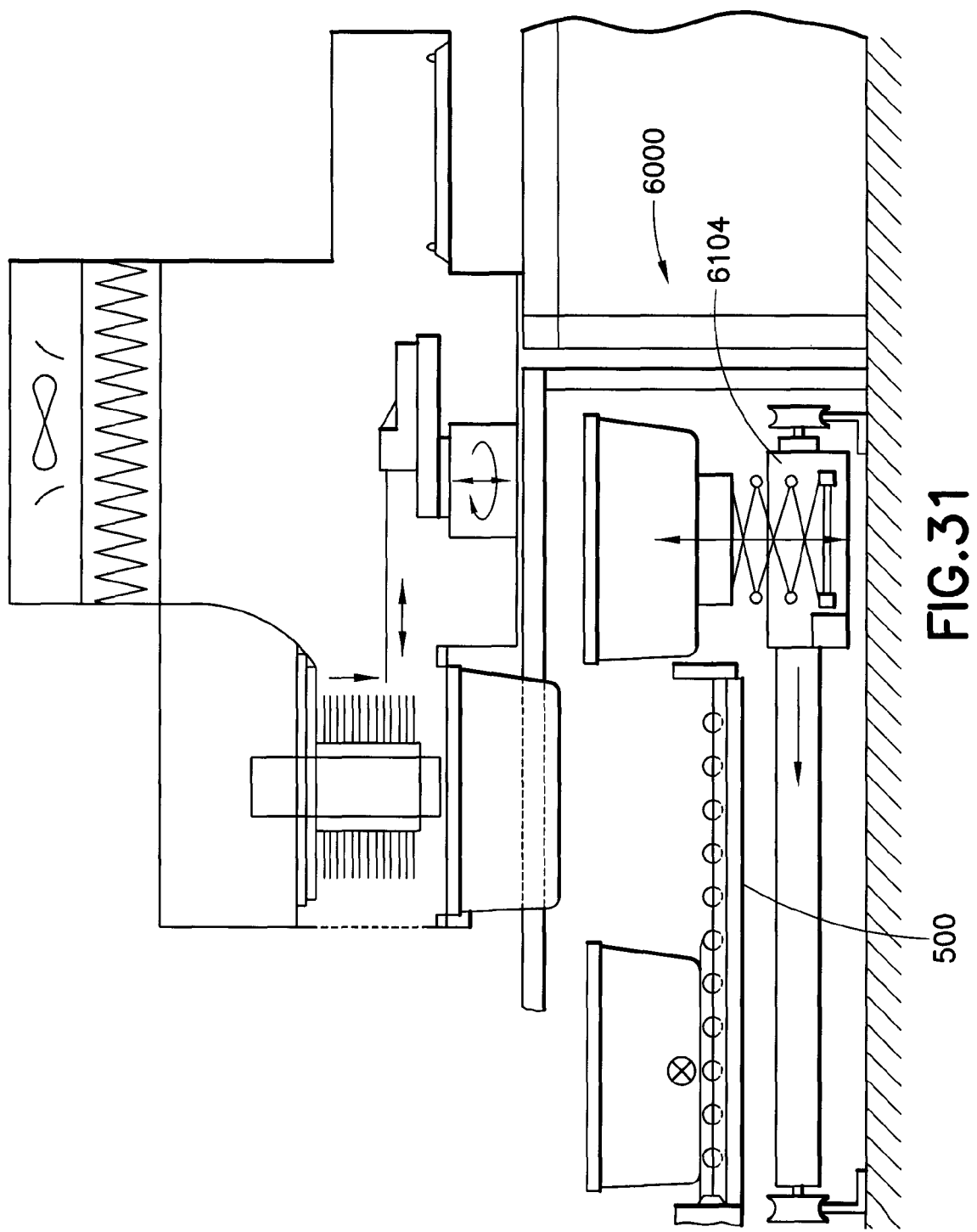

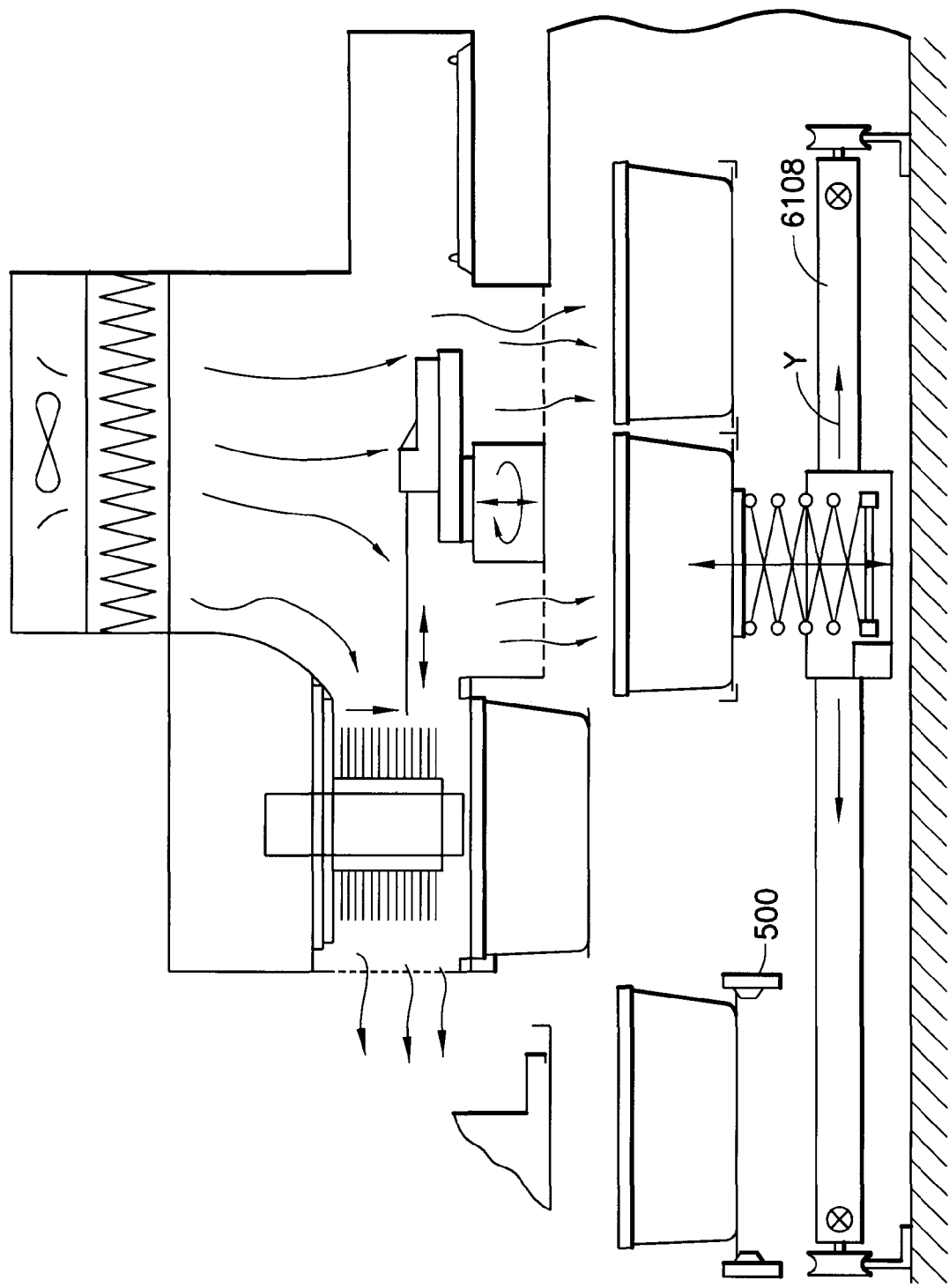

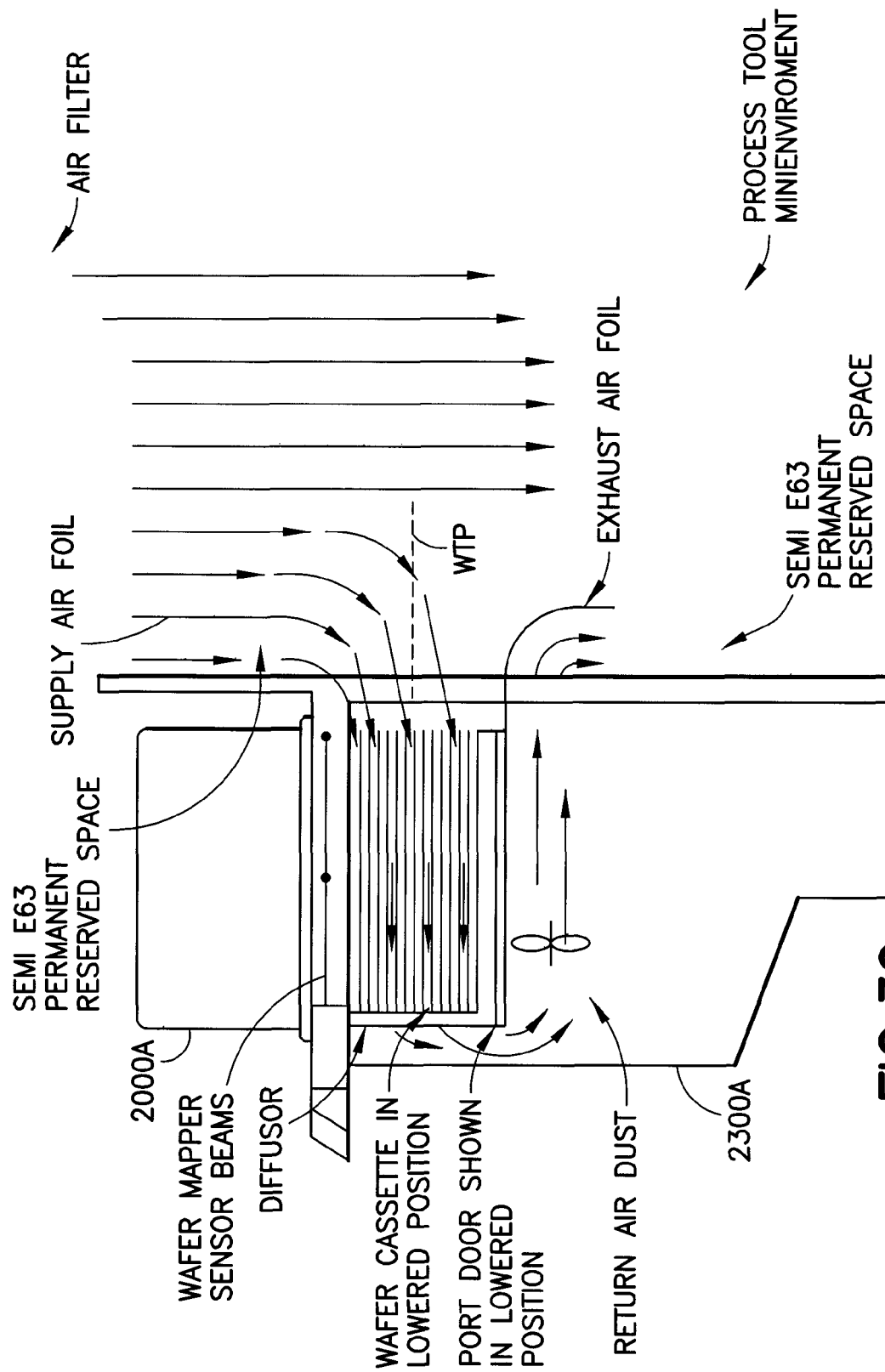

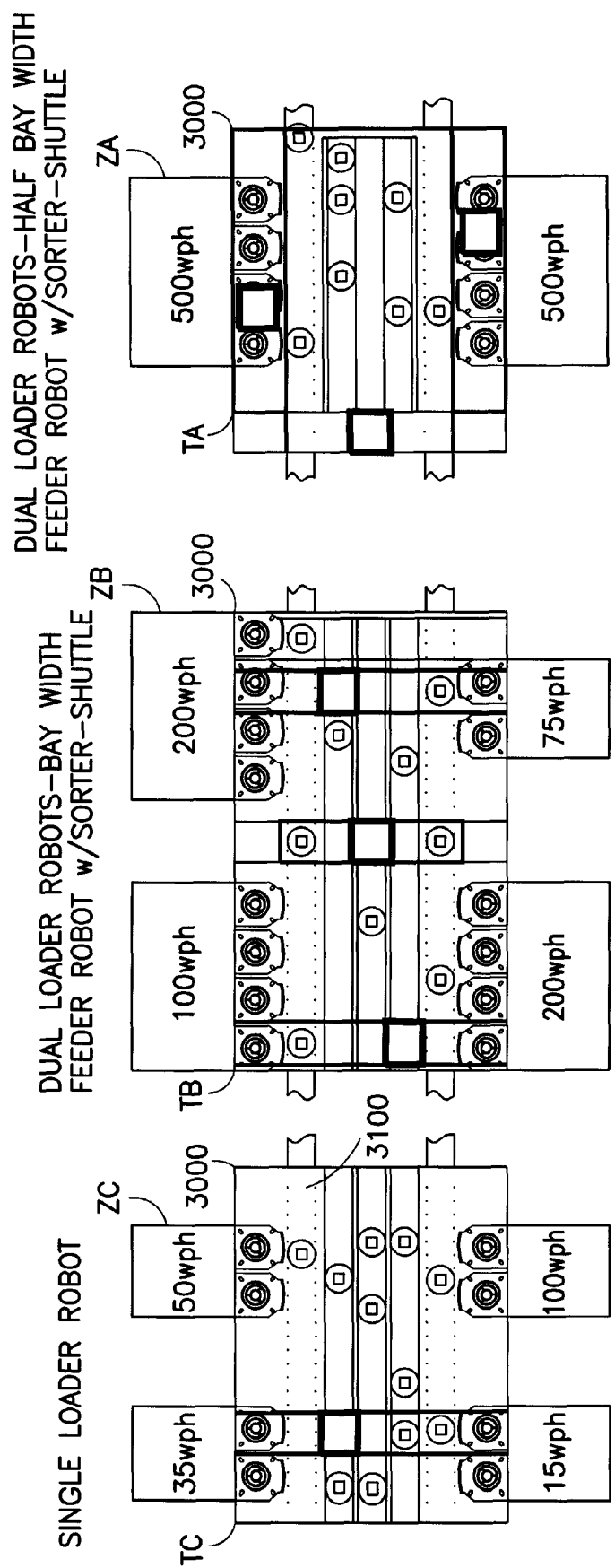

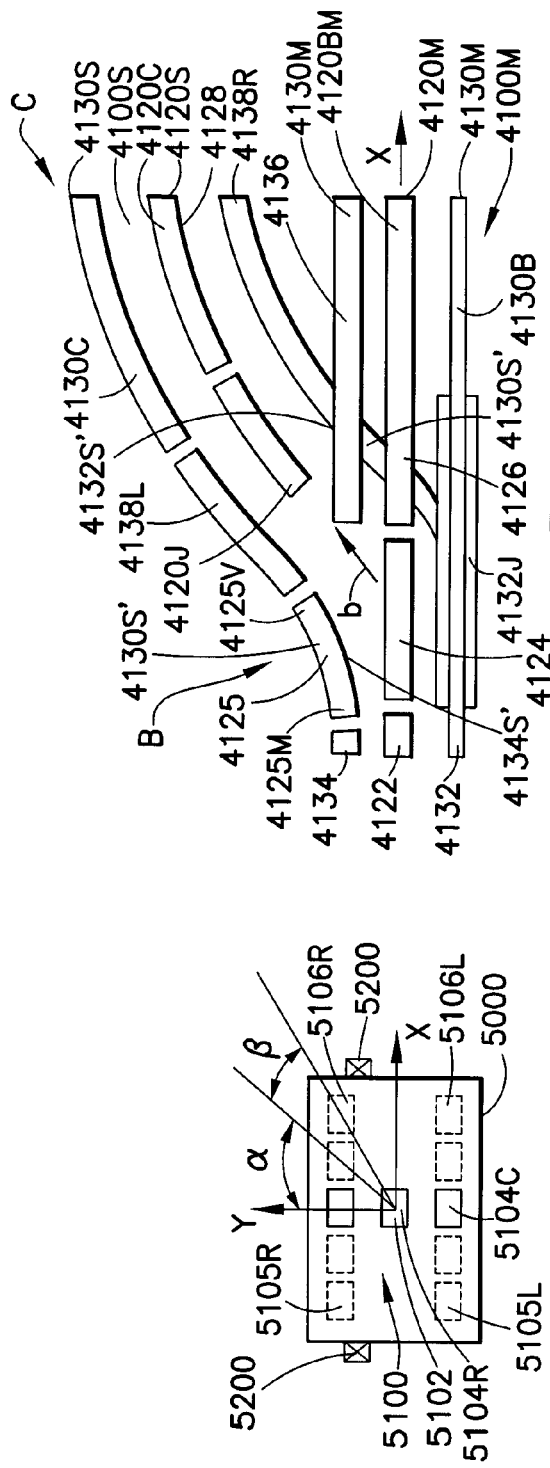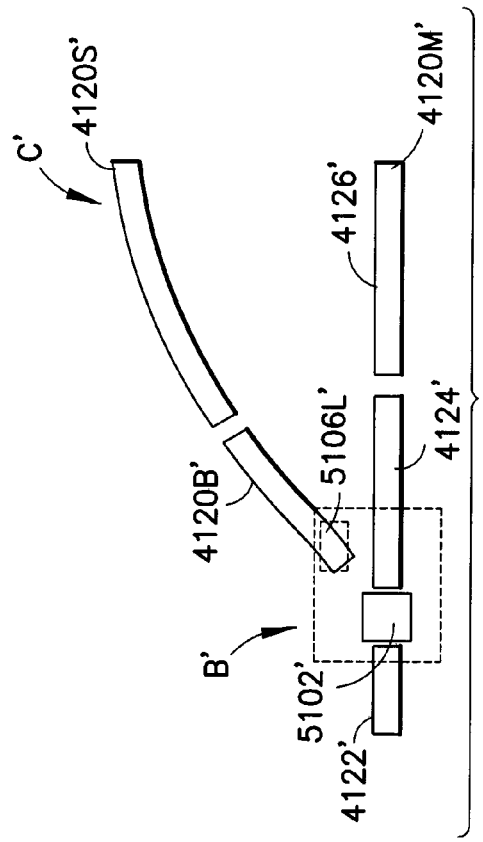

MECH.COUPLING COMPLIANCE

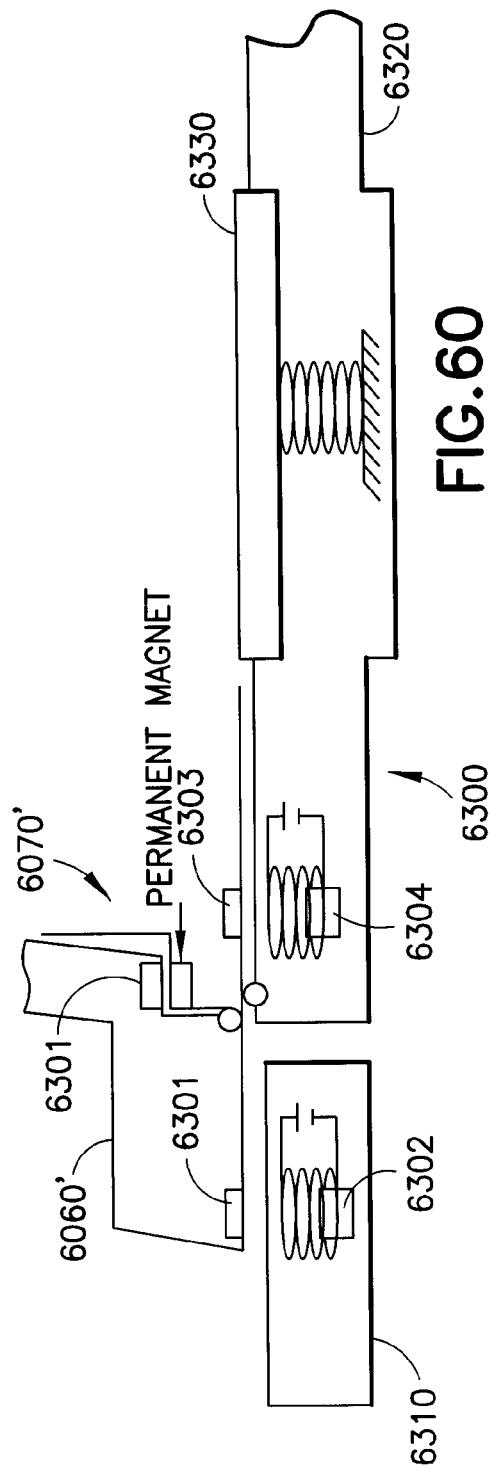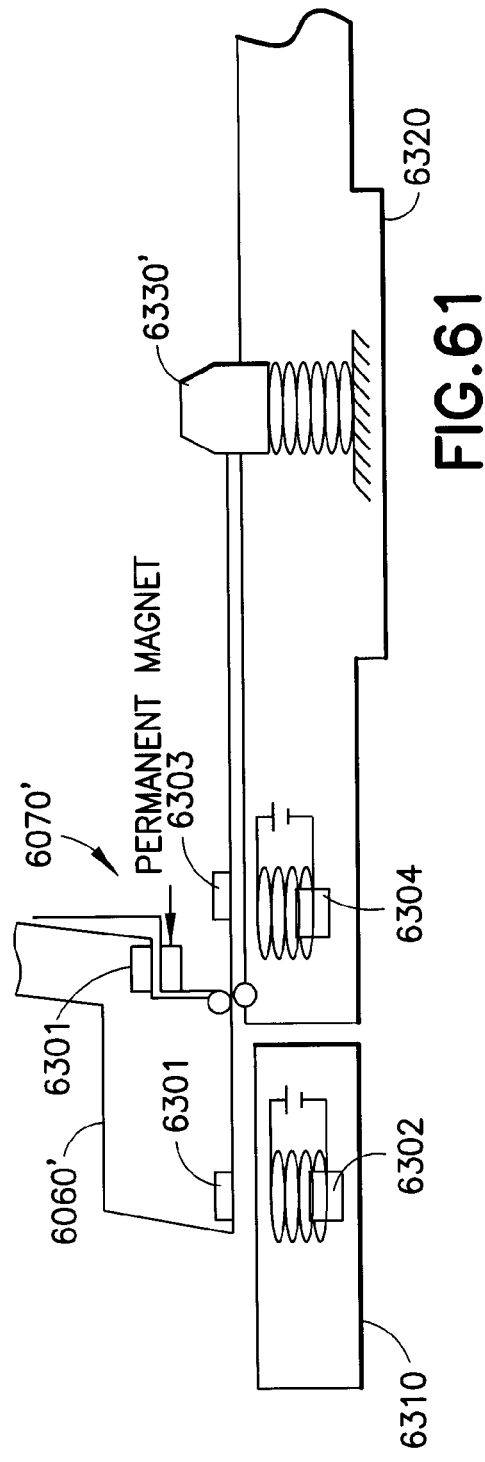

REDUCED CAPACITY CARRIER, TRANSPORT, LOAD PORT, BUFFER SYSTEM

CROSS-REFERENCE TO RELATED APPLICATION(S)

This application claims the benefit of U.S. Provisional Patent Application Ser. No. 60/838,906 (now expired), filed Aug. 18, 2006 and is a continuation of U.S. patent application Ser. No. 11/891,835 (now U.S. Pat. No. 8,272,827) filed on Aug. 13, 2007 which is a continuation in part of U.S. application Ser. No. 11/803,077, filed May 11, 2007 which is a continuation in part of U.S. patent application Ser. No. 11/787,981 (now abandoned), filed Apr. 18, 2007 which is a continuation in part of U.S. patent application Ser. No. 11/594,365 (now U.S. Pat. No. 7,798,758), filed Nov. 7, 2006 which is a continuation of U.S. patent application Ser. No. 11/556,584 (now abandoned), filed Nov. 3, 2006 which claims the benefit of U.S. Provisional Patent Application No. 60/733,813 (now expired), filed Nov. 7, 2005, all of which are incorporated by reference herein in their entirety.

FIELD

The exemplary embodiments described herein are related to substrate processing systems and particularly to substrate transport systems, transport carriers, transport to processing tool interfaces and arrangements.

EARLIER RELATED EMBODIMENTS

The prime forces on the fabrication of electronic devices are the consumer desire for more capable, and smaller electronic devices at lower costs. The primal forces translate to an impetus on manufacturers for further miniaturization and improvements in fabrication efficiency. Manufacturers, thus seek gains wherever possible. In the case of semiconductor devices, the conventional fabrication facility or FAB has at its heart (or base organizational structure) the discrete processing tool, for example a cluster tool, for performing one or more processes to semiconductor substrates. Conventional FABs are hence organized around the processing tool, that may be arranged in desired configurations to transform the semiconductor substrates into desired electronic devices. For example, the processing tool may be arrayed in the conventional FAB in processing bays. As may be realized, between tools, substrates may be held in carriers, such as SMF's, FOUP's, so that between tools substrates in process may remain in substantially similar cleanliness conditions as within the tools. Communication between tools may be provided by handling systems (such as automated material handling systems, AMHS) capable of transporting substrate carriers to the desired processing tools in the FAB. Interface between the handling system and processing tool may be considered for example purposes as having generally two parts, interface between handling system and tool to load/unload carriers to the loading stations of the processing tool, and interface of the carriers (i.e. (individually or in groups) to the tool to allow loading and unloading or substrates between carrier and tool. There are numerous conventional interface systems known that interface the processing tools to carriers and to material handling systems. Many of the conventional interface systems suffer from complexity resulting in one or more of the process tool interface, the carrier interface or the material handling system interface having undesired features that increase costs, or otherwise introduce inefficiencies in the loading and unloading of substrates in processing tools. The exemplary embodiments described in greater detail below overcome the problems of conventional systems.

Industry trends indicate that future IC devices may have about a 45 nm architecture or smaller. In order to increase efficiency and lower fabrication costs, it is desired that IC devices of this scale be manufactured using semiconductor substrates or wafers as large as possible. Conventional FABs are generally capable of handling 200 mm or 300 mm wafers. Industry trends indicate that in the future, it may be desirable that FABs handle wafers that may be larger than 300 mm wafers, such as 450 mm wafers. As may be realized, the use of larger wafers may result in longer processing times per wafer. Accordingly, with the employment of larger wafers, such as wafers of 300 mm or greater it may be desired to use smaller lot sizes for wafer processing in order to reduce work in process (WIP) in the FAB. Also smaller wafer lot sizes may be desired for specialty lot processing of wafers of any size, or for processing of any other substrates or flat panels including for example flat panels for flat screen displays. Though reduced WIP and efficient specialty lot processing is enabled by their use, nevertheless employment of small processing lots in the FAB may have a deleterious effect on conventional FAB throughput. For example smaller lot size, as compared to larger lot sizes, tend to increase the transport system burden for a transport system (transporting wafer lots) of a given capacity. This is illustrated in the graph shown in FIG. 51A. The graph in FIG. 51A illustrates the relationship between lot size and transport rate (expressed as moves per hour) for a number of different fab rates (expressed as wafer starts per desired periods such as per month, e.g. WSPM). The graph in FIG. 51A also shows a line indicating the maximum capacity of a conventional FAB handling system (e.g. about 6000-7000 moves per hour). Thus, the intersection between the handing system capacity line and the FAB rate curves identify the surfaces to lot size available. For example, to achieve a FAB rate of about 24,000 WSPM, with the given conventional transport system, the smallest lot size is about 15 wafers. The use of smaller wafer lots causes a reduction in FAB rate. Hence, it is desired to provide a system in which the wafer carrier, the interface between the carrier and processing tool, the carrier transport system (transporting carriers between tools, storage locations, etc. within the FAB) be arranged to allow use of wafer lots as small as one and as large as desired, without adversely impacting FAB rate.

SUMMARY OF THE EXEMPLARY EMBODIMENT(S)

In accordance with an exemplary embodiment a semiconductor workpiece processing system comprising at least one processing tool for processing semiconductor workpieces, a container for holding at least one semiconductor workpiece therein for transport to and from the at least one processing tool and a first transport section elongated and defining a travel direction. The first transport section has parts that interface the container, supporting and transporting the container along the travel direction to and from the at least one processing tool. The container is in substantially continuous transport at a substantially constant rate in the travel direction, when supported by the first transport section. A second transport section is connected to the at least one process tool for transporting the container to and from the at least one processing tool. The second transport section is separate and distinct from the first transport section and interfaces the first transport section for loading and unloading the container to and from the parts of the first transport section.

In accordance with another exemplary embodiment a semiconductor workpiece processing system is provided. The system comprises at least one processing tool for processing semiconductor workpieces, a container for holding at least one semiconductor workpiece therein for transport to and from the at least one processing tool. A first transport section elongated and defining a travel direction. The first transport section has parts that interface the container, supporting and transporting the container along the travel direction to and from the at least one processing tool. The system has a second transport section connected to the at least one processing tool and first transport section interfacing the container between the at least one processing tool and first transport section. When supported by the first transport section the container travels at a substantially constant rate in the travel direction. The constant rate of travel of the container is substantially independent of an interface rate between the second transport section and the at least one processing tool.

BRIEF DESCRIPTION OF DRAWINGS

The foregoing aspects and other features of the present invention are explained in the following description, taken in connection with the accompanying drawings, wherein:

FIG. 1 is a schematic elevation view of a workpiece carrier incorporating features in accordance with an exemplary embodiment, and a workpiece or substrate S positioned on the carrier; and FIGS. 1A-1B are respectively schematic partial plan and elevation views of a workpiece support of the carrier in accordance with another exemplary embodiment;

FIG. 2B is another schematic cross-section elevation of a tool port interface and carrier in accordance with another exemplary embodiment;

FIG. 10A is a schematic partial elevation of a process tool and carrier interfaced therewith in accordance with another exemplary embodiment;

FIG. 15 is a schematic elevation view of a tool interface and carrier in accordance with yet another exemplary embodiment;

FIGS. 25A-25B respectively show different elevation views of a transport system and processing tool in accordance with another exemplary embodiment;

FIGS. 29A-29B are schematic plan views of transport systems in accordance with another exemplary embodiment;

FIG. 30 is a schematic partial elevation of the transport system and processing tools in FIG. 29C;

FIG. 31 is another schematic partial elevation of the transport system;

FIG. 32 is another schematic partial elevation of the transport system in accordance with another exemplary embodiment;

FIG. 39 is cross sectional view of a tool loading station in accordance with another exemplary embodiment;

FIGS. 43-47 respectively are schematic views illustrating different selectable arrangements of the system in accordance with different exemplary embodiments;

FIGS. 52-52A are schematic partial plan views respectively showing a portion of the transport system in accordance with other exemplary embodiments;

FIG. 53 is a schematic plan view of a vehicle of the transport system shown in FIG. 51.

FIGS. 60-62 are partial cross sectional views of a carrier and load port respectively showing the carrier and load port in three different positions;

DESCRIPTION OF THE EMBODIMENT(S)

Figure 2A:
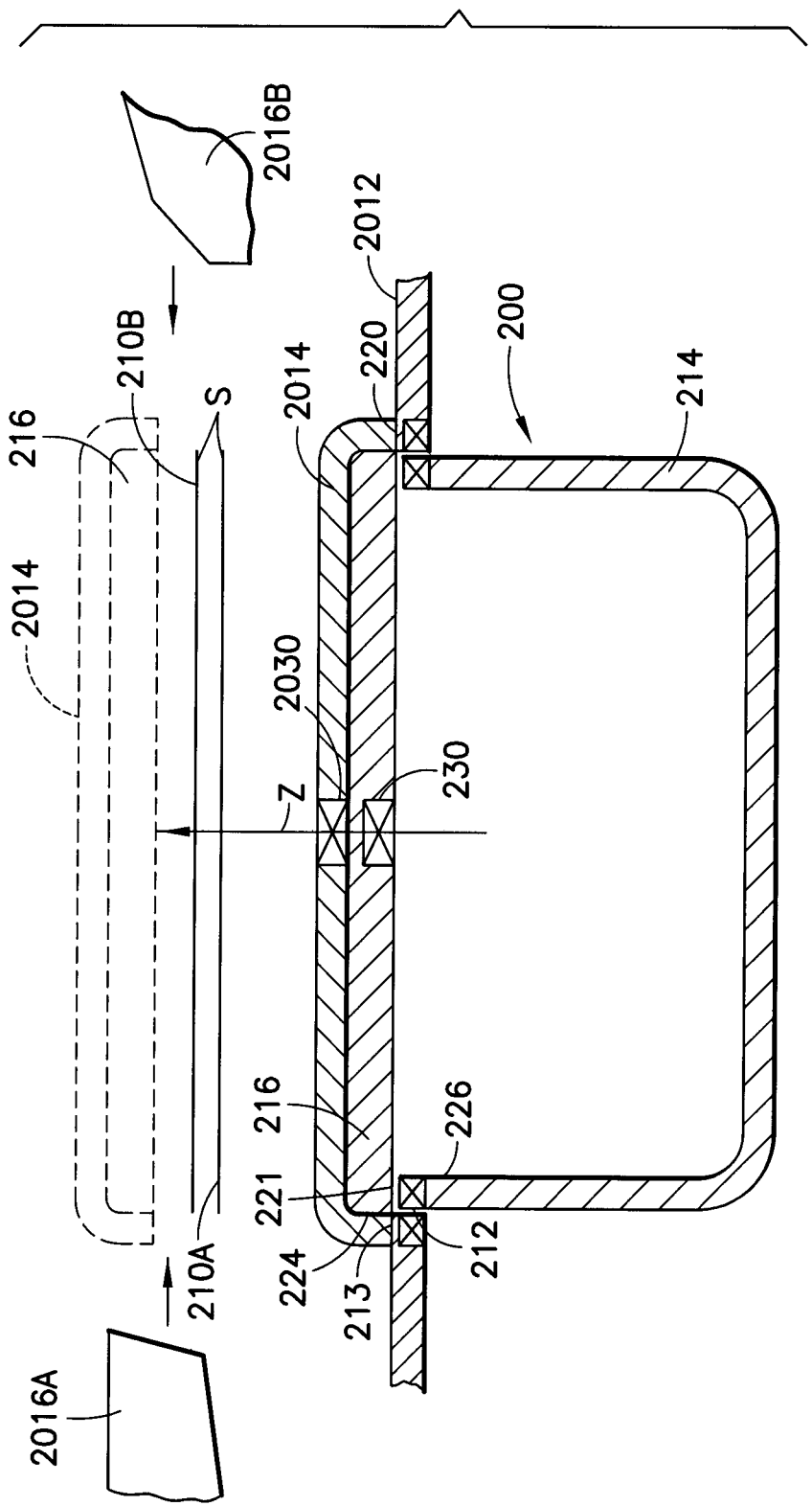
FIG. 2A is a schematic cross-sectional elevation view of the carrier in FIG. 1 and a tool port interface in accordance with another exemplary embodiment.

Still referring to FIG. 1, the workpiece carrier 200 defines a chamber 202 in which workpieces S may be carried in an environment capable of being isolated from the atmosphere exterior to the chamber. The shape of the carrier 200 shown in FIG. 1 is merely exemplary, and in alternate embodiments the carrier may have any other desired shape. The carrier 200 may be capable of accommodating a cassette 210 inside the chamber for supporting the workpieces S within the carrier as shown. The cassette 210 generally has elongated supports 210S (in the embodiment two are shown for example) with workpiece support shelves 210V distributed thereon to provide a row or stack of supports, or shelves on which one or more workpieces may be individually supported as shown. The cassette may be mounted or otherwise attached to the carrier structure, and will be described in greater detail below. In alternate embodiments, the carrier may not have a cassette, and the workpiece supports may be integral or formed as a unitary construction with the carrier structure. The workpieces are shown as flat/substrate elements, such as 350 mm, 300 mm, 200 mm or any desired size and shape semiconductor wafers, or reticles/masks or flat panels for displays or any other suitable items. The carrier may be a reduced or small lot size carrier, relative to conventional 13 or 25 wafer carriers. The carrier may be configured to carry a small lot with as few as one workpiece, or may be configured to carry small lots of less than ten workpieces. Suitable examples of reduced capacity carriers, similar to carrier 200, are described and shown in U.S. patent application Ser. No. 11/207,231, filed Aug. 19, 2005, titled "Reduced Capacity Carrier and Method of Use', incorporated by reference herein in its entirety. Suitable examples of interfaces between the carrier, similar to carrier 200, and processing tools (e.g. semiconductor fabrication tools, stockers, sorters, etc.), and transport systems are described and shown in U.S. patent application Ser. No. 11/210,918, filed Aug. 23, 2005, titled "Elevator Bases Tool Loading and Buffering System"; and Ser. No. 11/211,236, filed Aug. 24, 2005, titled "Transportation System", both of which are incorporated by reference herein in their entirety. Another suitable example of a carrier, with features similar to carrier 200, is described and shown in U.S. application Ser. No. 10/697,528, filed Oct. 30, 2003, titled "Automated Material Handling System" and also incorporated by reference herein in its entirety. As may be realized, a reduced size carrier, similar to carrier 200, allows reduction of work in process in the FAB as the workpieces forming smaller lots may be immediately (upon completion of processing at a given workstation) transported to following workstations in the FAB without waiting for completion of processing of other workpieces as would occur in larger lots. Though the features of the exemplary embodiments are described and shown with specific reference to small capacity carriers, the features of the exemplary embodiments apply equally to any other suitable carrier, such as carriers capable of housing 13, or 25, or any other desired number of workpieces therein.

Referring still to FIG. 1, in the exemplary embodiment, carrier 200 may be shaped to hold the workpieces in a vertical (i.e. Z axis) stack. Carrier 200 may be a bottom or top opening or bottom and top opening carrier. In the exemplary embodiment shown, top and bottom are disposed along the vertical or Z axis, though in alternate embodiments top and bottom may be oriented along any other axis. Top and bottom openings, which will be described in greater detail below, means that the opening(s) 204 of the carrier (though which workpieces S moved in and out of the chamber 202, defined by the carrier) are substantially aligned with the planar surface of the workpieces held in the carrier (in this embodiment substantially orthogonal to Z axis). Carrier 200 as will also be seen below, generally has a casing 212 with a base and a closable or removable door. When closed, the door may be locked and sealed to the base. The seal between door and base may allow the chamber 202 to be isolated from the exterior atmosphere. The isolated chamber 202 may hold any desired isolated atmosphere, such as clean air, an inert gas, or may be capable of holding a vacuum. The door may be opened to allow workpieces to be loaded/unloaded from the carrier. In the exemplary embodiment, door means a removable or removed portion when the carrier is opened to access the workpieces/workpiece support shelves therein. In the exemplary embodiment shown in FIG. 1, casing 200 generally has a generally recessed or hollow portion (referred to hereafter as the shell) 214 capable of receiving the workpieces therein, and a wall (cap/cover, etc.) 216. As will be described below, either wall 216, or shell 214 may operate as the carrier door. The wall and shell are mated to close the carrier, and are separated to open the carrier. In the exemplary embodiment, the shell and wall may be metal, such as an aluminum alloy, or stainless steel made by any suitable process. The wall or shell or both may be one piece members (unitary construction). In alternate embodiments, the carrier casing may be made of any other suitable materials including suitable non metallic materials. Cassette 210 may be mounted to the wall 216, though in alternate embodiments the cassette may be mounted to the shell. Mounting of the cassette to either the shell or door may be selected to facilitate ease of removal of the cassette, or substrates therein from the carrier when the door is opened. Though in the embodiment shown wall 216 is located on top of the shell, in alternate embodiments the carrier casing may have a configuration with the shell on top and wall on the bottom. In still other embodiments, the shell may have a removable wall both on top and bottom (i.e. carrier with top and bottom openings). In other alternate embodiments, the removable wall may be located on a lateral side of the carrier. In the exemplary embodiment, the door may be a passive component (for example, substantially without moving parts or components to effect closing and opening between door and carrier and between door and tool interface as will be described further below).

Referring now to FIG. 2A, carrier 200 is shown positioned at a tool port interface 2010 of a suitable processing tool. The processing tool may be of any desired type, for example a sorter, stocker, or a tool capable of one or more processes, such as material deposition, lithography, masking, etching, polishing, metrology, or a tool with one or more process modules or chambers such as a load lock. The processing tool may have a controlled atmosphere, at least in part, and the tool interface 2010 allows loading/unloading of workpieces between tool and carrier 200 without compromising the controlled atmosphere in tool or carrier 200. In the exemplary embodiment, the port interface 2010 may generally have a port or opening 2012, through which substrates may be loaded into the processing tool, and a door, cover or removable portion 2014 closing the port. In alternate embodiments the removable portion may block the opening in part. In FIG. 2A, the port door 2014 is shown in closed and open positions for example purposes. In the embodiment shown in FIG. 2A, the carrier 200 may be bottom loaded (i.e. moved in Z direction) to interface with the tool port 2012 as will be described below. FIG. 2A shows top wall 216 operating as the door for carrier 200. For example, wall 216 may be connected to the port door 2014 and removed in unison with removal of the port door, for example into the tool, to open the tool port interface. Removal of the wall 216, causes removal of the cassette (mounted thereon) and workpieces thereon from the carrier (for access by a workpiece transport/robot). Referring again to FIG. 1, the configuration of cassette 210 with opposing supports 210S, provide access areas 210A, 210B on more than one side of the cassette (in the exemplary embodiment two sides) which workpiece robot(s) (see also FIG. 2A) may load/unload workpieces onto the cassette shelves. In alternate embodiments the carrier may have any desired number of workpiece access areas. The access areas may be arranged symmetrically around the perimeter of the carrier, or may be disposed in an asymmetric configuration. In the exemplary embodiment shown in FIG. 2A, the tool may have more than one workpiece handling robot 2016A, 2016B to access for example the workpieces V in the more than one access areas 210A, 210B. In alternate embodiments, the tool may have more or fewer workpiece transport robots. Multiside robot access to the cassette may allow workpiece hand off between robots at the cassette. Also, multisided robot access to workpieces delimits the orientation of the carrier when transported or interfaced to tool port. Accordingly, the carrier 200 may be mated to the tool interface in more than one orientation relative to the tool interface. The carrier is closed by returning the port door to its closed position which returns the carrier wall 216 to mate with shell 214.

Referring to FIG. 2B, there is shown the interface of carrier 200 with a tool port interface 2010' in accordance with another exemplary embodiment. In this embodiment, the shell 214 of the carrier may operate as the door. In the embodiment shown the tool port door 2014' may have a shape generally conformal to the carrier shell, to surround and seal around the shell in order to prevent exposure inside the tool interior to contamination on the outside of the shell. In the exemplary embodiment, the carrier 200 may be top loaded, (i.e. moved down along (−) Z direction) such as when the carrier is being lowered from an overhead transport system. To open the carrier 200, the port door is moved down (direction (−)Z), for example into the tool interior, simultaneously removing the shell 214 from the carrier. This may be referred to as bottom opening the carrier, in that the carrier door here (i.e. shell 214) is located on the bottom and opens the carrier by downward movement. The opening of the carrier, exposes the workpieces in the cassette, which remain with wall 216. In this embodiment, the robot (similar to robot(s) 2016A, 2016B in FIG. 2A) may be provided with degree of freedom in Z axis to access the vertically spaced cassette shelves or workpieces therein. The robot may have a mapper (not shown) thereon. In alternate embodiments, the shell 216 may have an integral mapper, such as a through beam mapper allowing mapping of the cassette on removal of the shell. FIGS. 2A-2B illustrate that carrier 200 may be both top and bottom opening. In other alternate embodiments, the shell and wall orientation may be reversed (shell on top of wall) and the carrier may be top opening in a similar but mirror image to FIG. 2B (i.e. lifting shell up) and bottom opening in a manner similar but opposite to FIG. 2A (i.e. lowering wall down).

Referring again to FIG. 1, as noted before the wall 216 and shell 214 may be passive structures, without movable elements, such as locks, which have the potential for generating contamination by actuation within the tool or container clean space. For example, the wall and shell may be magnetically locked to each other. Magnetic locks for example, may have permanent or electromagnetic elements 226, 228 or a combination thereof may be positioned as desired in wall 216 and shell 214 to lock and release wall and shell. The magnetic locks may for example have a reversible magnetic element that is switched (i.e. to open or close) by passing a charge through the reversible element. For example, the wall 216 may include magnetic elements 228 (for example ferrous material) and the shell 214 may have a magnetic switch elements 226 actuated to lock and unlock the wall and shell. In the exemplary embodiment shown in FIGS. 2A, 2B, the magnetic elements in the wall, and the operable magnets in the shell may be configured to allow cooperation with magnetic locks 2028', 2026' in the port door interface 2010, 2010' so that locking the carrier door (either wall or shell, see FIGS. 2A-2B) to the port door causes unlocking of the carrier door from the rest of the carrier. In alternate embodiments, the magnetic locks between wall and shell may have any other desired configuration. In the exemplary embodiment shown in FIG. 23 the carrier may include mechanical coupling elements 230, such as actuated pins, piezo coupling devices or shape memory devices to engage mating coupling features 2030 on the port interface and interlock the carrier to the port interface. In the exemplary embodiment, the devices are shown located in the wall portion, but in alternate embodiments the devices may be locked in the shell. As may be realized from FIG. 24, the actuable devices are enclosed in the sealed interface between the removable wall portion and port door trapping potential particulates, that may arise by operation of the devices therein. The passive carrier and carrier door provide a clean, washable carrier that is vacuum compatible.

As noted before, the carrier door and base (i.e. wall 216 and shell 224) may be sealed to isolate the carrier chamber 202. Also, when the carrier is interfaced with the port of a tool, (for example a load port module), the carrier door and base may each have sealing interfaces for respectively sealing the carrier door (i.e. wall 216 or shell 214 in FIG. 1) to the port door and the carrier base to the port. Further, the port door may have a seal interface to the port.

Figure 3A:
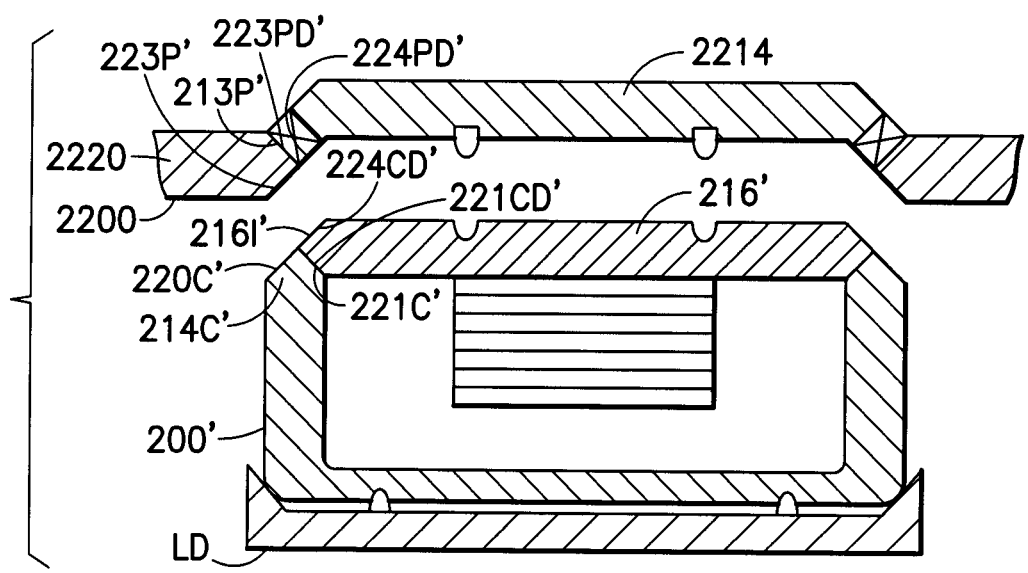
FIGS. 3A-3C are schematic cross-section elevation views respectively illustrating a tool port interface and carrier, in accordance with another exemplary embodiment, in three different positions.
Figure 3B:
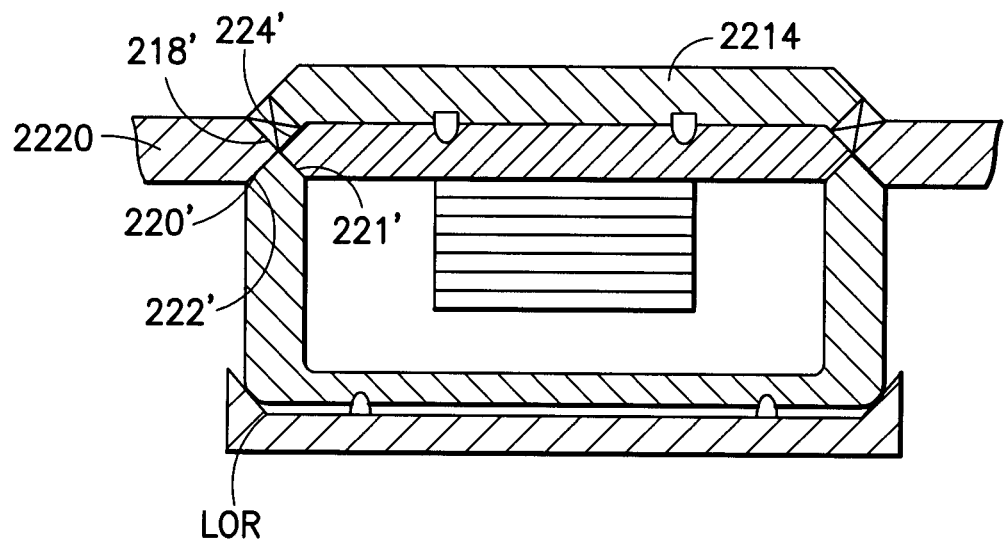
Figure 3C:
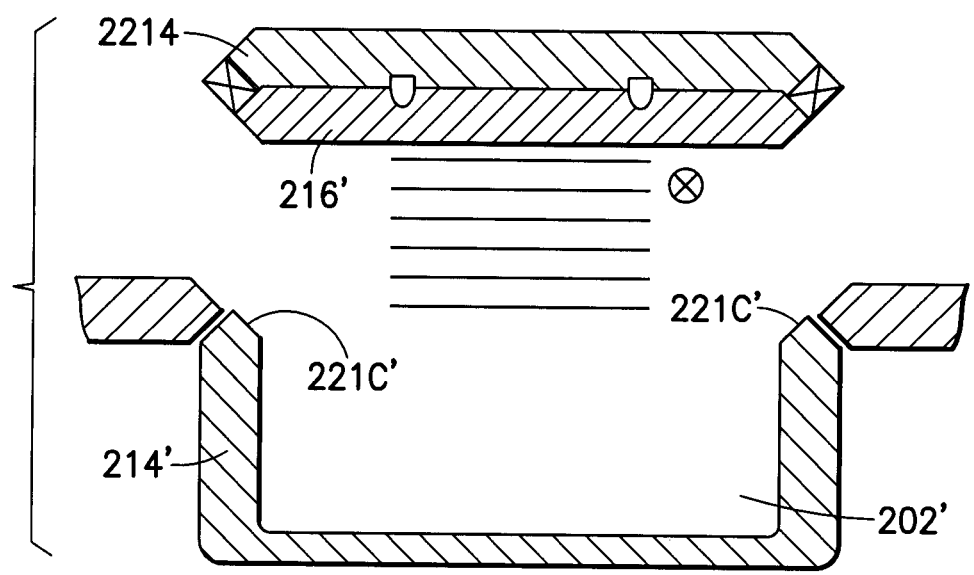

FIGS. 3A-3C show a carrier 200', similar to carrier 200, being interfaced to tool port 2220 in accordance with an exemplary embodiment where the respective seal interfaces (221' carrier door to carrier, 222' carrier to port, 223' port door to port and 224' port door to carrier door) form a combined seal 222' with what may be referred to for convenience as a general X configuration (seen best in FIG. 3B). In the exemplary embodiment shown, the carrier seal interfaces are shown at the top opening for example purposes, and in alternate embodiments wherein the carrier has multiple openings (similar to opening 204 shown in FIG. 1, (e.g. top and bottom) sealing interfaces may be provided at each opening. As may be realized, the general X configuration is merely a schematic representation of the sealing interface surface and in alternate embodiments the sealing interface surfaces may have any suitable arrangement, for example the seal interface surfaces may be curved. The generally X shaped seal configuration defines multiple seal interfaces (e.g. 221'-222') with substantially zero (0) trapped volume between the interfaces. Hence, opening of any sealed interface will not result in a release of contaminants into the space opened on opening of the seal interface. Moreover, in other alternate embodiments the seal may have any desired orientation (e.g. the seal interfaces being oriented horizontally or vertically in a general+pattern). In the exemplary embodiment, the carrier 200' is illustrated as a top opening (wall 216' is door opened by lifting upwards similar to the embodiment illustrated in FIG. 2A) and the port 2220 is configured for bottom loading (lifter lifts carrier 220' upwards to dock to tool port) for example purposes. The shell 214' in this embodiment may have a sealing interface 2141' generally beveled sealing faces 221C', 222C'. Though the sealing faces 222C', 221C' on the shell are shown substantially flat, in alternate embodiments the sealing faces may have inclusive or exclusive angles or other shapes formed therein for enhanced sealing though the surface is generally pitched to result in the generally X shape seal configuration. The wall 216' of the carrier in this embodiment has sealing interface 216I' oriented (in the exemplary embodiment shown in FIG. 3A, beveled) generally to define sealing faces 221CD' and 224CD'. As seen in FIG. 3A, the respective shell and wall sealing faces 221C', 221CD' are generally complementary defining seal interface 221' when wall and shell are closed. The faces 221C' on the carrier interface 214' form a general wedge providing a guide for the wall 216' when being seated onto the shell (see for example FIG. 3C). Also, in the exemplary embodiment the carrier door to carrier seal interface 221' may be positioned so that the weight of the wall 216' acts to increase sealing pressure on the interface. As may be realized, the cassette and workpieces supported from the wall 216' in this embodiment aid in sealing the carrier door to carrier. As seen in FIGS. 3A-3B, sealing faces 222C' and 224CD' are disposed to complement the sealing faces 222P', 224PD' respectively on the port 2220 and port door 2214. FIG. 3B shows the carrier 200' docked to the port 2220, and seals 221', 224' closed. Closure of seals 222', 224' seals off and isolates all exposed surfaces (i.e. surfaces exterior of controlled or isolated chambers inside the carrier or tool) with potential contamination from the interior/chambers of the tool and carrier. As seen best in FIG. 3B, the generally X shape seal 220' provides for optimal cleanliness as it forms what may be referred to as a substantially zero lost volume interface. This as noted before means that the seal geometry of seal 220' does not generate substantial pockets or spaces having exterior surfaces that are exposed (i.e. become interior surfaces) when either the carrier door or the port door is opened. This is best seen in FIG. 3C, wherein removal of the port door 2214, thereby removing the carrier door 216' does not cause exposure of any previously unsealed/exterior surfaces to the carrier/process tool interiors.

As seen in FIG. 3C, top opening of the carrier door results, in this embodiment, in the carrier chamber 202' being located under the raised cassette supported from the wall 216'. The carrier chamber 202' is in communication with the tool interior, that may have a forced air circulation system (not shown), which may cause a general venturi flow within the carrier chamber. In this embodiment, the circulatory air flow within the carrier chamber is located below the workpieces on the raised cassette (hanging from wall 216') with minimum potential for deposition of particulates disturbed by the circulation (which settle down away from the workpieces above). In the exemplary embodiment shown in FIGS. 3A-3C, the carrier 200' may be raised, to interface with and dock with the port 2220 by a suitable lifting device LD. Suitable registration features LDR may be provided on carrier and lifting device to position the carrier on the device and hence position the carrier relative to the port. In alternate embodiments the carrier may be held at the port in any suitable manner. The carrier door 216' may be locked to the port door 2214 via a magnetic lock, mechanical interlocks (e.g. positioned in the sealed interface between doors) or vacuum suction generated in the sealed interface between doors. The port door 2214 may be opened/closed by a suitable device that may be capable of indexing the cassette (similar to cassette 210 in FIG. 1) past a desired mapping sensor (not shown).

Figure 4:
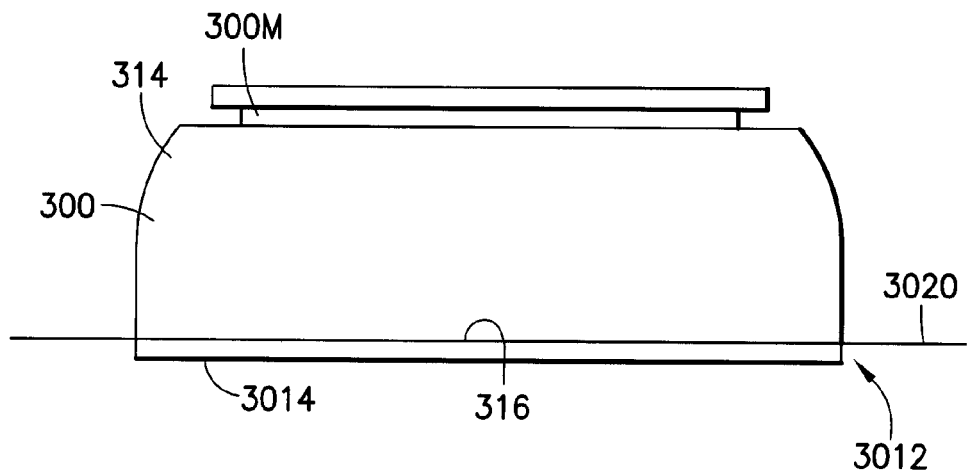
FIG. 4 is a schematic elevation view of a carrier and tool interface in accordance with yet another exemplary embodiment.
Figure 4A:
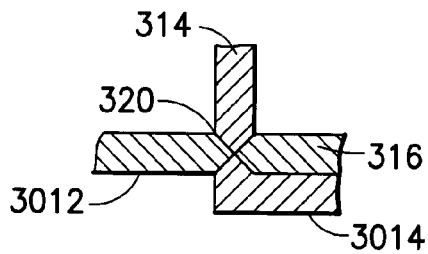
FIGS. 4A-4C are respectively enlarged cross-sectional views of a portion of the interface between carrier and tool each illustrating the interface configuration in accordance with different exemplary embodiments.

Referring now to FIG. 4, there is shown a carrier 300 in accordance with another exemplary embodiment, Carrier 300 is generally similar but inverse to carrier 200 with the shell 314 on top of wall 316. Similar to carrier 200, carrier 300 may be either top (shell operates as door) or bottom (wall operates as door) opening. In the exemplary embodiment shown, the carrier 300 may have integral transport components 300M. For example, the carrier shell (or wall) 314, 316 may have transport motive supports such as rollers or air bearings and a reactive member capable of being motivated by a drive or motor to cause the carrier to be self transportable (i.e. without using an independent transport vehicle) within the FAB. FIG. 4 illustrates the carrier 300 positioned at a loading port 3010 (generally similar to port 2010 described before) for example purposes. In the exemplary embodiment shown, the carrier 300 may be top loaded onto the port interface. The carrier door 316 may be positioned against or adjacent (to form an interface with) the port door 3014, and the shell 314 may interface the port 3012. Carrier 300 and port interface may also have a three, four or five way "cross" type (or zero lost volume) seal similar to the general X seal 220' shown in FIG. 3B. FIG. 4A shows a cross sectional view of the seal 320 in accordance with one embodiment. In the exemplary embodiment seal 320 may be a four way seal for a bottom opening configuration but otherwise generally similar to seal 220'.

Figure 4B:
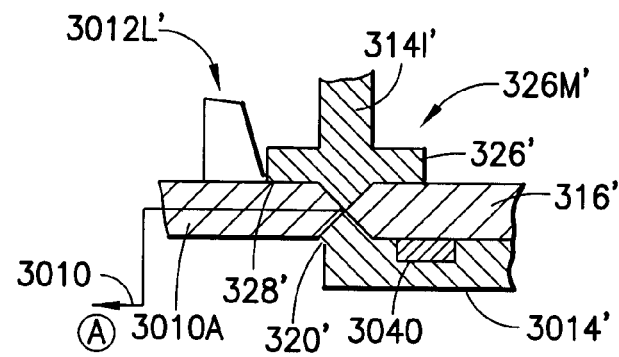
Figure 4C:
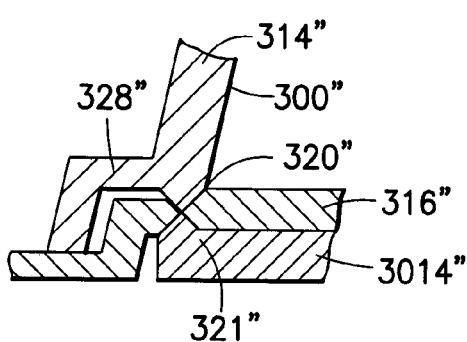

FIG. 4B shows another cross-section of the interface between carrier and port, and the seal therebetween in accordance with another exemplary embodiment. In this embodiment, seal 320' is substantially similar to seal 320. FIG. 4B further shows that the shell interface 3141' may have supporting flanges/features 326', 328'. Flange 326' in this embodiment may operate wall 316', for example the flange may overlap a portion of the carrier door (though in the embodiment shown the feature defines a door contact surface, in alternate embodiments, the feature may not contact the door) and locate a magnetic lock 326M' to hold the wall 316' to shell 314' when the carrier door is closed. Further, feature 326' may overlap magnetic lock 3040' in the port door 3014. The magnetic lock 3040' in the port door may operate for locking the wall 316' to the port door 3014' for carrier door removal. The position of the carrier shell feature 326' may enable the activation of the port door lock 3040' (locking wall 316' to the port door) and for example cause substantially simultaneous unlocking/deactivation of the wall 316' to shell 314' lock. Conversely, upon closing of the port door 3014', unlocking/deactivation of the port door lock 3040' may cause the magnetic latch 326M' between wall 316' and shell 314' to lock. In the exemplary embodiment, exterior feature 328' on the shell may engage a locating/centering feature 3012C' of the port 3010' to locate the carrier when seated. The shape of exterior feature 328' illustrated in FIG. 4B is merely exemplary, and in alternate embodiments the carrier may have any desired locating features. As noted before, the X configuration of seal 320' may eliminate purging the seal interface prior to opening the carrier door because the seal interface may have substantially zero purge volume. In alternate embodiments, (see for example FIG. 4B), the port may include a purge line 3010A. The purge line 3010A may be on any of the seal interfaces or between them. FIG. 4C shows another cross section of the carrier to tool port interface in accordance with another exemplary embodiment. The carrier to port interface has seal 320" generally similar to seal 320 described before. In this embodiment, the carrier shell 314" may have a support 328" for seating the carrier 300" on the port without loading the port door 3014" (i.e. supporting the carrier 300" on the port without distributing carrier weight onto the port door 3014") with the carrier door (wall) 316". Sealing contact at port door to carrier door seal 321" remains substantially constant when opening and closing the carrier door.

Figure 5A:
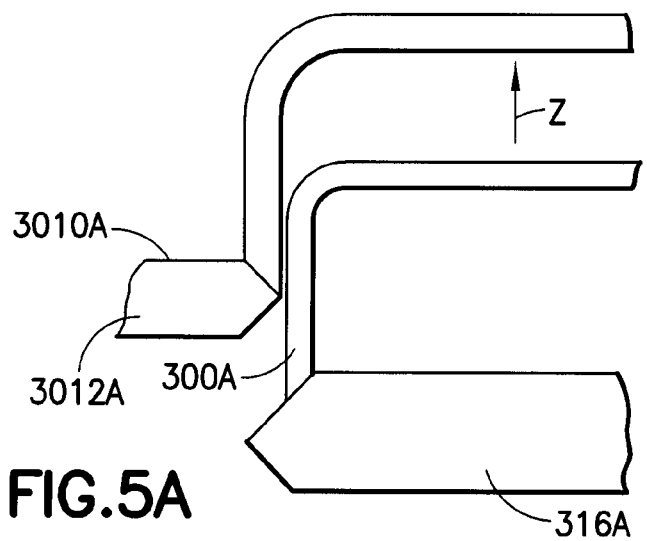
FIGS. 5A-5C are schematic partial elevation views of a carrier and tool interface in accordance with yet another exemplary embodiment, showing the carrier and tool interface in three respective positions.
Figure 5B:
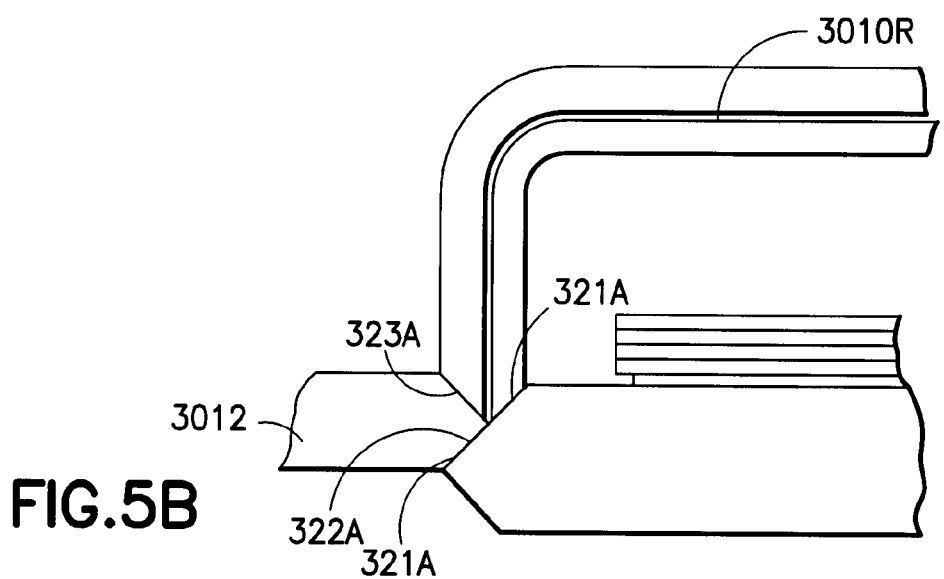
Figure 5C:
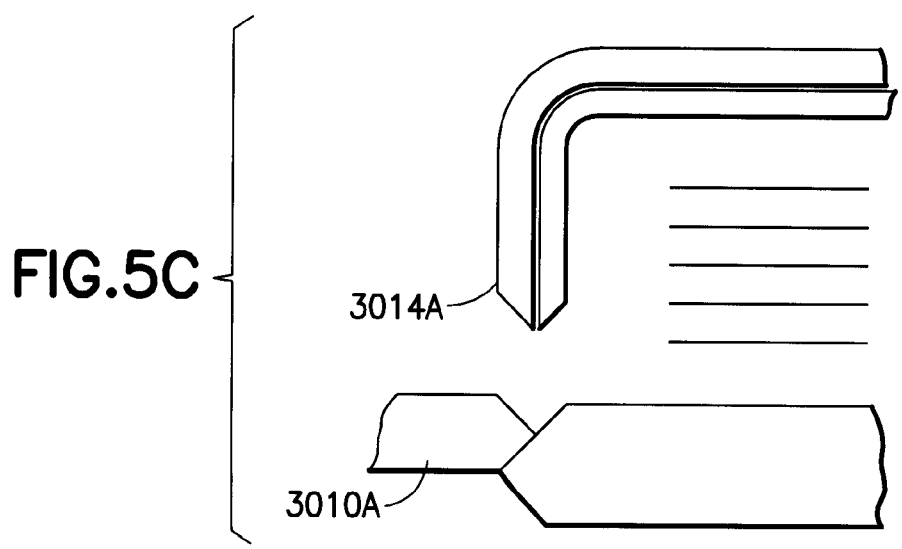

FIGS. 5A-5C illustrate a carrier 300A, similar to carrier 300, mated to a tool port in accordance with another exemplary embodiment. Carrier 300A in this embodiment may be top opening and bottom loaded (in the direction indicated by arrow +z in FIG. 5A). Carrier shell 316A may operate as the carrier door. The seal interface 320A, seen best in FIG. 5B is what may be referred to as a three way seal (with substantially zero purge or lost volume, similar to seal 320, 220 described before), with a general Y configuration (interface 321A, wall to shell, interface 322A wall to port, interface 323A port 3012A to port door 3014A). In this embodiment, the port door 3014A may be generally conformal to the shell 316A. For example, shell 316A may be nested in the port door 3014A. In the exemplary embodiment, the fit and placement of the shell 316A and port door 3014A minimizes the volume at the interface in between. A seal (not shown) may be provided between shell 316A and port door to seal the interface therebetween. As seen in FIG. 5B, the port door, 3014A in this embodiment, may have a vacuum port 3010V to purge the port door to carrier door interface volume.

Referring again to FIGS. 2A-2B, the carrier to port interface is shown according to still other exemplary configurations. Interface 220, 220' is substantially similar in the exemplary embodiments shown in FIGS. 2A, 2B (bottom load/top opening, top load/bottom opening respectively). Seal interface 220, 220' may be a four way seal with a general "cross" or X configuration (interface 221 wall 216 to shell 214, interface 222 shell 214 to port, interface 223 port 2012 to port door 2014 and interface 224 port door to wall 216). As seen in FIG. 2A, in this embodiment seal interfaces 222, 224 may be positioned (e.g. vertically) substantially parallel to direction of relative motion of interfacing surfaces (such as during loading of the carrier, and during closing of the port door). In other words, movement of the carrier or carrier door to closed position does not generate sealing closure. In this embodiment, one or more of the faces forming seal interfaces 222, 224, for example, may be provided with actuable seals such as inflatable seal, piezo actuated seal or shape memory members to actuate the seal sections and close the seal interface without substantial rubbing contact at the seal interface. The seal configurations described are merely exemplary.

Figure 6A:
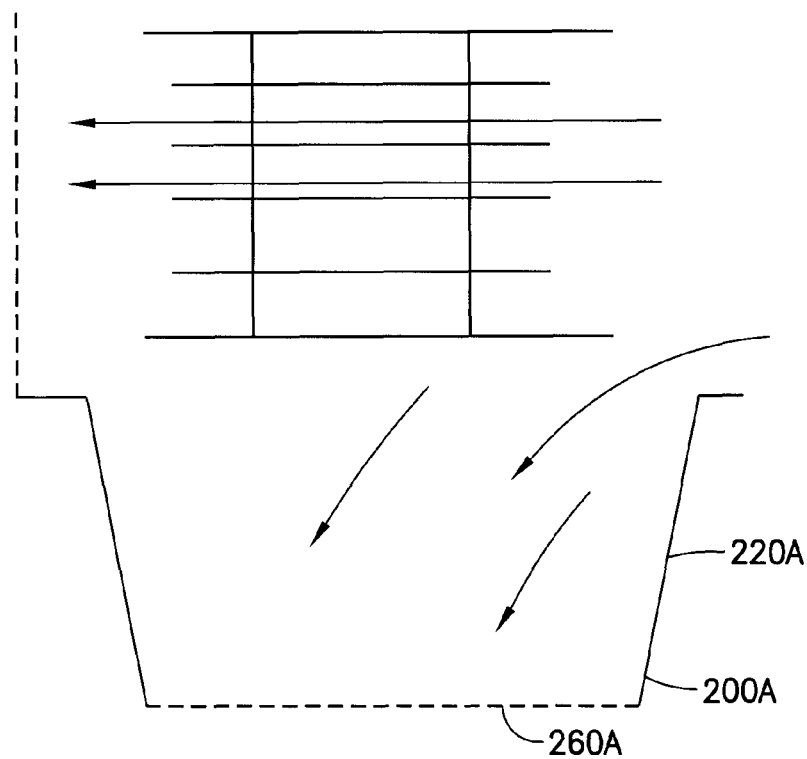
FIG. 6A-6B are respectively schematic elevation views of workpiece carriers in accordance with other different exemplary embodiments.
Figure 6B:
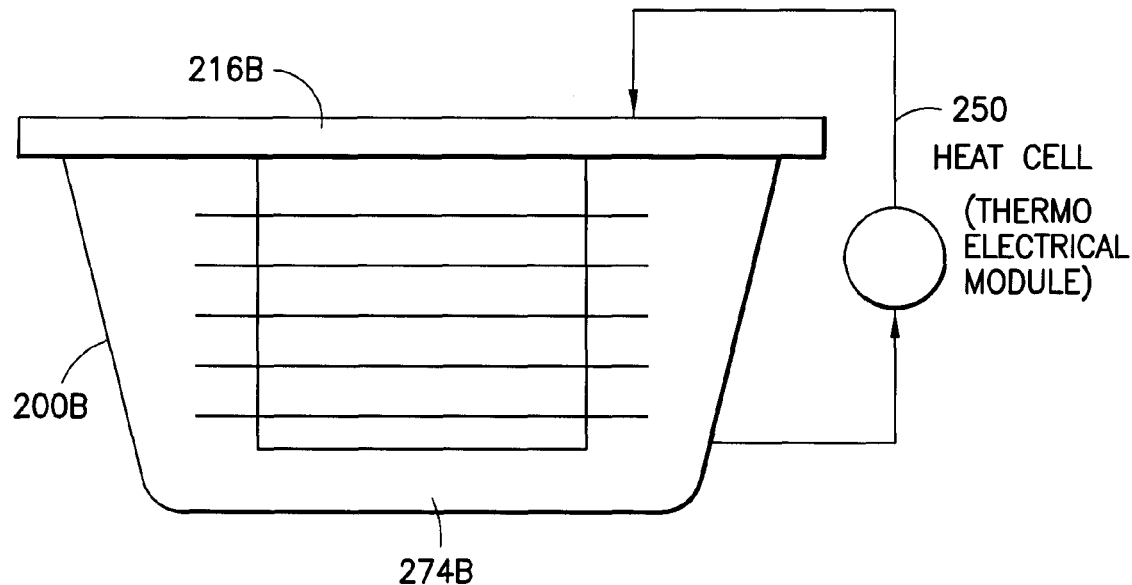

Referring again to FIG. 1, carrier shell 214 may have external supports 240 for handling the carrier. Supports 240 are shown, for example as handles, but may have any suitable form. In the exemplary embodiment, supports 240 may be located on opposite side of the shell as far apart as desired to optimize handling stability of the carrier. In alternate embodiments more or fewer supports may be provided. Referring now to FIG. 6A, carrier shell 220A may have a perforated or recessed member, membrane or filter 260A located proximate the bottom of the shell. The perforations or recesses in the member are sized and shaped to mitigate or reduce the strength of venturi or vortex flows induced in the shell when the carrier door is open. In alternate embodiments the venturi or vortex flow mitigation elements may be located in any other suitable location in the carrier. Carrier 200A is shown with the shell on bottom for example purposes, and in alternate embodiments the carrier may be on top. Further flow straightening spaces and/or vanes (not shown) may be provided within the tool interior to aid maintaining substantially smooth/laminar flow over the workpieces when positioned inside the tool. FIG. 6B shows a carrier 200B in accordance with another exemplary embodiment. The carrier 200B may have a thermal regulator 250 for maintaining the workpieces within the chamber at a different temperature then ambient temperature. For example, the carrier shell or wall 214B, 216B may have a thermoelectric module connected thermally to the workpieces, such as via the cassette supports, to heat/raise the temperature of the workpieces over ambient. Higher workpiece temperature than ambient drives particles and water molecules away from the workpiece via thermophoresis, preventing contamination when workpieces are out of carrier, or the carrier door is opened. In alternate embodiments, any other desired thermal regulator may be used such as microwave energy. In other alternate embodiments, an electrostatic field may be generated around each workpiece to repel contamination by water molecules and particulates.

Referring now to FIGS. 1A-1B, in the exemplary embodiment the cassette 210 (see also FIG. 1) may have nested shelves 210V for 360° positive restraint of the workpiece supported by the shelf. Each shelf 210V may be formed by one or more shelf seats or supports 210C. As seen in FIG. 1A, in the exemplary embodiment the cassette shelf supports 210C may be located so that the workpiece is generally straddled by the supports. Each shelf 210V may have a raised surface to form a perimeter constraint for the workpiece S seated on the shelf. The raised surface may be inclined (relative to the vertical) to form a locating guide 210L for seating the workpiece S. The seating surface of the shelf 210V may be pitched (relative to the bottom surface of the workpiece, forming for example a pitch angle of about 1° to the workpiece bottom surface) to ensure contact with the bottom of the workpiece for example within the perimeter exclusion zone. In alternate embodiments, the workpiece shelves may have any suitable configuration defining passive workpiece restraints. In other alternate embodiments, the shelves may not have passive workpiece restraints.

Figure 7A:
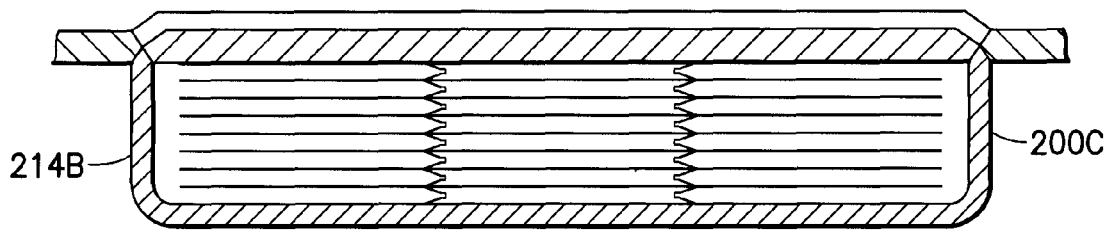
FIGS. 7A-7C are schematic elevation views of a workpiece carrier, in accordance with another exemplary embodiment, respectively showing the carrier in different positions.
Figure 7B:
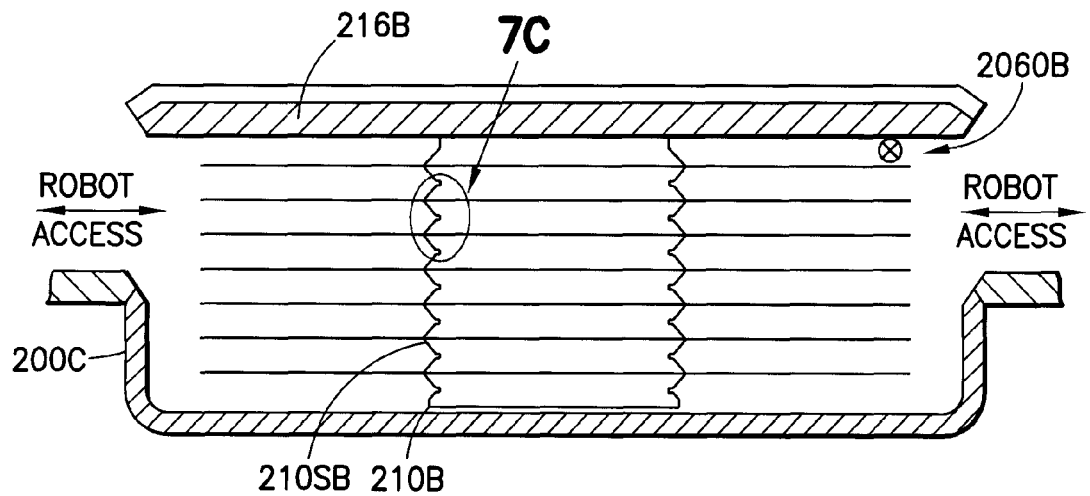
Figure 7C:
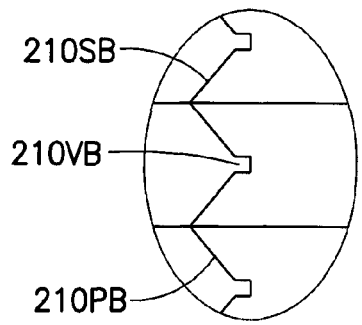

Referring now to FIGS. 7A-7B, the carrier 200C, in accordance with another exemplary embodiment which is similar to carrier 200 shown in FIG. 1, is shown respectively in closed and opened positions. Cassette 210B in this embodiment is capable of variable height. When the carrier 200B is closed, cassette 210B may be at a min height, and when the carrier door (e.g. wall 216B) is opened, the cassette may be expanded to a maximum height. The pitch between workpiece/shelves of the cassette is increased when cassette expands from min to max height thereby allowing min carrier height, with maximum space between workpieces when accessed. In this embodiment, the cassette supports 210SB may have a general bellows configuration. The supports may be made for example of aluminum sheet, or any other suitable material (e.g. shape memory material), allowing sufficient flexibility without articulated joints. As shown, the cassette supports may be supported at the top to the carrier wall 216B. Top opening of the carrier (removing wall 216B as shown in FIG. 7B) or bottom opening (removing shell 214B similar to that shown in FIG. 2B) causes the cassette (bellows) supports 210SB to expand under gravity. The cassette bellows is compressed by closing the carrier door. As seen in FIG. 7C, the bellows 210SB may have workpiece supports 210VB on which the workpieces rest. In the exemplary embodiment, the workpiece supports 210VB may be shaped, relative to adjoining portions 210PB of the bellows, to remain in a substantially constant radial position (hence avoiding relative radial movement between workpiece and workpiece seat) when the bellows expands/collapses. As may be realized, the bellows cassette may be collapsed so that the workpieces in the cassette are actively clamped between adjacent pleat section 210PB of the bellows. As may be realized, the upper clamping portions may contact workpiece along its peripheral edge. As seen in FIG. 7B, in the exemplary embodiment a through beam mapper 2060B, or other suitable device in the tool or carrier may be provided to determine the locations of the workpieces S when the cassette is expanded. The workpiece robot (not shown) may also have a sensor for detecting proximity of workpiece to ensure proper positioning for workpiece pick.

Figure 8:
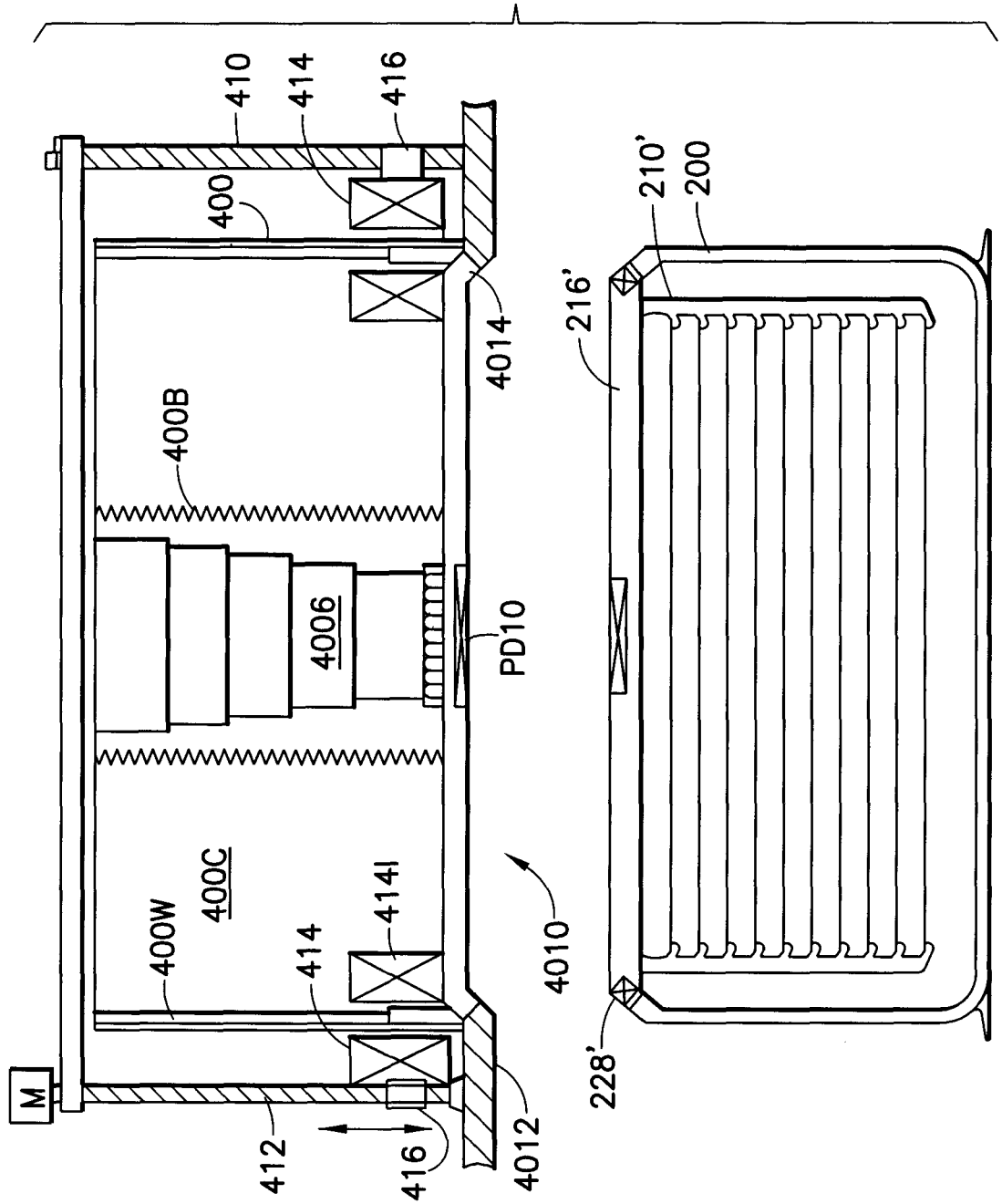
FIG. 8 is another schematic elevation view of tool interface and carrier in accordance with another exemplary embodiment.

As noted before, the carrier with passive carrier door and seal is suitable for direct interface to a vacuum capable chamber such as a load lock. FIG. 8 shows a carrier 200' (top opening) to be mated directly to a port interface 4010 of a vacuum capable chamber (referred to for convenience as load lock) 400 in accordance with another exemplary embodiment. Carrier 200' shown in FIG. 8 may be generally similar to carrier 200, 300 described before. The load lock, in the exemplary embodiment, has an indexer 410 that operates to open/close the port door 4014, and hence open/close the carrier door (in this embodiment top wall 216') and raise/lower cassette 210'. In the exemplary embodiment, the indexer 410 may be configured to provide the load lock chamber with a low or minimal Z-height. For example, the indexer 410 may be positioned exterior to the load lock chamber 400C and arranged alongside the load lock chamber to reduce overall height of chamber and load lock. In the exemplary embodiment, the indexer 410 may have a drive section 412 and a coupling section 414. In the embodiment shown, the drive section 412 may have an electro-mechanical drive system with for example a motor driving belt or screw drive to raise/lower shuttle 416. Coupling section 414 in the exemplary embodiment, may be a magnetic coupling that couples the shuttle 416 on the drive section to the port door 4014. The port door may for example have magnets (permanent, or electromagnets) or magnetic material located thereon forming the interior portion 414I of the magnetic coupling 414. The magnetic portion 414I of the door 4014 may also lock the port door to the port frame 4012. For example, the port frame 4012 may have suitable magnets (similar to magnets 2028' in FIG. 2B) arranged to operate with the magnetic portion/magnets 414I on the port door and lock the door and port when the door is in its closed position. In the exemplary embodiment, the magnetic lock elements in the port frame may operate with the magnetic coupling portion 414I on the door 4014. In alternate embodiments the magnetic coupling between door and drive, and magnetic lock between door and frame may have any suitable configuration. As seen in FIG. 8, the chamber walls 400W isolate the drive section 412 from the interior of the chamber 400C. In other exemplary embodiments (see also FIGS. 18-19), the drive section 412' may be linear motors (e.g. linear induction motors, LIM) that operate on a reactive portion 414I' of the port door 4014' to effect movement of the port door. The LIM may be located exterior to the chamber walls and isolated from the chamber interior. In the exemplary embodiment shown in FIGS. 18-19, the drive may include magnetic material sections 4122', or permanent magnets forming fail safe locks to hold the port door 4014' in the open position in the event of power loss to the chamber. In alternate embodiments, suitable accumulators may be connected to the drive to allow desired control for lowering the port door to the closed position. As may be realized from FIGS. 8 and 18-19, the seal between port door and port frame, in the exemplary embodiment is located so that door weight contributes to sealing the interface.

In the exemplary embodiment shown in FIG. 8, the respective section 414I of the magnetic coupling may also lock the port door 4014 and carrier door 216' to each other. For example, the carrier door may have suitable magnets (e.g. permanent magnets) or magnetic material 228' positioned to cooperate with the coupling section 414I (e.g. may include electromagnets, or magnets with variable magnetic field) when activated to lock port and carrier doors to each other. In the exemplary embodiment, the port door motion may be guided by a guide that is also isolated from the chamber. For example, in the embodiment shown, a bellows 400B connects the port door to the chamber walls and isolates the port door movement guide 4006 from the chamber. The guide in this embodiment has generally telescoping sections. The telescoping guide is shown as made from hollow cylindrical telescoping sections for example purposes, and may have any suitable configuration in alternate embodiments. In other alternate embodiments, the indexer may have any other desired configuration. For example, suitable indexing motors may be located in the chamber walls, but isolated from the chamber interior such as disclosed in U.S. patent application Ser. No. 10/624,987, filed Jul. 22, 2003, and incorporated by reference herein in its entirety, capable of effecting controlled movement of the port door without mechanical guides for the port door. The bellows 400B may be pressurized to assist port door closure. The bellows may also house umbilical systems such as vacuum line, and power/signal lines connected to the port door. In the exemplary embodiment, the port door may have a port PD10 connected to a vacuum source forming the chamber pump down port as will be described further below.

Figure 9:
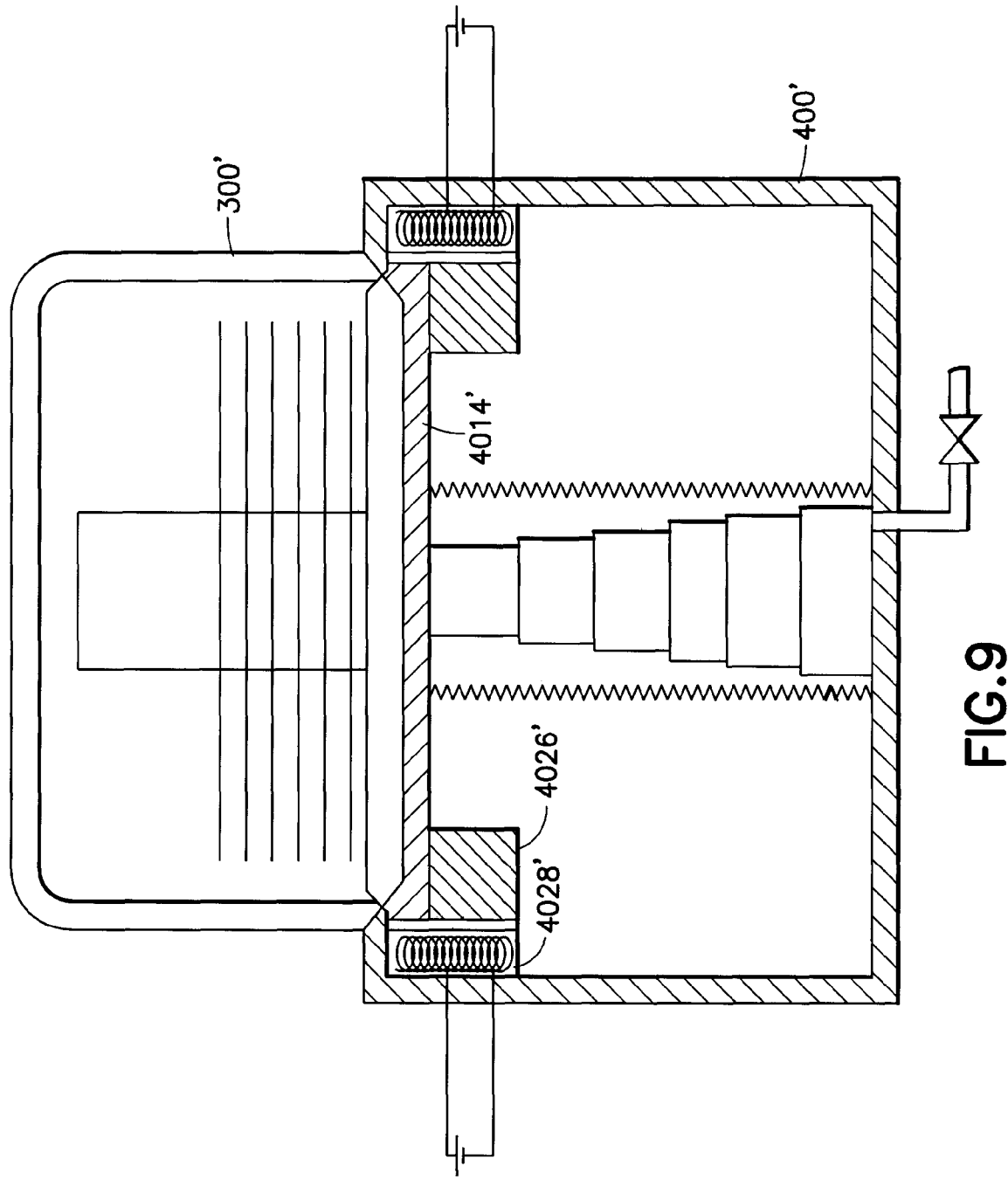
FIG. 9 is another schematic elevation view of tool interface and carrier in accordance with another exemplary embodiment.

Referring now to FIG. 9, there is shown a carrier 300' on a vacuum chamber 400' in accordance with another exemplary embodiment. In the exemplary embodiment shown, the carrier 300' may be a bottom opening carrier (similar for example to carrier 300 described before, see also FIG. 3). In the exemplary embodiment, the port door 4014' may be lowered into the chamber when opened. The indexer (not shown) may be similar to that shown in FIGS. 8, 18-19 but arranged to move the port door down. The chamber and port door may have magnetic locks 4028', 4026' for locking the door in the closed position to the chamber frame. In the exemplary embodiment the port frame may have one or more coil elements 4028' (defining what may be referred to as the frame side portion of the magnetic locks). The coil element(s) 4028' may be positioned as desired and may generate a magnetic field that operates on door lock components 4026'. The magnetic lock components 4026' on the door may be permanent magnets or magnetic material. In the exemplary embodiment, the coil elements 4028' are shown located in the chamber for example purposes. In alternate embodiments, the coil elements may be located outside. The chamber walls, isolated from the chamber interior. The coil elements may be fixed or stationary relative to the frame. Field strength may be reduced when desired to reduce magnetic forces in the magnetic lock and ease movement of the port door. In alternate embodiments, the coil elements may be movable, for example mounted to the shuttle of the drive system and may form part of the magnetic coupling between port door and indexer. In alternate embodiments, the magnetic locks may be similar to those for locking the carrier door to the carrier described before. The permanent magnets or magnetic material 4026' on the port door 4014' that effect magnetic locking to the frame, may also provide coupling to the indexer similar to that shown in FIG. 8. The chamber in the embodiment shown in FIG. 9 may also have a bellows and port door guide similar to that shown in FIG. 8. The bellows may be pressurized to assist raising the port door and maintain in closed position, especially when carrier door and cassette are seated on the port door. In alternate embodiments, the chamber may have a bellows without a port door guide therein. Vacuum may be connected to the port door to effect chamber pump down through the port door to carrier door interface. Thus, as in the embodiment shown in FIG. 8, the chamber pump down port, in the exemplary embodiment, may be located in the port door.

Figure 10:
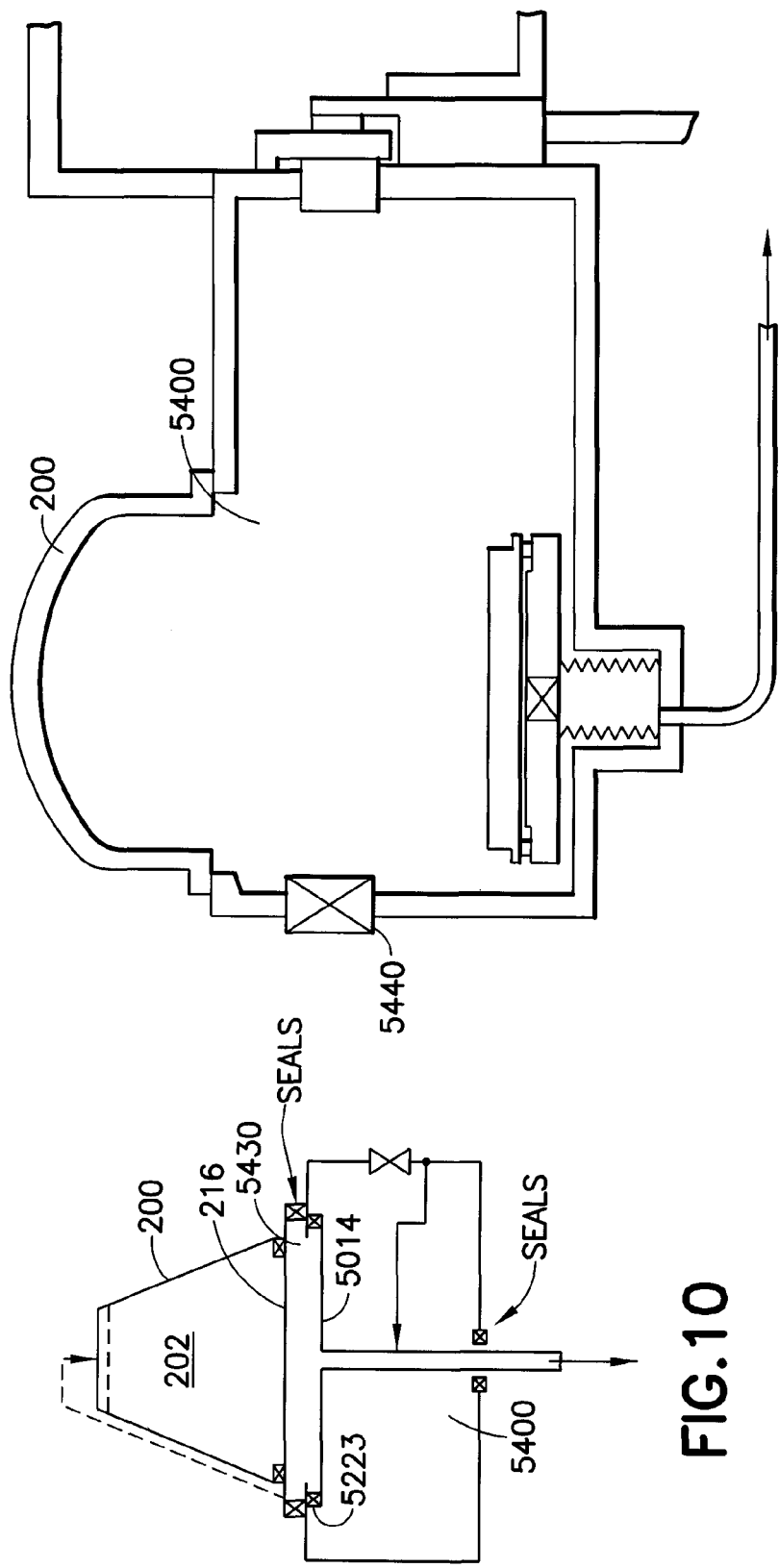
FIG. 10 is another schematic elevation view of tool interface and carrier in accordance with another exemplary embodiment.

Referring again to FIG. 8, in the exemplary embodiment load lock chamber pump down may be performed for example with the carrier interfaced to the chamber port and the port door moved by the indexer 410 from its closed position. As may be realized from FIG. 8, in the exemplary embodiment pump down of the load lock chamber, via vacuum port PD10 in the port door, may be through the carrier door 216' to port door 4014 interface. The suction flow of chamber/carrier gas through the carrier door to port door interface generates a negative pressure on the interface preventing inadvertent escape of contaminants into the chamber. FIG. 10 illustrates load lock chamber pump down through the port door 5014 in accordance with another exemplary embodiment. In this embodiment, purge of the port door to carrier door space 5430, and of the carrier chamber 202 may be performed prior to load lock chamber pump down. For example, purge gas may be introduced into space 5430 by applying vacuum and cracking a port door to port seal 5223 (or with suitable valving). The carrier 200 may be purged by cracking the carrier door 216 allowing load lock chamber 5400 gas to enter the carrier, or again by suitable valving. For example, a gas supply from the chamber (shown in phantom in FIG. 10) may be provided to the carrier to introduce a desired gas species in the carrier 200. As seen in FIG. 10A, which illustrates the load lock chamber 5400 and carrier 200 with the port door and carrier door moved to the open position the load lock chamber 5400 may have a vent (or gas species supply) 5440 disposed as desired in the load lock walls, to vent the load lock chamber. Accordingly, the purge line may, in the exemplary embodiment, be used for purging, and venting of the chamber may be performed independent of the carrier door to port door interface.

Figure 11:
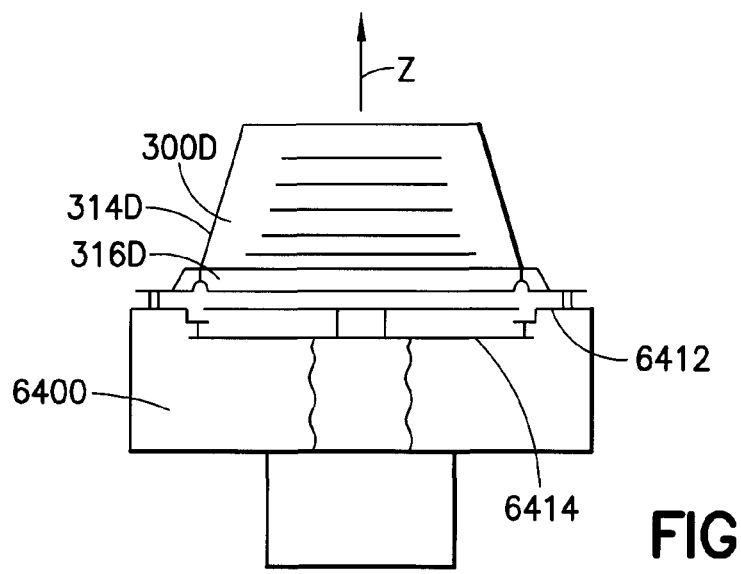
FIG. 11 is a schematic elevation view of a process tool section and carrier interface therewith in accordance with another exemplary embodiment.
Figure 12A:
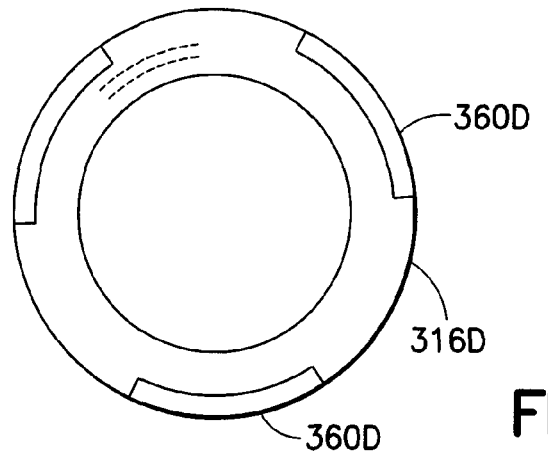
FIGS. 12A-12B are schematic bottom views of the carrier (workpiece transfer) opening and carrier door of the carrier in FIG. 11.
Figure 12B:
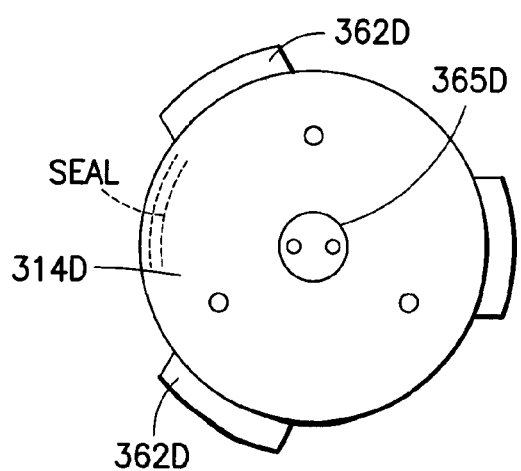
Figure 13A:
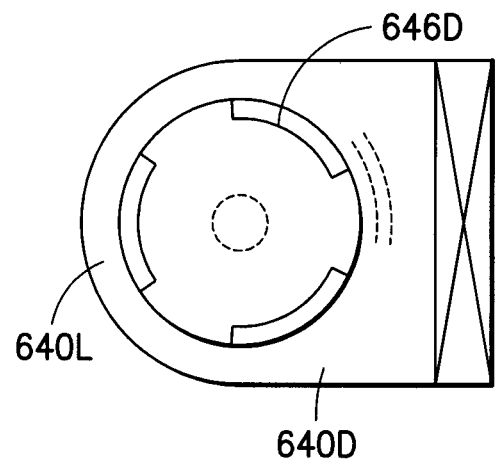
FIGS. 13A-13B are schematic top plan views of the interface and a tool to carrier door interface of the tool section in FIG. 11.
Figure 13B:
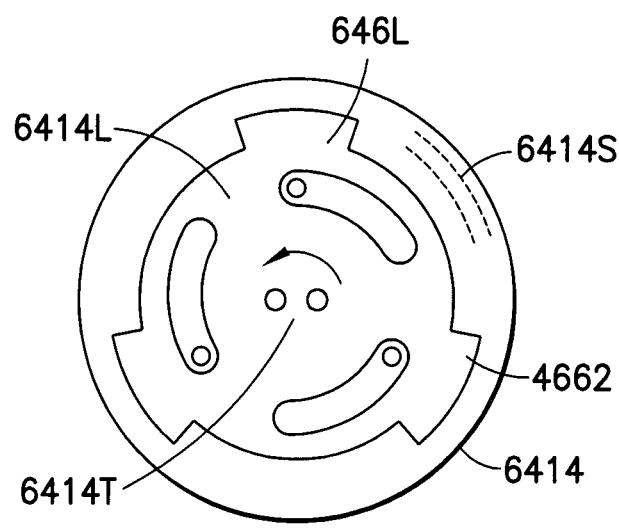

FIG. 11 illustrates an exemplary embodiment where the carrier door 316A and port door 6414 have respective mechanical "failsafe" locks respectively locking the carrier door to carrier 3140 and port door to port 6412 or chamber 6400D. The carrier 314D, carrier door 316D, port 6412 and port door 6414 may be passive (no articulated locking parts). In this embodiment, the indexer may be capable of both Z axis indexing of the port door and of rotating the port door (for example about the Z axis) for engaging/disengaging the lock tabs on the port door and carrier door. In alternate embodiments, Z axis movement and rotation of the port door may be provided via different drive shafts. FIGS. 12A-12B respectively show bottom views of the carrier shell 314D and the carrier door 316D. FIGS. 13A-13B respectively show top plan views of the port 6412 in the (load lock) chamber 6400 and the port door 6414. In the exemplary embodiment, the lower surface of the carrier shell has engagement tabs/surfaces 360D, that are engaged by engagement surfaces 362D on the carrier door 316D. As may be realized, engagement/disengagement between engagement surfaces 360D, 362D may be effected via rotation of carrier door relative to the carrier 314D. Rotation of the carrier door is imparted by the port door 6414 as will be described below. In alternate embodiments the engagement surfaces between door and carrier may have any desired configuration. The carrier door 316D may have a male/female torque coupling feature 365D complementing a torque coupling member on the carrier door 6414T. In the exemplary embodiment shown, the port 6412 and port door 6414 may have interlocking or engagement surfaces generally similar to the engagement features of the carrier and carrier door. As seen best in FIGS. 13A, 13B, the port may have engagement surfaces 6460 (for example projecting inwards), and the port door 6414 may have complementing engagement surfaces 6462 to overlap and engage port surfaces 6460. As may be realized, in the exemplary embodiment the engagement surface 3600, 3620 on the carrier, and the engagement surfaces 6460, 6462 on the port are located relative to each other to allow simultaneous engagement/disengagement between carrier and carrier door, and port and port door when the port door is rotated.

Figure 14:
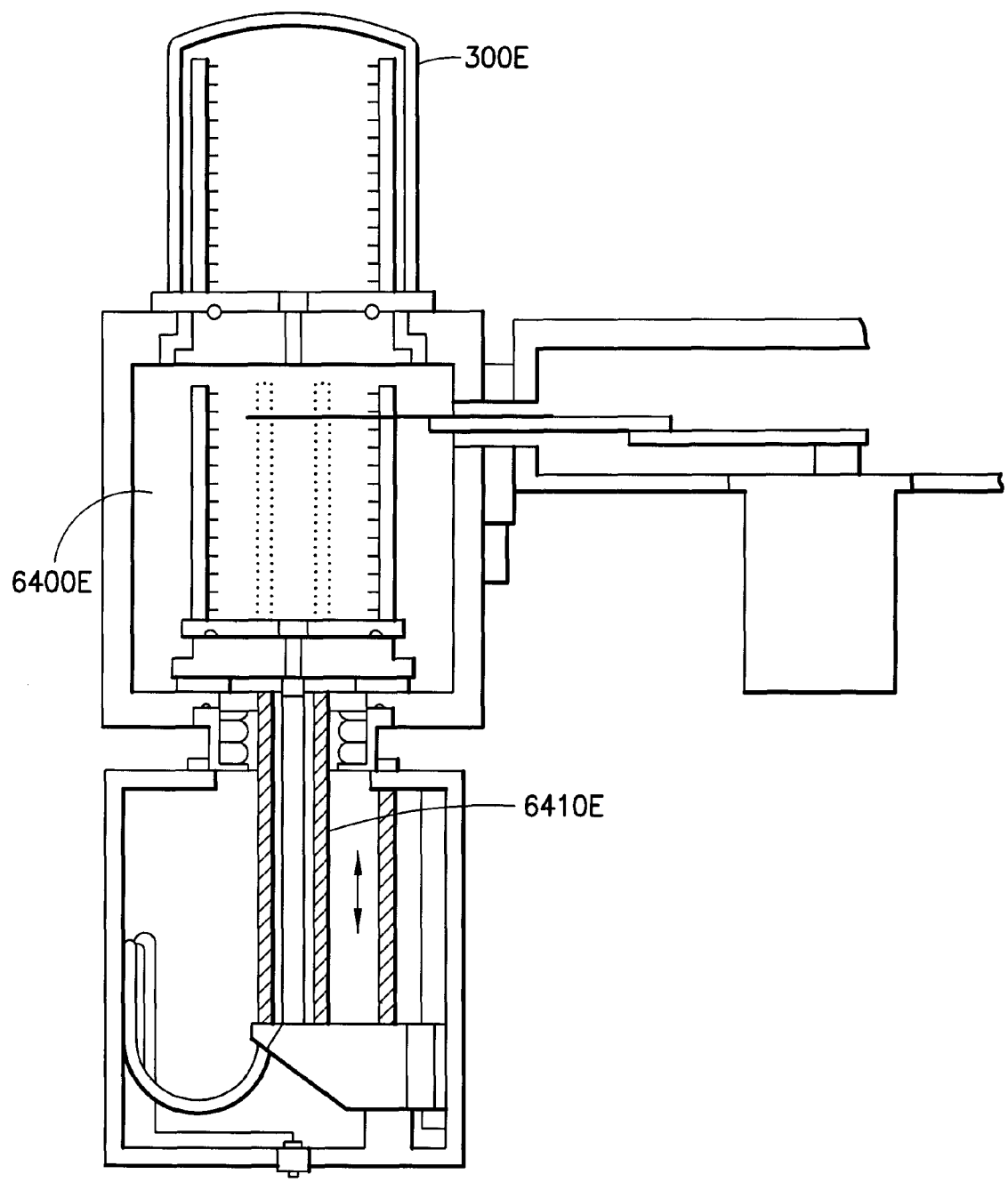
FIG. 14 is a schematic elevation of a process tool and carrier interfaced therewith in accordance with still another exemplary embodiment.

FIG. 14 illustrates load lock chamber 400E and indexer 6410E and carrier 300E. In the exemplary embodiment the indexer may be located substantially axially in series with the load lock chamber. Similar to pod 200, 300, 3000, pod 300E in the exemplary embodiment shown in FIG. 4 may be a vacuum compatible top or bottom opening pod with features similar to those described before. Chamber 6400E may be similar to the chambers described previously. FIG. 15 shows a load lock chamber and carrier 300F having a reduced pump down volume configuration. In the exemplary embodiment shown, the carrier door 316F may have top 350F and bottom 321F door to carrier shell 314F seals. The bottom seals 3270F (similar for example to seals 221) engage the shell 314F when the carrier door is closed, as shown in FIG. 15. The top seals 350F seal against the carrier shell when the carrier door is opened (for example seal 350F may seat and seal against carrier seat surface 351F). The top seal 350F isolates the carrier chamber from the load lock chamber, hence reducing the pump down volume when pumping the load lock chamber to vacuum.

Figure 16A:
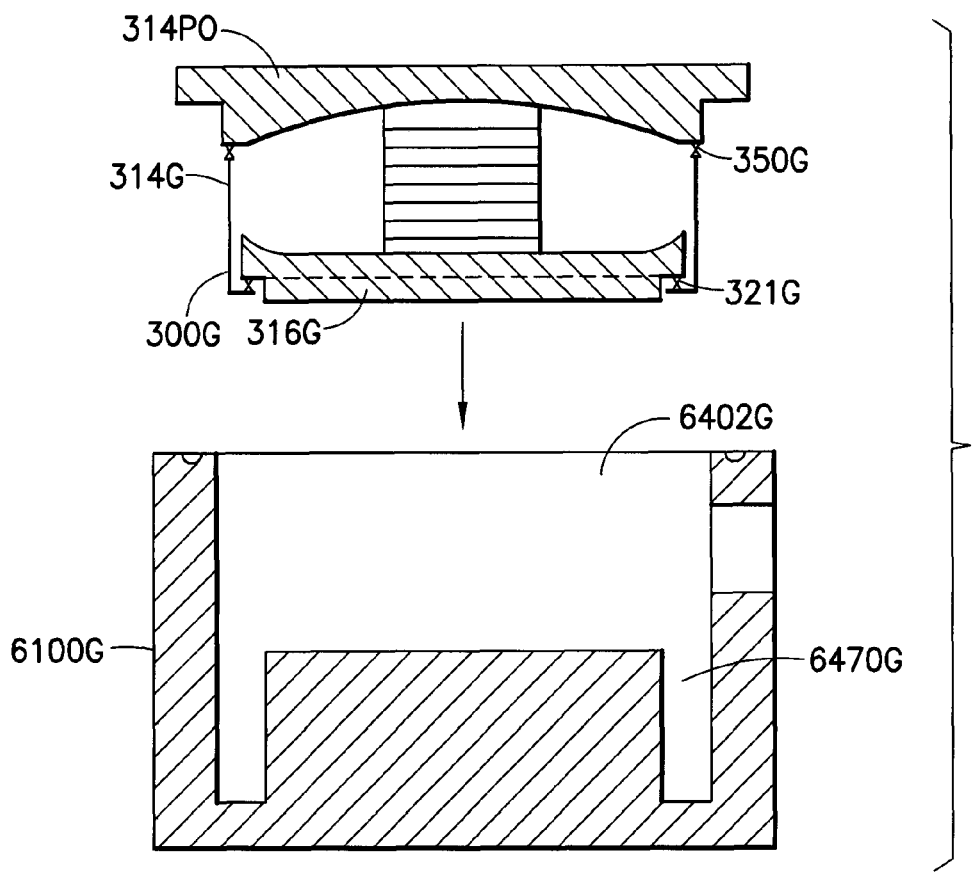
FIGS. 16A-16B are schematic elevation views of a tool interface and carrier respectively shown on two different positions in accordance with another exemplary embodiment.
Figure 16B:
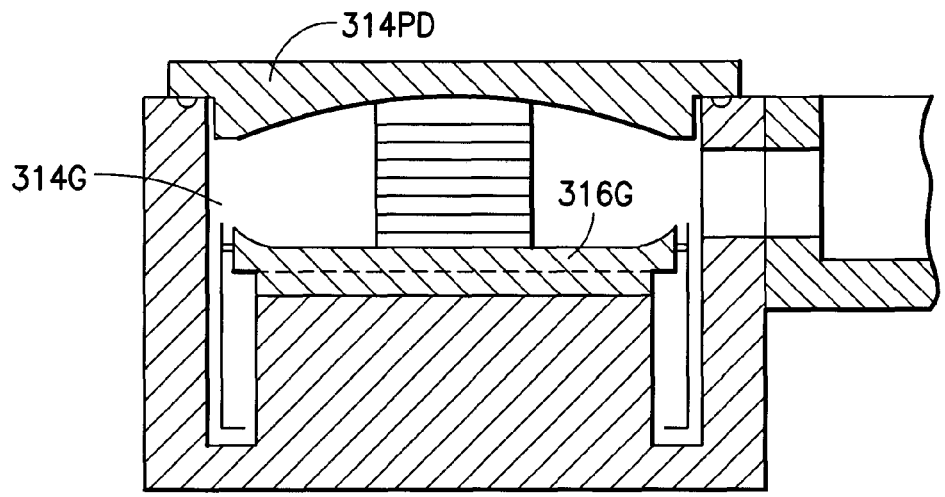
Figure 17:
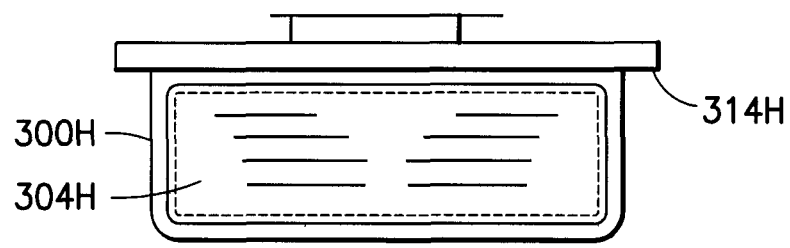
FIG. 17 is a schematic side view of a carrier.
Figure 17A:
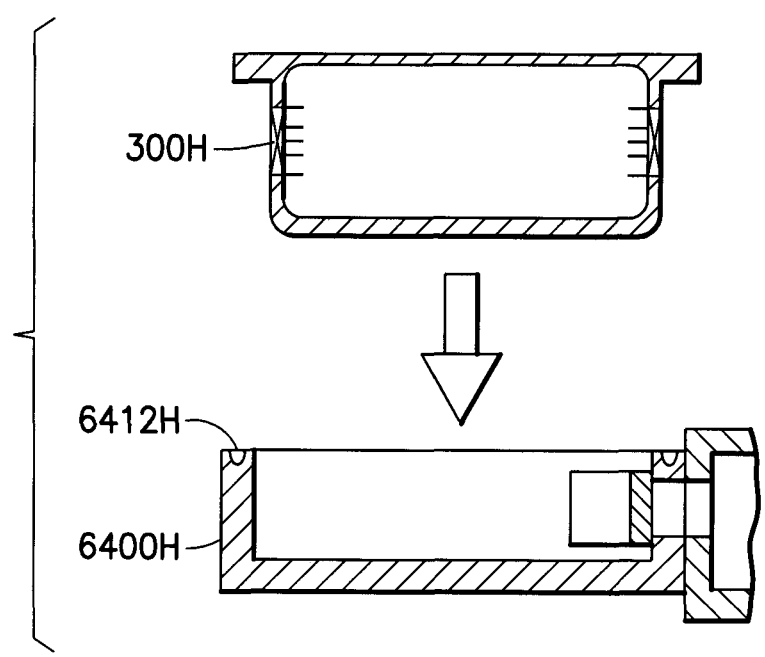
FIGS. 17A-17C are other schematic elevation views of the carrier and a tool interface and a plan view of the tool interface in accordance with another exemplary embodiment.
Figure 17B:
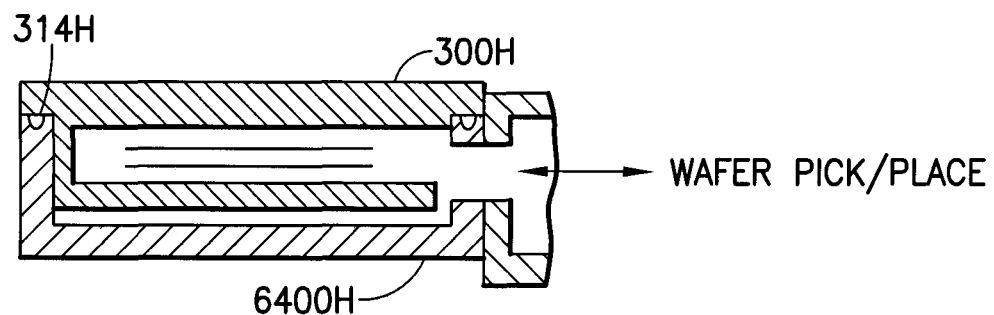
Figure 17C:
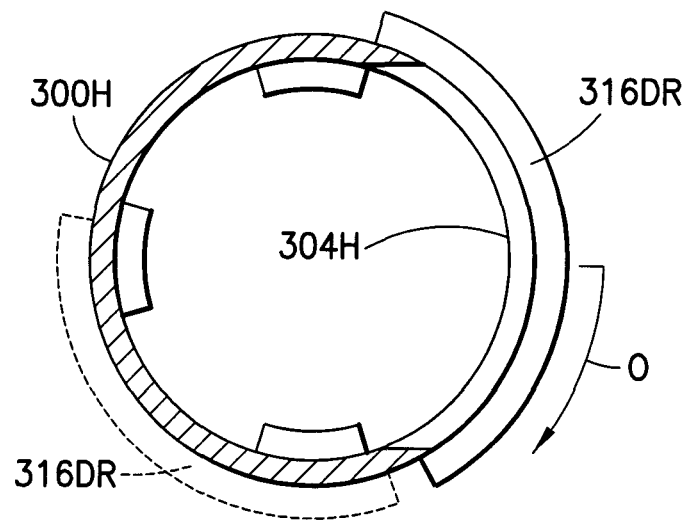
Figure 18:
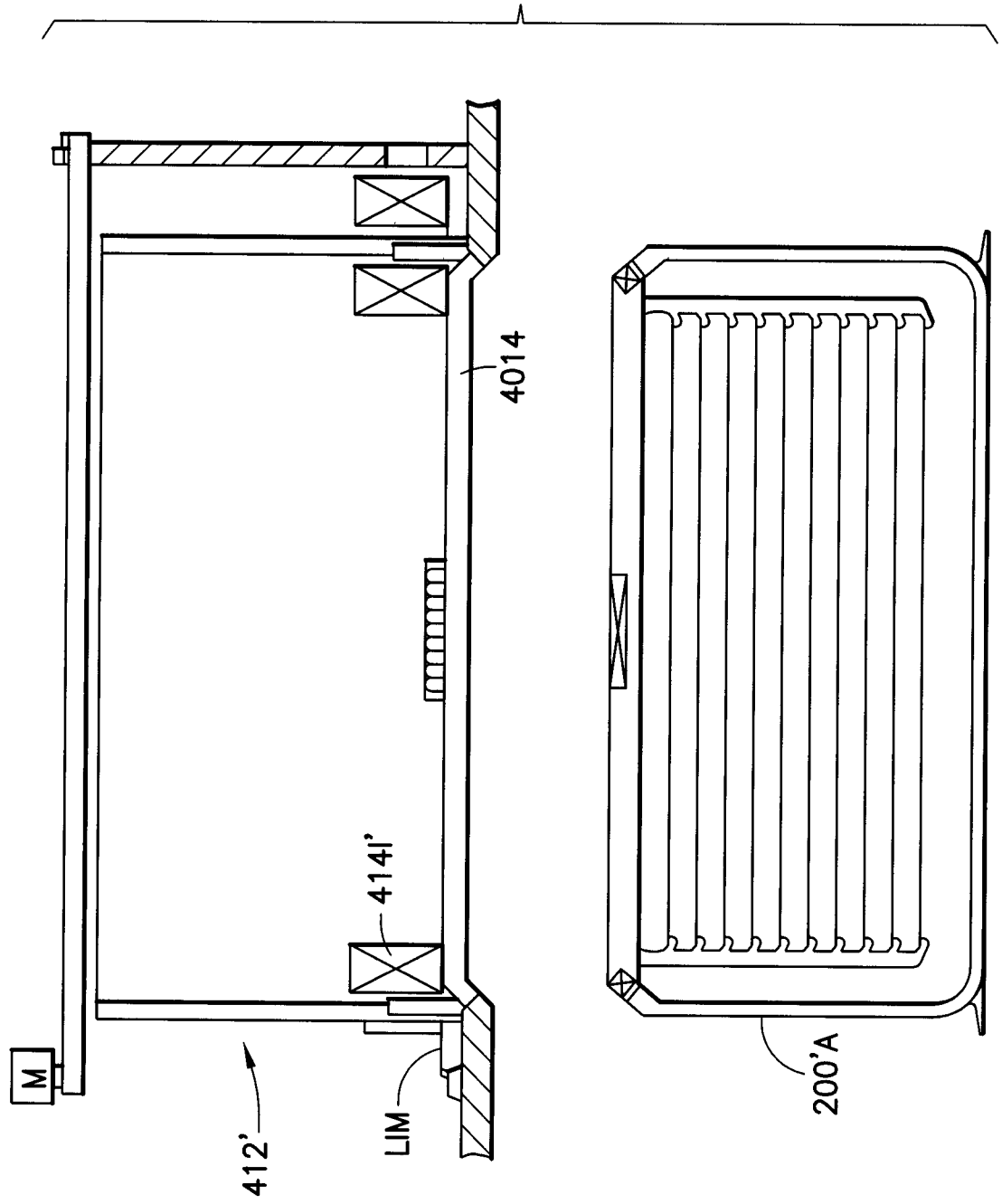
FIGS. 18-19 are schematic elevation views of a tool interface and carrier in accordance with another exemplary embodiment.
Figure 19:
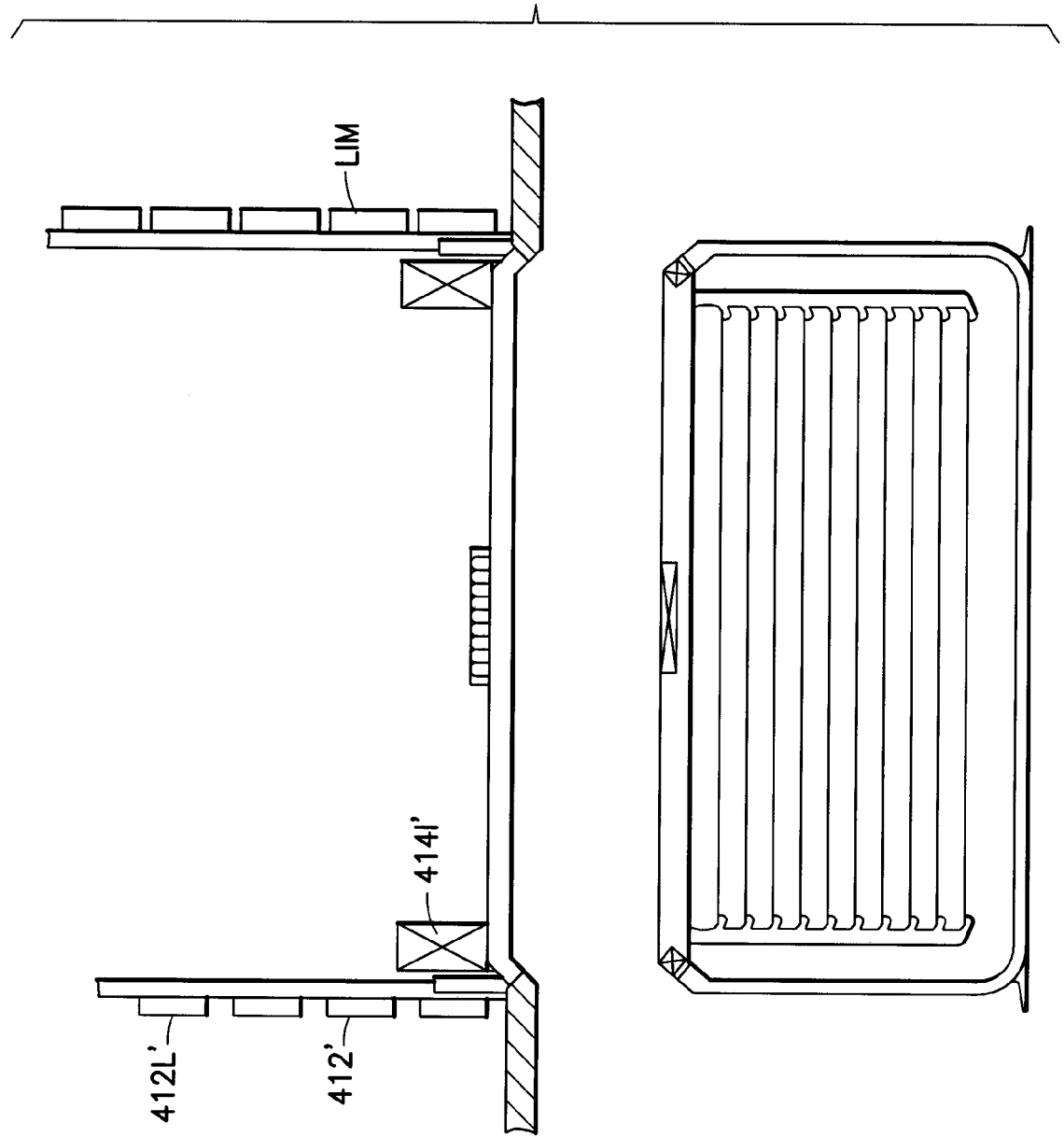

FIGS. 16A-16B show a carrier 300G and load lock chamber 6400G respectively in docked and undocked positions in accordance with another exemplary embodiment. Carrier 300G has a bottom wall 316G, annular section 314G and a top wall 314PD. In this embodiment the annular section 314G or one or more portions thereof may operate as a carrier door. The top and bottom walls 316G, 314PD may be fixed together and the movable section 314G, defining the door, may have seals 350G, 321G both top and bottom for respectively sealing to the top and bottom walls 316G, 314PD. Load lock chamber 6400G may have an open port 6402G through which the carrier 300G may be nested into the load lock chamber as seen in FIG. 16B. The load lock chamber 6400G may have a recess 6470G for lowering the carrier door 314G to open access to the carrier. The top wall 314PD of the carrier may seal against the load lock chamber port thereby sealing the load lock chamber and allowing pump down of the chamber. A suitable elevator may be provided to raise/lower the carrier door 314G. FIGS. 17-17C, show another top sealing carrier 300H and load lock chamber 6400H in accordance with another exemplary embodiment. The carrier 300H may have a top sealing flange 314H and side opening 304H (along a carrier edge for loading/unloading of workpieces). In the exemplary embodiment, the carrier top sealing flange 314H seats and seals against the rim 6412H of the chamber port as shown best in FIG. 17B. The carrier door 314DR may be opened by radial outward and rotational motion indicated by arrow 0 in FIG. 17C. The carrier opening is aligned with a slot valve in the load lock chamber. Although the exemplary embodiments have been described with specific reference to a load lock chamber, the features described are equally applicable to a load port chamber such as shown in FIG. 18. The interior of the load port chamber may have a controlled atmosphere, but may not be isolatable.

Referring to FIGS. 29A and 29B, there is shown a schematic plan view of an automated material handling system 10, 10' in accordance with another exemplary embodiment. The automated material handling system 10, 10' shown for example, in FIGS. 29A and 29B generally includes one or more intrabay transport system section(s) 15, one or more interbay transport system section(s) 20, bay queue sections 35, transport sidings or shunt sections 25 and workpiece carriers or transports. The terms intrabay and interbay are used for convenience and do not limit the arrangement of the transport system 10110' (as used herein inter generally refers to a section extending across a number of groups, and intra refers generally to a section extending for example within a group). The transport system sections 15, 20, 25, 35 may be nested together (i.e. one transport loop within another transport loop) and are generally arranged to allow the high-speed transfer of semiconductor workpieces, such as for example, 200 mm wafer, 300 mm wafers, flat display panels and similar such items, and/or their carriers to and from, for example, processing bays 45 and associated processing tools 30 in the processing facility. In alternate embodiments, any suitable material may be conveyed in the automated material handling system. The transport system 10 may also allow for the redirection of workpieces from one transport section to any another transport section. An example of an automated material handling system for transporting workpieces having interbay and intrabay branches can be found in U.S. patent application entitled "Automated Material Handling System" having Ser. No. 10/697,528 previously incorporated herein by reference in its entirety.

The configurations of the automated material handling system 10, 10' shown in FIGS. 29A and 29B are representative configurations, and the automated material handling system 10, 10' may be disposed in any suitable configuration to accommodate any desired layout of processing bays and/or processing tools in a processing facility. As can be seen in FIG. 29A, in the exemplary embodiment the interbay transport sections 15 may be located on one or more side(s) of and connected to each other by any number of transport sections 20, corresponding for example to one or more processing bay(s) 45. In alternate embodiments the outer or side transport sections may be intrabay sections, and the sections traversing in between may be linking the intrabay sections to groups or arrays of processing tools within a bay. The interbay transport sections 15 of FIG. 29A, in the exemplary embodiment, may also be connected by a cross-shunt 50 that allows the movement of a workpiece transport directly between interbay transport sections 15 without passing through a processing or fab bay 45. In yet other alternate embodiments, the transport sections 15 may be connected to each other by additional intrabay transport sections (not shown). In other exemplary embodiment(s), such as shown in FIG. 29B, the interbay transport section 15 may be located between any number of processing bays 45, hence forming for example a generally center isle or a transport central artery between the branch sections serving bays or tool groups 45. In other alternate embodiments, the intrabay transport section may form a perimeter around and enclose any number of processing bays 45. In yet other alternate embodiments, there may be any number of nested loop sections such as for example N number of systems, such as system 10 or 10' as shown in FIGS. 29A and 29B, connected generally in parallel by transport sections that directly connect each of the interbay transport sections 15. In still other alternate embodiments, the transport sections 15, 20 and processing tools may have any suitable configuration. In addition, any number of intrabay/interbay systems may be joined together in any suitable configuration to form nested processing arrays.

The interbay transport section 15, for example may be a modular track system that provides for the movement of any suitable workpiece transport. Each module of the track system may be provided with a suitable mating means (e.g. interlocking facets, mechanical fasteners) allowing the modules to be joined together end to end during installation of the interbay transport sections 15. The rail modules may be provided in any suitable length, such a few feet, or in any suitable shape, such as straight or curved, for ease of handling during installation and configuration flexibility. The track system may support the workpiece transport from beneath or in alternate embodiments, the track system may be a suspended track system. The track system may have roller bearings or any other suitable bearing surface so that the workpiece transports can move along the tracks without substantial resistance over the rollers. The roller bearing may be tapered or the tracks may be angled towards the inside of a curve or corner in the track to provide additional directional stability when the workpiece container is moving along the track.

The intrabay transport sections 20 may be a conveyor based transport system, a cable and pulley or chain and sprocket based transport system, a wheel driven system or a magnetic induction based transport system. The motor used to drive the transport system may be any suitable linear motor with an unlimited travel capable of moving workpiece containers along the intrabay transport sections 20. The linear motor may be a solid state motor without moving parts. For example, the linear motor may be a brushed or brushless AC or DC motor, a linear induction motor, or a linear stepper motor. The linear motor may be incorporated into the intrabay transport sections 20 or into workpiece transports or containers themselves. In alternate embodiments, any suitable drive means may be incorporated to drive the workpiece transports through the intrabay transport system. In yet other alternate embodiments, the intrabay transport system may be a pathway for trackless wheeled autonomous transport vehicles.

As will be described below, the intrabay transport sections 20 generally allow for uninterrupted high-speed movement or flow of the workpiece transports along the path of the intrabay transport sections 20 through the use of queue sections and shunts. This is highly advantageous compared to conventional transport systems that have to stop the flow of material when a transport container is added or removed from a transport line.

As noted before, in the exemplary embodiment, the intrabay transport sections 20 may define processing or fab bays 45 and may be connected to the interbay transport section(s) 15 through queue sections 35. The queue sections 35 may be located for example on either side of the interbay or intrabay transport sections 15, 20 and allow a workpiece or workpiece container to enter/exit the intrabay transport sections 20 without stopping or slowing down the flow of material along either the interbay transport sections 15 or the flow of material along the intrabay transport sections 20. In the exemplary embodiment, the queue section 35 are schematically shown as discrete sections from transport sections 15, 20. In alternate embodiments the queue section, or the queue paths between transport sections 15, 20 may be formed integral to the transport sections but defining discrete queue transport paths between transport sections. In alternate embodiments the queues may be positioned on the interbay and intrabay sections as desired. An example of a transportation system having a travel lane and an access or queue lane, allowing selectable access on and off the travel lane without impairment of the travel lane, is described in U.S. patent application entitled "Transportation System" with Ser. No. 11/211,236 previously incorporated herein by reference in its entirety. The intrabay transport sections 20 and the queue sections 35 may have track systems that are substantially similar to that described above for the interbay transport sections 15. In alternate embodiments, the intrabay transport sections and the queue sections tying intra and inter transport sections may have any suitable configuration, shape or form and may be driven in any suitable manner. As can best be seen in FIG. 29A, in the exemplary embodiment the queue sections 35 may have an input section 35A and an output section 35B that correspond to the direction of movement R1, R2 of the intrabay and interbay transport sections 20, 15. The convention used herein for example purposes defines section 35A as input to section 20 (exit from section 15) and section 35B as exit/output from section 20 (input to section 15). In alternate embodiments the travel direction of the queue sections may be established as desired. As will be described below in greater detail, workpiece containers may exit the interbay transport sections 15 via the input section 35A and enter the interbay transport sections 15 via the output section 35B. The queue sections 35 may be of any suitable length to allow for the exiting or entering of the workpiece transports on and off the transport sections 15, 20.

The intrabay transport sections 20 may extend within corridors or passages connecting any number of process tools 30 to the transport system 10, 10'. The intrabay transport sections 20 may also connect two or more interbay transport sections 15 to each other as shown in FIG. 29A and as described above. The intrabay transport sections 20 are shown in FIGS. 29A and 29B as having an closed loop shape however, in alternate embodiments they may have any suitable configuration or shape and may be adaptable to any fabrication facility layout. In the exemplary embodiment, the intrabay transport sections 20 may be connected to the process tool(s) 30 through a transport siding or shunt 25, which may be similar to the queue section 35. In alternate embodiments, shunts may be provided on the interbay transport sections in a similar manner. The shunts 25 effectively take the workpiece transports "off line" and have for example input sections 25A and output sections 25B corresponding to the direction of travel R2 of the interbay transport sections 20 as can be seen in FIG. 29A. The shunts 25 allow the workpiece transports to exit and enter the intrabay transport sections 20, through the input and output sections 25A, 25B, substantially without interrupting the substantially constant velocity flow of workpiece transports on the intrabay transport sections 20. While in the shunt 25, the workpiece container may, for example, stop at a tool interface station that corresponds to the location of the process tool station 30, so that the workpieces and/or the container itself may be transferred into the process tool load port or any other suitable workpiece staging area by or through any suitable transfer means, such as for example, an equipment front end module, sorter or any other suitable transfer robot. In alternate embodiments, workpiece transports may be directed to desired shunts to effect reorder (e.g. reshuffling) of the transports on the given transport section.

The switching of the workpiece carriers or transports from and between the different sections 15, 20, 25, 35 may be controlled by a guidance system (not shown) connected to a controller (not shown). The guidance system may include positioning devices allowing for position determination of the transports moving along the sections 15, 20, 25, 35. The positioning devices may be of any suitable type such as continuous or distributed devices, such as optical, magnetic, bar code or fiducial strips, that extend along and across the sections 15, 20, 25, 35. The distributed devices may be read or otherwise interrogated by a suitable reading device located on the transport to allow the controller to establish the position of the transport on the section 15, 20, 25, 35 as well as the kinematic state of the transport. Alternatively, the devices may sense and/or interrogate a sensory item, such as a RFID (rapid frequency identification device), on the transport, workpiece carrier or workpiece, to identify position/kinematics. The positioning devices may also include, alone or in combination with the distributed devices, discrete positioning devices (e.g. laser ranging device, ultrasonic ranging device, or internal positioning system akin to internal GPS, or internal reverse GPS) able to sense the position of the moving transport. The controller may combine information from the guidance system with the position feed back information from the transport to establish and maintain the transport paths of the transport along and between the sections 15, 20, 25, 35.

In alternate embodiments, guidance system may include or have grooves, rails, tracks or any other suitable structure forming structural or mechanical guide surface to cooperate with mechanical guidance features on the workpiece transports. In still other alternate embodiments, the sections 15, 20, 25, 35 may also include electrical lines, such as a printed strip or conductor providing electronic guidance for the workpiece transports (e.g. electrical lines sending a suitable electromagnetic signal that is detected by a suitable guidance system on the transports).

Still referring to FIGS. 29A and 29B, an exemplary operation of the transport system 10, 10' will now be described. A workpiece container, located for example in a shunt 25 may enter the transport system 10, 10'. To maintain the flow of the intrabay transport section 20 substantially uninterrupted and moving at a generally constant velocity, the workpiece container may access the interbay transport section 20 via shunt 25. The workpiece transport accelerates within the shunt 25 so that the transport is traveling the same speed as the flow of material in the intrabay transport section 20. The shunt 25 allows the workpiece transport to accelerate, and hence the transport may merge into the flow of the intrabay transport section 20 without hindering that flow or colliding with any other transports traveling in the interbay transport section 20. In merging with the intrabay transport section 20, the workpiece transport may wait in the shunt 25 for suitable headway so that it may enter the flow of the intrabay transport section freely, without colliding with any other workpiece carriers or transports or causing reduction in velocity of transports traversing the intrabay section. The workpiece transport continues, for example, along the intrabay transport section 20 at a substantially constant speed and switches, with the right-of-way, onto the output queue area or section 35B for example to switch an interbay section 15. In one embodiment, if there is no room within the output queue section 35B, the transport may continue to travel around the intrabay transport section 20 until the output queue section 35B becomes available. In alternate embodiments, cross shunts may be provided connecting opposing travel paths of the transport section, allowing transports to switch between transport paths to, for example, return to a bypassed station without traveling the whole loop of the transport section. The transport may wait in the bay output queue section 35B for suitable headway, then accelerate and merge into the generally continuous constant velocity flow of the interbay transport section 15 in a manner substantially similar to the merge described above for the intrabay transport section 20. The transport may for example continue at a generally continuous speed along the interbay transport section 15 to a predetermined bay and is switched onto the associated queue input section 35A for entry to desired intrabay section 20. In one embodiment, if there is no room within the input queue section 35A, the transport may continue to travel around the intrabay transport section 15 until the input queue section 35A becomes available in a manner similar to that described previously. The transport may wait in the input queue section 35A for suitable headway and accelerate to merge onto a second intrabay transport section 20, the second intrabay transport section 20 again having a continuous constant velocity flow. The transport is switched off of the second intrabay transport section 20 and onto the transport shunt 25 where the transport interfaces with the process tool 30. If there is no room in the shunt 25 for the transport, due to other transports in the shunt 25, the transport continues to travel along the intrabay transport section 20, with the right-of-way, until the shunt 25 becomes available. Because the flow of material in the interbay transport sections 15 and the intrabay transport sections 20 is substantially uninterrupted and travels at a generally constant velocity, the system can maintain a high throughput of workpiece transports between processing bays and processing tools.

In the exemplary embodiment shown in FIG. 29A, the transport may travel directly between processing bays via an extension 40 that may directly connect the queue sections 35, processing tools, intrabay transport sections 20 or interbay transport sections 15 together. For example, as shown in FIGS. 29A and 29B, extensions 40 connect the queue sections 35 together. In alternate embodiments, the extensions 40 may provide access from one processing tool to another processing tool by connecting the transport shunts, similar to shunts 25, of each of the tools together. In yet other alternate embodiments, the extensions may directly connect any number or any combination of elements of the automated material handling system together to provide a short access route. In larger nested networks, the shorter path between destinations of the transport created by the extensions 40 may cut down traveling time of the transports and further increase productivity of the system.

In still other alternate embodiments the flow of the automated material handling system 10, 10' may be bi-directional. The transport sections 15, 20, 25, 35, 40, 50 may have side by side parallel lanes of travel each moving in opposite directions with exit ramps and on ramps looping around and connecting the opposite lanes of travel. Each of the parallel lanes of the transport sections may be dedicated to a given direction of travel and may be switched individually or simultaneously so that the travel for each of the respective parallel lanes is reversed according to a transport algorithm to suit transport loading conditions. For example, the flow of material or transports along the parallel lanes of a transport section 15, 20, 25, 35, 40, 50 may be flowing in its respective direction. However, if at a later time it is anticipated that some number of workpiece transports are situated in the facility and are going to a location where it would be more efficient to move along one of those parallel lanes in a direction opposite the current flow direction, then the travel directions of the parallel lanes may be reversed.

In alternate embodiments, the bi-directional lanes of travel may be located in stacks (i.e. one above the other). The interface between the process tool and the transport shunts 25 may have an elevator type configuration to raise or lower a transport from a shunt to the process tool load port, for example, such as where a shunt having a clockwise flow of material is located above a shunt with a counterclockwise flow of material. In alternate embodiments, the bi-directional shunts and other transport sections may have any suitable configuration.

Figure 20:
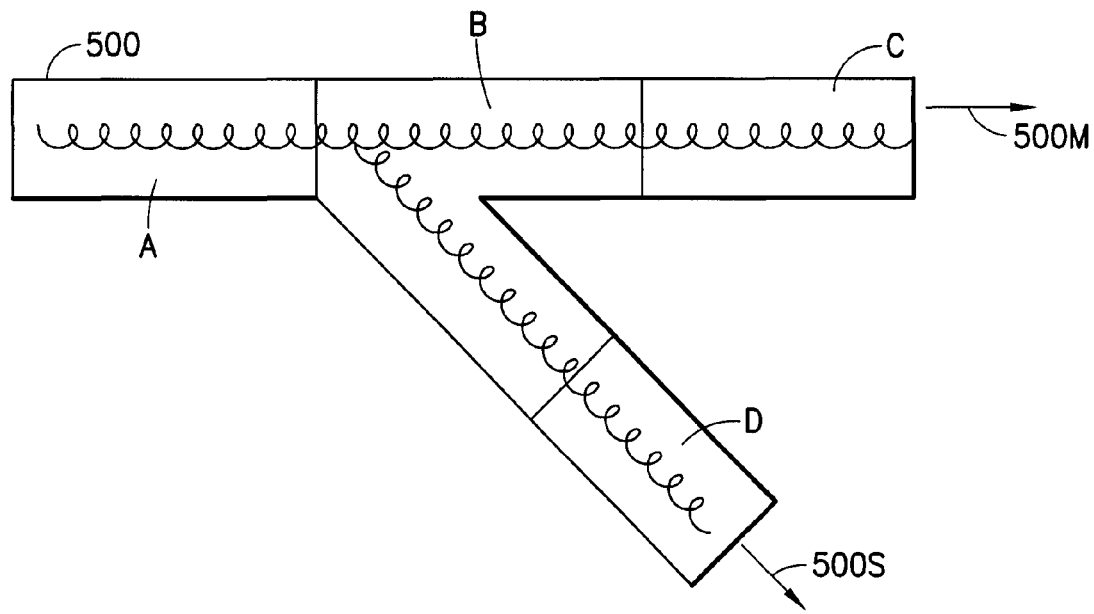
FIG. 20 is a schematic plan view of a transport system in accordance with another exemplary embodiment.
Figure 20C:
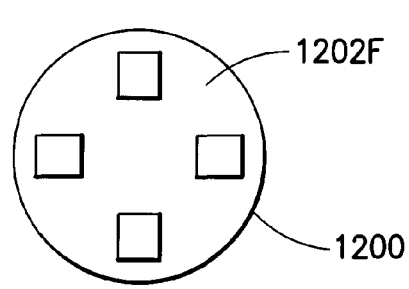
FIGS. 20C-20D are schematic bottom views of a different payloads of the transport system in accordance with other exemplary embodiments.
Figure 20D:
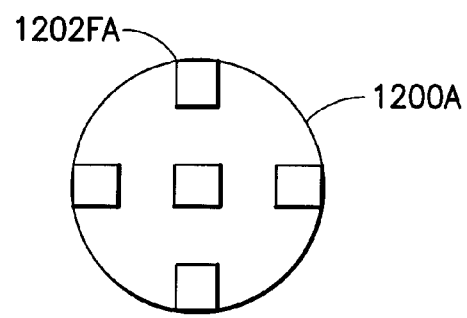
Figure 20A:
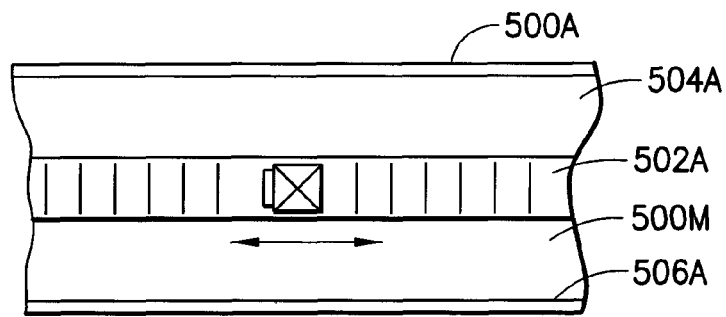
FIGS. 20A-20B are schematic partial plan views of portions of the transport system track in FIG. 10.

FIG. 20 shows a portion of a transport system track 500 of a transport system, for transporting carriers between tool stations in accordance with another exemplary embodiment. The track may have a solid state conveyor system, similar to that described in U.S. patent application Ser. No. 10/697,528 previously incorporated by reference. The track may have stationary forcer segments cooperating with reactive portion integral to the carrier shell/casing. The carrier may thus be transported directly by the conveyor. The transport system 500 shown in an asynchronous transport system in which transport of carriers is substantially decoupled from the actions of other carriers on the transport system. The track system is configured to eliminate determining factors affecting transport rate of a given carrier due to actions of other carriers. Conveyor track 500 employs main transport paths with on/off branching paths (see also FIGS. 297-298) that routes a carrier away from the main transport path to effect routing changes and/or interface with tool stations (buffer, stocker, etc.) without impairing transport on main transport path. Suitable example of transport system with branching on/off paths is disclosed in U.S. patent application Ser. No. 11/211,236 previously incorporated by reference. In this embodiment segments 500A, C, D may have winding sets for A1-D linear motor causing movement along the main travel path 500M (this is shown in FIG. 20A). Segment 500B is illustrated for example in FIG. 20 as an off/exit to what may be referred to as access path 500S. The windings of the forcer in this segment be arranged to provide in effect a 2-D planar motor to allow both motion along main path 500M and when desired effect movement of the carrier(s) along path 500S (see FIG. 20B). The motor controller may be a zoned controller similar to the distributed control architecture described in U.S. patent application Ser. No. 11/178,615, filed Jul. 11, 2005 incorporated by reference herein in its entirety. In this embodiment, the drives/motors may be zoned, efficiently controlled by zone controllers with appropriate hand off between zones. The conveyor 500 may have suitable bearings to movably support carrier. For example, in segments 500A, 500C and 500D, bearings (e.g. roller, ball may allow 1 degree of freedom movement of the carrier along path 500M).

Figure 20B:
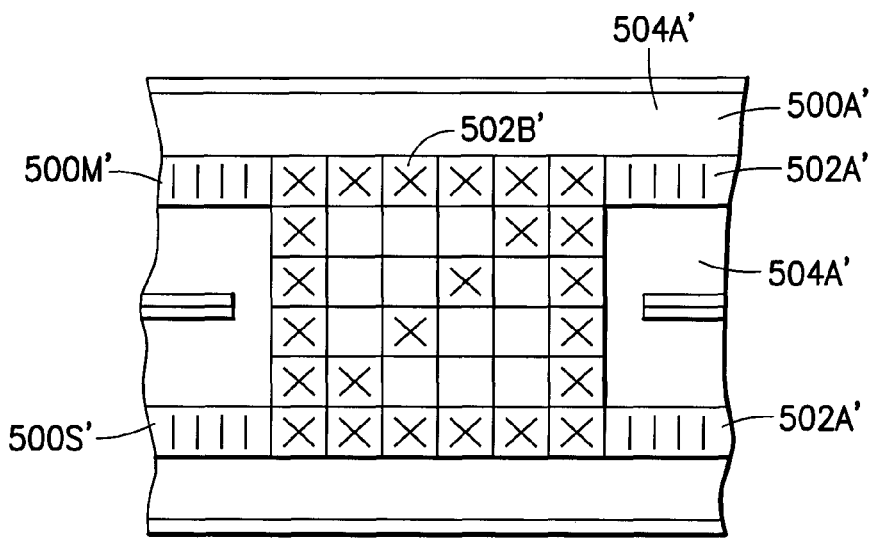

Bearings in segment 500B may allow 2-degree of freedom movement of the carrier. In other embodiments, bearings may be provided on the carrier. In still other embodiments air bearings may be used to movably support the carrier on the track. Guidance of the carriers between path 500M and direction onto path 500S may be effected by suitable guide system such as steerable or articulated wheels on the carrier, articulated guide rails on the track, or magnetic steerage as shown in FIG. 20B.

FIG. 20A illustrates an exemplary transport element 500A of system 500. The exemplary embodiment shown illustrates a segment with single travel lane or path (e.g. path 500M). As seen in FIG. 20A, in the exemplary embodiment the segment has linear motor portion or forcer 502A and support surface(s) 504(A) for motive supports on the transport. As noted before, in alternate embodiments the transport segment may have any other desired configuration. In the exemplary embodiment, guide rails 506A may be used to guide the transport. In alternate embodiments, the transport segment may have magnets or magnetic bearings in lieu of rails for transport guidance. An electromagnet on the carrier may be used to assist decoupling the carrier from the track. FIG. 20B illustrated another transport segment of the transport system 500 in accordance with another exemplary embodiment. Segment 500A' may have multiple travel lanes (for example intersecting lanes similar to segment 500B shown in FIG. 20) or substantially parallel main travel lanes (similar to paths 500M) with switching therebetween. As seen in FIG. 20B, in the exemplary embodiment, the travel lanes (similar to paths 500M, 500S) are generally defined by the 1-D motor sections 502A1 and corresponding carrier motive support surfaces/areas 504A'. The intersection or switch between the travel lanes is formed by an array of 2-D motor elements capable of generating desired 2-D forces on the transport to effect traverse between travel lanes 500M', 500S'.

Figure 21:
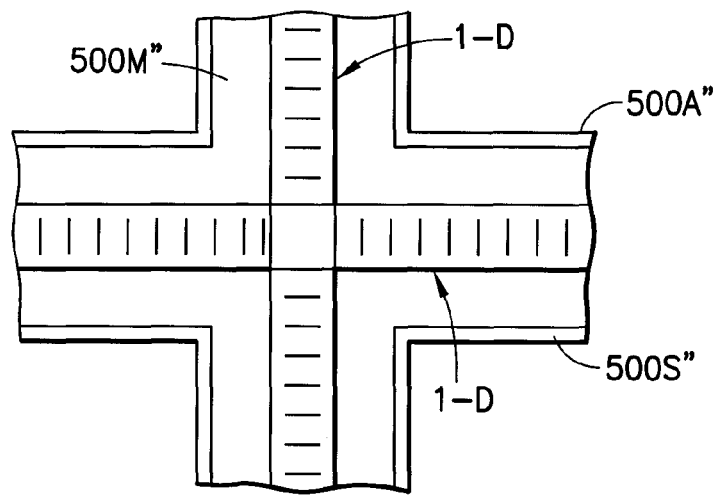
FIG. 21 is a schematic partial plan view of another portion of the transport system in accordance with another exemplary embodiment.
Figure 22:
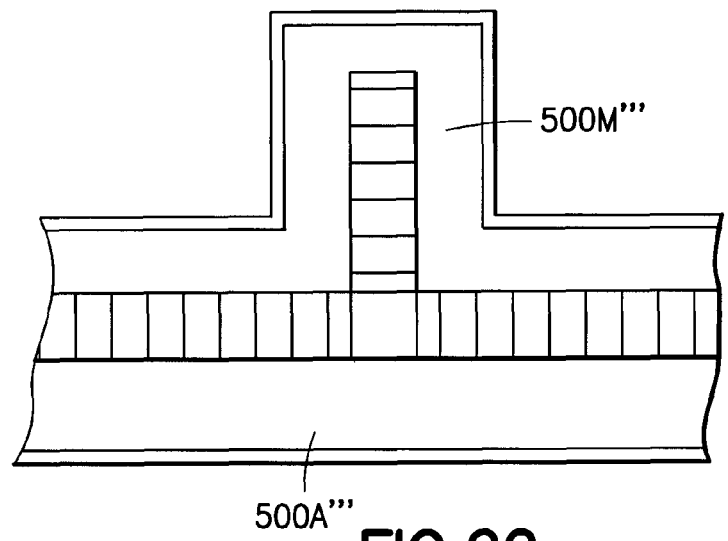
FIGS. 22-24 are other schematic partial plan views of portions of the transport system in accordance with other exemplary embodiments.
Figure 23:
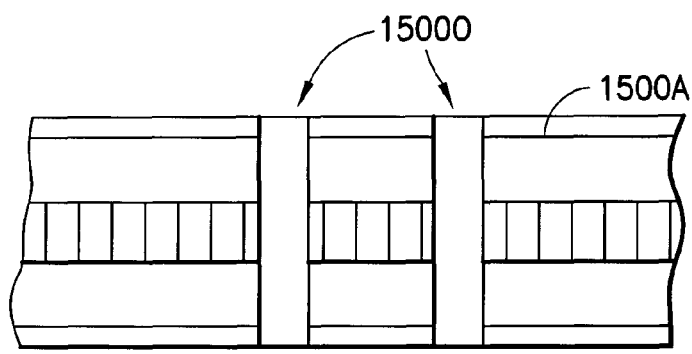
Figure 23A:
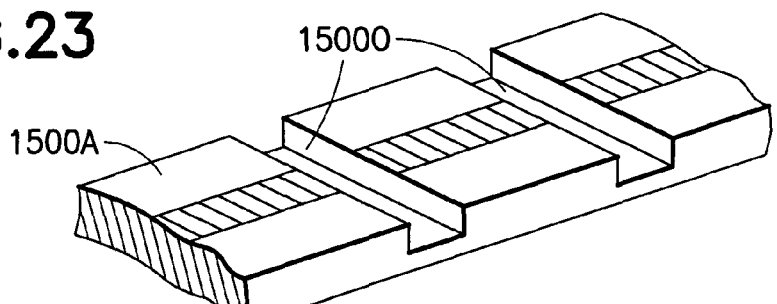
Figure 24:
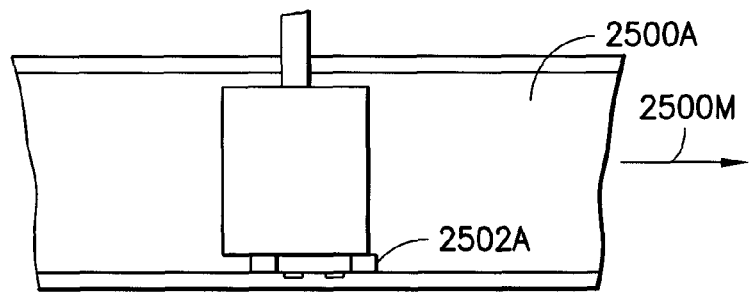

FIG. 21 shows an intersection, or turn segment of the conveyor transport system in accordance with another exemplary embodiment. In the exemplary embodiment shown, the transport segment 500A" defines multiple travel lanes 500M", 500S" that intersect. The travel lanes are generally similar to lane 500M (see FIG. 20A). In the exemplary embodiment, the transport vehicle may traverse a given lane 500S", 500M" until generally aligned with the intersecting lane. When aligned, the 1-D motor of the desired lane commences to move the transport along the intersecting lane. In alternate embodiments, the intersection may not be oriented at 90° FIG. 20C shows the bottom of the carrier 1200 and the reactive elements therein. As may be realized the reactive elements may be arranged to coincide with the orientation of the respective forcer sections at the intersection (see for example FIG. 21). This allows the carrier to change tracks at the intersection substantially without stoppage. FIG. 20D shows the reactive elements 1202FA positioned on a pivotal section of a carrier 1200A that may be rotated to desired position in accordance with another exemplary embodiment. FIG. 22 shows a track segment 500H''' with a beside track storage location 500S''', generally similar to the intersection shown in FIG. 21. FIGS. 23-23A show track segments 500, with cutouts or openings 15000 for lift arms of a carrier lift or shuttle, (not shown) as described further below. In the exemplary embodiment, the openings 15000 allow side access to the carrier for a bottom pick of the carrier from the conveyor track. FIG. 24 shows a track segment 2500A with the forcer (such as a linear motor) 2502A located offset from carrier/track centerline indicated by arrow 2500M.

FIGS. 25A-25B show a linear motor conveyor 3500 (having grounded forcer segments and reaction elements embedded within the carrier 3200) for transporting substrates within a semiconductor FAB. In the exemplary embodiment shown, the conveyor 3500 may be inverted (e.g. carrier is suspended from and is located below conveyor), as shown such that the carrier is accessible from directly below. The conveyor 3500 may otherwise be similar to transport system segments 500A, 500A", 500A''' described previously. In the exemplary embodiment, a magnetic retention forcer 3502 may be employed to maintain the coupling between the conveyor 3500 and carrier 3200. This force may arise from the linear motor coils (e.g. in a linear synchronous design) and/or via separate electromagnets and/or permanent magnets (not shown) provided specifically for that purpose. Coupling and decoupling of the carrier to the conveyor is rapid and may be achieved without moving parts (e.g., an electro-magnetic switch). Failsafe operation may be assured via flux path and/or passive mechanical retention features between carrier and conveyor.

In the exemplary embodiment intersections and branch points (i.e., merge-diverge locations similar for example to segment 500B in FIG. 20) may be achieved with coil switching. In alternate embodiments, turntables or other routing devices, may be used to transfer carriers between travel paths of the conveyor 3200.

In the exemplary embodiment the carrier 3200 may be arranged such that the reaction elements are on the top, and the substrates are accessed from the bottom of the carrier. In the exemplary embodiment, carrier 3200 may have a magnetic platen located to cooperate with the forcer of conveyor 3500. The carrier platen=, or platen section may include rollers, bearing or other motive support surfaces (e.g. reaction surface for air bearings in the conveyor). The platen may also include an electromagnetic coupling allowing the container portion of the carrier to decouple from the platen portion that may remain connected to the conveyor when the workpiece container portion is loaded on a processing tool 3030.

In the exemplary embodiment, to load a tool, the conveyor 3200 positions a carrier at the tool loadport, and for example a dedicated vertical transfer mechanism 3040 may be used (see also FIGS. 26A-26B) to lower the carrier from the conveyor elevation to the (controlled environment) loading interface 3032 of the tool 3030. The vertical transfer device may also be used as an indexer, thereby positioning the wafers for access by a wafer-handling robot. A suitable example of a vertical transfer device is described in U.S. patent application Ser. No. 11/210,918, filed Aug. 25, 2005 and previously incorporated by reference herein.

In alternate embodiments, the conveyor may be a powered-wheel accumulating conveyor positioned in an inverted arrangement and having a suitable magnetic attractive force to hold the carrier on the conveyor wheels. In other alternate embodiments, the general arrangement may be inverted such that the conveyor is below the loadport, the carrier has reaction features on the top.

Figure 26A:
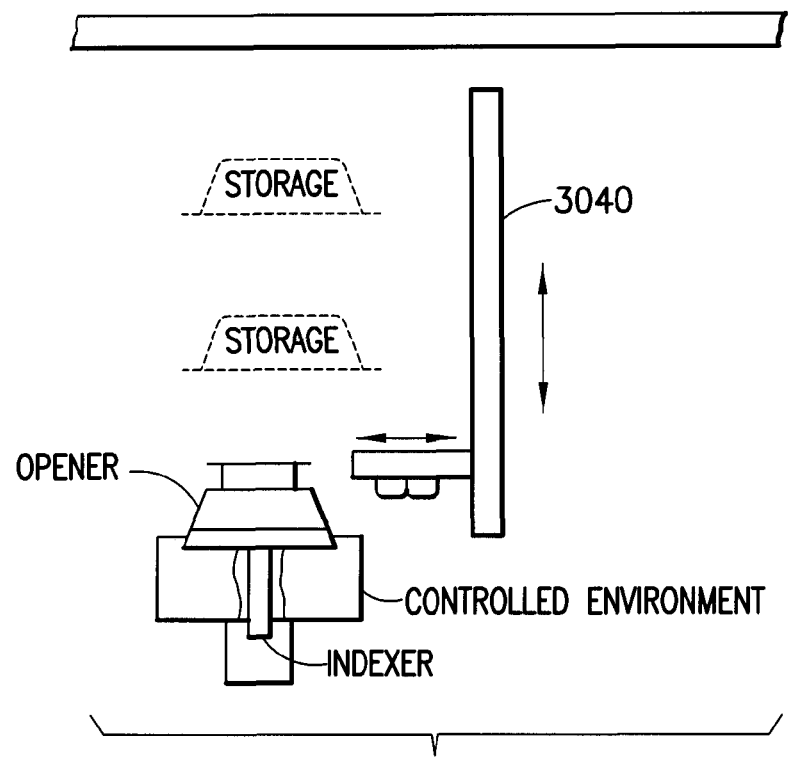
FIGS. 26A-26B respectively show different schematic elevation views of a transfer interface system for transferring carriers between transport system and tool in accordance with another exemplary embodiment.
Figure 26B:
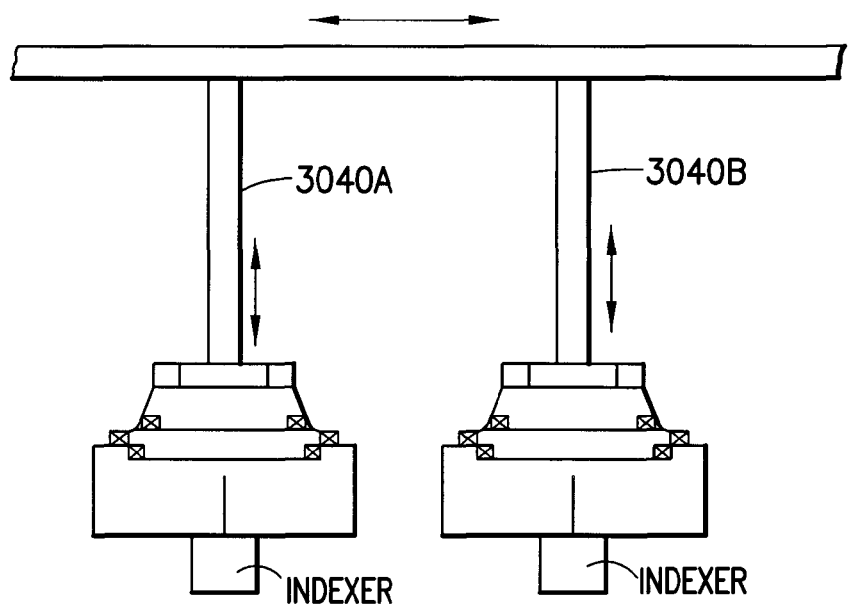

FIGS. 26A-26B show other examples of direct lower/lift carriers from transport system to load port/tool interface. In the exemplary embodiments shown in FIGS. 26A-26B, the carriers may have a reaction platen that may be integral to the carrier. In other embodiments the platen, as noted before, may be detachable from the carrier, for example remaining on/coupled to the conveyor when the carrier is removed. In such a case, each platen in the transport system corresponds in a substantially 1:1 relationship to the carriers in the FAB.

Figure 27:
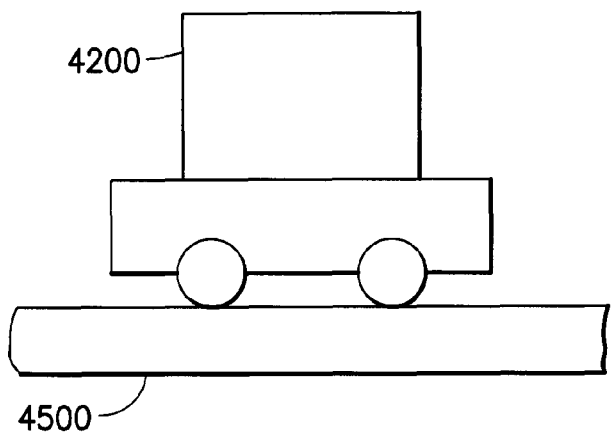
FIG. 27 is a schematic partial elevation view of a transport system in accordance with another exemplary embodiment and FIGS. 27A-27B are other schematic partial elevations of the transport system in different positions.

FIG. 27 illustrates a carrier 4200 having a conveyor vehicle hybrid configuration in accordance with another exemplary embodiment. Carrier vehicle(s) 4200 may be provided for automated conveyance of payloads (such as carriers containing semiconductor substrates). The vehicles may carry stored energy for self-propulsion, a steering system, at least one motor-powered drive wheel, sensors for odometry and obstacle detection, and associated control electronics. In addition the vehicles are outfitted with one or more reaction elements (similar to magnetic platens described before) that can cooperate with stationary linear motor forcer segments of a conveyor 4500, similar to conveyor system 500 (see also FIG. 20).

Figure 27A:
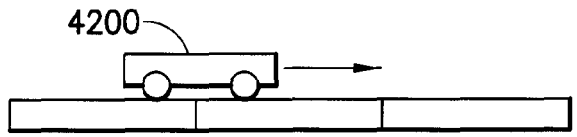
Figure 27B:
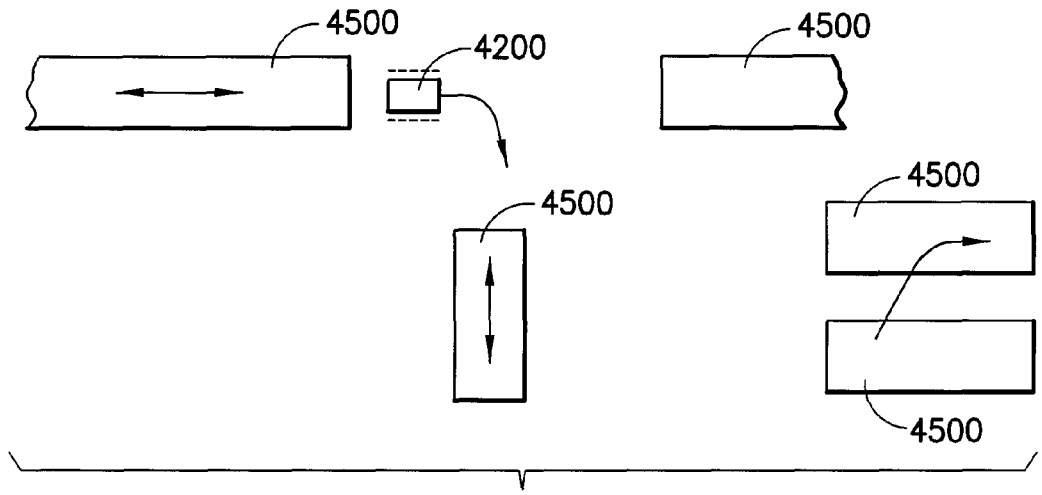

In the exemplary embodiment, when a vehicle(s) 4200 is traveling along the path (similar to paths 500M, 500J) defined by one or more forcer segments, the drive motor may be disconnected from the drive wheel(s), and the vehicle be passively urged along the path via electromagnetic coupling with the reaction elements in the conveyor 4500. If the stored energy device (e.g. batteries, ultracapacitors, flywheel, etc.) within the vehicle needs to recharge, the motion of the traction wheel(s) along the guideway may be used to convert energy from the linear motor to the vehicle storage. In the case of electrical energy storage, this may be accomplished by re-connecting the vehicle drive motor to be used as a generator with suitable monitoring and conditioning electronics. Such "on-the-fly" charging has the benefit of simplicity and ruggedness, and such an arrangement affords significant flexibility and fault tolerance. For example, vehicle(s) 4200 may be capable of driving autonomously past failed conveyor segments, around obstacles or between work areas not serviced by a conveyor (see FIGS. 27A,27B). The number and length of conveyor forcer segments may be tailored to an operating scheme such as a conveyor for interbay transport, and using autonomous vehicle motion with the bay for example. Self-directed steering may be used for flexible route selection. Self-directed cornering could be used to eliminate curved forcer segments. High-speed travel may be effected along conveyor runs and, if desired, separated from operators by safety barriers. Conveyor sections may be used for long runs, such as links to adjacent FABs. Conveyors may be used for grade changes, mitigating the difficulties encountered by vehicles using exclusively stored energy.

Figure 28:
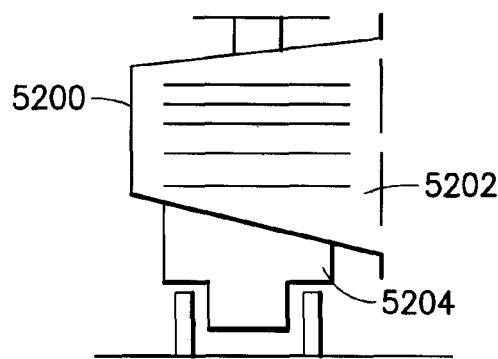
FIG. 28 is another schematic elevation view of a transport system in accordance with another exemplary embodiment.

FIG. 28 shows another example of an integrated carrier and transport vehicle. In contrast to conventional vehicle-based semiconductor automation, in which vehicles are dispatched to transport workpiece carriers, within a FAB, in the exemplary embodiment each carrier 5200 is a vehicle. The integrated carrier/vehicle 5200 in the exemplary embodiment may be similar to vehicle 4200 described before. In alternate embodiments, the carrier vehicle may have any desired vehicle features. In the exemplary embodiment vehicle 5200 may include integral carrier 5202 and vehicle 5204 portions. The carrier 5202 is shown as front/side opening in FIG. 28 for example purposes. In alternate embodiments, the carrier may be top opening or may have any other suitable workpiece transfer opening. The vehicle may drive directly to the loadport where work pieces are to be transferred, or may be engaged by another automation component such as a tool buffer. Substantially permanently fixing the carrier 5202 and vehicle 5204 eliminates the time waiting for a free vehicle to be dispatched when a lot transfer is desired, as well as the associated deliver time variance. Further, the carrier vehicle 5200 eliminates "empty-car" moves and hence may reduce the total traffic on the transport network improving the system capacity. In alternate embodiments, the carrier and vehicle may have a coupling for detaching carrier from vehicle. Though vehicles in the system may be apportioned to carriers in a 1:1 relationship to eliminate delays in carrier transport awaiting for vehicles, system knowledge in a suitable controller may be used to allow separation in limited instances (e.g. repair/maintenance or either vehicle or workpiece carrier sections). Otherwise, the carrier and vehicle remain an integral unit during transport or when engaged to a tool loading station or other automation component of the FAB.

Figure 29C:
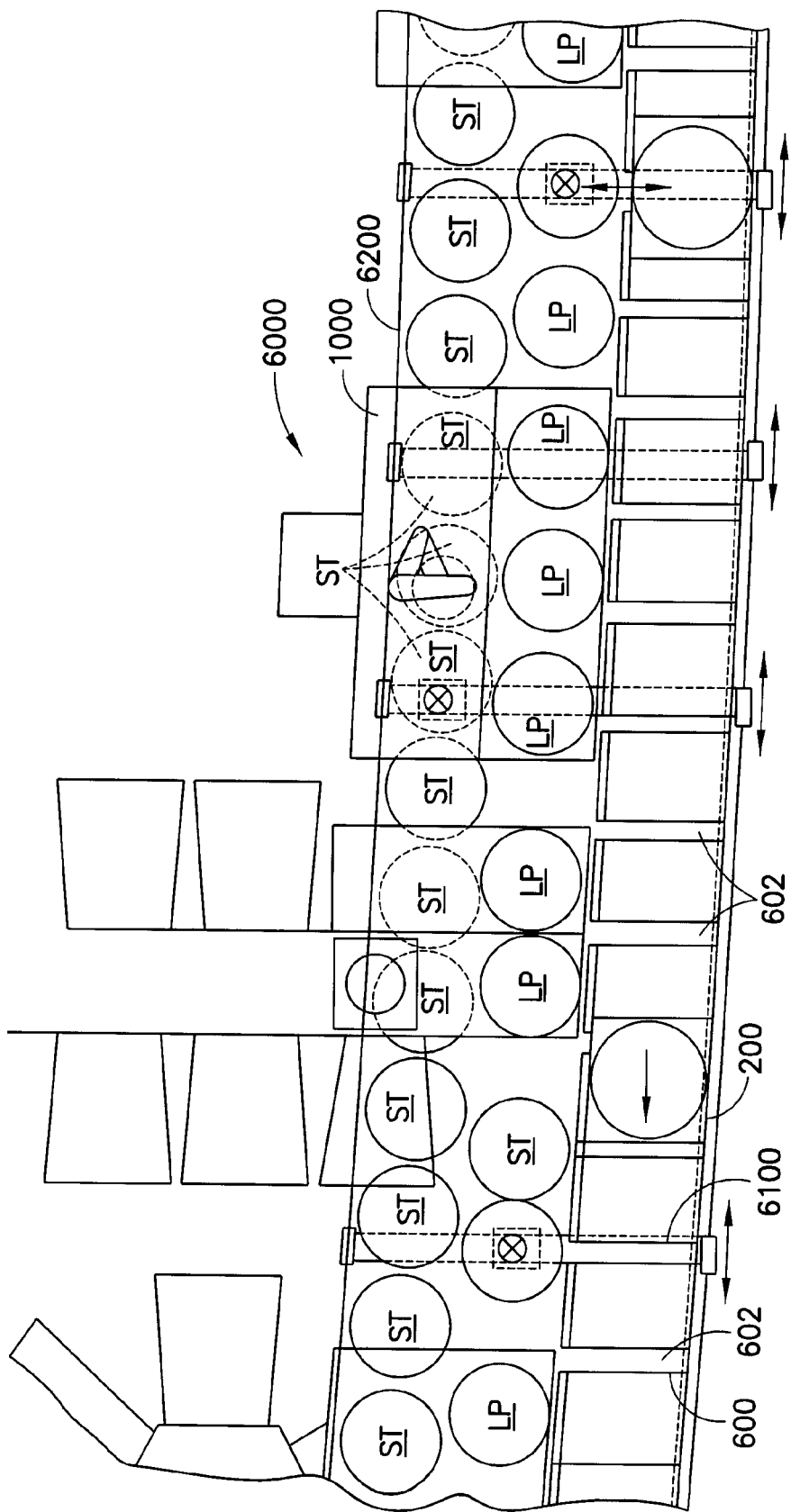
FIG. 29C is a schematic plan view of a transport system and processing tools in accordance with another exemplary embodiment.
Figure 33:
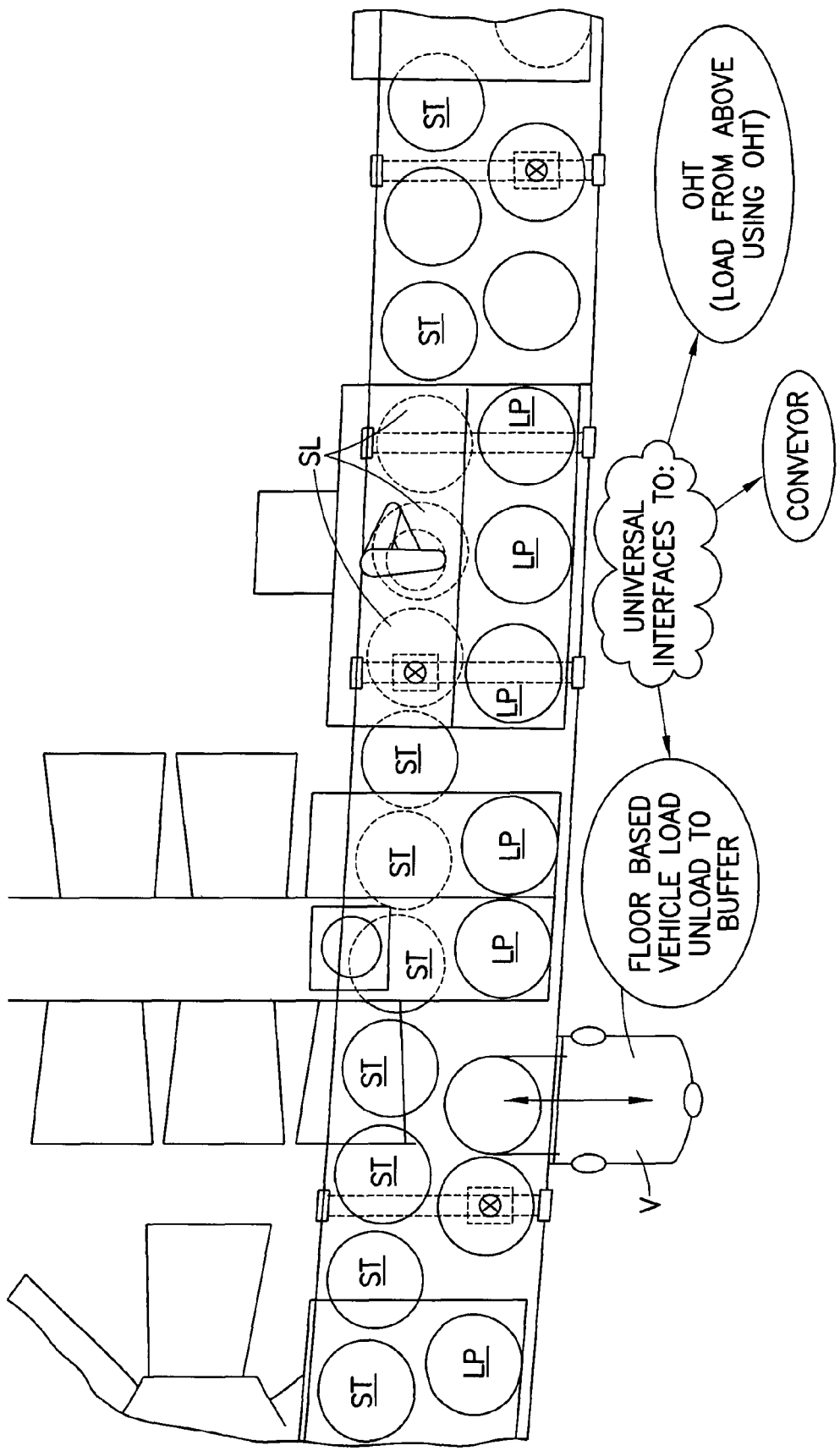
FIGS. 33-34 are respectively schematic plan and elevation views of another transport system in accordance with other exemplary embodiments.
Figure 34:
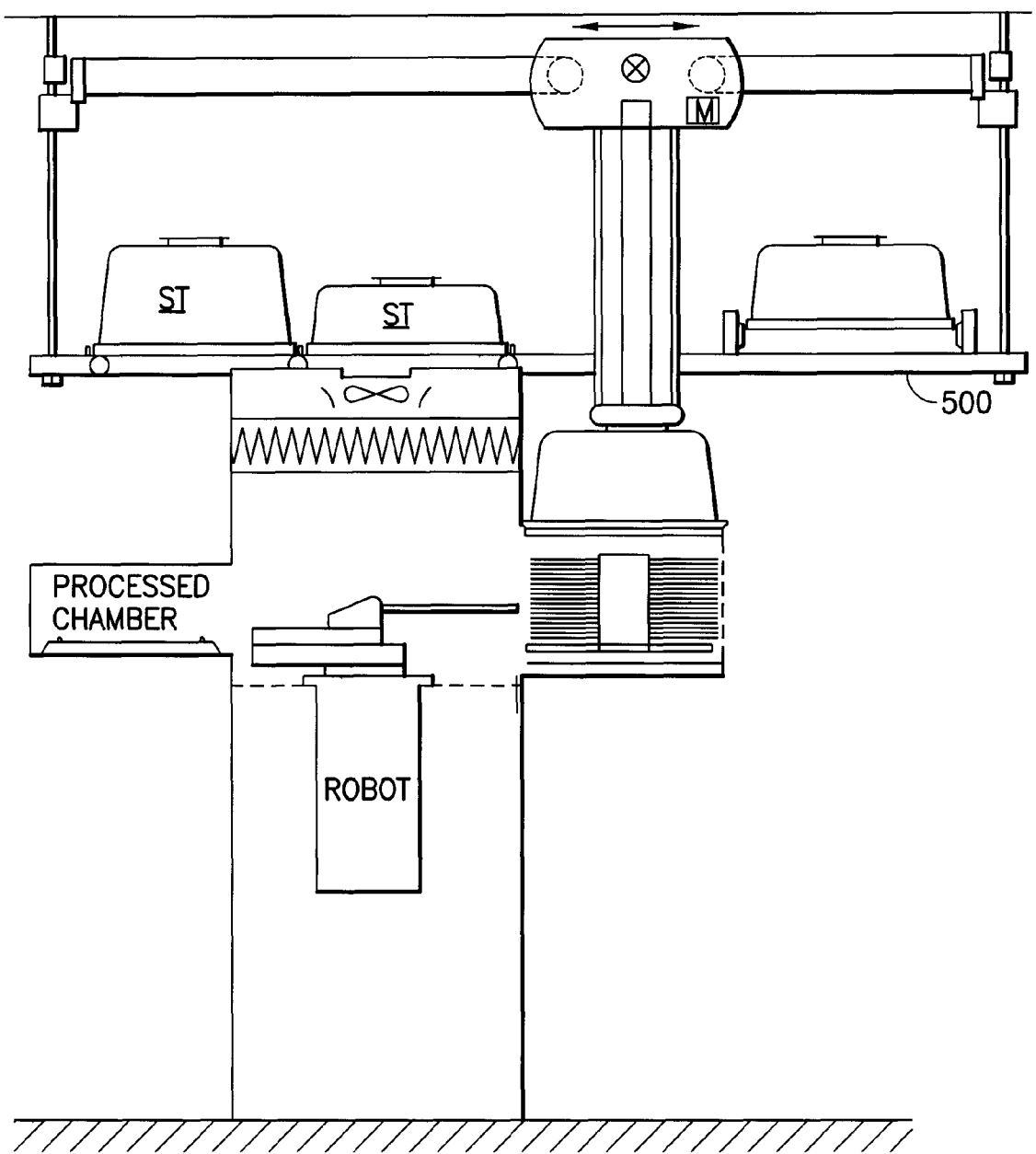

FIG. 29C shows a plan view of a horizontally arrayed buffering system 6000 that may interface between a conveyor system 500 (or any other desired carrier transport system) and tool stations 1000 in accordance with another exemplary embodiment. The buffering system may be located under tool stations or portions thereof or above the tool stations. The buffering system may be positioned away (i.e. below or above) from operator access ways. FIG. 30 is an elevation view of the buffering system. FIGS. 29C-30 show the buffering system located on one side of conveyor 500 for example purposes. The buffering system may be extended to cover as large a portion of the FAB floor as desired. In the exemplary embodiment shown, operator walkways may be elevated above the buffering system. Similarly, the buffering system may be extended anywhere in the FAB overhead. As seen in FIGS. 29C-30, in the exemplary embodiment the buffering system 6000 may include a shuttle system 6100 (which may have suitable carrier lift or indexer) capable of at least 3-D movement and an array of buffer stations ST. The shuttle system may generally include guide system (e.g. rails) 6102 for one or more shuttle(s) 6104 capable of at least 2-D traverse over the guide system. The arrangement of the shuttle system illustrated in FIGS. 29C-30 is merely exemplary and in alternate embodiments the shuttle system may have any other desired arrangement. In the exemplary embodiment, the shuttle system shuttles or interfaces between the conveyor 500, buffer stations ST and tool loading stations LP (see FIG. 29C). The shuttle(s) 6102 are capable of traversing between horizontally disposed conveyor 500 (for example via an access lane 602 between the segments 600 of the conveyor) and buffer storage ST or loading locations LP on the tool stations to shuttle carriers 200 therebetween. As seen best in FIG. 30, in the exemplary embodiment, the shuttle(s) 6104 may include an indexer 6106 for picking/placing the carrier on the conveyor 600, or buffer stations ST or tool loadport LP. The buffering system may be configured in modular form allow the system to be easily expanded or reduced. For example, each module may have corresponding storage location(s) ST and shuttle rails and coupling joints for joining to other installed modules of the buffering system. In alternate embodiments, the system may have buffering station modules (with one or more integral buffering stations) and shuttle rail modules allowing modular installation of the shuttle rails. As seen in FIG. 29C, the access lane(s) 60L of the conveyor 500 may have shuttle access ways allowing the shuttle indexer to access the carrier through the conveyor lane. FIG. 31 shows elevation of a buffering system 6000 communicating with the merge/diverse lane of the conveyor 500. In the exemplary embodiment, the buffering system shuttle 6104 may access carriers directed onto the access lane of the conveyors. Stops (or lack of accessways similar to lanes 602 in FIG. 29C) may limit the shuttle from accessing or interfering with the travel lane of the conveyor. FIG. 32 is yet another elevation showing multiple rows of buffering stations. The buffering system may have any desired number of buffering stations in any desired number of rows. Shuttle traverse (in the direction indicated by arrow Y in FIG. 32) may be adjusted as desired by modular replacement of traverse guide 61087. In other alternate embodiments, the buffering stations may be arrayed in multiple horizontal planes or levels (i.e. two or more levels that may be vertically separated (to allow carrier height pass through between levers). Multilevel buffering may be used with reduced capacity carriers. FIG. 33 shows another plan view of a buffering system with an interface to a guided vehicle carrier V. FIG. 34 shows an elevation view of an overhead buffering system 7000 otherwise similar to the under tool buffering system 6000 described before. The overhead buffering system 7000 may be used in conjunction with the under tool buffering system (similar to system 6000). The overhead buffering system is shown interfacing with an overhead conveyor 500. In alternate embodiments, the overhead system may interface with a floor conveyor system or floor based vehicles. Suitable control interlocks (e.g. hard) may be provided to prevent horizontal traverse of shuttle with lowered payload that may impinge walkway vertical clearances. Top shields over the walkway may be used for preventing suspended loads from crossing through walkway space.

Figure 35:
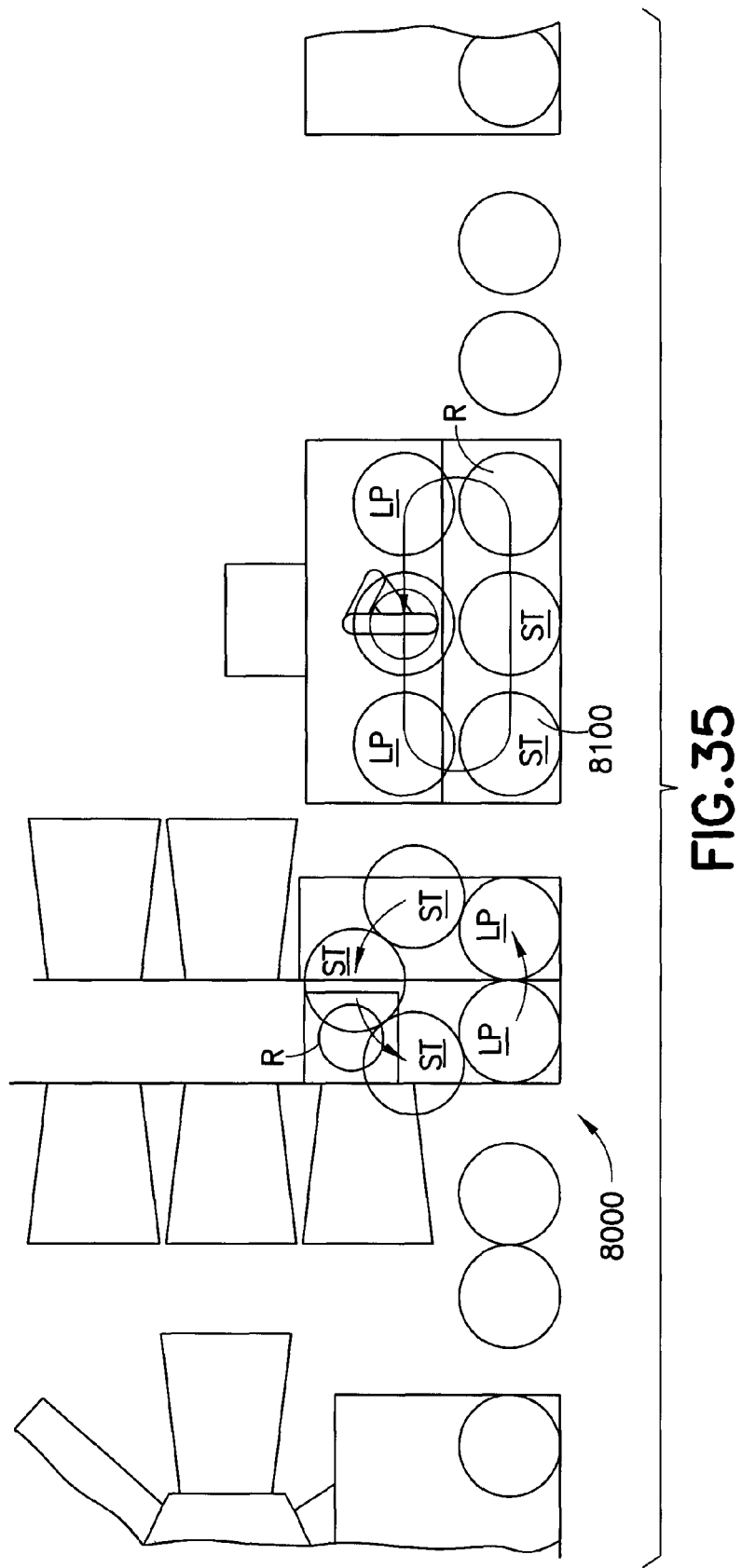
FIG. 35 is yet another schematic plan view of a transport system in accordance with another exemplary embodiment.

FIG. 35 shows a looped buffering system 8000. The buffering stations ST of the system may be movable, mounted on a track 8100 (in the exemplary embodiment shown as being closed looped) that moves the buffer stations ST between loading position(s) R in which carriers may be loaded into the buffer stations ST (for example with overhead loading) and loading station(s) LP of a tool interface. The tool interface may have an indexer for loading the carrier to the tool station.

Figure 36A:
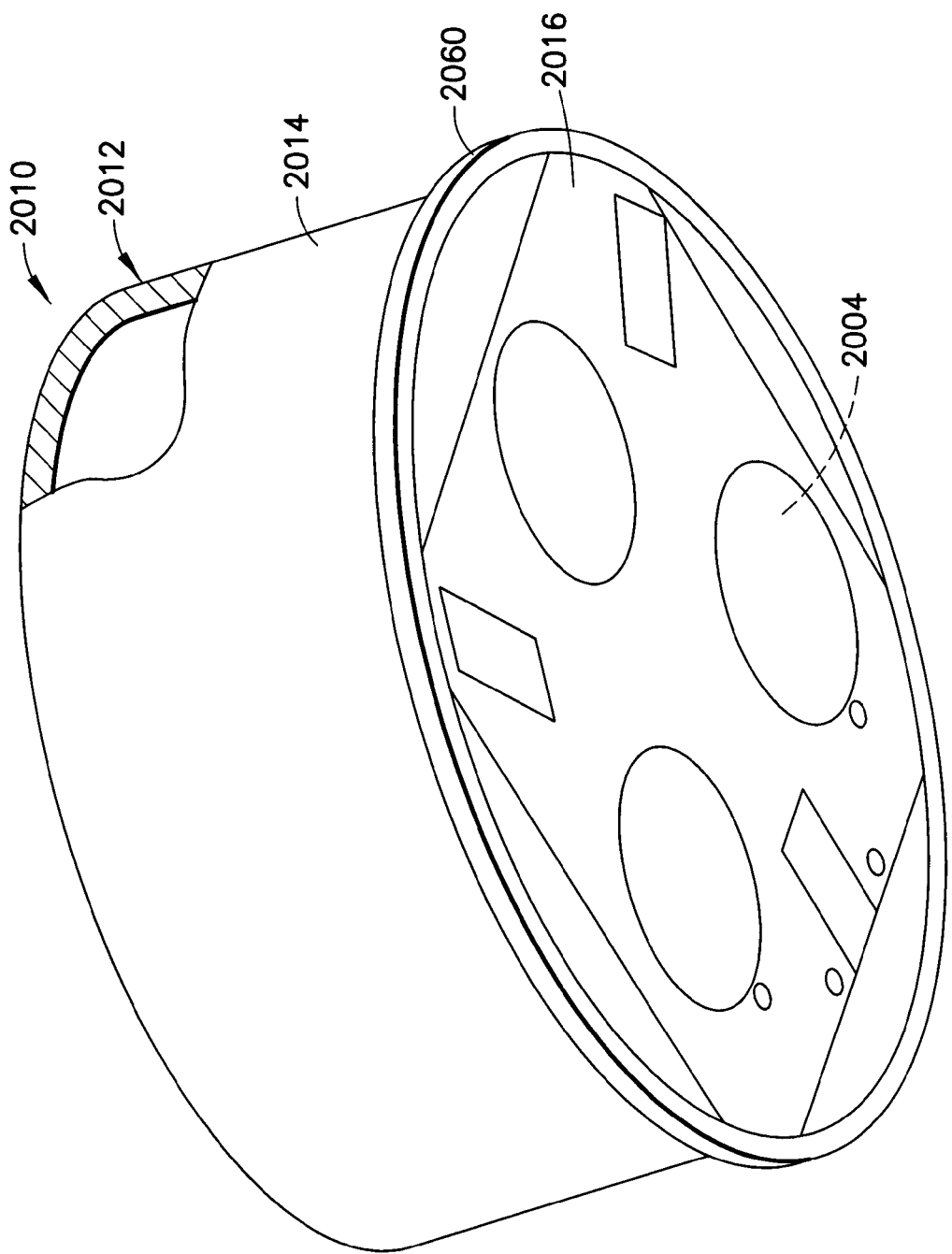
FIGS. 36A-36C are respectively bottom perspective, elevation and bottom plan views of a transport device in accordance with another exemplary embodiment.
Figure 36B:
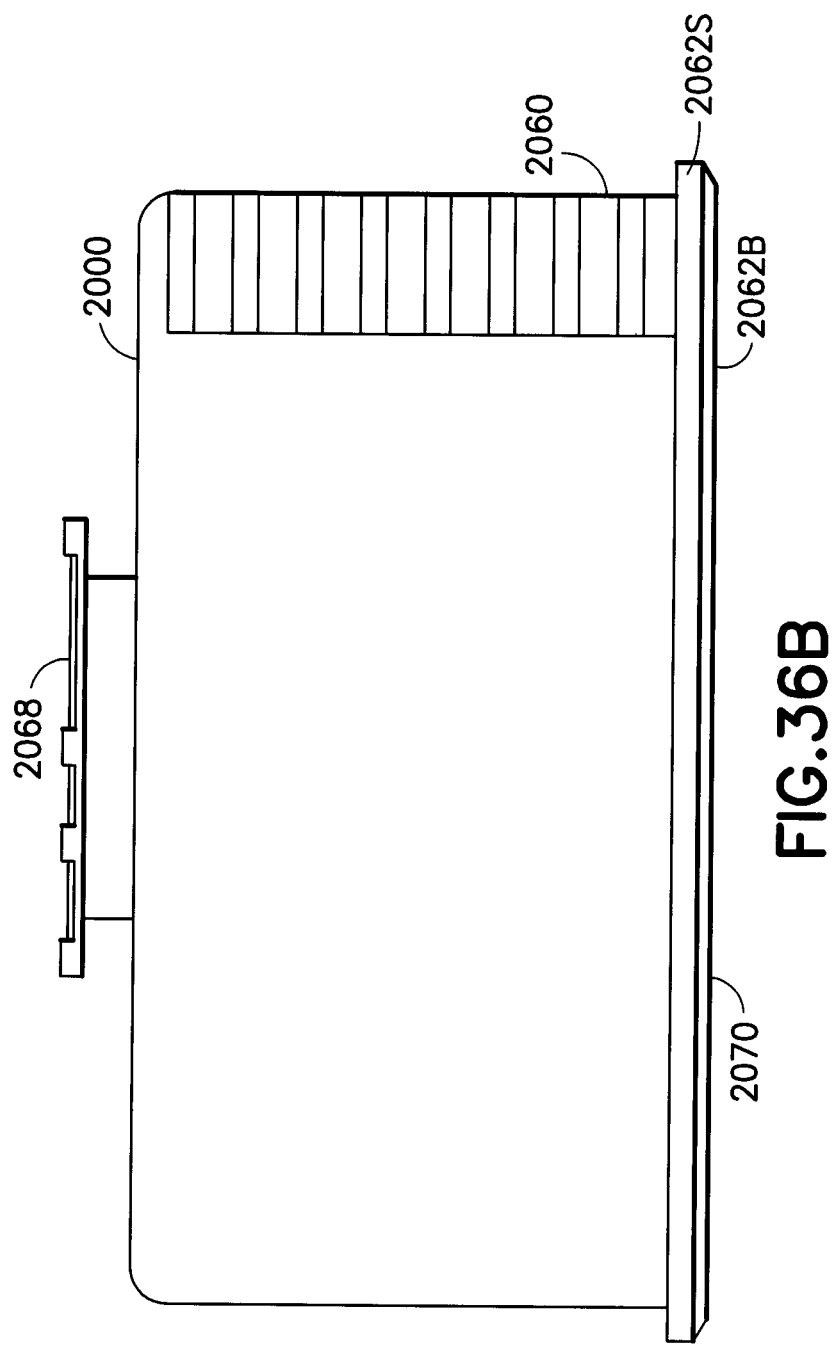
Figure 36C:
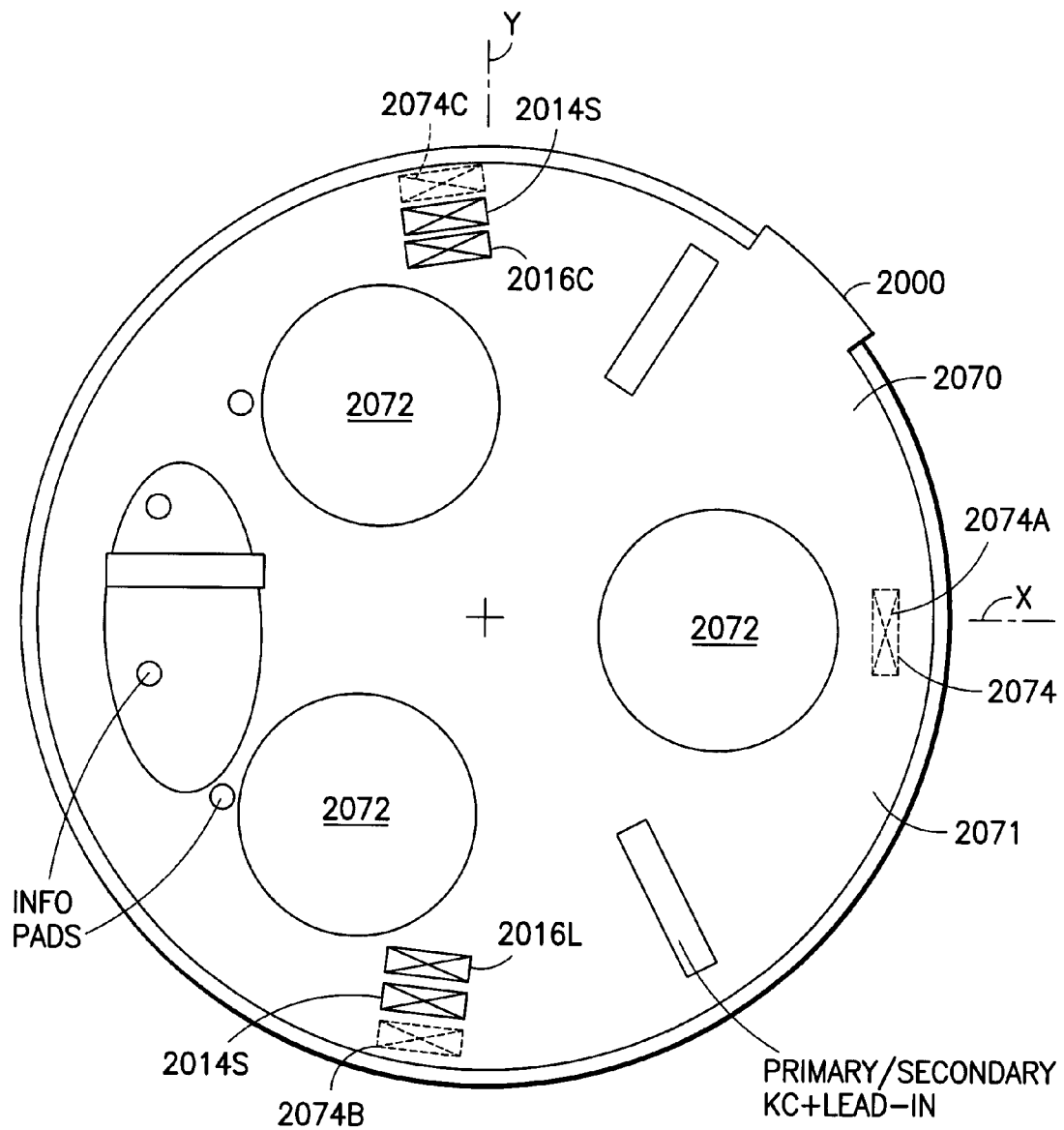

Referring now to FIGS. 36A-36C there is shown respectively perspective, side and bottom views of a substrate carrier 2000 in accordance with yet another exemplary embodiment. The carrier 2000 is a representative carrier and is shown as having an exemplary configuration. The carrier 2000 in the embodiment shown is illustrated as being a bottom opening carrier for example purposes, and in alternate embodiments the carrier may have any other desired configuration such as top opening, or side opening. The carrier 2000 in the exemplary embodiment shown in FIGS. 36A-36C may be generally similar to carrier 200, 200', 300 shown in FIGS. 1-3, and similar features are similarly numbered. Carrier 2000 thus has a shell or casing 2012 with one or more opening(s) 2004 (only one of the opening(s) is shown in FIGS. 36A-36C for example purposes) through which wafer(s) may be transported in/out of the carrier. The carrier shell may have removable wall(s) or section(s) 2016 that may form closure(s) or door(s) for opening and closing the respective opening(s) 2004. As noted before, in the exemplary embodiment shown the shell 2012 may have a bottom wall 2016 that is removable in order to open and close opening 2004. In alternate embodiments any other section or wall of the carrier shell may be removable to allow wafer transport in and out of the carrier. The removable sections 2016 may be sealed to the rest of the casing 2014 in a manner similar to that shown and described before, and the casing may be capable of holding an isolated atmosphere such as an inert gas, high cleanliness air with a pressure differential to ambient atmosphere or vacuum for example. The shell 2014 and removable wall(s) 2016 may be passive structure(s) similar to wall 216 and shell 214 described before, and may be locked to each other magnetically for example or any other desired passive lock. In the exemplary embodiment, the wall(s) 2016 may include magnetic elements 2016C (for example ferrous material) and the shell 2014 may have a magnetic switch 2014S actuated to lock and unlock the wall and shell. The magnetic elements in the wall, and the operable magnets 2014S in the shell may be configured to allow cooperation with magnetic locks in the port door interface (as will be described further below) so that locking the carrier door (either wall or shell, see FIGS. 36A, 36C) to the port door causes unlocking of the carrier door from the rest of the carrier. In alternate embodiments, the magnetic locks between wall and shell may have any other desired configuration. The metal passive carrier 2000 and carrier door 2016, 2014 provide a clean, washable carrier that is vacuum compatible.

In the exemplary embodiment shown in FIGS. 36A-36C, the carrier 2000 is illustrated as configured to carry multiple wafers. In alternate embodiments, the carrier may be sized as desired to carry but a single wafer with or without an integral wafer buffer, or any desired number of wafers. Similar to carriers 200, 200', 300 in the earlier described exemplary embodiments, carrier 2000 may be a reduced or small lot size carrier, relative to conventional 13 to 25 wafer carriers. As seen best in FIGS. 36A-36B, the carrier shell may have a transport system interface section 2060. The transport system interface section 2060 of carrier 2000 may be arranged to interface with any desired transport system, such as a conveyor system similar to the exemplary embodiments shown in FIGS. 20-30. For example, the carrier may include reactive elements, such as ferrous magnetic material pads or members, disposed or connected to the carrier casing, capable of cooperating with forcer sections of a linear or planar motor of the conveyor system transport to propel the carrier along the conveyor. An example of a suitable configuration of reactive elements, of a linear or planar motor, connected to the carrier casing is described in U.S. application Ser. No. 10/697,528, filed Oct. 30, 2003 and previously incorporated by reference herein. In the exemplary embodiment shown in FIGS. 36A-36C, the carrier interface section 2060 may also have carrier support member(s) or surface(s) 2062 that may interface with the transport system to support the carrier from the transport system when the carrier is moving and/or stationary on the transport system. The support surface(s) may be non-contact or contact support surfaces and may be arranged on or facing the sides (e.g. surface(s) 2062S) or bottom (e.g. surface(s) 2062B) or any other desired location or facing to stably support the carrier from the transport system. The non-contact support surfaces, for example may be substantially flat areas, surfaces or pads, connected to or otherwise disposed on the casing and formed by any suitable means, capable of interacting with air bearings (not shown) of the transport system to stably hold the carrier (either on the basis of the air bearings alone or in combination with motive forces imparted on the carrier by the transport system motor; e.g. magnetic forces). In alternate embodiments, the carrier casing may have one or more (active) air bearing(s) directing air (or any other desired gas) against (passive) transport system structure to provide floating (e.g. non-contact) but stable support of the carrier from the transport system structure. In this embodiment, a suitable source of air/gas (e.g. a fan or gas pump) may be connected to the carrier to feed the air bearings of the carrier. In other alternate embodiments, the carrier casing and the transport system may have both active air bearings and passive air bearing surfaces (e.g. lifting air bearings in the transport system and horizontal guidance air bearings in the carrier). The carrier 2000 may have other handling members, flanges or surfaces such as for example handling flange 2068 as shown in FIG. 36B.

In the exemplary embodiment, carrier 2000 may have a tool interface section 2070 that allows the carrier to interface with the loading section (for example a load port) of a processing tool. The processing tool may be of any kind. In the exemplary embodiment, the interface 2070 may be located on the bottom of the carrier. In alternate embodiments, the carrier may have tool interfaces on any other desired sides of the carrier. In still other alternate embodiments, the carrier may have multiple tool interfaces (e.g. bottom and side) enabling the carrier to interface in different configurations with tools. The tool interface section 2070 of the carrier 2000 in the exemplary embodiment is seen best in FIG. 36C. The configuration of the tool interface section 2070 shown in FIG. 36C is merely exemplary, and in alternate embodiments the carrier may have a tool interface section having any other desired configuration. In the exemplary embodiment, interface section 2070 may have features and generally conforms to the criteria set forth in the appropriate SEMI standards for a carrier (such as SEMI E.47.1 and E57 and any other appropriate SEMI or other standard) all of which are incorporated by reference herein in their entirety. Thus, in the exemplary embodiment, carrier interface section 2070 may include kinematic coupling (KC) receptacles, arranged in compliance with the criteria in SEMI STDS. E.47.1 and E57, for receiving primary and/or secondary KC pins (not shown) located in conventional load port interfaces. The carrier interface 2070 may also have a section with one or more info pads in compliance with the SEMI STDS. for the carrier. In alternate embodiments, the carrier interface section may not be provided with one or more of the SEMI specified features (for example, the interface section may not be provided with kinematic coupling features) but may never the less have reserve areas on the interface side of the casing corresponding to the such features. In the exemplary embodiment, the carrier interface section 2070 may thus be capable of interfacing the carrier 2000 to conventional loading interface of conventional processing tools. As may be realized, and is noted before with respect to the previously described embodiments, in order to mate the carrier to a load port coupling the carrier to the process environment (or for example to maintain a vacuum in the process apparatus), it is desired to mate the carriers so that the carrier interior may be substantially sealed to the process environment, and what may be referred to as unclean surfaces on the carrier, may be substantially isolated and sealed off from the process environment. As may be realized, the carrier/load port contact interfaces, for sealing the carrier, such as previously described, and the kinematic coupling between carrier and loadport may give rise to an over constrained condition between carrier and loadport. To relax the over constraints, the kinematic coupling between carrier and loadport may be compliant allowing repeatable positioning of carriers on the loadport interface. Coupling compliance may be actuated with preload from the loadport interface. Referring now to FIG. 36E, there is shown a schematic cross-section of a representative interface portion 2272 of the compliant kinematic coupling 2072 in accordance with an exemplary embodiment. The coupling interface portion 2072 may generally have a pin 2274 and grooves or detent 2276 arrangement, and compliance or flexibility may be provided in one or more desired directions (such as indicated by arrows X, Z) to relax over constraints on the carrier in any desired degrees of freedom (e.g. carrier pitch, roll, yaw). By way of example, the coupling pin 2274 may be compliant (such as by spring load, e.g. flexurally mounted generally spherical pin, pin made of resiliently flexible material, etc.) The coupling grooves 2276 may also be compliant (such as by flexural mounting, or forming grooves in resiliently flexible material allowing flexure of the groove surface when compressed under preload.

Moreover, in the exemplary embodiment, the carrier interface section 2070 may further be configured to allow non-contact coupling interface of the carrier to a loading interface of a processing tool, as will be described in greater detail below.

As may be realized, generally a wafer carrier, such as carrier 2000, may be located with respect to the process tool for processing. Close alignment of the wafer carrier to the loadport of the tool is desired to automate the transport of the wafers into the tool. Conventional locating methods may generally use conventional mechanical couplings that contact the bottom surface of the carrier. For example, these conventional mechanical couplings provide a lead-in or cam to compensate for gross misalignments and aid in guiding a wafer carrier to the aligned position. Unfortunately, this feature relies on the lead-in surface of a carrier to make sliding contact with the mating pin of a loadport, thereby possibly causing wear and generation of contaminants. A second issue related to the use of conventional mechanical coupling is the desire for the carrier to be coarsely located within the capture range of the conventional coupling to function properly. The carrier transport system is responsible for achieving adding to either complexity of the transport system and/or time in effecting proper placement (e.g. retries). Hence, the design of the carrier transport system should be sufficiently repeatable to place the carrier within the capture range of the conventional mechanical coupling or in conventional applications the nominally aligned position to prevent wear. Inevitably, the carrier transport system cannot achieve repeatability over many cycles and consequently results in sliding contact instigating particle generation. The interface of carrier 2000 may provide the same repeatability in locating a wafer carrier to the process tool but with the use of a non-contact (e.g. magnetic) coupling. This capability enables the transport system to fully realize a lead-in feature that loosens the placement tolerances and subsequently speed up the carrier load/unload step. Secondly, all motions to compensate for the placement error may be performed without physical contact between carrier and load port eliminating any relative sliding motion for cleanliness.

As seen in FIG. 36C, in the exemplary embodiment the carrier interface section 2070 may have a non-contact coupling 2071 for non-contact interface and coupling of the carrier to a loadport. The non-contact coupling 2071 may include generally non-contact support or lift area(s) 2072 and non-contact coupling section(s) 2074. In the exemplary embodiment, the lift area(s) 2072 may be substantially flat and smooth surfaces arranged to cooperate with air bearings of the load port (as will be described below) to allow controlled and stable lifting of the carrier by the air bearings in the load port. In the exemplary embodiment the carrier lift area(s) are passive, but in alternate embodiments the carrier may include one or more active air/gas bearings to lift the carrier. Referring again to FIG. 36C, in the exemplary embodiment the lift area(s) 2072 may have three sections that are generally similar to each other and distributed on the interfacing (e.g. bottom) side of the carrier casing so that lift acting on the carrier from the load port air bearings is generated substantially by the pressure, from air bearings impinging on the lift area(s) sections, and the resultant lift is substantially coincident with the center of mass (CG) of the carrier. The shape and number of the lift area(s) sections 2072 shown in FIG. 36C is merely exemplary and in alternate embodiments the lift area(s) may have any desired shape and number. For example, the lift area(s) may be a single continuous (or substantially uninterrupted section extending around the perimeter of the carrier interface). In the exemplary embodiment, the lift area(s) is located on the carrier interface 2070 as not to interfere with the SEMI compliant interface features (e.g. kinematic coupling receptacles, info pads, etc.). The lift area(s) 2072 may be located as far from the CG as possible within the constraints of the interface, and may be sized as desired for generating desired pressure distribution and accommodating as large as desired translational (i.e. x-y plane) misalignment between carrier and load port. In the exemplary embodiment, the lift area(s) 2072 are arranged symmetrically about a single axis (indicated by axis X in FIG. 36C, e.g. the bilateral datum axis) but not any other axes of the carrier interface. Hence, the carrier interface 2070 is polarized so that non-contact interface with the tool loading interface may be accomplished in but a single proper orientation. Placement of the carrier in an incorrect orientation may result in instability of the carrier lift, that may be sensed by suitable sensors of the transport system placing the carrier, or of the carrier itself or of the load port, and causing a signal to be sent to stop the incorrect placement. The lift area(s) 2072 may also have a desired pitch or bias to aid in proper alignment of the carrier to the load port. In alternate embodiments, the lift area(s) may be movable or tiltable, such as by mechanical, electromechanical, piezoelectric, thermal or any other suitable means, in order to generate when impinged upon by the air bearing desired horizontal resultant force on the carrier of the variable magnitude and variable direction to effect alignment between carrier and load port.

Still referring to FIG. 36C, in the exemplary embodiment the non-contact coupling section(s) 074 may have one or more permanent magnet(s) 2074A-2074C (three magnets 2074A-2074C are shown for example purposes and more or fewer magnets may be provided in alternate embodiments). The coupling magnet(s) 2074A-2074C may be part of the reactive section of the transport system linear/planar motor or may be independent of the motor reactive section. The coupling magnet(s) 2074A-2074C may be of sufficient size to overlap coupling magnets of the load port (as will be described below) for a desired misalignment between carrier and load port. In the exemplary embodiment shown the coupling magnet(s) 2074A-2074C are arranged symmetrically about a single axis (such as axis X in FIG. 36C) but are asymmetric about all other axis of the carrier interface. Hence, the non-contact coupling section of the carrier is polarized preventing the carrier from coupling to a load port if the carrier is not in the desired orientation relative to the load port. In other words the non-contact coupling of the carrier may nevertheless be "keyed" to the load port for correct orientation and all other orientations would not be engaged by the coupling and thus would not attempt to load. A suitable sensor(s) may be provided on the load port or carrier, to detect when the carrier may be incorrectly placed on the load port and coupling cannot be properly effected and send a suitable signal causing the transport system to remove, and if possible reposition the carrier in the proper orientation. In alternate embodiments, the non-contact coupling sections, and/or the lift area(s) may be arranged symmetrically about multiple axes of the carrier interface.

Figure 36D:
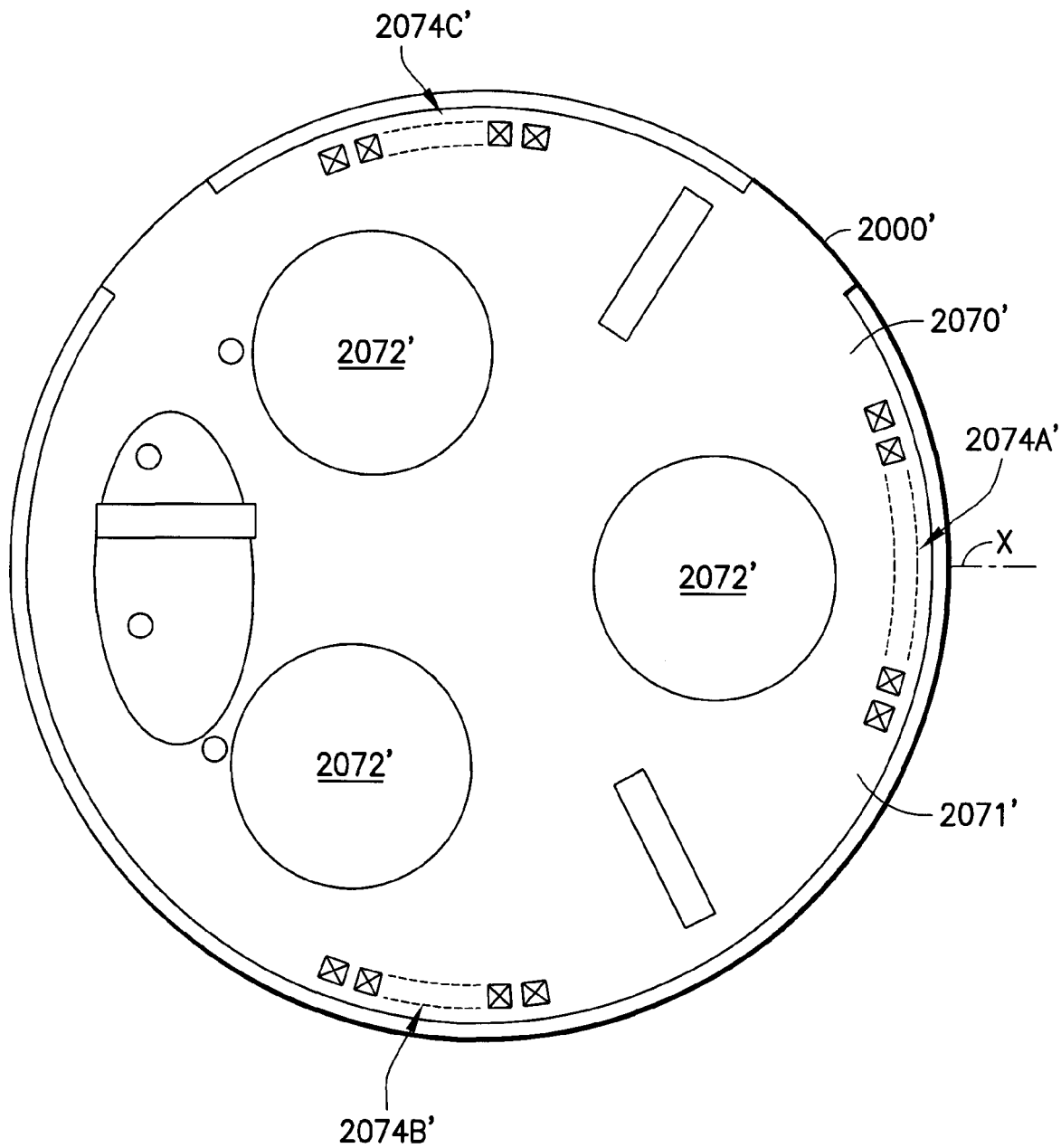
FIG. 36D is another bottom plan view of a transport device in accordance with another exemplary embodiment.
Figure 36E:
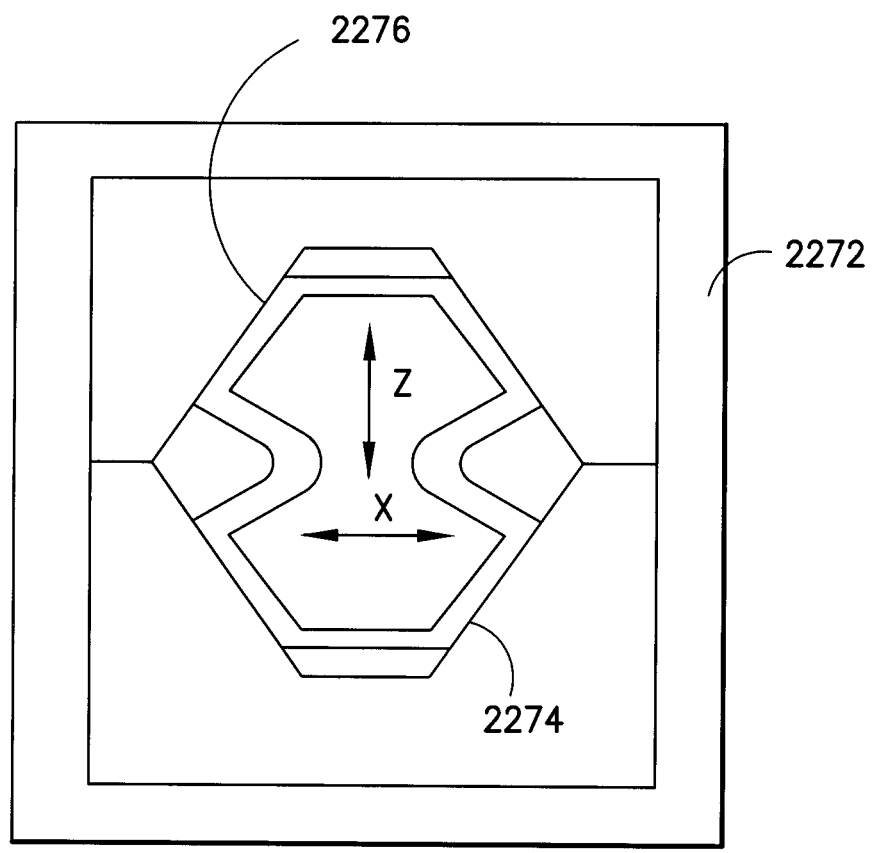
FIG. 36E is a schematic cross-sectional view of a portion of a compliant kinematic coupling.

Referring now to FIG. 36D, there is shown a bottom view of a carrier 2000' in accordance with another exemplary embodiment carrier 2000' is substantially similar carrier 2000 described before and similar features are similarly numbered. Carrier 2000' may have a carrier interface section 2070' with a non-contact coupling 2071' generally similar to non-contact coupling 2071 described before with reference to FIGS. 36A-36C. In the exemplary embodiment shown in FIG. 36D, the non-contact coupling section 2074' may have ferrous magnetic material sections 2074A', 2074B', 2074C' (that may be part of or independent of the transport system motor reactive components in the carrier) in place of permanent magnets. The ferrous material sections 2074A', 2074B', 2074C' may be of any desired shape such as rectangular, round cylindrical or spherical. Each of the sections 2074A'-2074C' may be similar to each other, though in alternate embodiments different shared section defining desired magnetic coupling and directional characteristics may be used in each of the sections. The sections may be of sufficient size to be within the magnetic field of the load port coupling points and accommodate a desired initial misalignment between carrier and load port when the carrier is initially placed on the load port. The coupling sections 2074A', 2074B', 2074C' may be sized and arranged on the carrier interface so that the magnetic forces on the carrier bias the carrier into an aligned position relative to the load port. As seen in FIG. 36D, the coupling sections 2074A', 2074B', 2074C' in the exemplary embodiment may be distributed on the carrier interface to define a single a single axis of symmetry (axis X) and thereby keying the non-contact coupling 2071' of the carrier to allow coupling to the load port in but one orientation. In alternate embodiments the coupling sections may have any other desired arrangement.

Figure 37A:
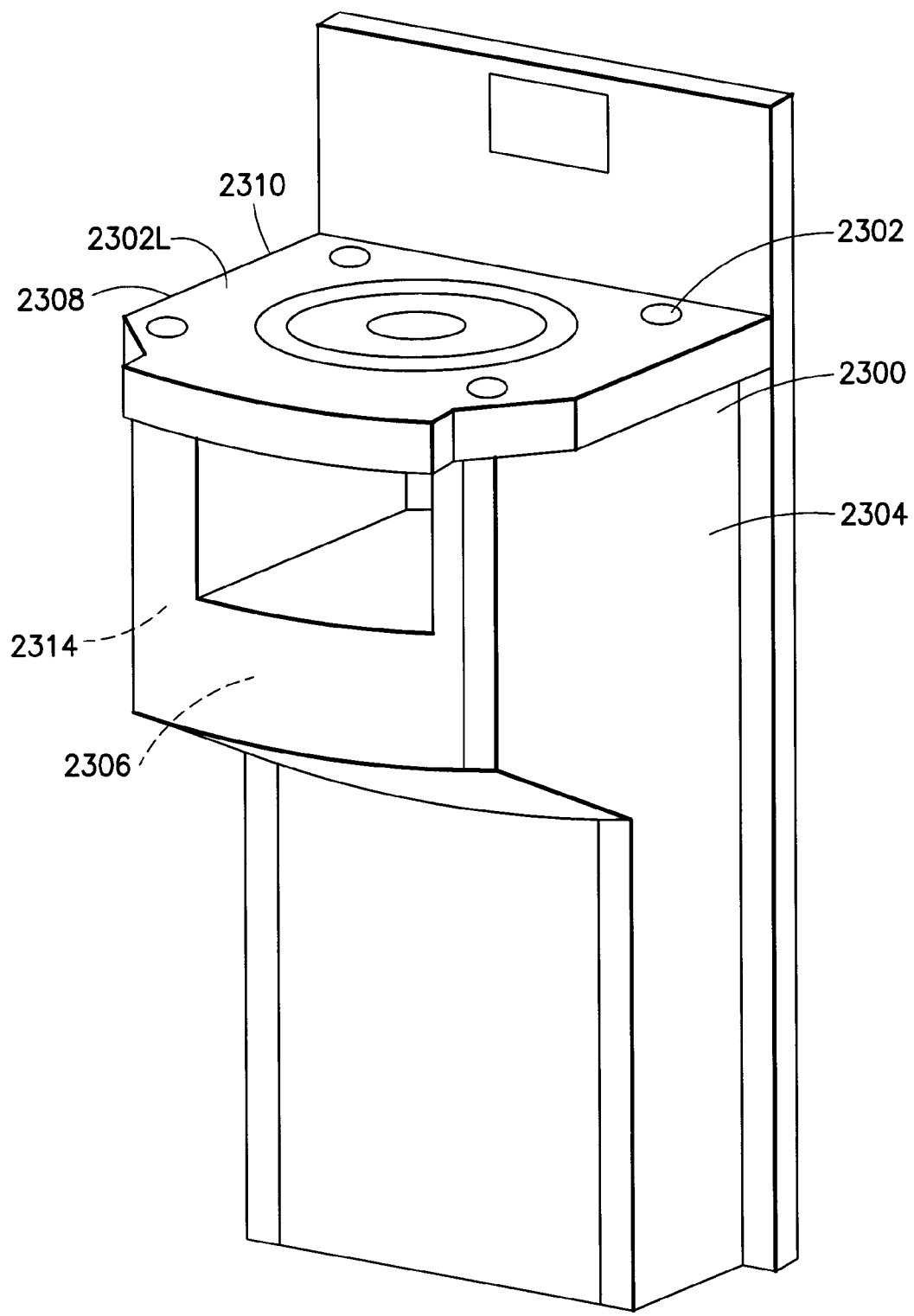
FIGS. 37A-37D are respectively a perspective, end and side elevations, and top plan views of a tool loading station in accordance with an exemplary embodiment.
Figure 37B:
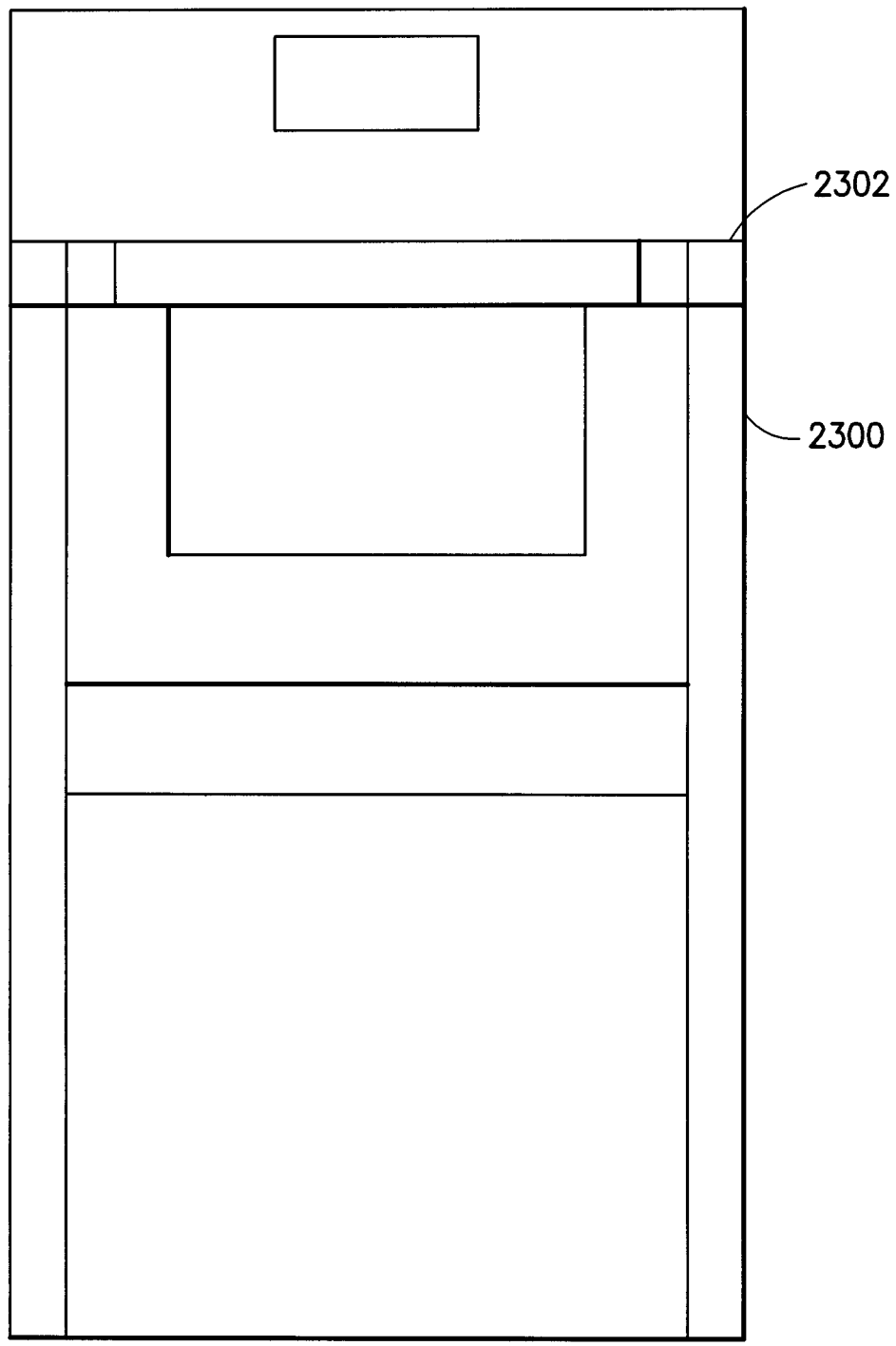
Figure 37C:
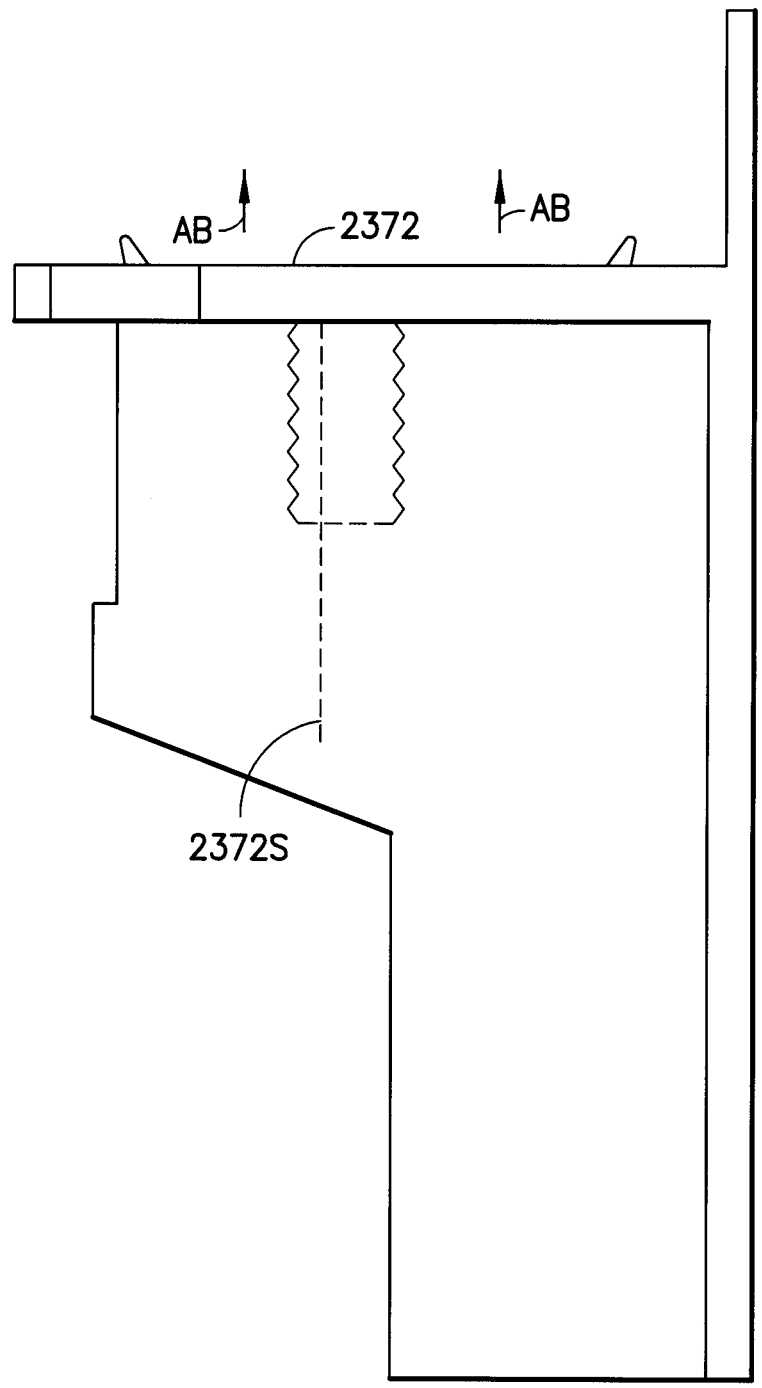

Referring now to FIGS. 37A-D there is shown respectively a perspective, end, side elevation and top plan view of a tool loading station or load port 2300 in accordance with another exemplary embodiment. The load port in the exemplary embodiment shown may have a configuration for interfacing with and loading wafers to and from a bottom opening carrier similar to carrier 2000, 200, 200' 300 described previously. In alternate embodiments, the load port may have any other desired configuration. Load port 2300 may have a suitable mounting interface, such as a SEMI STD. Comprises BOLTS interface, allowing the load port to be mated to any desired processing tool or work station. For example the load port may be mounted/mated to a controlled atmosphere section such as and EFEM of a processing tool (as will be described further), or may be mated to an atmospherically isolated chamber (e.g. vacuum transfer chamber) of a processing tool (in a manner similar to that shown in FIG. 14) or to an atmospherically open chamber of a processing tool. The load port in this exemplary embodiment is similar to the load ports described previously. The load port 2300 may generally have a carrier loading interface 2302, and loading cavity or chamber 2304 (into which the wafer(s), individually or in a cassette are received from the carrier or returned to the carrier). The chamber 2304 may be capable of holding an isolated atmosphere (thereby allowing the load port to function as a load lock of the processing tool) or a controlled (highly clean) air atmosphere. The carrier loading interface 2302 may have a loading plane 2302L, supporting the carrier when interfaces to the load port, that, unlike conventional load ports, is substantially free of protrusions in the carrier placement zone. As seen in FIG. 37A, the loading plane may have bumpers or snubbers exterior to the carrier placement zone to sub carrier movement in the event of cross misalignment between carrier and load port. The loading interface 2302 of the load port, may have a loading opening and, (or port 2308) (communicating with the loading chamber 2304) and port door closing the port similar to the load ports described before. In the exemplary embodiment, the port door 2310 may be substantially flat and level with the loading plane of the loading interface. The port door 2310 may be sealed to the port rim in a seal arrangement similar to that described before and shown in FIGS. 4A-4B. As may be realized, when interfaced and coupled to the load port interface 2302 of the load port, the carrier casing and carrier door are sealed respectively to the load port rim 2308R and the port door 2310 with what may be referred to as a substantially "zero volume purge" seal having an arrangement similar to that shown in FIGS. 4A-4B. In alternate embodiments the seals between the port rim, port door, carrier casing and carrier door may have any other desired configuration. The port door 2310 in the exemplary embodiment may be coupled to the port with passive magnetic coupling or latch in a manner also similar to that described before. In the exemplary embodiment, the magnetic coupling/latching elements between the port door and port may be located and configured to actuate the passive magnetic latching between carrier door and casing simultaneous with the actuation of the latching between port door and port. Thus, for example, unlocking of the port door from the port also causes unlocking of the carrier door from the carrier, and locking of the port door locks the carrier door to the carrier. In the exemplary embodiment, the load port may include an indexer 2306 and a purge/vent system 2314 similar to that shown in FIGS. 8-14.

Figure 37D:
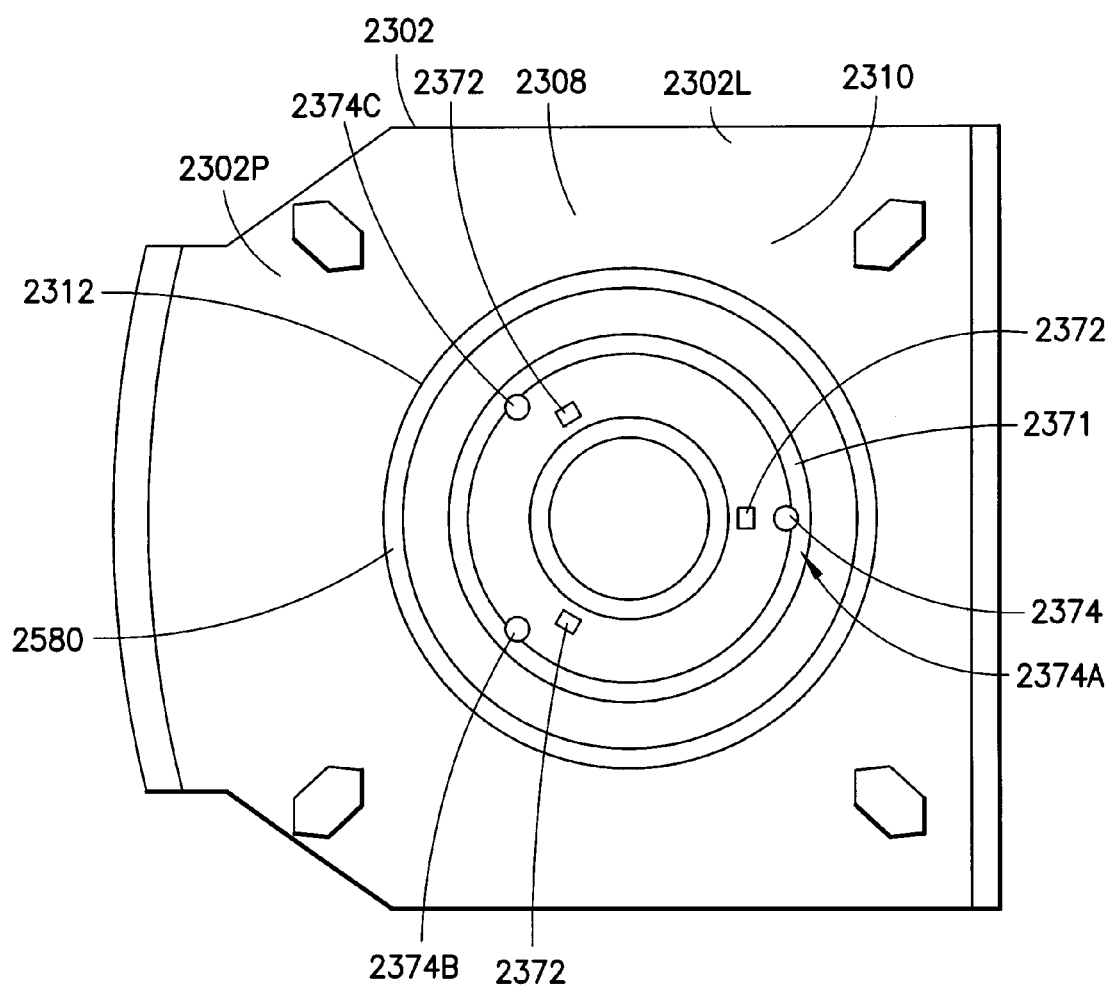

Referring also to FIG. 37D, the carrier loading interface of the load port of in the exemplary embodiment may have a substantially non-contact interface section 2371 that may cooperate with the non-contact interface section 2071 of the carrier 2000, for example for interfacing and coupling the carrier 2000 to the load port 2300. As seen in FIG. 3710, in the exemplary embodiment, the interface section 2371 may have one or more air bearings 2372 and a non-contact coupling section 2374. The air bearing(s) 2372 of the load port may be of any suitable type and configuration, and may be located for example in a "keyed" arrangement, generally corresponding to the arrangement of the lifting areas 2072 on the carrier interface. The air bearings 2372 may thus be symmetrically arranged with respect to the reference datum X that defines the alignment of the carrier 2000 when coupled to the load port. A suitable source (not shown) of air/gas surprises the air bearings. Suitable regulators (not shown) may be used to maintain desired gas flow from the air bearings. The gas supply and regulators for the air bearings may be located as desired. For example exterior or interior to the loading chamber 2304 of the load port, but maybe isolated from the interior atmosphere of the chamber for example, the gas supply 2372S to the air bearings 2372 (see FIG. 37C) may extend within a bellows or other flexible sealed sleeve to the air bearings that isolates the gas supply from the loading chamber. As a further example, the gas supply to the air bearings may extend in a manner similar to the purge and vent lines shown in FIG. 14 within a bellows seal isolating the indexing device. In the exemplary embodiment, the air/lift areas of the carrier may be on the carrier door, and hence the air bearings 2372 of the load port (located substantially under the lift areas) in the exemplary embodiment may be located within the bounds of the port door 2310. In alternate embodiments, the air bearings may be located on the port frame or port rim, and the gas supply for the air bearings may be located entirely exterior to the loading chamber of the load port. In the exemplary embodiment, the air bearing(s) 2372 may be orifice bearings (having a substantially localized exhaust) or may be porous media air bearings having a distributed substantially uniform exhaust. The exhaust flow from each of the air bearing(s) 2372 may be fixed (may remain substantially constant) in terms of pressure, mass flow and direction (indicated as substantially vertical by AB in FIG. 37C for example only). In alternate embodiments, the air bearings may have a variable exhaust flow allowing for example changing the exhaust flow characteristics (e.g. pressure, mass or direction) to offset movement of the carrier relative to the load port and facilitate carrier to load port alignment. As may be realized, the air bearings 2372 and lift pads 2072 on the carrier may be sized in order to provide a desired misalignment tolerance band or placement zone for the initial placement of the carrier onto the load port.

Figure 37E:
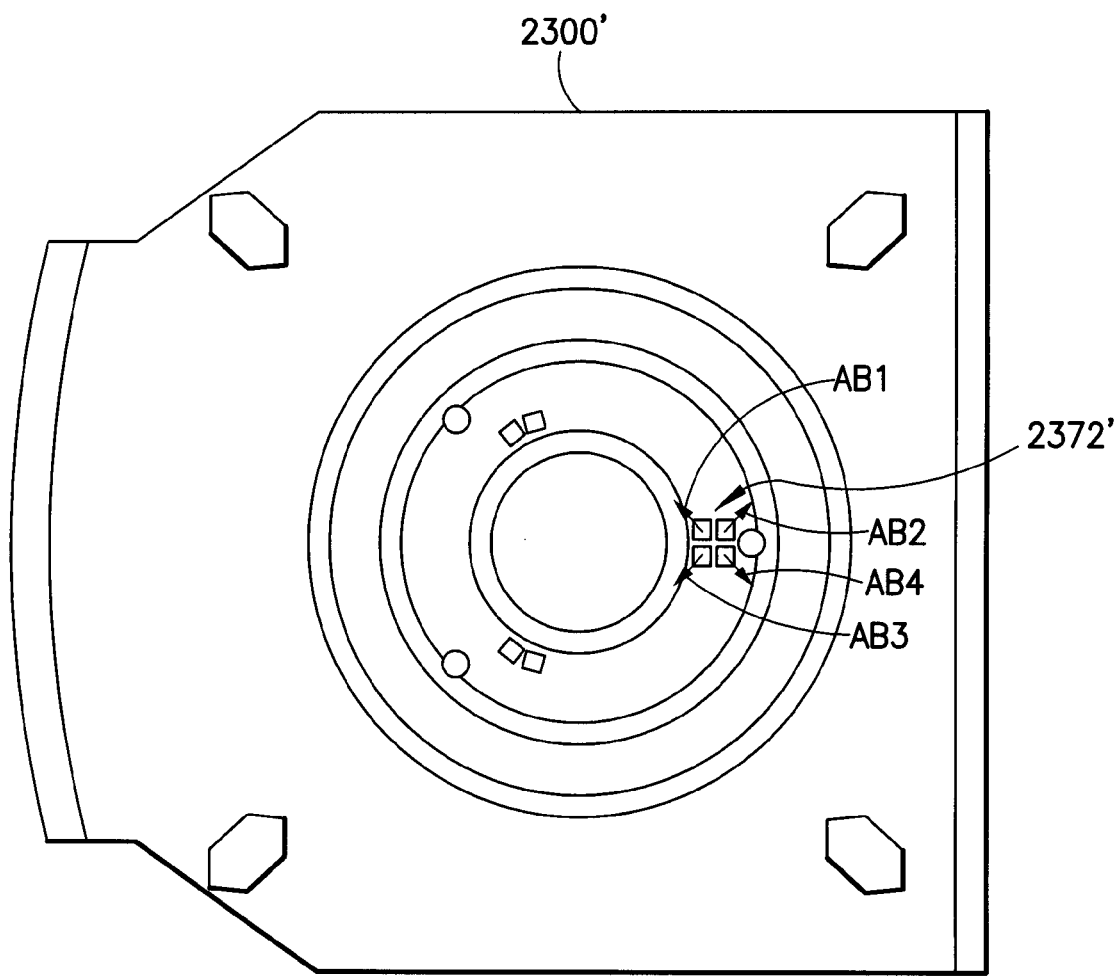
FIG. 37E is a plan view of another tool load station in accordance with another exemplary embodiment.

Referring now to FIG. 37E, there is shown a plan view of a load port 2300' in accordance with another exemplary embodiment, load port 2300' is similar to load port 2300 and similar features are similarly numbered. One or more of the air bearing(s) 2372' in this exemplary embodiment may have an array of nozzles. The exhaust AB1-AB4 from the array nozzle may combine to provide a directable resultant exhaust. By way of example, each nozzle of the array may have an exhaust angled relative to other nozzle exhaust. The exhaust flow from one or more of the nozzles may be fixed or variable. When air nozzles of the array are operating at full flow, the resultant exhaust has a first desired direct (e.g. substantially vertical). Stopping or reducing the flow through one or more of the nozzles of the array causes a change in the resultant exhaust direction, resulting in a directional component in the loading plane. In alternate embodiments, the air bearing nozzle may be movable (e.g. air bearing nozzle mounted on tiltable platform), or capable of changing geometry (e.g. by use of piezoelectric materials or share memory materials) to directionally steel the exhaust. As may be realized, the directional component of the air bearing exhaust in the loading plane imparts impetus of the carrier riding on the air bearings in the loading plane in the opposite direction of the directional component of the exhaust, and generates lateral motion of the carrier in the loading plane.

Referring again to FIGS. 37A-37D, the non-contact coupling section 2374 of the load port may comprise magnet sections 2374A-2374C located to cooperate with the magnets 2074A-2074C (see FIG. 36C) or magnetic materials sections 2074A'-2074C' of the carrier to define a magnetic lockable/unlockable coupling between carrier and load port (such as between carrier door 2016 and port door 2310 and, if also desired between carrier casing and load port frame). In the exemplary embodiment, the magnet sections 2374A-2374C of the load port may also, in cooperation with the magnets 2074A-2074C, or magnetic material sections 2074A'-2074C'1 of the carrier, form a carrier position compensation device capable of adjusting the position of the carrier on the load portion to achieve desired alignment as will be described below. The arrangement of the magnet sections 2374A-2374C shown in the figures is merely exemplary, and in alternate embodiments the magnet sections of the load port non-contact carrier coupling section may be arranged/configured in any desired manner. The magnet sections 2374A-2374C may be operable magnets to effect a magnetic switch, that when actuated generates a desired magnetic field that biases the magnet or magnetic section in the carrier in a desired direction (such as to effect locking/coupling of carrier and load port) and/or impart correction forces on the carrier). As seen best in FIGS. 37A and 37D, the load port interface in the exemplary embodiment may have a non-contact alignment system 2380 to effect teaching of the carrier transport system the location/position of the load port and enable initial placement of the carrier onto the load port interface. As noted before, the placement zone of the load port is substantially free of protrusions, and initial placement of the carrier onto the placement zone is substantially without contact (i.e. no rubbing contact) between carrier and load port in the exemplary embodiment. In the exemplary embodiment shown, the alignment system 2380, may have an array or pattern of registration marks that are capable of being imaged by a suitable sensor. The pattern of marks shown in FIG. 37D is merely exemplary, and in alternate embodiments any suitable marking pattern may be used that is capable of being imaged with a suitable sensor and defines positional information in all desired degrees of freedom. The sensor (not shown), that may be positioned for example on a carrier holding portion of the transport system, (see for example FIG. 26B) may be for example a CCD or CMOS imaging sensor capable of imaging the pattern and its spatial characteristics. The image data embodying the pattern may be communicated to a suitable processor that also registers and relates the positional data of the carrier transport to the pattern in order to determine the position of the load port placement zone with respect to the carrier transport and teach the carrier transport said position.

In the exemplary embodiment, the carrier 2000 may be placed by the transport system onto the loading plane that is free of protrusions in the placement zone 2302P. The placement zone in the exemplary embodiment can be an area formed by the size of the carrier +/- for example about 20 mm with respect to the alignment axis of the load port. The actual placement error can be any value and is not dependent on the values stated, and may be specified in proportion to the compensation mechanism used to position the carrier after placement. Thus, the alignment repeatability of this coupling is substantially the same as conventional coupling method, while at the same time increasing the allowable carrier transport placement error. Once the carrier is sensed by the load port, a film of air (air bearing) is activated lifting the carrier and eliminating friction between the carrier and load port interface. At this point the forces on the carrier are its mass and the relative location of the center of gravity to the horizontal datum plane and the lifting force itself. The carrier lift areas interface with the air pads on the load port to lift the carrier and establish repeatable positioning (both angular and transverse) of the carrier to the load port. The carrier floating on the film of air may now be positioned in alignment with the load port. As noted before, the magnetic coupling can be used to impart forces on the carrier to translate and rotate the carrier. Any method other than magnetic can be used to impart forces on the carrier as long as it is of sufficient stroke and can predict the target position. Completing the coupling of the carrier and load port is clamping the two objects together and hold position.

By way of example, and with particular reference to the exemplary embodiment illustrated in FIGS. 36A-36C, when carrier 2000 is in the placement zone, the permanent magnet(s) 2074A-2074C overlap magnet(s) 2374A-2374C on the load port interface. The air bearing may be energized and the load port magnetic is activated either electronically or by mechanical means to present the opposite magnetic pole to the carrier magnet. The absence of friction at the interface allows the carrier freedom to move in X, Y and Theta Z axes until the magnet poles naturally align but do not make physical contact. Throughout this step the air bearing is preloaded by the magnetic force of the magnets in the carrier and load port. The preload is useful in maintaining control of the carrier and increases the stiffness of the air bearing. The air bearing is deactivated for example after a predefined time period or by means of sensor feedback, allowing the carrier to lower onto the load port's port door. The magnets are now in full contact and provide a clamping force to hold the carrier to the port door.

In the exemplary embodiment shown in FIG. 36D the carrier 2000 possesses ferrous material pad(s) 2074A and 2074C (see FIG. 36D) of sufficient size to be within the magnetic field of the load port coupling points after placement (by the carrier transport system). The air bearing may be activated and the magnets on the load port are activated either electronically or by mechanical means introducing the magnetic field(s) to the carrier ferrous pad(s). The absence of friction at the interface permits the attractive force between the magnet and the ferrous pad(s) to translate or rotate the carrier to the aligned position. The air bearing is preloaded by the magnetic force. The preload is useful in maintaining control of the carrier and increases the stiffness of the air bearing. After a predefined time period or by means of sensor feedback for example, the air bearing is deactivated for example allowing the carrier to lower onto the load ports port door. The magnetic force on the ferrous pad(s) provide a clamping force to hold the carrier to the port door.

In accordance with yet another example, the carrier may be driven by a directed air nozzle 2372' (see FIG. 37E) integrated into the air bearing surface such as in the exemplary embodiment shown in FIG. 37E. In the embodiment, the air nozzle 2372 may provide a laterally applied pressure to the bottom surface which imparts a motion to the carrier. The motion can be controlled by the controller energizing the appropriate set of nozzles to direct the carrier in the X or Y axis until the magnet on the carrier is aligned to the load port. In the alternate embodiment where the array of nozzles is mounted to a platen that rotates/tilts the platen may be energized to provide the desired direction to the nozzles. The nozzles direct the exhaust opposite of the intended direction of motion of the carrier. This action imparts the lateral force to translate the carrier until alignment of the magnets. Some form of sensor feedback including for example feedback from the magnetic coupling may be used to detect the actual position of the carrier and compare to the aligned position. This information may determine which direction the carrier should be translated, and how the forces to be applied to the carrier by the air nozzles. In alternate embodiments, the nozzles and magnetic coupling may be used in combination together to align the carrier to its desired position.

Figure 37F:
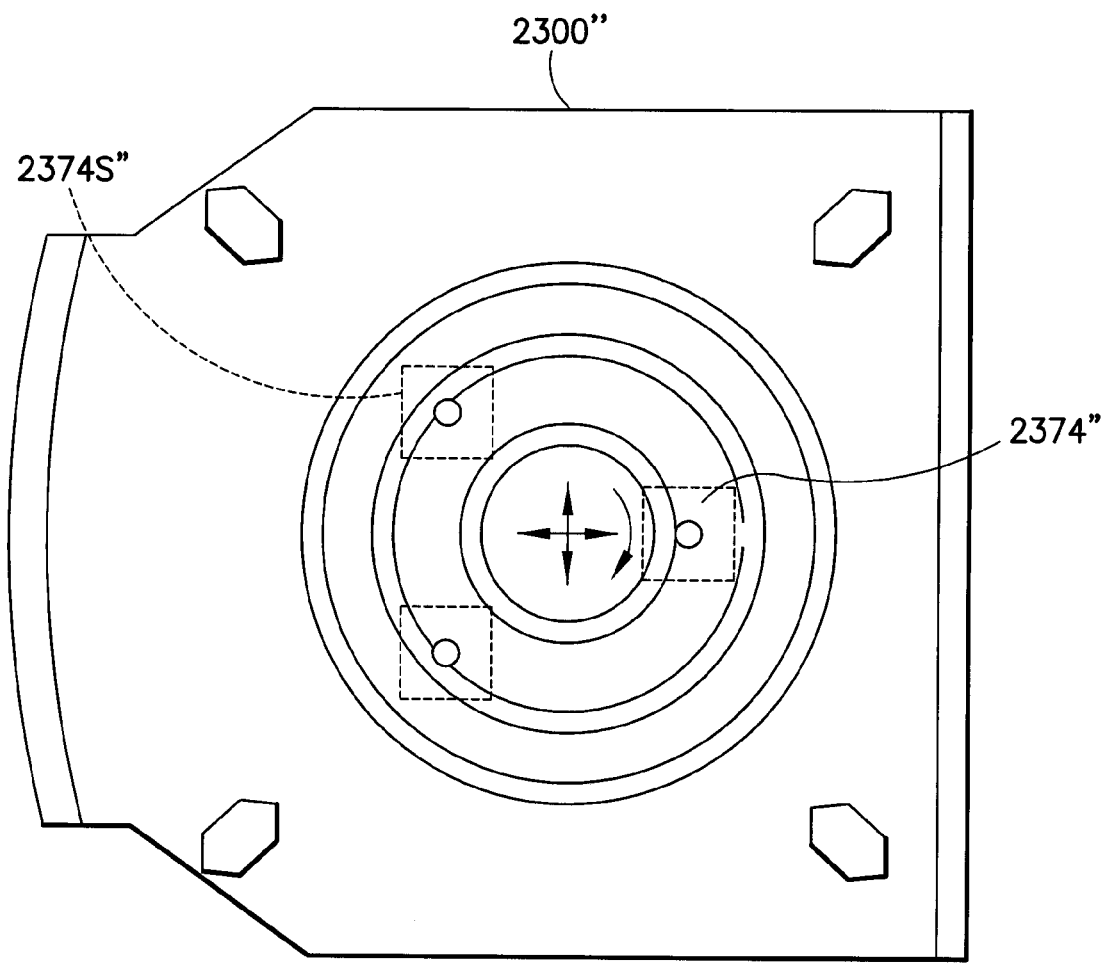
FIG. 37F is a plan view of still another tool loading station in accordance with still another exemplary embodiment.

FIG. 37F shows a plan view of load port interface in accordance with another exemplary embodiment. Load port 2300" in this embodiment is similar to previously described, except the magnet(s) 2374" positioned in the load port is attached to a movable X-Y stage movement directions indicated by arrows in FIG. 37E). In this embodiment the carrier is placed onto the load port and the air bearing is activated the carrier magnet is attracted to the load port magnet coupled to X-Y stage 2374S". The X-Y stage 2374S" can be either for example air cylinder, threadless screw or electric solenoid and is linear encoded to report the translated position. The coupled carrier magnet and load port magnet are driven back to a learned (aligned) position. At arrival to the destination the bearing may be deactivated and the carrier lowers to the port door and is clamped. Similarly, this method could be adapted to existing kinematic coupling approach used whereby each kinematic pin is coupled to an X-Y stage. In this example, two of the kinematic pins are driven to align X, Y and theta Z. Although, this would not operate within the premise of non-contact it is a viable method to increase the carrier placement tolerance with minimal wear.

Figure 37G:
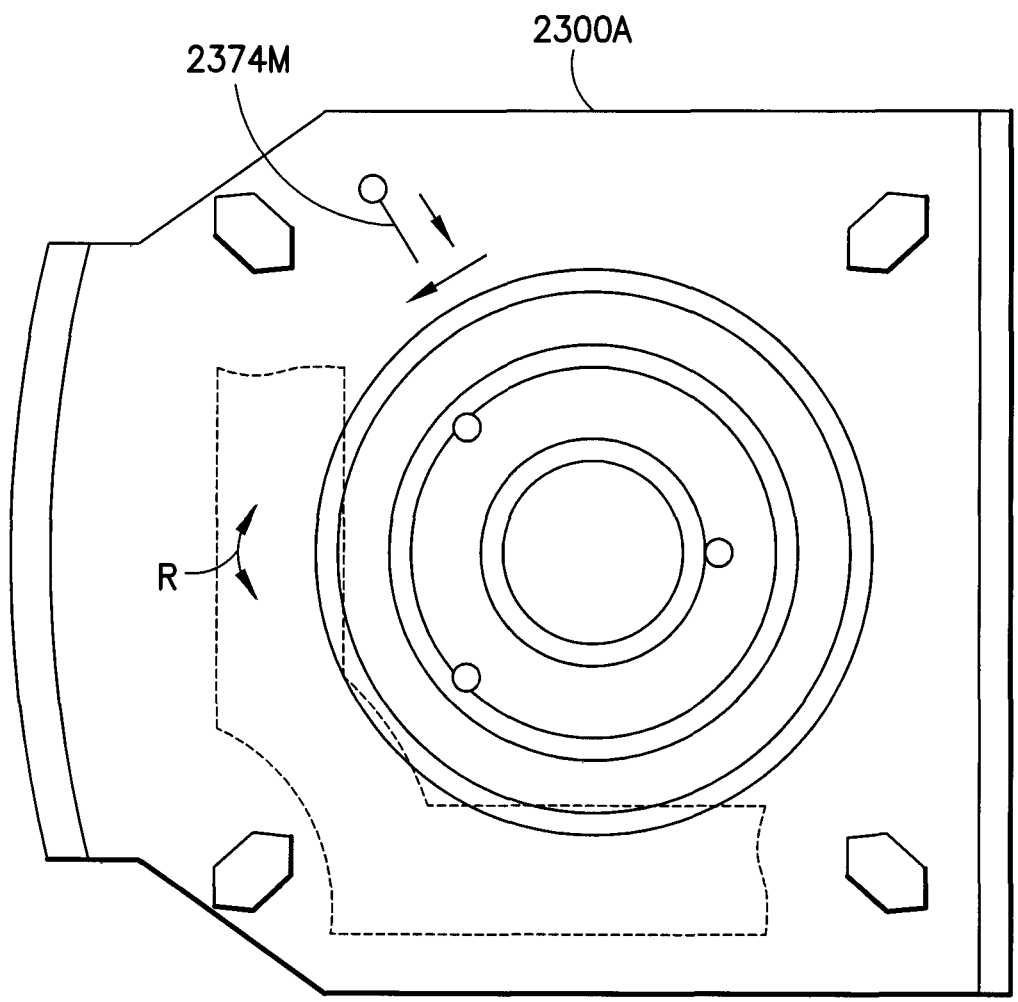
FIG. 37G is a plan view of yet another tool loading station in accordance with yet another exemplary embodiment.

FIG. 37G shows another exemplary embodiment of a similar load port 2300A except the carrier may be driven by a mechanically actuated pusher arm 2374M to position the carrier and align the coupling points of the carrier to the load port. In the exemplary embodiment shown, the loading plane may be pivotally mounted (as indicated by the arrows R, P) about theta X and theta Y. The degree of freedom in combination with an air bearing can be used to tilt the load plane shifting the center of gravity of the carrier to impart translation in the direction of the pivot angle. This method uses position feedback to intelligently actuate the load plane in the appropriate carrier direction to align the carrier and load port magnets. Once the carrier is in position, the air bearing may be deactivated and the carrier is clamped to the port door. Finally, the load plane is pivoted back to the original position to achieve proper alignment to the port for door removal.

Figure 38A:
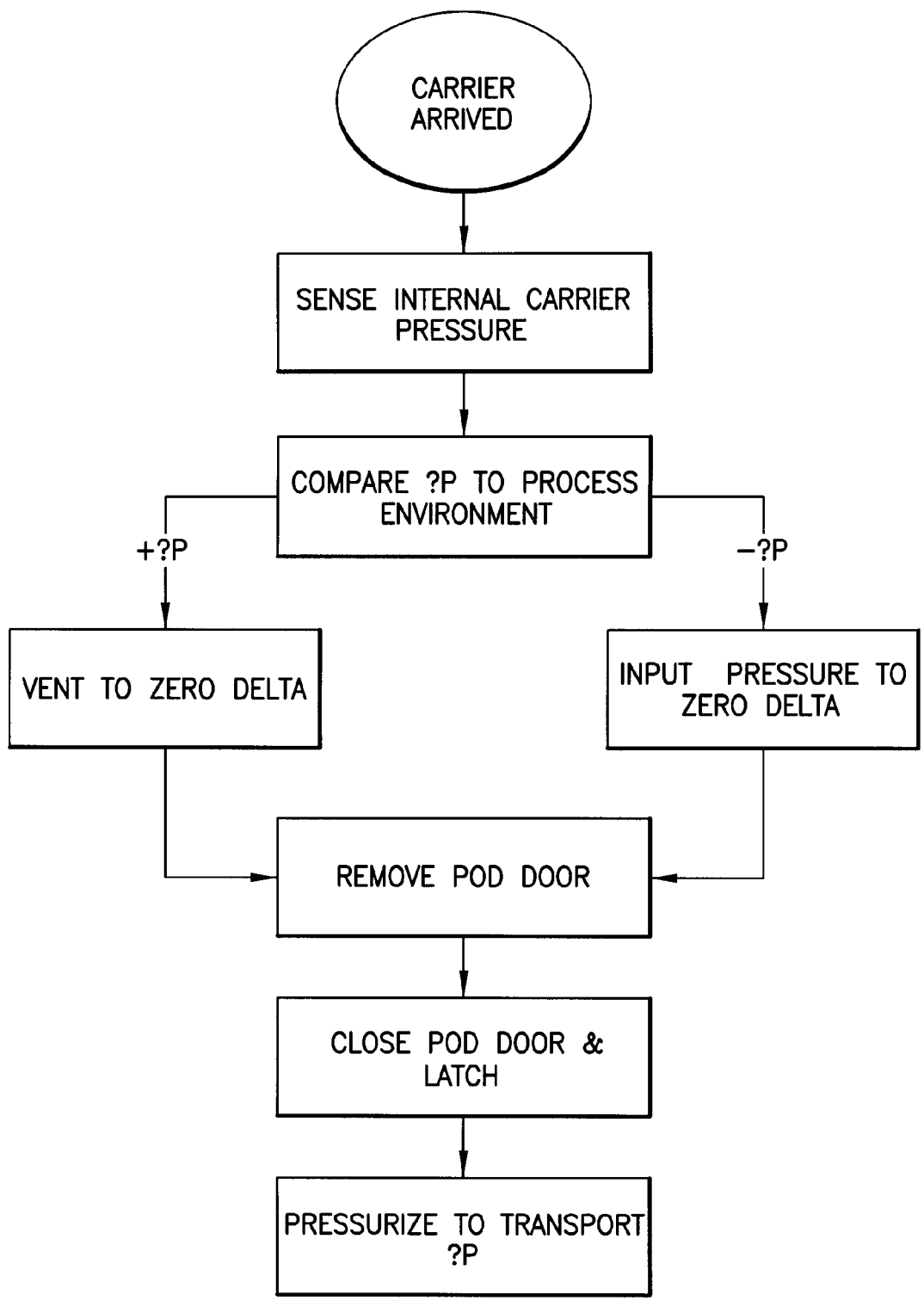
FIGS. 38A-38C are flow diagrams respectively graphically illustrating different processes in accordance with different exemplary embodiments.
Figure 38B:
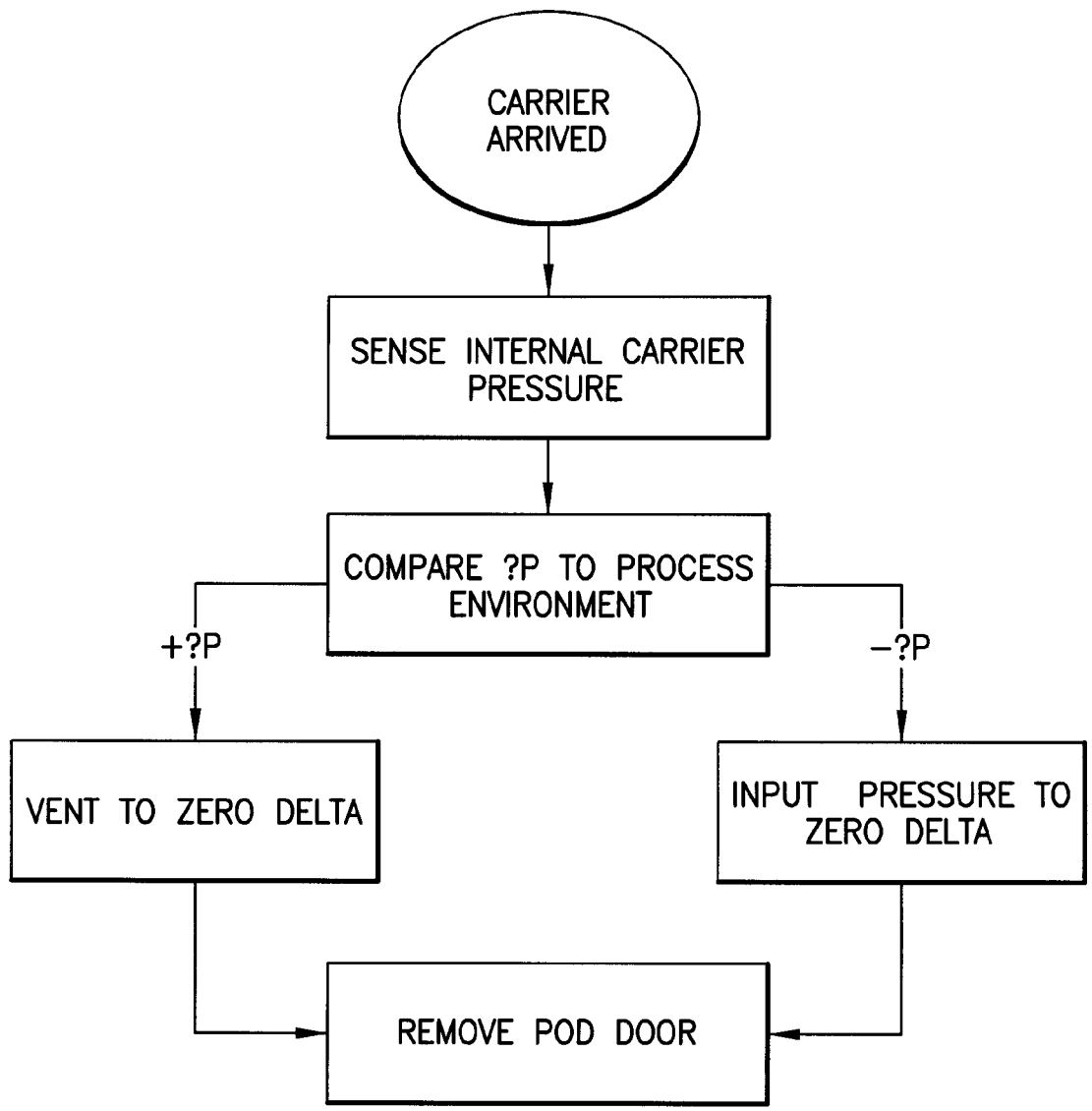
Figure 38C:
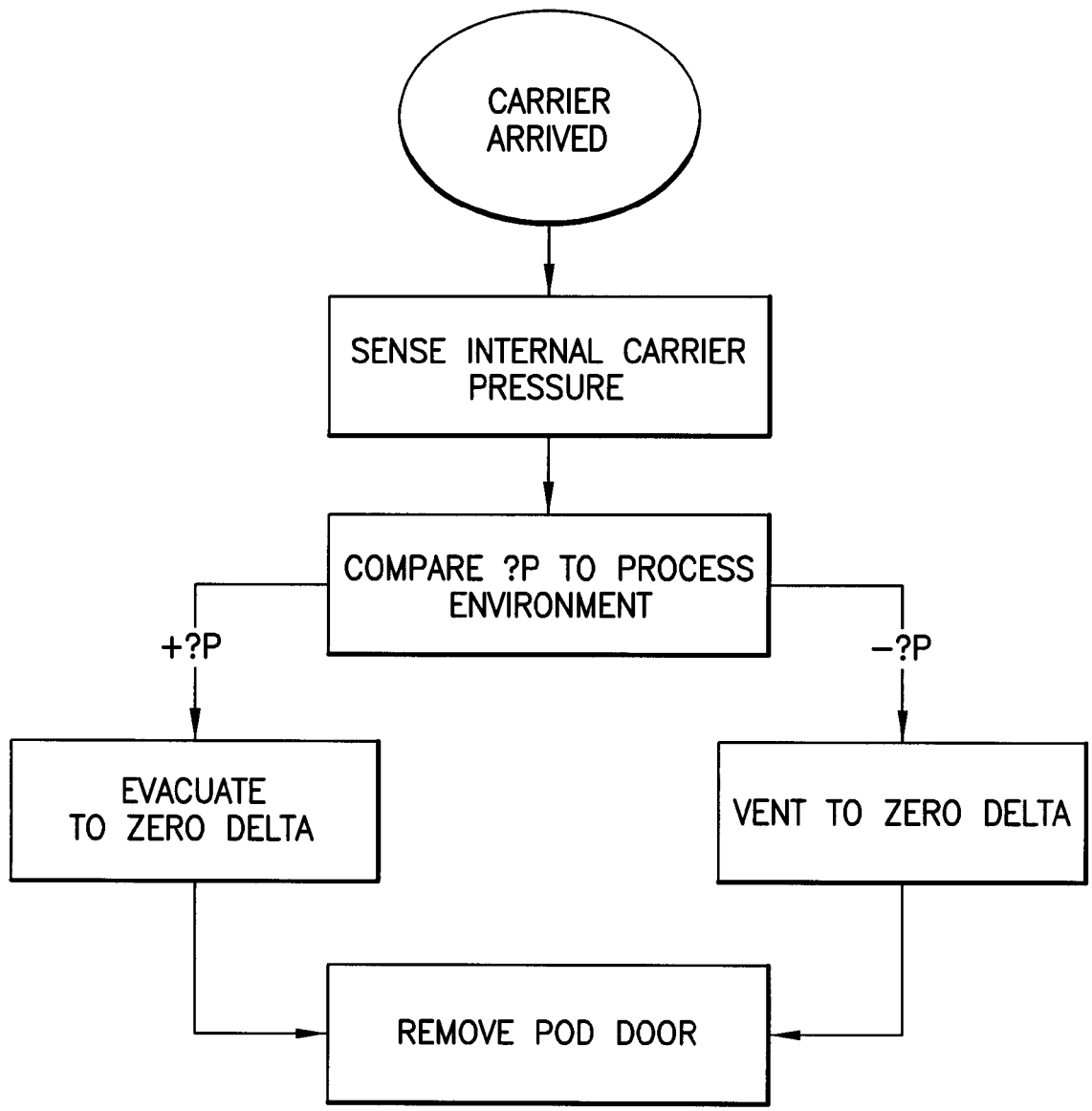

As noted before, the environment within a carrier may vary, for example depending on the prior process and environment to which the wafer(s) and carrier interior were subjected. Accordingly, carriers coupled to the load port or loading station may have an environment therein (e.g. gas species, cleanliness, or pressure) that is different than the environment of the current process. For example, a given process for the wafers of a carrier may employ an inert gas. Accordingly, the interface between the carrier and the load port of the given tool allows the suitable gas species to be input or vented as desired to minimize pressure differentials or introduction of undesired gas species during carrier opening. By way of another example, the tool environment may be vacuum, and the carrier mated to the load port of the tool may be evacuated to a low pressure, via the interface, allowing wafers from the carrier to be loaded directly to a vacuum load lock. The interface between the carrier and load port and environmental control system allowing environment matching between carrier and tool may be substantially similar to that previously described and shown in FIGS. 10-10A and 14. Another suitable example of a carrier load port interface and environmental matching system is described in U.S. application Ser. No. 11/210,918, filed Aug. 25, 2005 and previously incorporated by reference herein. Referring now to FIG. 38A there is shown a flow chart illustrating a process for matching the environment in a carrier to a load port that may have a different controlled environment. In the exemplary embodiment of FIG. 38A, the carrier and load port may both hold the same gas species (e.g. same species of inert gas). In this embodiment, if the carrier is at a higher pressure than the process pressure, the carrier may be vented (via the interface) for example to the load port chamber (or other suitable plenum) until equilibrium is achieved, and if the carrier is at a lower pressure, then gas from the load port or other suitable supply may be inserted (via the interface) into the carrier until equilibrium is achieved between carrier and load port/tool environment. In the exemplary embodiment of FIG. 38B, the load port may have an atmospheric environment (e.g. highly clean air) and equilibrium between carrier and load port may be established for example in a manner similar to that described before with respect to FIG. 38A. FIG. 38C illustrates the process in an exemplary embodiment where the load port has a vacuum environment. In alternate embodiments in which the carrier and load port may have initially different gas species, the initial environment of the carrier may be evacuated and gas species such as in the load port may be input (e.g. from the load port) into the carrier before the door is opened.

Referring again to FIG. 37A, and as noted before, in the exemplary embodiment the load port has an indexer 2306 that may raise and lower the port door 2310 (to open and close the port) and also may raise and lower a wafer cassette from the carrier to the desired height in the load port chamber for wafer processing. The indexer 2306 may be similar to the exemplary embodiments previously described and shown in FIGS. 8, 9, 10-10A, 14 and 18, with the indexing mechanism isolated from the volume/environment occupied by the wafers. In summary, suitable examples of indexing mechanisms may have the following arrangements:

1. Lead Screw with Bellows—this mechanism employs a lead screw driven by an electric motor which is attached the port plate of the load port. The portion of the lead screw which enters the clean area is enclosed by a bellows. The bellows can be of any material such as metal, plastic or fabric as long as it is generally clean during operation and can remain flexible without fatigue. The bellows provides a barrier between the contaminant producing mechanism and the clean area where wafers are located. The flexible nature of the bellows provides this isolation throughout the entire stroke of the actuator. The feedback of the mechanism can be by rotary encoder on the motor, or lead screw; or by linear encoder along the path of motion. (see FIG. 14)
2. Pneumatic cylinder with Bellows—similar to earlier embodiment (1) except the drive mechanism is by pneumatic cylinder. May be used for example for movement between two positions; e.g. pod closed and lowered. (see FIG. 9)
3. Lead Screw of Pneumatic Cylinder remote drive—similar to prior embodiment except the drive mechanism is remotely located outside the wafer volume (see FIG. 10). The port plate of the load port is attached to the drive with supporting structure. The drive may be exposed to the clean areas but contamination is controlled through the airflow path or a labyrinth seal. Use of the airflow entails placing the drive downstream of the wafers to that contaminants which might be generated are below the wafer and swept down and away from the wafer. The addition of a labyrinth or other "no rubbing" seal can further limit the introduction of particles providing a solid barrier between the drive and the clean area. Secondarily, the drive can be remotely located outside the process tool environment altogether. This places the potentially dirty mechanism in the less clean FAB environment but uses labyrinth seal to protect the process tool environment from the less clean FAB. 4. Drive mechanism with magnetically coupled port plate— this embodiment employs a magnetic coupling between the port plate and the drive mechanism (see FIG. 8 for example but inverted). The magnetic coupling may operate through a non-ferrous wall across an air gap permitting the drive to be isolated outside the clean area. The drive method can be of any type previously described such as lead screw, pneumatic cylinder or linear motor. The later could reside inside the clean area because of its inherent ability to operate cleanly in combination with an air bearing guide to constrain the direction of motion.

Referring now to FIG. 39, there is shown a cross sectional view of a load port 2300A and carrier 2000A interfaced thereto, and a wafer air flow management system in accordance with another exemplary embodiment. The carrier 2000A and load port 2300A may be respectively similar to carriers and load ports of previously described exemplary embodiments. In the embodiment shown in FIG. 39, the port door is opened and the cassette is indexed into the load port chamber and positioned for processing for example purposes. When the carrier is opened and the wafers are positioned for processing the air flow around the wafers may contribute to maintaining the cleanliness of the wafers. For example, depending on the process the wafers may remain in the lowered position for a lengthy time increasing the risk of particles from within the environment depositing on the wafer surface. In addition any contaminants generated by the load port mechanisms could deposit on the wafer surface without proper airflow. In the exemplary embodiment shown, at least a portion of the airflow inside the process environment may be "captured" and redirected to flow across the wafers. The air is then exhausted back to the process environment downstream of the wafer transfer plane (WTP). In the exemplary embodiment, the airflow pattern passes horizontally in a parallel direction to the wafer top surface and exits out the back of the wafer cassette. The exhaust routing pulls the air vertically after it exits the cassette and directs it out an exhaust port directed to the floor. This approach is capable of maintaining a clean constant flow or air across the wafer surface while operating in a open loop or a sealed environment. For example, when the load port operates in an environment with a process dependent gas species like nitrogen or argon, redirecting existing airflow and depositing back into the main stream as shown supports a closed loop environment used for a controlled gas species.

As seen in FIG. 39, in the exemplary embodiment a supply air foil is mounted for example, above the zone where wafers are accessed, to the vertical surface of the process mini-environment. This location is a reserved space for FOUP door openers on the existing SEMI E63 standards. The air foil is designed to capture a volume of the existing laminar air flow from the mini-environment and bend the air stream from a vertical to horizontal direction. In the exemplary embodiment, positioned at the back of the wafer cassette when it is lowered interior of the external skin of the loadport is a diffuser element. The diffuser for example may be constructed of a solid panel which is partially open depending on the flow characteristics. The diffuser is configured to manage the uniformity of the horizontal airflow as it passes over the wafers while providing a pressure differential prior to the air entering the exhaust side of the duct. In the exemplary embodiment, the exhaust side of the circuit be force inducted to ensure a steady and uniform stream of air across the wafers. For example, an axial fan mounted internal to the exhaust side duct with the output directed to the process tool mini-environment port. Alternatively, the unit could be used without a fan and the configuration of the supply air foil, the diffuser and exhaust ducting may be arranged to ensure stable uniform air flow across the wafers.

Figure 40A:
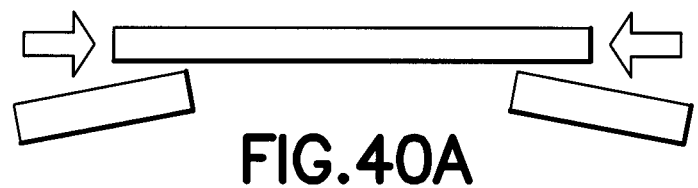
FIGS. 40A-40D are schematic cross sectional views of substrate supports in accordance with different respective exemplary embodiments.
Figure 40B:
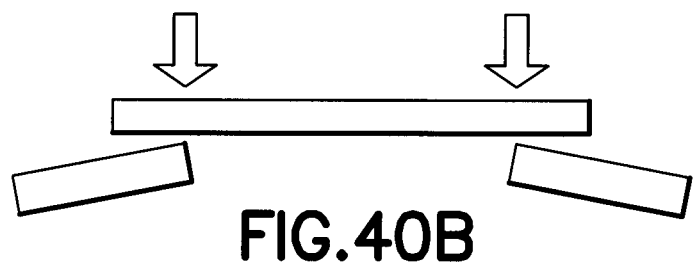
Figure 40C:
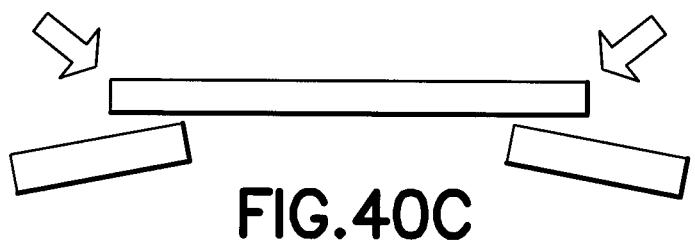
Figure 40D:
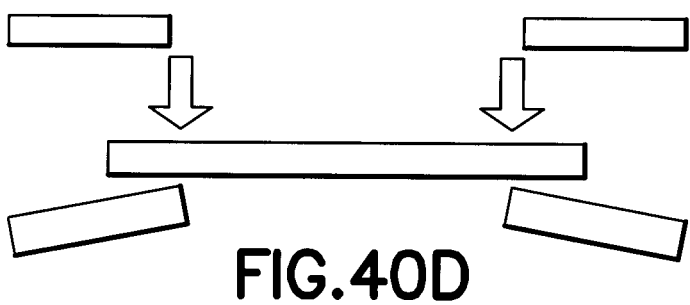

Referring now to FIGS. 40A-40D, there is shown schematic cross sectional views of wafer restraints of an exemplary carrier in accordance with respective exemplary embodiments. The exemplary embodiment shown in FIG. 40A illustrates a radial clamp wafer restraint. Clamping maybe provided by translating side walls of cassette. Mechanism resides within cassette and is actuated either by loadport or the pod shell to cassette interface (Z axis). In alternate embodiments there may be translating side wall internal to pod shell. Mechanism resides with pod shell and is actuated either by loadport, pod shell to port door (Z axis of OHT) or pod to cassette (Z axis of loadport). Use of advanced materials for actuation (i.e. shape memory metals or magnetorestrictive etc.). The exemplary embodiment shown in FIG. 40B illustrates a wafer restraint employing clamping force directed substantially normal to the wafer top surface. In the exemplary embodiment, a vertically translating finger integral to cassette. Mechanism resides within cassette. Mechanism is actuated either by loadport, pod to port door (Z axis of OHT) or pod to cassette (Z axis of loadport). In alternate embodiments, an off-axis translating finger integral to pod shell or cassette. Mechanism can reside on either the cassette or pod shell. Finger translates at an off-horizontal angle to wafer (see FIG. 40C). Mechanism is actuated either by loadport, pod shell to port door (Z axis of OHT) or pod shell to cassette (Z axis of loadport). In another exemplary embodiment a 2 DOF finger integral to pod shell or cassette. Finger rotates then translates vertically to engage wafer (see FIG. 40D). Mechanism is actuated either by load port, pod shell to port door (Z axis of OHT) or pod shell to cassette (Z axis of load port). In alternate embodiments, the wafer restraint in the carrier may have any other suitable configuration. For example, the wafer may be wedged between wafer edge contact supported, such as support fingers on the cassette that form a linear edge contact with the wafer.

Figure 41:
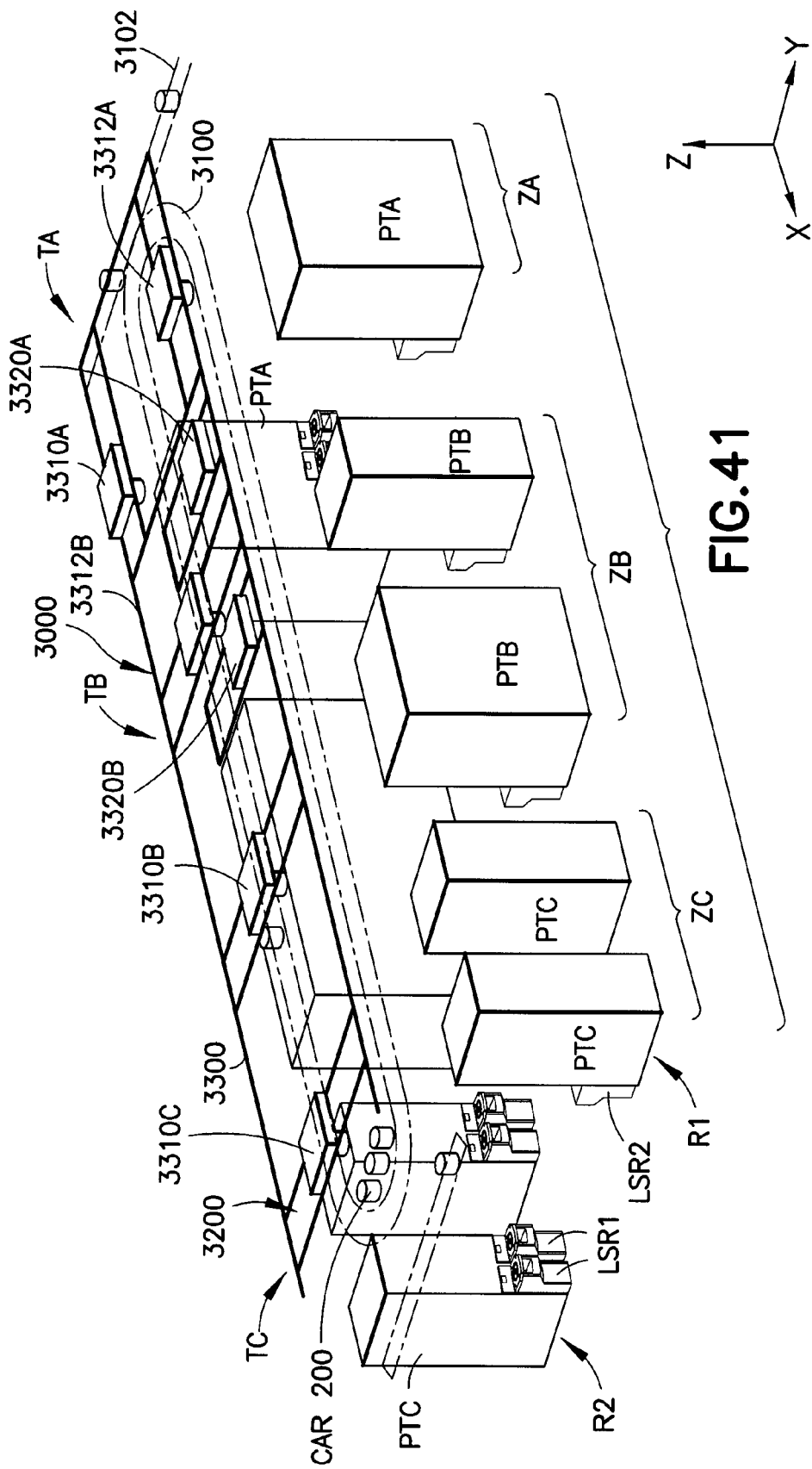
FIGS. 41 and 41A-41B are respectively a schematic perspective view, an end elevation view and a top plan view of a processing system in accordance with still another exemplary embodiment.
Figure 41A:
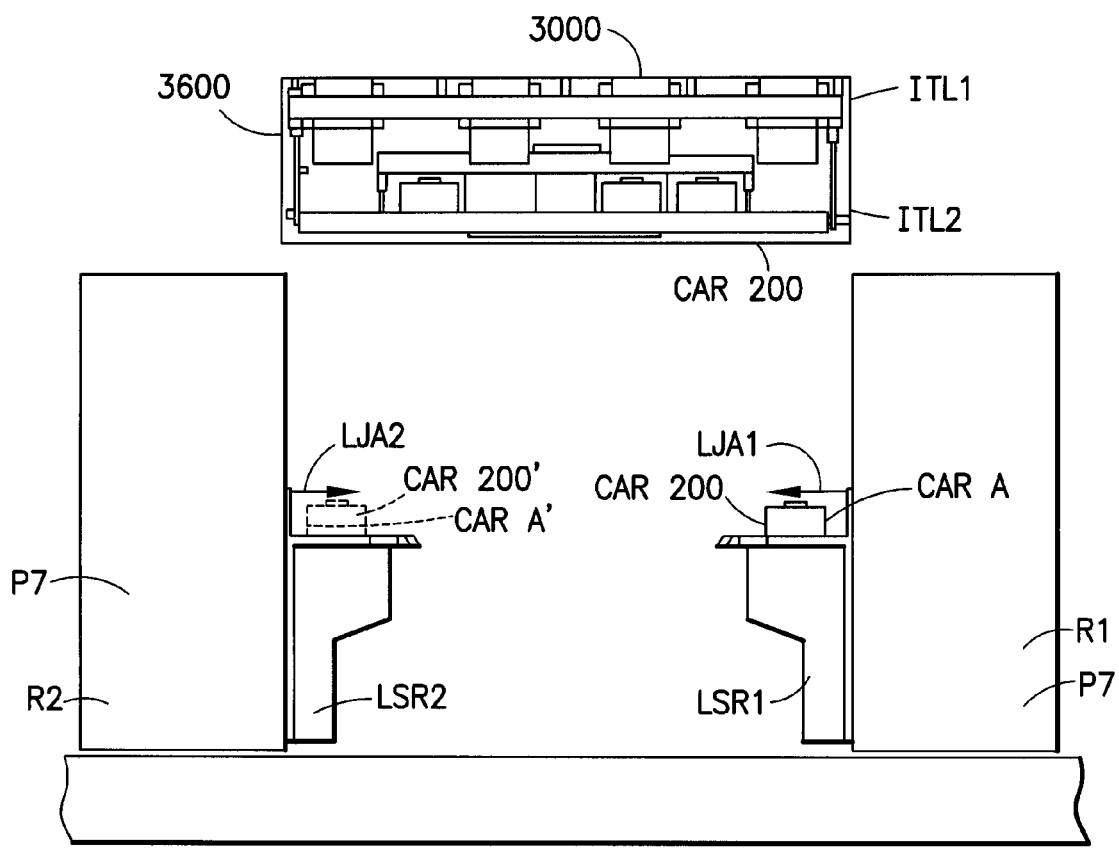
Figure 41B:
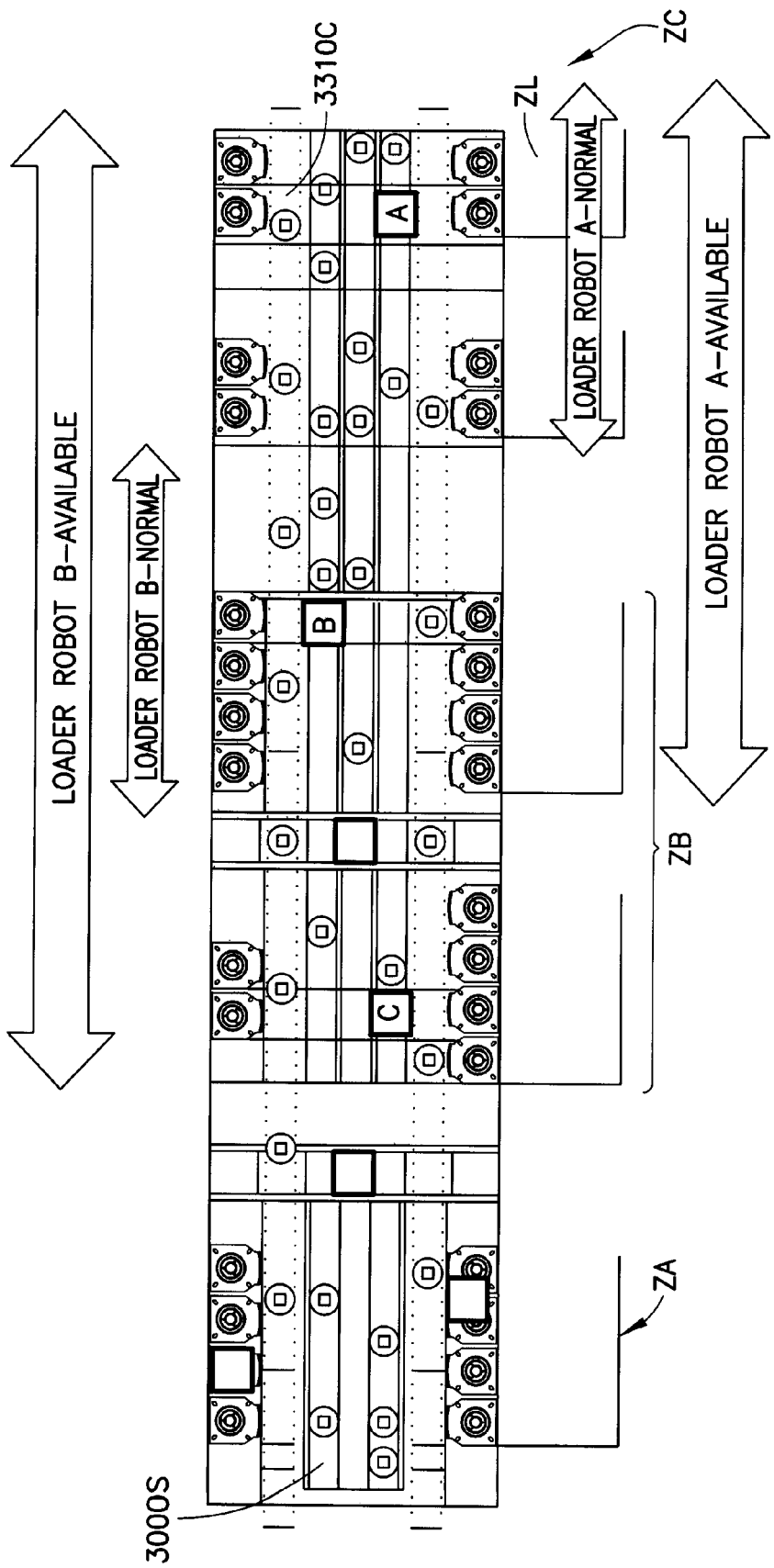

Referring now to FIGS. 41-41B, there is shown respectively a schematic perspective view, an end elevation view, and top plan view of a representative processing arrangement with processing tools PT and a transport system in accordance with another exemplary embodiment. The processing tools PT are illustrated in an exemplary array such as tools arrayed in a processing bay of a FAB. The transport system 3000 in the exemplary embodiment may service the tools of the processing bay for example, the transport system 3000 may be an intra-bay portion of a FAB wide transport system. The transport system 3000 in the exemplary embodiment may be generally similar to a section of the AMHS system exemplary embodiments described previously and shown in FIGS. 29A-29D. The transport system 3000 may communicate with other (e.g. interbay) portions 3102 of a FAB AMHS system via suitable transport interfaces seen in FIG. 41. As noted before, the arrangement of the processing tools PT in the tool array shown is merely exemplary, with multiple tool rows (in the example two rows R1, R2 are shown, but alternate embodiments may have more or fewer tool rows). In the example shown, the tool rows may be arranged substantially parallel (geometrically, but may be angled relative to each other) and may define substantially parallel process directions. Process direction along different tool rows may be the same or opposite to each other. Also process direction along a given row may reverse so that the process direction along one portion or zone of the tool row may be in one way and the process direction of another portion or zone of the same tool row may be the opposite way. The process tools in row R1, R2 may be distributed to define different process zones ZA-ZC (see for example FIG. 41). Each process zone ZA-ZC may include one or more process tools in rows R1, R2. In alternate embodiments, a process zone may have tools located in but a single row. As may be realized, the process tools in a given zone may be process related, such as having complementing processes and/or having similar tool throughput rates. For example tool zone(s) ZA may have tools with a high throughput, (e.g. about 500 wafers per hour (WPH)), tools with medium throughput (e.g. roughly 75 WPH to less than 500 WPH) may be located in zone ZB, and tools with a low throughput (e.g. roughly 15 WPH to 100 WPH) may be located in zone ZC. As may be realized, the tools defining any given zone may not be identical, and one or more tools within a given zone may have a throughput or process that may be different than the other tools in the given zone, but a relationship may nevertheless exist between the tools in the zone so that it is organizationally appropriate, at least with respect to a transporting aspect, to have the tools organized within the same zone. The tool zones illustrated in FIG. 41 are merely exemplary, and the tool zones may have any other desired arrangement in alternate embodiments.

Figure 46:
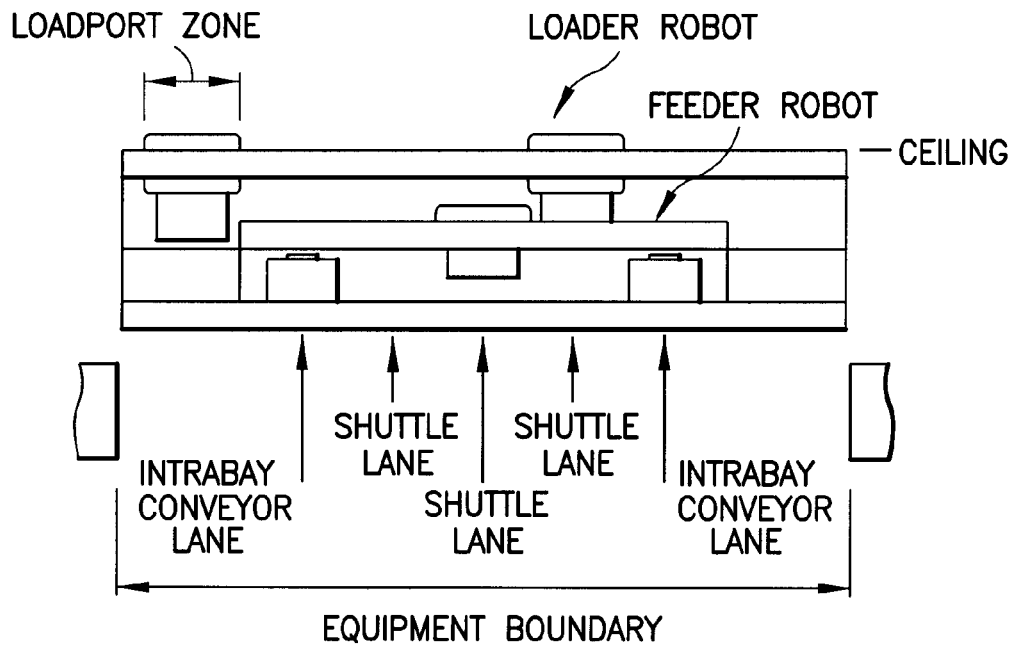

As seen in FIG. 41, the transport system 3000 is capable of transporting carriers to/from tools. The transport system 3000 may be generally similar to the transport system in the previously described exemplary embodiment and shown in FIGS. 29-35. In the exemplary embodiment shown in FIGS. 41-41B, the transport system 3000 may have an overhead configuration (e.g. transport system is located above/over the tools). In alternate embodiments, the transport system may have any other suitable configuration, such as having an underneath configuration (e.g. transport system is located underneath the tools for example similar to the transport system illustrated in FIG. 30-33). As seen in FIGS. 41-41B, the transport system may generally have a number of transportation sub-systems or sections. In the exemplary embodiment, the transport system 3000 may generally have a bulk material/rapid transport section 3100, such as a conveyor section (e.g. similar to the solid-state conveyor previously described and shown in FIGS. 20-25B or any other suitable conveyor). The conveyor section may extend through all tool zones, and may transport carriers, for example, at a substantially constant transport rate without stopping/slowing when carriers are placed/removed from the conveyor section. The transport system 3000 in the exemplary embodiment may also include storage stations/locations 3000S (see also FIG. 41B), shuttle system section 3200 with shuttles 3202 capable of accessing one or more storage stations/location (see also FIG. 42), and an interfacing transport system section 3300. In the exemplary embodiment, the interfacing transport system section may be capable of accessing carriers transported by the bulk transport conveyor section 3100, or at the storage stations, and transferring the carrier to loading sections of the processing tools. In the exemplary embodiment, the storage stations, shuttle system section 3200 and interfacing transport system section may be formed in selectably installable portions capable of selectable installation along the transport system. In the exemplary embodiments, the transport system sections 3100, 3300, 3200 may be modular for ease of installation of the portions of the system sections selected for installation in the transport system. The portions of the transport system shuttle system, interface system, and storage system sections selected for installation along the transport system may correspond to the zones ZA-ZC of the processing tool. As may be realized, the transport system 3000 may be configurable to correspond to the processing tools or processing tool zones. Moreover, in the exemplary embodiment the transport system may be configurable in zones TA-TC, generally commensurate with and corresponding to the processing tool zones ZA-ZC. Thus, the transport system may have different zones with different system sections configurations. In the exemplary embodiment, the storage system and shuttle system sections may be configurable in each zone TA-TC of the transport system. Also, in the exemplary embodiment, the interface transport system section may be configurable in each zone. The interface transport system, in the exemplary embodiment may have selectably installable interface transporter (in the example shown in FIG. 41 gantry) portions 3310, 3320 that may be added, removed and may be installed in a number of different orientations in each transport system zone TA-TC. The desired interface transport system portion, may be installed in the transport system zones to provide a desired tool interface and access rate, for example commensurate with the throughput rate of the process tool of a corresponding tool zone ZA-ZC. As seen best in FIG. 41A, the interface transport system section may have a selectably variable number of transporter travel planes (e.g. some zones TC may have a single interface transporter travel plane, see FIG. 48, and other zones TA, TB may have more than one transporter travel plane ITC1, ITC2, (see FIGS. 41A, 46). In the zones with multiple planes, transporters may be capable of traversing past one another. Though two planes are shown, more or fewer transporter planes may be provided. Although in the exemplary embodiment the transport system is arranged with the travel planes substantially horizontally, in alternate embodiments the transport system may have any other desired arrangement including having vertical travel planes for interface transporter bypass.

The Overhead Gantry System (OGS) can be configured for low, medium, or high throughput. Changing factor or process capability can be met through field reconfigurable modular assemblies. These modular assemblies can be broken for example into three categories; low throughput, medium throughput, and high throughput. Arrangement of the various modules may be dependent upon many factors such as desired move rate, storage capacity, and distribution of the desired throughput in a bay.

Low Throughput: By way of example, low throughput tools or tool zones can be sufficiently accommodated with a single gantry 3310. This configuration may provide all the desired moves without the use of a "feeder" robot 3320 or a shuttling system 3200. The gantry may pick carriers from the intrabay conveyor and transfer to a storage location in addition to transferring carriers from storage to the tool. In order for carriers to be moved to an adjacent gantry zone, the carrier may be placed on the intrabay conveyor or placed in a storage nest for retrieval by the adjacent gantry. With this configuration one gantry to cross past another gantry until the intervening gantry has moved. In situations where two or more gantries are working side by side one fails, the adjacent gantry can take on the work of the failed unit. Although the work capacity will decrease, it will not be shut down completely.

Figure 47:
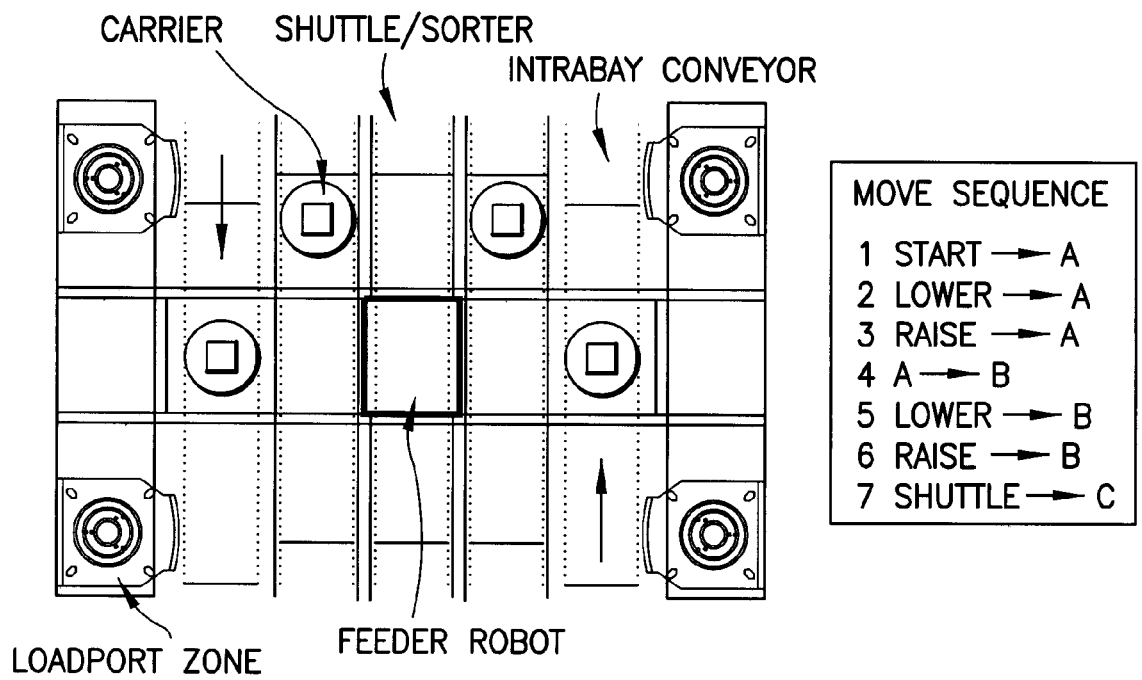

Medium Throughput: For example, a medium throughput tool or tool zone can be satisfied with the addition of a "feeder" robot 3320 (e.g. an additional gantry/transporter level). This configuration is generally similar to the low throughput arrangement with the addition of a feeder robot 3320 and sorter/shuttle 33200. In the exemplary embodiment, the feeder robot and sorter/shuttle may be dedicated device for executing intrabay conveyor to storage moves only. For every feeder robot it may be desired to employ two gantry loader robots 3310, 3312 on either side (see FIG. 44) of the feeder. However, in alternate embodiments, the feeder may be paired with one loader robot. The sorter/shuttle's purpose is to accept the carrier from the feeder and queue it for storage. With this configuration the "loader" robot can focus on storage to tool moves and vice versa without the added burden of picking carriers from the intrabay conveyor. The system can work with adjacent low, medium, or high throughput modules. In the event of a loader robot failure it is possible for an adjacent loader robot to move in and work the failed robot's zone. (see FIGS. 46 and 47). If a feeder mechanism was to fail, the individual loader robots behave in the same manner as the low throughput configuration. In both failure cases the system remains active but at a reduced capacity.

High Throughput: By way of example, for high throughput applications the gantry modules can be reconfigured to meet the demand of the specific tool or tool zone. The high throughput arrangement may have a loader robot on each side of the bay, a similar feeder robot arrangement as in the medium throughput zone, and a similar sorter/shuttle for queuing the carriers to storage. (see FIG. 45). The loader robot is responsible for the tool located on one side of the bay, which allows for shorter moves. Carriers enter and exit the high throughput zone via the intrabay conveyor system. The high throughput configuration has fault tolerance to both a loader robot failing and/or the feeder robot failing. If a loader robot was to fail the other loader robot may work both sides of the bay after the failed robot is moved out of the zone. If the feeder fails the loader robots become responsible for picking carriers from the intrabay conveyor system. If both a loader robot and a feeder robot fail, one loader robot becomes accountable for all desired moves.

Figure 50:
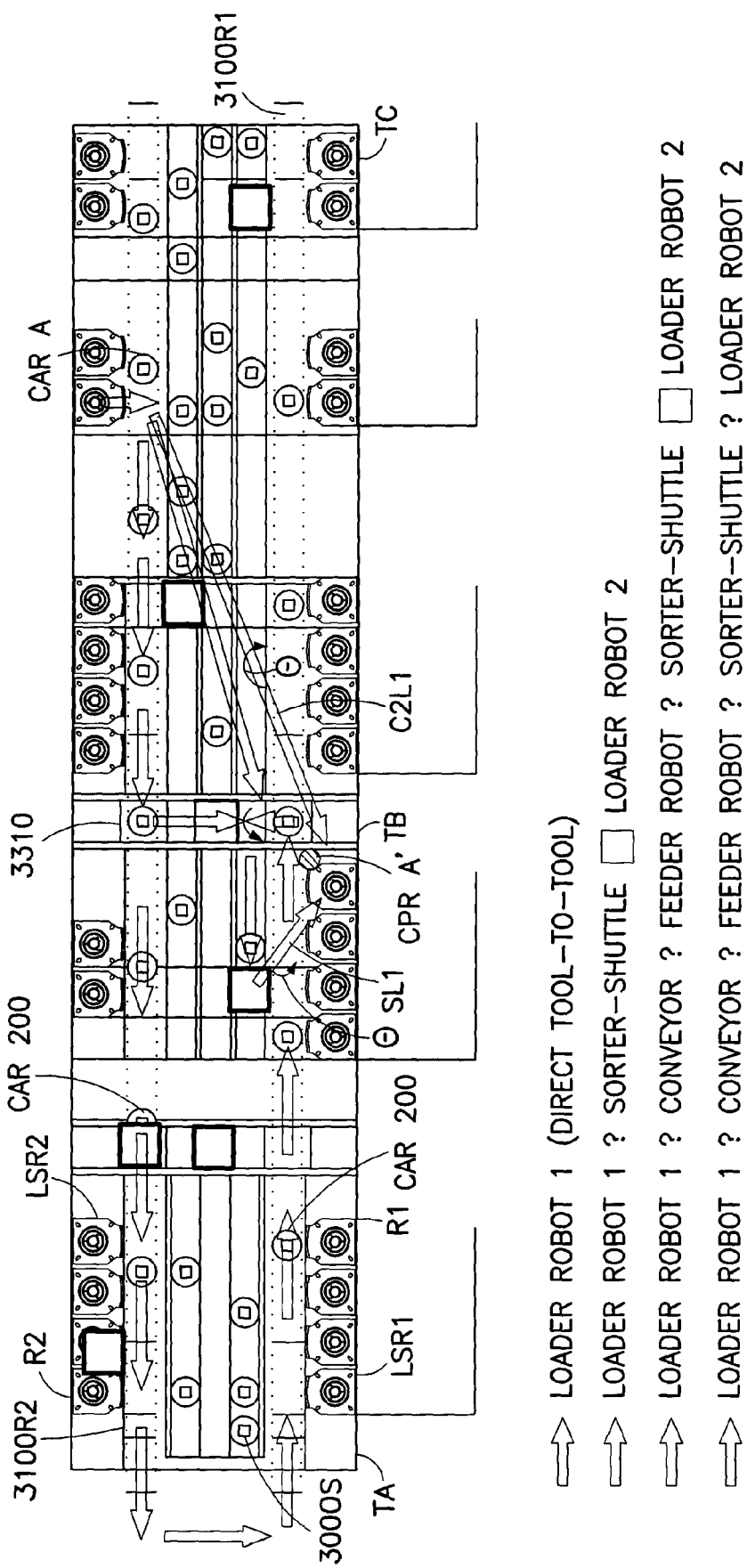
FIG. 50 is another schematic plan view of a processing system in accordance with another exemplary embodiment.

Each configuration; low, medium, and high can operate as a single entity or adjacent to any of the three arrangements depending on the desired move rate. The system does not have any single point failures that completely incapacitate the flow of carriers through the system. In addition to fault tolerance for individual or multiple component failures, the system can exploit multiple available move paths for a carrier. The host controller employs a standard set of moves with successive levels of priority moves for a particular carrier under normal operating conditions. To overcome periodic surges in carrier traffic, tool failures, or upstream restrictions, a host's control logic can initiate schemes to reroute and divert carrier flow away from problem areas. FIG. 50 demonstrates the many methods to move a carrier from point A to B in accordance with the exemplary embodiment.

In the exemplary embodiment the "feeder" robot may retrieve carriers from the intrabay conveyor system and place them in the appropriate storage location. If desired the feeder robot allows the tool loading robot to focus solely on storage to tool moves and increases the systems total move capacity. The feeder utilizes quick short moves allowing the intrabay conveyors to move with limited or no interruption (e.g. no conveyor interruption may exist when accessing carriers from access lanes similar to FIG. 20). The feeder mechanism relieves the workload of a gantry system. Anticipated drive mechanisms to support the various motions include linear motors, ball screws, pneumatic drives, belt drives, friction drives, and magnetic propulsion. The following embodiments can be implemented based on the previously described premise:

1. The feeder robot is similar to the gantry loading robot except it is fixed in the x direction (length of the bay) and has degrees of freedom in the y (transverse to bay) and Z (vertical) directions. The feeder mechanism is located on a plane below the tool loading robot to allow the loader robot to pass over without a payload. The area above the load port zones is free to allow the loader robot to move across the feeder with a payload. The feeder system is vertically located such that when the vehicle is in the raised position it can pass over the intrabay conveyor and have enough space to move over and grasp a carrier. The feeder accesses carriers from above, utilizing short vertical strokes to pick and place carriers from the intrabay conveyor system to the storage flange desired. In this configuration the storage lanes exist coplanar to the intrabay conveyors. The storage lanes possess a bi-directional sorter/shuttle mechanism used to shuttle a carrier to the next location along the storage row. The shuttle drive mechanism is designed for example such that it can move a carrier at least one pitch distance along the length of the bay. A pitch distance can be defined as the distance that allows the gantry tool loading robot to travel adjacent to the feeder robot and pick the carrier without interference. The sorter/shuttle is also used to transport carriers between adjacent loader robot zones and storage lanes when desired. For example, a carrier move sequence is as follows:

Intrabay conveyor momentarily stops at feeder robot's fixed X position along the bay length.
Feeder robot travels from previous Y position to location directly above carrier on intrabay conveyor.
Feeder robot picks carrier.
Feeder robot travels in Y direction (transverse to bay) to specific shuttle lane.
Feeder robot places carrier onto shuttle and proceeds to next move.
Shuttle/sorter mechanism drives carrier in X direction.
Gantry tool loading robot moves to storage location, then picks and places carrier to the appropriate tool.

Examples of some of the advances of the system in accordance with the exemplary embodiment are increased wafer throughput over conventional systems, multiple move paths to complete carrier moves, and increased fault tolerance.

Figure 48:
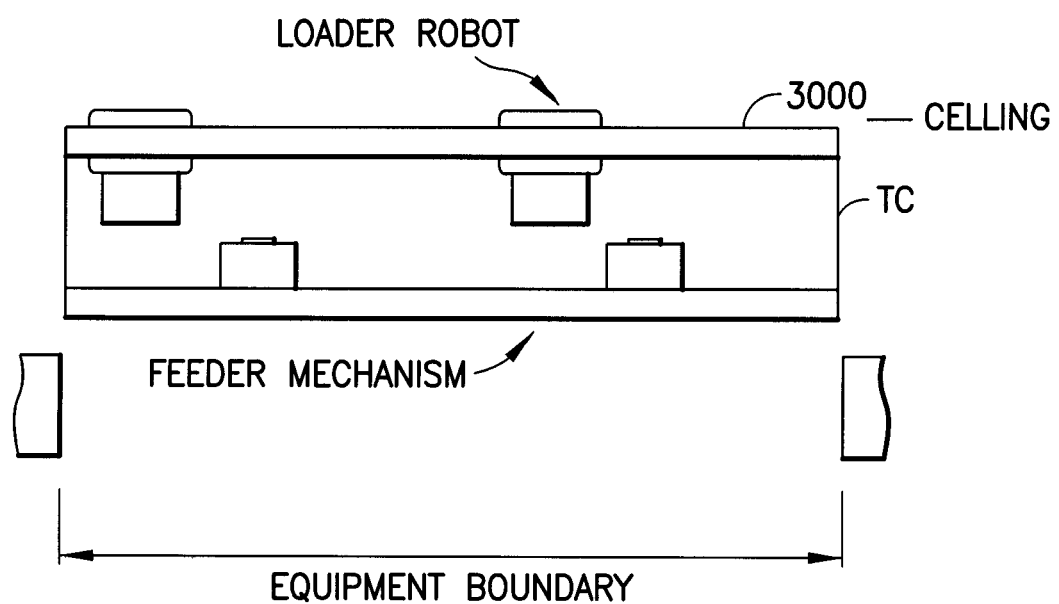
FIG. 48 is a schematic elevation view of the system in accordance with still another exemplary embodiment.

In accordance with another exemplary embodiment shown in FIG. 48, the feeder robot is implemented as a linear stage that resides on a plane just below the shuttle and intrabay conveyor system. The stage has the same degrees of freedom as embodiment 1 and grips the carrier from below rather than above. Once the carrier is captured from the intrabay conveyor it is driven transverse to the bay and release on the appropriate shuttle. This architecture has the benefit of allowing the conveyor lanes to be positioned anywhere between the equipment boundary. For example, the intrabay conveyors could exist in the center rather than the outside as in embodiment 1. Another advantage with this arrangement is the loader robot can now pass over the feeder mechanism with payload in any Y position in the bay whereas with embodiment 1 the loader is limited to performing this move only when it is located inside the load port zone. Furthermore, there is no need for the loader robot to communicate with the feeder geometry for collision avoidance. Both the feeder and loader robots can occupy the same vertical space with payloads and not interface with one another. The move sequence for this configuration is the same as embodiment 1 with the exception of grasping carriers from below rather than above.

Figure 49:
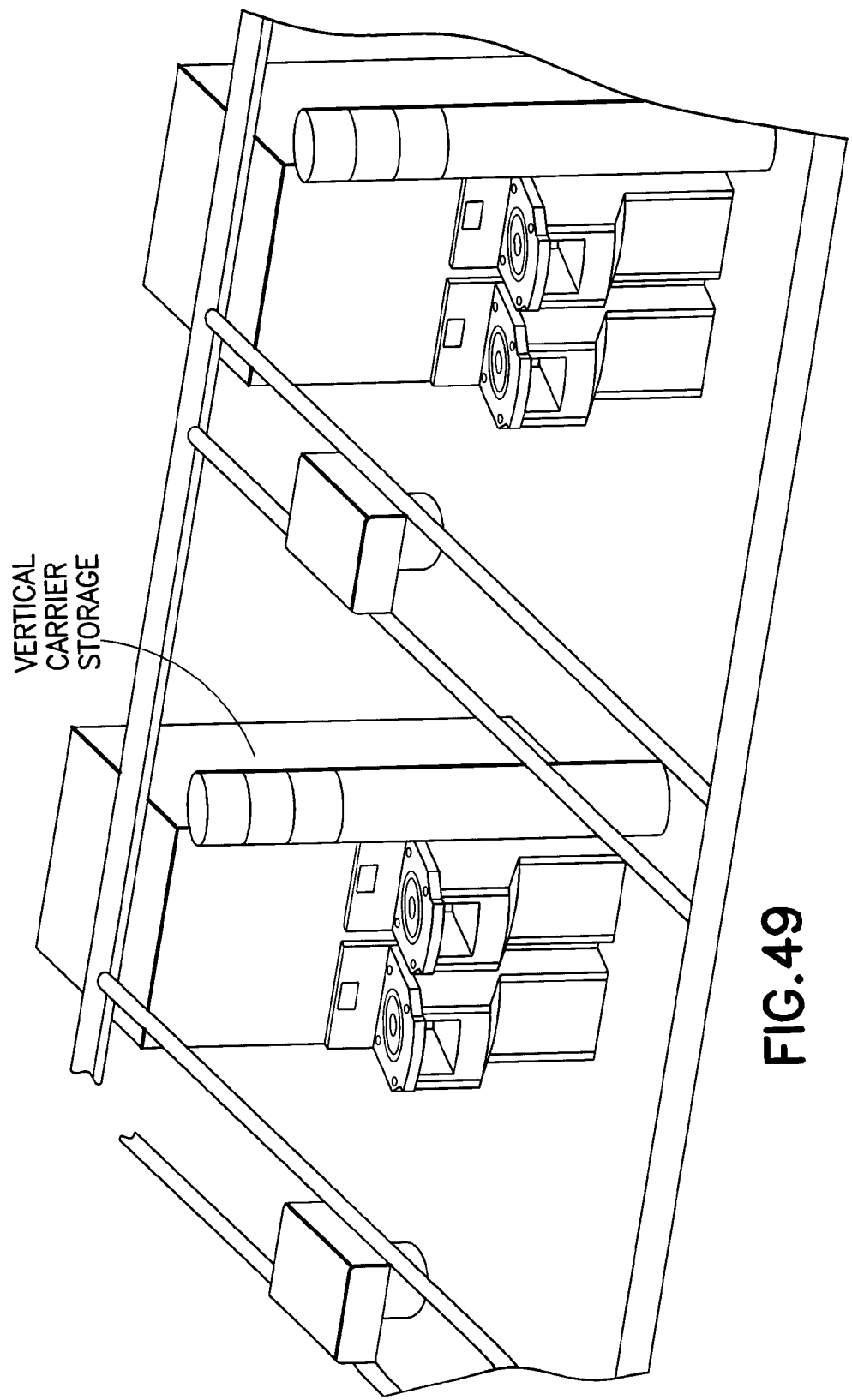
FIG. 49 is a schematic a partial perspective view of the system in accordance with yet another exemplary embodiment.

In alternate embodiments, the overhead or mechanism from below can move in the X (length of bay), Y (transverse to bay), and Z (vertical) directions. In this configuration a shuttle/sorter may not be used because the 3 axis feeder can move to the specific storage lane and slot as necessary. For example, a carrier is removed from the intrabay conveyor, positioned to the appropriate storage lane then translated perpendicularly to the initial queuing the carrier in storage. As seen best in FIG. 49, in accordance with an other exemplary embodiment, increased storage capacity may be generated by providing vertical storage columns that allow for carrier storage in a volume consistent with the carrier geometry that extends from the FAB floor to the highest reachable point by the OHT system can be arranged throughout the length of the bay.

As may be realized, in the exemplary embodiment, such as illustrated in FIG. 41, the interface or loading and unloading stations (see also for example FIGS. 37A-37C and 39) of process tools PT served by transport system 3000 may have different facings relative to each other. The facing of a loading station and/or process tool as described hereafter may not specifically refer to the position or orientation of any side or face of the loading station or process tool, but rather refers to the characteristics (whatever they may be) of the loading station or process tool that specify a predetermined orientation of the loading station and/or process tool relative to the carriers mated to the loading station and/or wafers loaded from the carriers into the process tool. Carriers, transported by transport system 3000 to and from the process tools PT, when mated to the loading stations of different tools, with different facings, may be mated in different orientations corresponding to the facing of the respective loading stations. Hence carriers mated to loading stations of different process tools, served by transport system 3000, may have different orientations relative to each other. The seating interface mating carriers to the loading stations(s) of process tools may be polarized to permit mating with the carrier in the desired orientation, for example corresponding to the facing of the loading station. Carriers (that may be generally similar to carriers 200 in FIGS. 1-5, and 36A-36D) may not have an isomorphic configuration with respect to mating to the loading station(s) of process tools PT. By way of example, the carriers may have a casing or housing, that may be generally isomorphic in appearance or shape (see for example FIGS. 1 and 36A), but may be loaded with substrate(s) in a desired orientation relative to the reference frame of the process tool(s). Thus, when mated to the loading station(s) of the process tool(s) PT the carriers may be loaded so that the substrate(s) therein are in the desired orientation specified for the processing tool. In alternate embodiments, the carrier casing may have a non-isomorphic shape (e.g. the carrier may be similar to a FOUP, having a casing such as with a substrate transfer opening in but one desired side or face of the casing) defining a desired orientation for mating the carrier to the loading station of the process tools. In the exemplary embodiment, the carrier(s) CAR 200 may have suitable discriminators or indicia (for example structural or electronic) to indicate orientation of the carrier. As may be realized, the control system (not shown) of the transport system 3000 may be suitable configured or programmed to identify and/or track the orientation of the carrier(s) CAR 200 from the discriminators or indicia of the carriers as the carrier of the transported between tools PT, throughout the FAB by transport system 3000. The control system may also be configured or programmed to relate the orientation of the carrier(s) CAR 200 to the facing of the loading stations so that carriers may be loaded and mated by transport system 3000, to the loading station(s) in an orientation corresponding to the given facing of the loading station. In the exemplary embodiment illustrated in FIGS. 41 and 50, the transport system 3000 may include, what may be referred to for description purposes, as a θ drive system 3600 arranged to provide independent θ motion (e.g. rotation of the carrier, such as indicated in FIG. 41A, to change carrier orientation) to the transported carriers. Drive system 3600 of the transport system 3000 may effect θ motion or rotation of the carriers independent of carrier movement in any other direction (such as in the x, y, z directions see FIG. 41) as will be described further below. Thus, transport system 3000 in the exemplary embodiment may be capable of four degrees of freedom movement (x, y, z, θ) for transporting carriers to and from process tools. In alternate embodiments, the transport system may have carrier transport movement with more or fewer degrees of freedom. In the exemplary embodiment, the θ drive system 3600 may be arranged to effect independent θ motion of the carrier with the carrier "on the fly" as will also be described further below.

As has been noted before, the process tools PT may have loading stations LSR1, LSR2 with different facings, relative to each other, that may cause the carriers to be placed on the loading stations, by transport system 3000, in different loading orientations (corresponding to the facing of the loading stations). Referring again to FIGS. 41 and 50, in the exemplary embodiment illustrated, the process tools PT served by transport system 3000, may be arranged in rows R1, R2 (though as has also been noted before, in alternate embodiments, the process tools, and their corresponding loading stations may be located in any desired arrangement that may or may not use rows or columns and may have any desired array or serial arrangement). As seen best in FIG. 41A, in the exemplary embodiment the process tools PT in the respective rows R1, R2 may be positioned so that the corresponding loading stations LSR1, LSR2 of the process tools may be generally facing each other. Accordingly, as may be realized from FIG. 41A, the loading stations LSR1 or process tools in row R1, may be facing in a direction (indicated by arrow LSA1 in FIG. 41A) that may be substantially opposite (e.g. about 180° apart) than the facing direction (indicated by arrow LSR2) of the loading stations LSR2 in row R2. The facing directions of loading station may be similar in each row (e.g. loading stations LSR1, LSR2 in corresponding tool rows R1, R2 may generally be facing in directions LSR1, LSR2 respectively), though in alternate embodiments, one or more tools in one or more rows may have loading stations with different facing than other loading station(s) of tools in the same tool row. In other alternate embodiments, the loading stations may be facing in different directions more or less than 180° apart. In still other alternate embodiments, the loading stations of tools served by the transport system may have a similar facing direction. FIG. 41A shows, for example purposes, CAR 200 mated to loading station LSR1. The carrier CAR 200 on the loading station LSR1, in the embodiment shown, may be oriented (as indicated by orientation features CAR A, depicted schematically for example purposes) to correspond to the facing (indicated by arrow LSA1) of the loading stations LSR1. FIG. 41A also shows the carrier CAR 200' (indicated in phantom) when mated to loading station(s) LSR2 oriented (as indicated by feature CAR A') to correspond to the facing (indicated by arrow LSR2) of loading station LSR2. As may be realized from FIG. 41A, in the exemplary embodiment the orientation of carriers CAR 200 mated to loading station(s) LSR2 may be about 180° from the orientation of carriers when mated to loading station(s) LSR1. In alternate embodiments, the difference in the orientation of carriers mated to loading stations with different facings may be more or less than 180°. In the exemplary embodiment, transport system 3000, for example using θ drive system 3600 is capable of rotating the carrier CAR 200 (such as θ rotation) to orient the carrier to the desired orientation CAR A, CAR A' for mating the carrier with the desired loading station. As may be realized from FIG. 41A, the θ drive system 3600 of the transport system 3000 may be capable of effecting θ rotation of the carrier of about 180° and, in the exemplary embodiment θ rotation of the carrier CAR 200 by the θ drive system 3600 may be about 270° as will be described further below. In alternate embodiments, the θ drive system may be capable of effecting θ rotation of the carrier in any desired amount.

Figure 42:
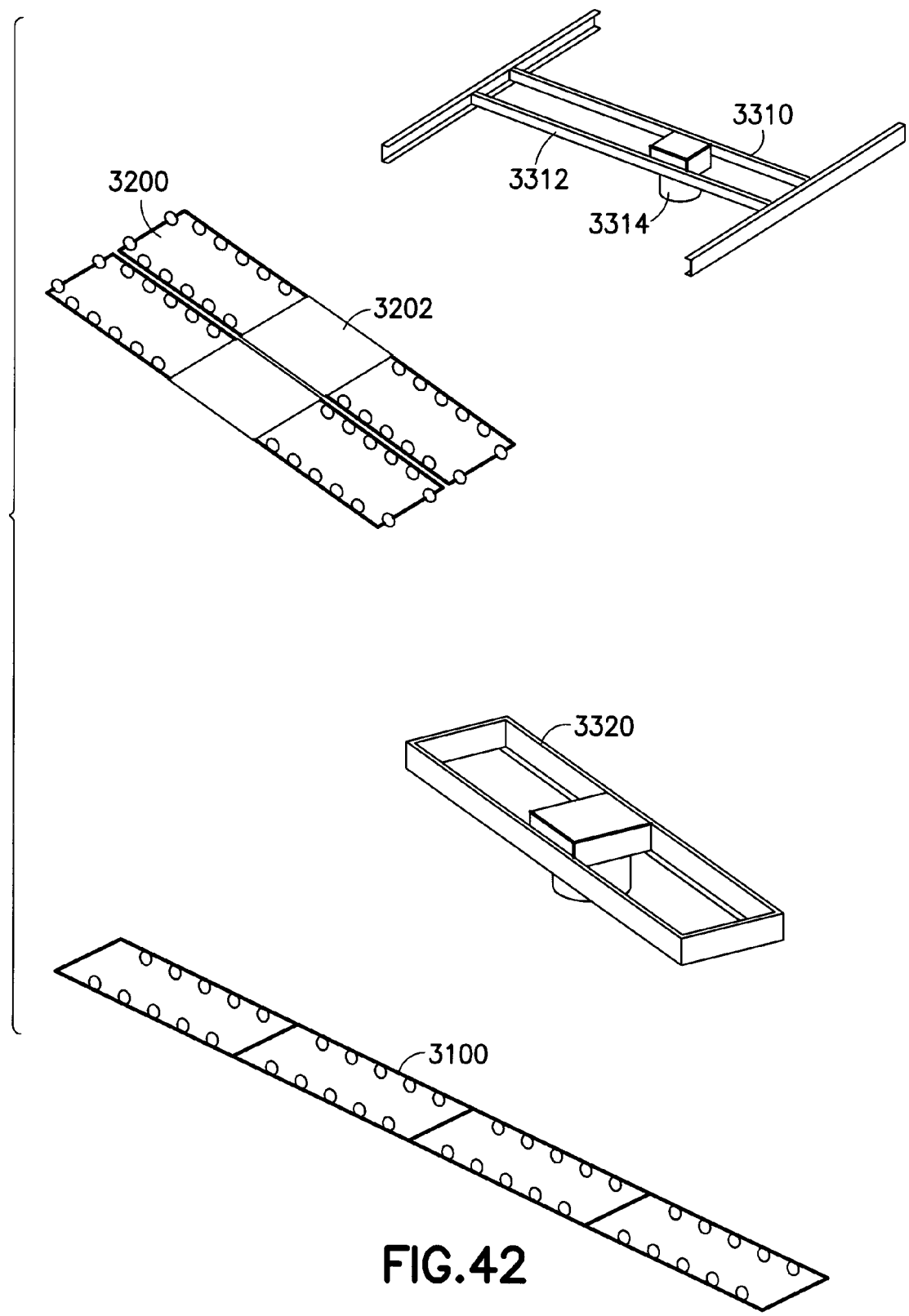
FIG. 42 is a schematic exploded perspective view of sections of the system in FIG. 41.

Referring still to FIG. 41, in the exemplary embodiment, the transport system 3000, as described before, may generally comprise rapid transport section 3100 (such as a conveyor or other suitable mass or bulk material transport without or with discrete transport vehicles) and an interface transport system section 3300 (interfacing carriers between the rapid transport section and tool loading stations so that transport section 3100 can, when operative, maintain substantially continuously a substantial constant transport rate independent of loading and unloading of the container to the loading stations). In FIG. 42, the interface transport section 3300 is illustrated as having an overhead gantry 3310 configuration for example purposes, and in alternate embodiments, the interface transport section may have any other suitable configuration. In the exemplary embodiment shown in FIG. 42 the gantry(ies) 3310 (the interface transport system may be modularly configured with a desired number of gantries) may generally comprise a translation platform 3312 with traverser 3314 arranged to provide two axis travel (e.g. x, y axes, see also FIG. 41). The traverser 3314 may have any suitable configuration and may include a hoist device so that the carrier grip of the gantry, for capturing and holding carrier(s) CAR 200, may be for example raised and lowered, thus effecting Z axis travel. A suitable example of a traverser vehicle may be the Aeroloader™ transport vehicle available from Brooks Automation, Inc. As was noted before, the gantry 3310 may be arranged (see also FIGS. 43-45) to pick or place carriers off or on the conveyor section 3100 and to pick and place carriers onto the loading station(s) of the process tools. In the exemplary embodiment, storage stations 3000S may also be provided (see for example FIG. 41B), and the interface transport section (e.g. gantry 3310) may access containers on any of the transport conveyor sections 3100, or at the storage stations 3000S or at the loading stations of the process tools, and may move the carriers CAR 200 therebetween in any desired sequence as has been described before. As noted before, FIG. 50 illustrates representative examples of some carrier moves, such as between any of the conveyor section 3100R1, 3100R2 and any loading station LSR1, LSR2 in either tool row R1, R2, or between any two loading stations LSR1, LSR2 in the same or different tool rows, or between any loading station LSR1, LSR2 and storage stations 3000S, that may be effected by the gantry 3310 of the interface transport section 3300.

Figure 42A:
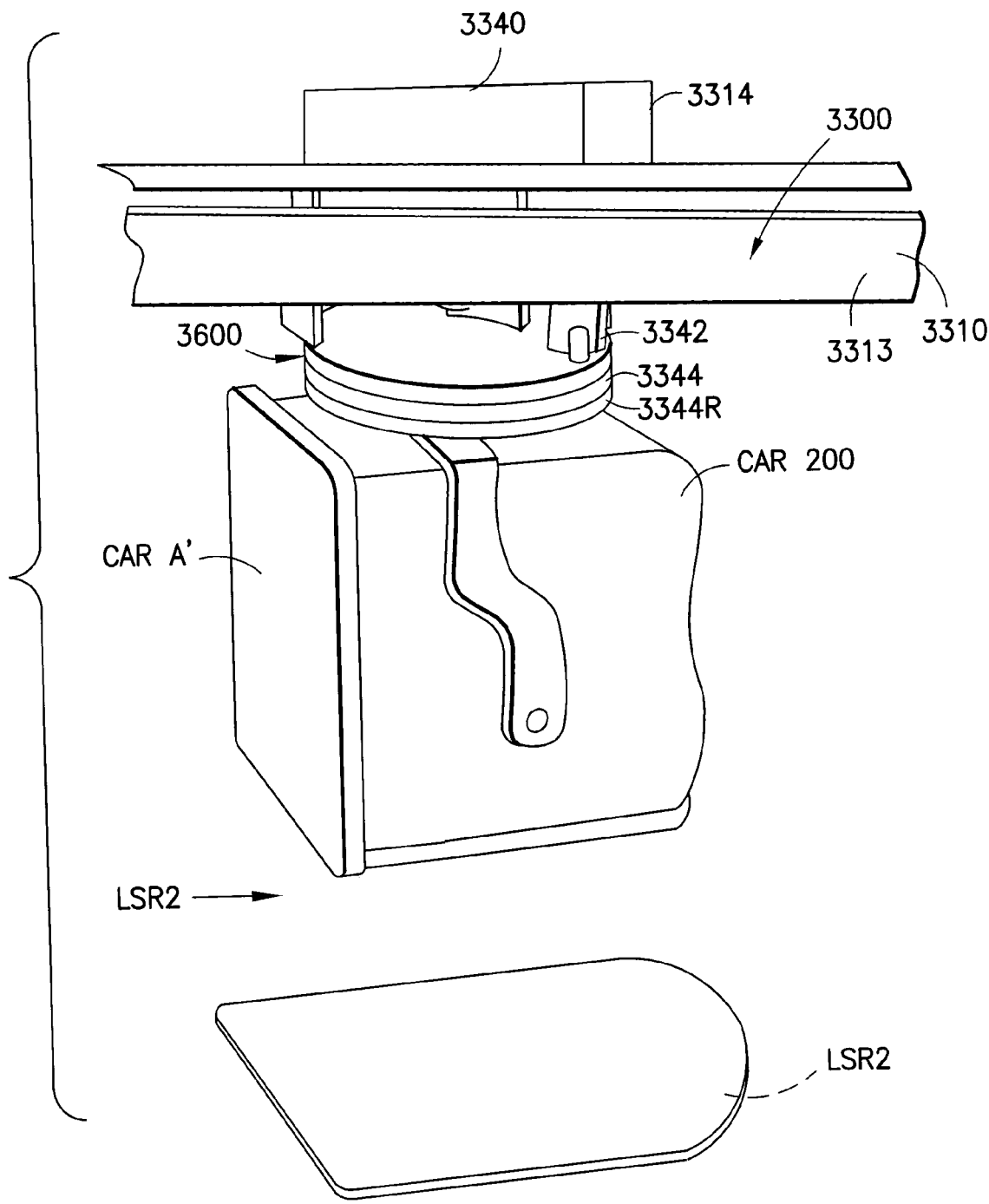
FIGS. 42A-42B are respectively schematic partial perspective views of another section of the transport system in FIG. 41 and carrier in different positions.

In the exemplary embodiment, the gantry 3310 may include the θ drive system 3600 as will be described further below. As seen in FIG. 50, in the exemplary embodiment the carrier CAR 200 may be rotated (as indicated by arrow θ) such as during transport by the interface transport section 3300, to change carrier orientation as desired. By way of example, when being conveyed by the conveyor sections 3100R1, 3100R2, the carrier(s) CAR 200 may have any orientation. In other words, the orientation of the carrier(s) CAR 200 on the conveyor transport may be different than the orientation in which the carrier is positioned at the loading station LSR1, LSR2. For example, the carrier CAR 200 may be positioned on conveyor transport 3100R2 in an orientation (indicated by feature CAR A shown in FIG. 50) that may be about 270° (clockwise) from the desired orientation (indicated by feature CAR A') of the carrier when mated to its destination loading station. The carrier CAR 200 may be moved by the gantry(ies) 3310 of the interface transport section 3300 from the conveyor 3100R2 to the desired loading station LSR1, generally as indicated by arrow C2L1 in FIG. 50. In the exemplary embodiment, orientation of the carrier may be changed by the transport section during the move (e.g. θ rotation of about 270° clockwise) from the initial orientation (indicated by feature CAR A), on the conveyor, to the desired loading orientation (indicated by feature CAR A') for mating the carrier CAR 200 to the loading station LSR1. FIG. 42A is a partial schematic perspective view of gantry 3310 of the interface transport section 3300 in an exemplary position with the carrier CAR 200 held by the traverser 3314 in proximity to a representative loading station LSR2. The carrier CAR 200 is shown hoisted, by the gantry proximate to the loading station LSR2 and oriented to correspond to the facing of the loading station. The position shown may be representative of positions prior to mating or after unmating the carrier from the loading station. As may be realized, the carriers transported by the transport system 3000, such as along move paths shown in FIG. 50, (e.g. move path C2L1) for loading and unloading loading stations LSR1, LSR2 may be positioned by the gantry 3310 as shown in FIG. 42A. In the exemplary embodiment, the θ rotation of the carrier CAR 200 to change orientation, such as to allow mating with the load station, may be effected "on the fly" as the gantry is moving the carrier to the loading station. The θ rotation of the carrier may be effected at any desired time during the carrier move by the gantry. In alternate embodiments, the θ rotation of the carrier may not be performed "on the fly". In the exemplary embodiment, the gantry may unload the carrier from the loading station LSR1, LSR2 and move the carrier to the desired conveyor 3100R1, 3100R2 and may change the orientation of the carrier, by θ rotation during the move. For example, the carrier may be rotated to preposition the carrier in a desired orientation, such as an orientation corresponding to its next expected destination or loading station (both the next expected destination and its corresponding carrier orientation may be identified by the transport system controller). As noted before, carriers CAR 200 when moved between conveyor transports 3100R1, 3100R2 and loading stations LSR1, LSR2 or between loading stations in the same or different tool rows R1, R2 may be stationed, at least temporarily at one or more carrier storage stations 3000S. The orientation of the carriers when positioned in the storage station(s) may also be different from desired carrier orientation when mated to the loading stations. For example, the carrier when placed into the storage station 3000S, such as by interface transport section 3300 (e.g. gantry 3310 or feeder robot 3320, see also FIGS. 42, 44) may have an orientation corresponding to some prior criteria (e.g. may be in an orientation corresponding to the loading station the carrier was last unloaded from). This orientation may be different than that corresponding to the next loading station to which the carrier is to be mated. Accordingly, in the exemplary embodiment the gantry may effect θ rotation of the carrier to change its orientation as desired when moving the carrier from the storage station 3000S to the loading station (such as along the path indicated by arrow SL1 in FIG. 50). The θ rotation of the carrier may be performed "on the fly" similar to that described previously. The carrier may also be placed by the gantry into a storage station 3000S in the desired orientation for subsequent interface. For example, in a manner similar to that described before, when unloading a carrier from a loading station. The gantry may change may change the orientation of the carrier, by θ rotation, when moving the carrier from the loading station to a storage station. In the exemplary embodiment, the gantry may also rotate the carrier to pre-orient the carrier, when moving the carrier from conveyor transports to storage stations. In the exemplary embodiment, the gantry 3310 positioned to effect transport of carriers to the loading stations LSR1, LSR2 of the different rows R1, R2, may move the carriers from loading stations of one row R1, R2 to loading stations of the other row R1, R2 (in one move or a series of moves) and may change the carrier orientation (from an initial orientation corresponding to the loading station from which the carrier is removed to a final orientation corresponding to the destination loading station) by θ rotation during the move.

Figure 42B:
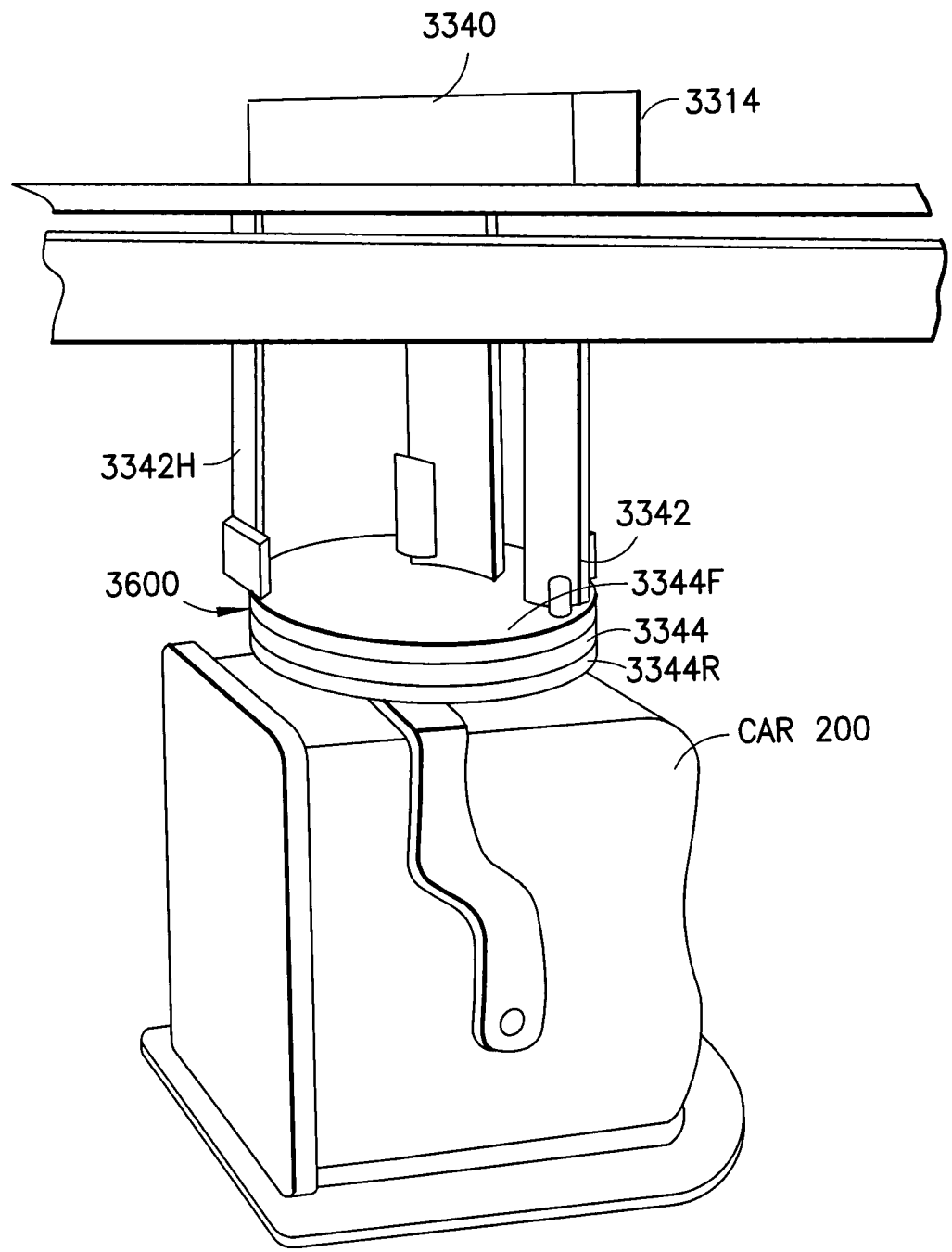
Figure 42C:
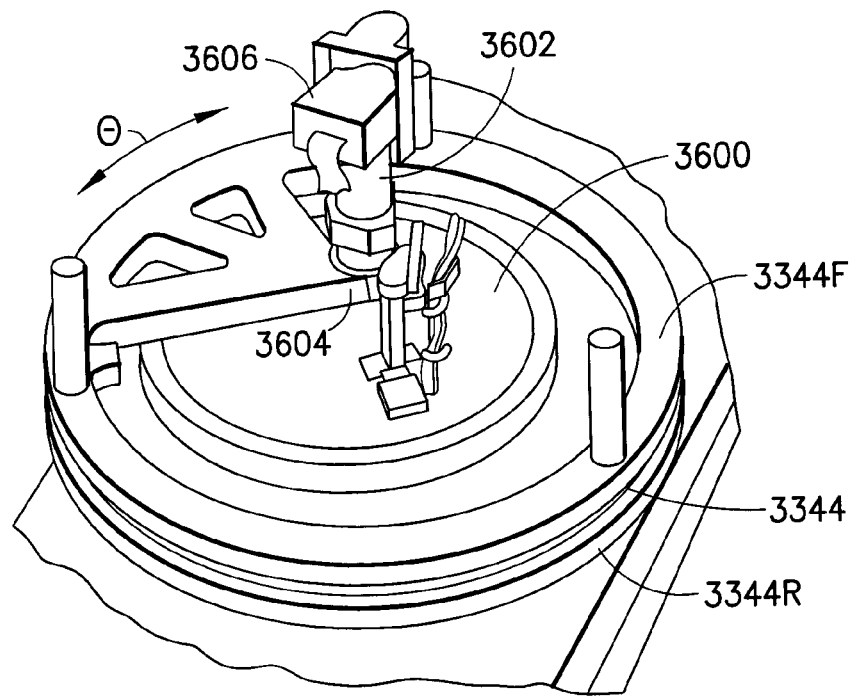
FIGS. 42C-42D are respectively schematic perspective and top plan views of a carrier gripper section of the transport system in FIG. 41.
Figure 42D:
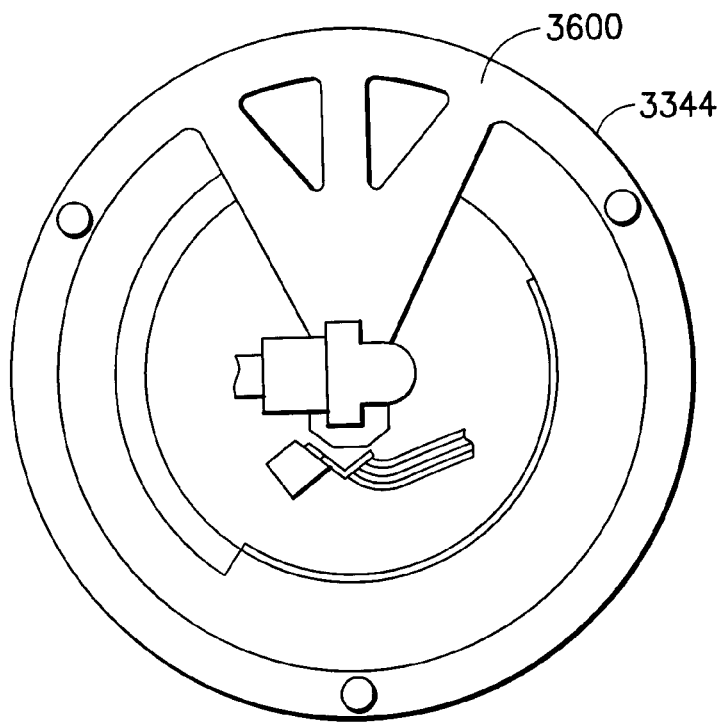

Referring now also to FIGS. 42B-D, in the exemplary embodiment the θ drive system 3600 of the gantry 3310 may be included in the traverser vehicle 3314. The configuration of the θ drive system shown in the figures and described below is merely exemplary, and in alternate embodiments, the θ drive system may have any other suitable configuration. In the exemplary embodiment, the traverser vehicle 3314 may generally have a base vehicle section 3340, a hoist mechanism 3342 and a carrier gripper section 3344. The base vehicle section 3340, in the exemplary embodiment, is movably supported on the translation platform of the gantry (see FIG. 42). The hoist mechanism 3342 attaches the carrier gripper section 3344 to the base vehicle section 3340. The hoist mechanism 3342 may be raised and lowered in order to raise and lower the carrier gripper section relative to the base vehicle section. The carrier gripper section may be configured to interface with and grip and release the carrier. Referring now to FIGS. 42C-42D, there is respectively shown a schematic perspective view and top plan view of the carrier gripper section 3344. In the exemplary embodiment, the θ drive system 3600 may be included in carrier gripper section 3344. In alternate embodiments, the θ drive system may be incorporated into the gantry traverser in any other desired manner. In the exemplary embodiment, the carrier gripper section 3344 may include upper and lower parts 3344F, 3344R that are pivotally joined (such as rotary shaft) to each other to allow relative rotation between parts (in the direction indicated in by arrow θ in FIG. 42C). In the exemplary embodiment, the upper part 3344F may be joined to the hoist bands or members 3342H (see FIG. 42B). The lower part 3344R may have the carrier gripper mechanism to engage the carrier. As may be realized, when gripped by the gripping mechanism the carrier may be locked relative to the lower part 3344R of the traverser carrier gripper section. In the exemplary embodiment shown in FIGS. 42B-D, the θ drive system 3600 may generally comprise a motor 3602 (such as a suitable servo or stepper motor), a shaft 3604 and an encoder 3606. The motor 3602 may have a stator fixed to the upper part 3344F of the carrier gripper section, and the rotor mounted on shaft 3604. The shaft 3602 may be fixed to the lower part 3344R of the carrier gripper section. Hence, the motor may be capable of rotating the lower part 3344R, and hence the carrier gripped by the carrier gripper. The encoder 360 (which may be of any suitable type) may identify both absolute and progressive positions of the shaft to the control system (not shown). As noted before, in the exemplary embodiment, the θ drive system may be arranged to provide about 270° or θ rotation. Accordingly, this allows the transport system to rotate a carrier at least about ±90° from any initial orientation. In alternate embodiments, the θ drive system may have any desired configuration and may be capable of rotating the carrier through any desired range of rotation.

In alternate embodiments, cylindrical carrier nests can be placed as desired to allow for higher storage density in the FAB. The cylindrical storage nests can hold carriers one on top of another and provide a mechanism for raising or lowering carriers to a specified height. The mechanism for the vertical motion can be pneumatic, mechanical, or magnetic.

Figure 51:
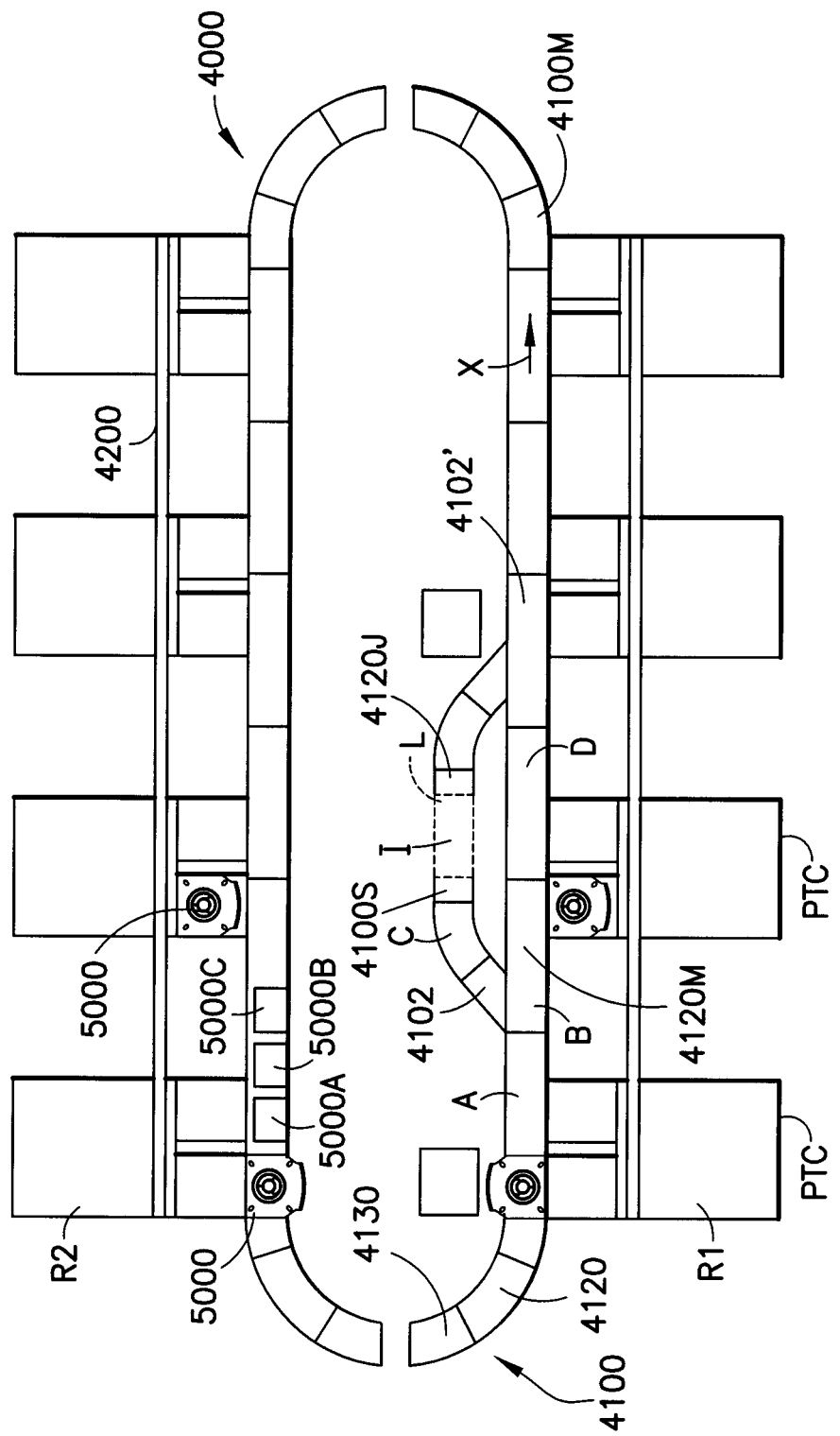
FIG. 51 is a schematic plan view of a transport system in accordance with another exemplary embodiment.
Figure 51A:
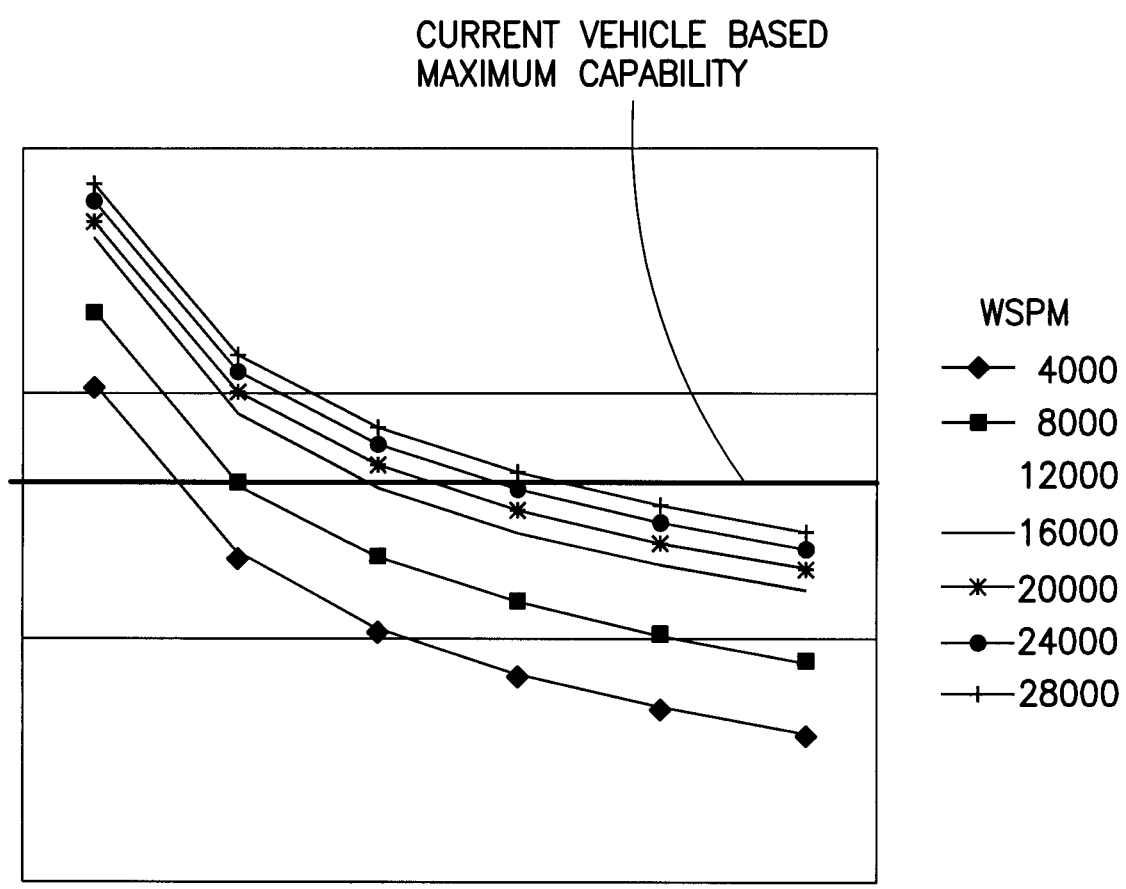
FIG. 51A is a graph that illustrates the relationship between lot size and transport rate.

Referring now to FIG. 51 there is shown a schematic plan view of a transport system 4000 in accordance with still another exemplary embodiment. The transport system in the exemplary embodiment illustrated in FIG. 51 is a representative section, such as for example an interbay portion of a FAB-wide transport system, and in alternate embodiments, the transport system may have any desired size and configuration. The transport system 4000 in the exemplary embodiment shown in FIG. 51 may be generally similar to the transport system 3000 described before and illustrated in FIGS. 41-50. Similar features are similarly numbered. Similar to transport system 3000, the transport system 4000 in the exemplary embodiment shown in FIG. 51 may have a bulk or rapid mass transport section 4100 (e.g. conveyor) and an interface section 4200. The interface section 4200 shown in this embodiment is merely exemplary, and in alternate embodiments may have any desired configuration with any desired number of subsections (e.g. storage sections, shuttling sections such as similar to those previously described). Generally the interface section 4200 may have a number of feeder robot(s) capable of interfacing carriers between the bulk transport system section 4100 and the process tools. The bulk transport system section 4100 may generally be similar to the transport system 500 described before and a portion of which is shown in FIG. 20. In the exemplary embodiment, shown in FIG. 51, the bulk transport system section 4100 may comprise a track with a solid state conveyor system. The track may be similar to the conveyor tracks described in U.S. patent application Ser. No. 10/697,528 and Ser. No. 11/211,236 previously incorporated by reference herein in their entirety. In the exemplary embodiment shown in FIG. 51, the transport system 4100 may be an asynchronous transport system (similar to transport system 500) in which transport of carriers by the transport system is substantially decoupled from the actions of other carriers being transported. Hence, one or more carriers may be capable of independent actions during transport (e.g. accel/decel, stopping, load/unload) without affecting the transport rate of other adjoining or proximate carriers in the carrier transport stream of the transport system.

In the exemplary embodiment shown in FIG. 51, the bulk transport system section, referred to from hereon as bulk transport 4100, generally comprise a main transport track(s) 4100M. The bulk transport 4100 may also have a number of siding track(s) 4100S. The main transport track(s) 4100M, shown in FIG. 51 as a loop for example purposes, and which may have any other desired shape in alternate embodiments, may define a main transport path (or stream) for carriers being transported by the bulk transport. Though the description of the exemplary embodiment refers particularly to carriers, the features described herein are equally applicable to alternate embodiments where the (substrate) carrier may be seated on a payload platen or other motive device that is transported by the bulk transport. The main transport path, in the exemplary embodiment may have a continuous, and substantially constant speed. Hence, carriers transported on main transport track(s) 4100M may be capable of a sustained, high rate of travel throughout the transport on the main path without impediment from carriers that stopped on the transport system. The siding or branching track(s) 4100S in effect enable decoupling of the transport rate deterministic operations of carriers on the bulk transport from the main transport path. As noted before, such rate deterministic operation may be performed from the siding track without impairment to the main transport path. Accordingly, the siding track 4100S may define for example a carrier buffer, loading/unloading station or path switching device. In the exemplary embodiment, one siding track is shown for example and in alternate embodiments, there may be any desired number of siding tracks. The configuration of the siding in the exemplary embodiment shown, bifurcating and rejoining on a substantially straight segment of the main track, is also merely exemplary and in alternate embodiments the siding track may have any other desired configuration. For example, the siding track may shunt between opposing sides of the main track loop (within a given bay) or may shunt between main tracks of different interbay (e.g. inter-inter) transport sections, or inter-intra (or vice versa) transport sections such as shown for example in FIGS. 29A, 29B. In alternate embodiments the siding may have a different orientation than the main track and may cross over or under the main track. In other alternate embodiments, the intersection between main and siding tracks may be arranged as desired such as a substantially orthogonal intersection or switch.

In the exemplary embodiment, the main and siding track(s) 4100M, 4100S may comprise modular track segments A, B, C, D, L that are modularly connected to assemble the tracks of the bulk transport. The carriers may be driven on the tracks 4100S, 4100M of the bulk transport by for example linear motors. Similar to track 500 described before, the forcer of the linear motor may be located in/on the track(s) 4100M, 4100S and the reaction portion of the linear motor may be on the carrier. The carrier(s) may be movably supported on the track by suitable devices such as contactless or lubricious bearings (e.g. air/gas bearings) maglev systems, or contact bearings (e.g. rollers, ball/roller bearings) in the track that act on suitable solid state support members of the carrier(s). In alternate embodiments, the carrier(s) may have the motive supports integrated therein such as wheels, rollers, gas/air bearings. As may be realized, the motive supports supporting carrier(s) on the main and siding tracks may have any desired arrangement on the track to stably support each carrier over the track, and may be distributed along the main and siding tracks to allow the carriers to move freely along the track. In the exemplary embodiment, the linear motor may be for example a linear induction motor (LIM), a linear brushless DC motor (etc.), though in alternate embodiments any desired linear motor or any other type of motor/drive may be used to urge the carrier(s) along the main and siding tracks of the bulk transport. As noted before, in the exemplary embodiment, the forcer (or phase windings) 4120, 4120M, 4120S of the LIM are located in the track modules A, B, C, D, L forming the main and siding tracks of the transport, and the carrier(s) has the reaction rate/members of the LIM as will be described in further detail below. In alternate embodiments the motor coils may be mounted to the carrier or vehicle platen and the magnetic reaction elements may be mounted to the track.

Still referring to FIG. 51, the modular segments A, B, C, D, L of the main 4100M and siding 4100S tracks in the exemplary embodiment shown are representative and in alternate embodiments may have any desired configuration. The track segments A, B, C, D, L are generally similar except as otherwise noted. As seen in FIG. 51, in the exemplary embodiments the track segments (modules) may generally include single track segments (e.g. A, C, D, L) and junction (track switching) segments. In alternate embodiments, any other desired modular track sections may be used. For example, in alternate embodiments, a given track module may include multiple tracks (each forming a different carrier transport path) generally extending alongside each other in what may be referred to as a non-junction multi track module. In the exemplary embodiment, the single track segments may include substantially straight segments A, D, L and curved segments C, though in alternate embodiments, the single track segments may have any other desired shape. In the exemplary embodiment shown, the track sections are depicted as being at a substantially common elevation for description purposes. In alternate embodiments, the main and siding tracks may include sections at different elevations. For example a siding may be located at a different elevation (e.g. lower or higher) than the main track and/or other sidings. Also the main track and/or siding track may have track sections at different elevations along the track, such as higher and lower track portions. Suitable ramps (not shown) may join track sections at different elevations allowing the carrier(s) traveling the track to transition between. As may be realized from FIG. 51, the junction segments B, 4102, 4102' may be located where the siding or branch tracks 4100S merge with the main track 4100M or where some junction may be desired. In the exemplary embodiment shown in FIG. 51, two junction track segments 4102, 4102' are shown for example purposes. The configuration of the junction segments 4102, 4102' shown in FIG. 51 is merely exemplary, with a single branching track merging/diverging on one side (e.g. left side relative to the direction indicated by axis X in FIG. 51) of the main track 4100M. In alternate embodiments, the junction segment may branch to the right of the main track. In other alternate embodiments, the junction segments may have any other desired configuration, such as for example multiple branching in one segment with branches on opposite sides of the main track that may be substantially directly opposite from each other or staggered, or multiple branching on one (e.g. left and/or right) side of the main track. In the exemplary embodiment, the single track segments A, C, D, L, though having different shapes (e.g. straight, curved, etc.) may be otherwise generally similar. Each track segment A, C, D, L may include corresponding sections in the motor forcer 4120. As may be realized, and also as shown in FIG. 51, when the modular track segments are assembled the motor forcer sections (of the various track sections) when integrated operably (using a suitable controller) may define a substantially continuous motor forcer 4120M, 4120S for the main and siding track(s) to operate on the reaction plate(s) in the carrier(s)/platen(s) and drive the carriers/platens throughout the length of the main and siding tracks. In alternate embodiments, the tracks may include one or more segments without integral forcer sections.

As may be realized, the forcer 4120 or what may be otherwise referred to as the primary coil assembly of the linear motor, may for example in the case of a LIM arrangement, generally comprise steel laminations and phase windings that may be formed integral to the track segments or may be housed in a forcer housing that is joined to the track segment. In alternate embodiments, the phase windings of the linear motor forcer integrated into the track segments may have any other suitable arrangement. The forcer section in each segment A, C, D, L (see for example segment C in FIG. 52) may be itself segmented or may be continuous. Curved track segments C, may have forcer sections 4120C in which the phase windings may be arranged so that the coil assembly defines a curve commensurate with the curvature of the track, or may have a forcer section that is segmented, with the segments arranged to define a generally curved forcer section. In alternate embodiments, the forcer section of the track segments may have any other desired shape. The forcer section of the track segments A, C, D, L may be arranged symmetrically relative to the track and the carrier(s) riding the track. In alternate embodiments, the forcer may be located asymmetric to the track and carrier(s) thereon.

Figure 54:
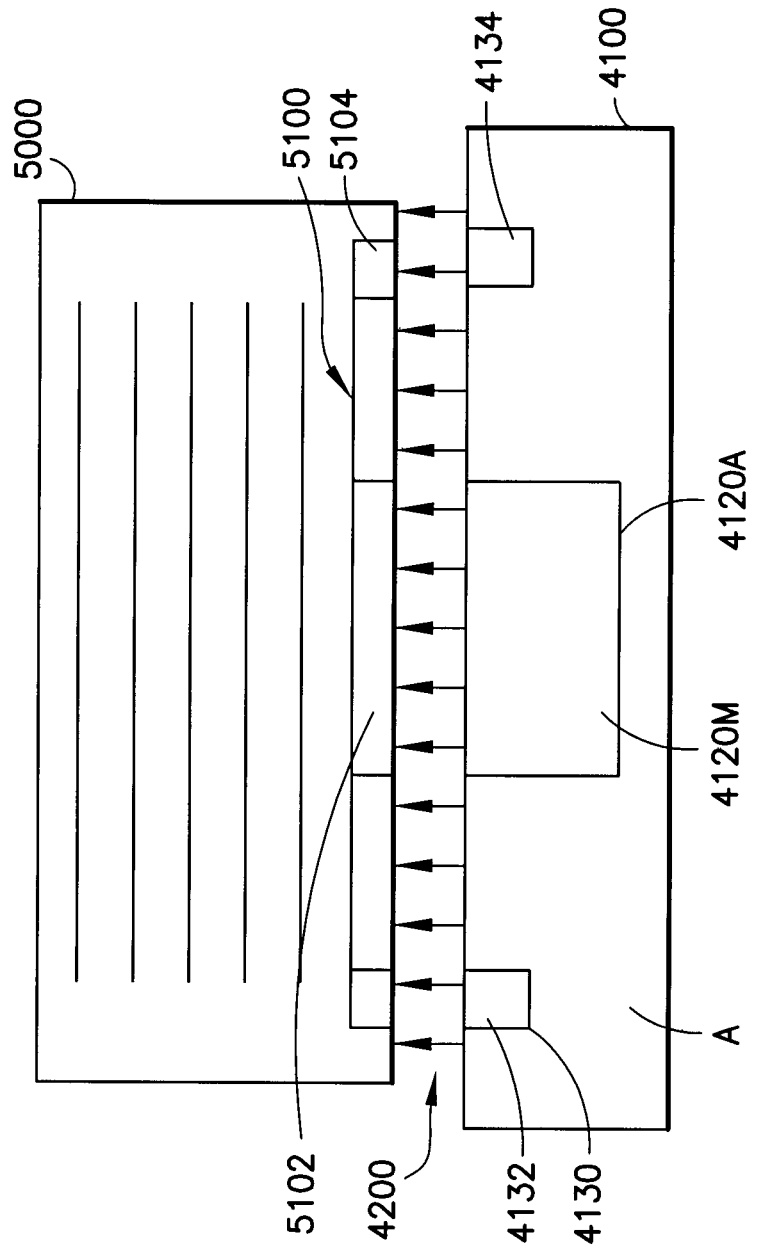
FIG. 54 is a schematic end elevation view of the transport system in accordance with still another embodiment.

FIG. 54 shows a schematic end view of a representative track segment A and representative carrier 5000 movably supported thereon. As noted before, the track(s) (main(s) and siding(s) 4100M, 4100S, generally provide motive force/impetus, motive support and guidance to the carrier(s) 5000 to effect controlled movement of the carrier(s) along the track(s). As also noted before, in the exemplary embodiment, the linear motor driving the carrier(s) such as for example a LIM, bias the forcer 4120M, 4120S in the tracks operating on the reaction plate(s)/elements 5100 on the carrier(s). Referring also to FIG. 53, there is shown a schematic bottom view of a representative carrier 5000 and the reaction plate(s) 5100 of the carrier. The arrangement of the reaction plate(s) 5100 on the carrier shown in FIG. 53 is merely exemplary and in alternate embodiments, the reaction plate(s) on the carrier may have any other suitable arrangement. In alternate embodiments there may be more or fewer reaction plates. In the exemplary embodiment, the reaction plate(s) 5100 are shown on the bottom of the carrier, though in alternate embodiments the reaction plates may be located on any other desired sides or portions of the carrier. In the exemplary embodiment, the reaction plate(s) 5100, such as defining a LIM, may be made of metal such as steel or aluminum, though any other suitable material may be used. One or more of the reaction plates may be made of ferrous (magnetic) material as will be described below. In alternate embodiments the reaction elements may include permanent magnets arrayed to operate with the motor phase windings, such as of a linear brushless DC motor. The reaction plate(s) on the carrier may include one or more plate(s) 5102 corresponding to the forcer 4120M, 4120S in the track(s) 4100M, 4100S providing propulsion along the main or siding tracks. This is schematically illustrated in FIG. 54. The reaction plate(s) 5102, is shown schematically in FIG. 53 as one plate, but may include any desired number of plates, for example having an arrangement as shown in FIGS. 20C, 20D. As noted before, the forcer 4120 in the tracks (and hence the forcer sections 4120A, 4120C, see FIGS. 52, 54, of the respective segments) and the corresponding reaction plate(s) 5102 may be arranged substantially symmetrically with respect to the carrier and track. In alternate embodiments, the motor forcer may be asymmetric.

In the exemplary embodiment shown in FIG. 54, the carrier(s) 5000 is movably supported on the track by suitable air bearings 4200. The distribution of the gas/air/fluid bearings shown in FIG. 54 is merely exemplary, and in alternate embodiments the exhaust ports may be arranged to provide any other desired gas pressure distribution stably supporting the carrier from the track. In alternate embodiments, the gas ports may be in the carrier exhausting gas to lift the carrier from the track. As noted before, in other alternate embodiments the motive supports between carrier and track may be of any other desired type and may be dependent from either the track segments or the carrier(s). The gas ports for air bearings 4200 and/or the gas impingement areas on the carrier may be configured to generate a resultant directional force(s) that effect horizontal guidance of the carrier relative to the track. As may be realized, the gas ports may be communicably connected to a suitable source of gas (not shown). The track sections, in the exemplary embodiment may have gas conduits for feeding gas from the gas supply to the gas ports of the fluidic bearings. Suitable valving and controls may be included for example to operate gas ports in the proximity of where carriers are present on the track. Control may be active (e.g. sensor identifies presence of carrier causing switch on/off of gas ports operated for track sections where carrier activity is known).

In the exemplary embodiment shown in FIGS. 51-52 and 54, the tracks 4100M, 4100S may include control and guide system(s) 4130 to guide the movement of the carriers as they are propelled down the tracks. Guide system 4130 may be a non-contact system extending along the main and siding tracks 4100M, 4100S. In the exemplary embodiment, each of the track segments A, C, D, L may include corresponding sections of the guide system 4130A, 4130C, (see FIGS. 52, 54) that, when the segments are joined, may be combined to form the substantially continuous guide system(s) of the tracks. In alternate embodiments the guide system may be independently mountable to the track. In other alternate embodiments, the guide system may be of any suitable type, and may be for example, integral to the support system of the tracks (e.g. rollers or wheels on the track or carrier that interface therebetween and help maintain orientation and horizontal alignment of the moving carrier along the track), and/or may be integral to the linear motor (as will be described further below), and/or may be independent from the carrier supports and linear motor. In the exemplary embodiment, the guide system 4130 in track 4100M, 4100S, may generally comprise a guide magnet track 4130M, 4130S that extends substantially parallel to the linear motor forcer 4120 in the track. The guide magnet track may comprise for example permanent magnets serially arrayed to form the magnet tracks. Portions of the track such as OT switches/junctions may also include electromagnets that may be cycled on/off to allow switching. In alternate embodiments, the guidance may include providing the motor in the track section with windings capable of generating guidance forces on the carriers. Such guidance windings may be integrated into the linear forcer, or may be separate and independent from the forcer providing propulsion along the track. As may be realized the guide forcer in the track may interact with suitable guide plates/elements 5104 (such as magnetic material (e.g. ferrus) or permanent magnets in the carrier to maintain the carrier(s) in a desired horizontal position relative to the track 4100M, 4100S. In other alternate embodiments, the locks for generating guidance forces on the carrier may be mounted on the carrier, and operate with stator elements in the track to effect carrier guidance. As noted before, in the exemplary embodiment, the track segment modules A, C, D, L may each have corresponding sections 1430A, 1430L of the guide track as shown in FIGS. 52 and 54. In the exemplary embodiment, the guide track section 1430A, 1430L of track sections A, C, D, L may comprise two guide tracks 4132, 4134 (for example see FIG. 54) located along but on opposite sides of the forcer 4120A. The position of the guide tracks shown is exemplary. In alternate embodiments, the more or fewer guide tracks may be provided in any desired location. The guide plate(s)/elements of the carrier, that interact with the guide tracks may be off axis (relative to axis X) linear motor reaction plates 5104R, 5106R, 5104L, 5106L (see FIG. 53) for other sections of the linear motor as will be described below, or may be other suitable ferrous plates/elements independent of the linear motor reaction plates. In other alternate embodiments, the carrier may guide magnet elements, and the tracks may have ferrous/magnetic material tracks positioned to interact with the magnets on the carrier to define a track guide system. The guide system may also include positioning/position sensing system/devices, such as Hall effect sensors, LVDT's etc. communicably connected to a controller to effect control of the movement of the carrier along the track. The positioning system/devices may be similar to that described in U.S. application Ser. No. 11/211,236 previously incorporated by reference. By way of example, positioning feedback along the main and siding tracks may also be provided by suitable Hall effect sensors of the LIM.

Referring now again to FIG. 52, there is shown a schematic plan view of track segment C, described above, and representative junction segment B. Other junction segments of the bulk transport 4100 are generally similar to junction segment B. In the exemplary embodiment, the junction segment may have forcer sections for both main and siding tracks 4120M, 4120S. In the exemplary embodiment the segment B may also have a switching linear motor forcer section 4125. As may be realized, in the exemplary embodiment an independent linear motor, independent from the linear motors of the main track and the siding track, may be located at junctions to effect carrier switching between main and siding tracks as will be described below. In the exemplary embodiment, the switching linear motor may be a LIM, though any other suitable linear motor such as a brushless DC motor may be used. In alternate embodiments, any other suitable electrical or mechanical switching system may be used. As seen in FIG. 52, in this embodiment the forcer 4125 (for the switch motor) may be located offset from the forcers 4120M, 4120S of the main and siding tracks. The forcer section for the main track may be further sub-sectioned 4122, 4124, 4126 as shown. The subsections 4122, 4124, 4126 of the main track forcer may be physically separated as shown, or may be virtually separated via the controller, from each other to allow section 4124 across from the switching LIM forcer 4125, to be deenergizable independent of the other adjoining main track LIM forcer sections 4122, 4126. The configuration of the forcer sections 4122, 4125, 4124, 4126 and guidance system on the junction segment shown in FIG. 52 is merely exemplary, and in alternate embodiments, the junction segments may have any other desired configuration. As seen in FIG. 52, in the exemplary embodiment the switching forcer 4125 may be offset from both main and siding track forcer in the direction (e.g. left from axis X) that the siding track merges/diverges. The switching forcer 4125, in the exemplary embodiment, may have one end 4125M that may be aligned generally parallel to the direction of the main track (indicated by axis X), and another end 4125S that may be aligned generally parallel to the local direction of the siding track (indicated by axis b in FIG. 52). In the exemplary embodiment, the local direction of the siding (axis b) at the exit/entry from the main track is oriented at an acute angle relative to the travel direction of the main track (axis X). Thus, as may be realized, the carriers may take advantage of momentum along axis X to effect switching and may not cancel momentum along axis X in its entirety (e.g. may not stop on the main track) when moving to the siding. In accordance with another exemplary embodiment, (see also FIG. 52C), the junction segment may be provided with switching guide 4130S' (tracks 4132S', 4134S") in place of the switching forcer (4125), effecting switching by co-opting momentum of the carrier along the travel axis (e.g. axis X) to effect switching without a motor A' will be described below. As noted before in alternate embodiments, the angle between entry/exit to siding and direction of main track may be provided as desired. (For example orthogonal, and even in such a case, the configuration of the switching linear motor may take advantage of momentum in the X direction). As seen in FIGS. 52-53, in the exemplary embodiment the end 4125M of the switching LIM forcer 4125 may be located to operate on one or more of the reaction plate(s) 5104, 5106 of the carrier (see also FIG. 53). Reaction plates 5104, 5106 may be offset laterally (along axis Y). In addition, reaction plates 5106L, 5106R may also be offset longitudinally (along axis X) from a desired reference point (e.g. center) of the carrier. In the exemplary embodiment, reaction plates may be located on diagonal axes located at different angles α, β relative to lateral axis Y. In alternate embodiments, the carrier may have any other desired reaction plate arrangement with more or fewer reaction plates. As noted above one or more of the reaction plate(s) 5104L, 5106L may be used with switching forcer 4125 to switch the carrier from the main track 4100M to the siding 4100S (and vice versa at the merging junction at the other end of siding 4100S, segment 4102', see FIG. 51).

Figure 52B:
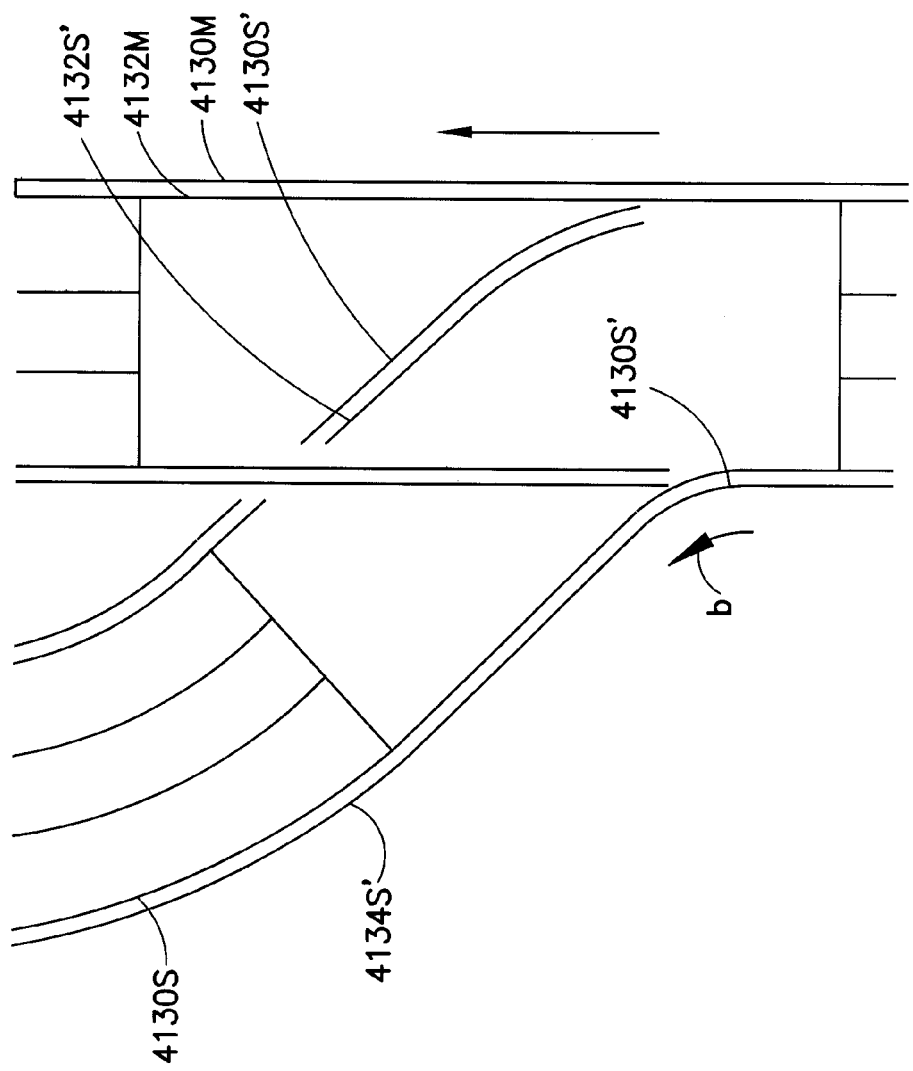
FIG. 52B is another partial plan view of the transport system in accordance with another exemplary embodiment.

As seen best in FIG. 52B, in the exemplary embodiment the guide magnet section 4130 is arranged to effect switching between main and siding tracks. As seen in FIG. 52B, in the exemplary embodiment guide magnet track 4134 (on the side proximate the siding entry) may be interrupted, so that at least a portion of switching guide track 4134S' (corresponding to that side) may intermerge with track 4134M. The interface of the guide tracks shown in FIG. 52B is merely exemplary, and in alternate embodiments the track interface/interchange may be arranged in any other suitable manner. The opposite guide magnet track 4132M (on the opposite side from the siding entry) may be intermerged with corresponding switching guide 4132S' as shown. In the exemplary embodiment, each of the guide tracks 4130M, 4130S' may include a section 4132J (see also FIG. 52), comprising an actuable magnetic field that may be turned on/off. For example, the section 4132J of the guide track may be configured with electromagnet coils, for example similar to a magnetic chuck having a permanent magnet(s) and a coil arranged around the windings so that passing electric flow through the coil may in effect turn the magnetic field of the guide magnet section on/off, hence releasing the guidance force between the carrier and guide track. In alternate embodiments, the actuable magnetic section may have any other desired arrangement. As may be realized, the guide magnet section 4132J of the desired guide tracks 4132M, 4132S', 4134S, 4134S' is turned "on" and "off" to effect switching, for example, when the carrier is to continue on the main track, the main guide tracks 4132M, 4134M are turned "on" and the switching guides are turned "off" when the carrier is being switched to the siding the switching guides 4132S', 4134S' are "on" and the main guides are "off". Turning the guide magnet section 4132M, 4134M "off" allows the carrier to move freely laterally (off the main track) as it may no longer be held to the main track. In alternate embodiments in which the guide magnets are in the carrier, the junction segment guide system may include suitable windings to generate a canceling magnetic field to the carrier magnets. The junction segment may further include one or more actuable/operable guide magnets (not shown) generally aligned with the entry (axis b) of the siding, that when turned "on" guide the carrier (moved by forcer 4125) onto the siding track 4100S. These guide magnet sections may be turned "off" when the carrier moves over the junction and continues on the main track. Thus, by way of example to switch the carrier from main track to siding, in the exemplary embodiment, the forcer section 4124 may be deactivated, the guide magnet section 4132M, 4134M is turned "off", and the switch in guide 4132S', 4134S' may be "on". The carrier momentum may move along the track with the switching guides in effect deflecting the trajectory of the carrier in the direction of arrow b (see FIG. 52) onto the siding. The forcer 4125 (if provided) may further urge the carrier from the main track towards the entry to the siding, though in the exemplary embodiment carrier momentum may be sufficient to move the carrier toward the siding until siding forcer 4120S operates on the corresponding reaction plate(s) 5102 to continue motion along the siding track 4100S as desired. The guide magnet track 4130S acquire the magnetic elements of the carrier to guide the carrier along the siding track 4100S. In the exemplary embodiment, carrier switching being accomplished in a generally passive manner, position feedback may not be employed for switching. In alternate embodiments with active switching position feedback during switching of the carrier from main to siding may be performed by the guidance/positioning system, that for example may be disposed to positionally acquire the carrier when on the main track prior to hand off to the switching LIM forcer, continue position feedback as the carrier is switching via the switching LIM and allow for handoff to the siding track LIM. As such, the positioning devices may be of any suitable type, continuous or distributed devices (e.g. optical, magnetic, bar-code, fiducial strips, laser/beam ranging or radio ranging) positioned to allow position feed back during the switch.

Referring now to FIG. 52A, there is shown another plan view of a junction segment B' of the bulk transporter in accordance with another exemplary embodiment. The junction segment B' in this exemplary embodiment is similar to segment B shown in FIG. 52 except as otherwise noted. In FIG. 52A, the guide magnet tracks are not shown for clarity. The main track LIM forcer section 4120M' on segment B' may also have a subsection 4124' that may be independently deenergized from the adjoining forcers 4122', 4126'. In this exemplary embodiment, the siding LIM forcer 4120B' may extend sufficiently towards the main track to be able to operate (if desired) on a reaction plate 5106L' of the carrier when the carrier is on the main track. This is illustrated in FIG. 52A, which shows the reaction plates 5102', 5106L' of the carrier (in phantom) located to effect switching. The reaction plates 5102' for the track LIM may be for example located over the main track forcer segment 4124' (and for example clear from adjoining "upstream" main track forcer 4122', and the reaction plates) 5106L' may be located to operate with the siding LIM forcer 4120B'. Accordingly, to switch main track segment 4124' may be deenergized and the siding forcer 4120B' may be energized directing the carrier onto the siding track. Switching from siding to main track may be accomplished in similar manner. In alternate embodiments, the linear motor for the main and siding tracks may be any suitable linear motor such as a DC brushless motor or other brushless iron core motor. In the alternate embodiments the permanent magnet reaction elements may be in the carrier, and in other alternate embodiments, the permanent magnets may be in the track segment (core motor in the carrier). In the alternate embodiments, phase windings may be located as desired either in the track (in a manner similar to that shown in FIGS. 20A, 20B), or the carrier to cancel the magnetic field between magnets and motor core eliminating the guidance provided by the interaction of magnets/iron core elements of the motor and allowing carrier switching from one track to another.

Referring now again to FIG. 51, in the exemplary embodiment one or more track segments L may have an area I where the carrier may be lifted from the track, such as by the robot of the interface section 4200. As may be realized the guide magnets tracks 4130S in the lift area I may be provided with sections having an actuable magnetic field similar to section 4132J shown in FIG. 52. In alternate embodiments, phase windings may be provided to cancel the field between magnets either in the track or carrier and magnetic material whether linear motor iron core, or ferrous reaction plates in either the track or carrier in order to "release" the carrier from capture by the track, and facilitate ease of lifting the carrier from the track.

Referring again to FIG. 53, in the exemplary embodiment, one or more carriers 5000 may have couplings 5200 for coupling one or more carriers together in a carrier train. The couplings may be of any suitable type such as magnetic couplings that may be operably connected to a controller to couple or release. In alternate embodiments, the inter carrier couplings may be for example mechanical couplings. The couplings 5200 are shown schematically in FIG. 53 and in alternate embodiments may be positioned as desired on the carrier. The intercarrier couplings may be used to train two or more carriers together during transport by the bulk transport 4100. As may be realized, this allows one or more entrained carriers to be engines for the train, while other carriers in the train may be passive. FIG. 51 shows a carrier train in accordance with the exemplary embodiment. As may be realized, the entrained carriers become batched, during the entrainment, allowing movement of all carriers to be effected by controlling the movement of the "engine" carrier(s) in the train. This may significantly reduce the burden on the controller. Positional information of a given carrier in the train may be registered in the controlled relative to a desired reference in the carrier train, (e.g. a fiducial of the "engine" carrier). Accordingly, when desired the controller may identify and locate the desired carrier without tracking individual carriers movements of each carrier when moving as a train, when desired to commence individual control of a given carrier in the train, the controller may look up the train location on the track, and position of the given carrier relative to the desired reference on the train to identify a rough location of the carrier on the track. Fine positioning may be effected with the track positioning system. In alternate embodiments, positioning when decoupling from the carrier train may be effected in any other desired manner. As may be realized, any carrier in the train may be the engine carrier. Positioning of the engine in the carrier train may be established to support desired operating parameters. Moreover, the position of the engine may be switched by deactivation of an engine carrier and activation of another carrier in the train to become the engine.

Figure 55:
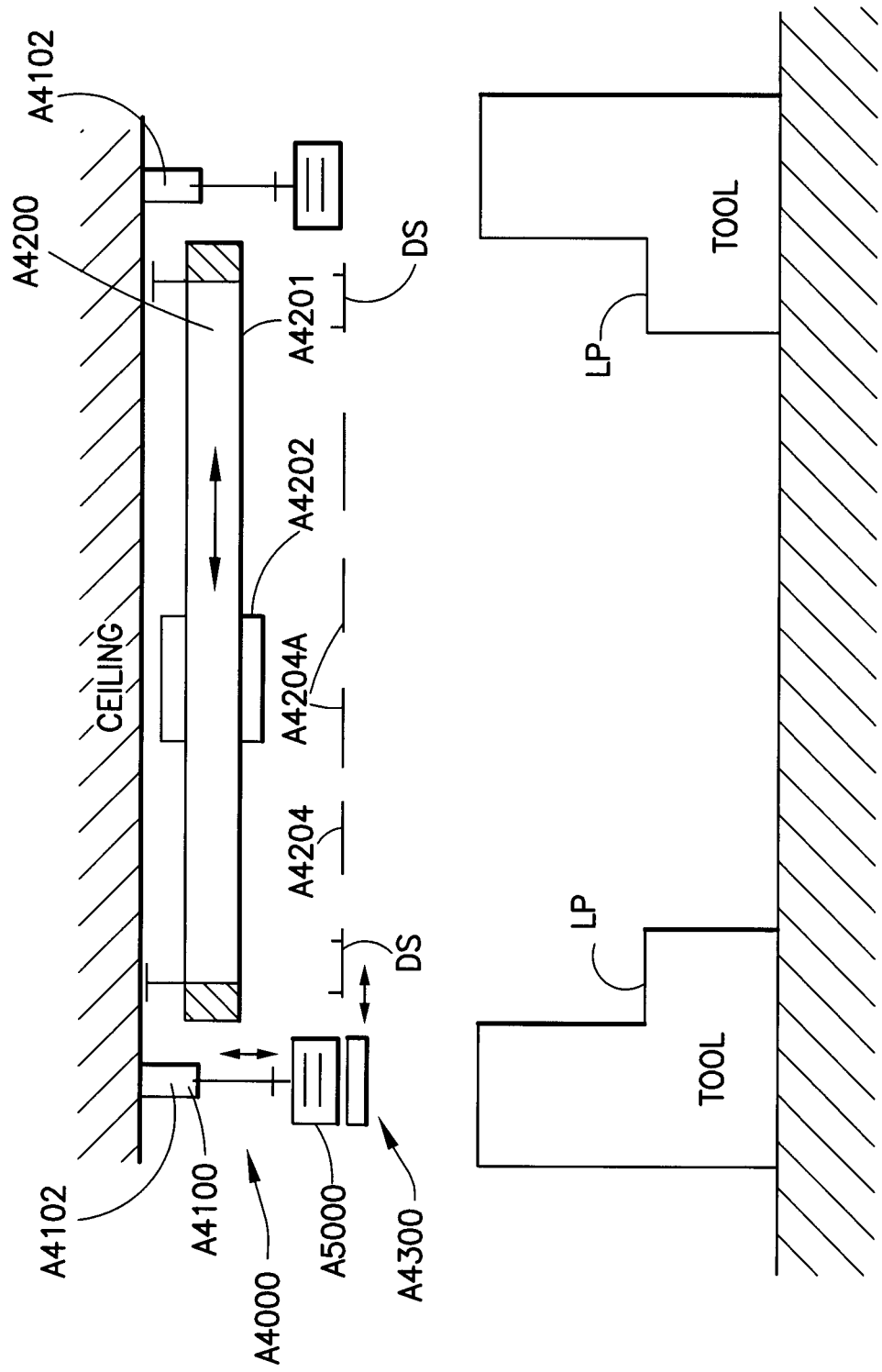
FIG. 55 is a schematic end elevation view of a transport system in accordance with yet another exemplary embodiment.

Referring now to FIG. 55, there is shown a schematic end elevation view of a transport system A4000 in accordance with still another exemplary embodiment. The arrangement of the transport system in the exemplary embodiment shown in FIG. 55 is merely exemplary and in alternate embodiments the transport system may have any other suitable arrangement. In the exemplary embodiment shown in FIG. 55, the transport system A4000 may be generally similar to transport system 4000, described before and illustrated in FIG. 51, (similar features are similarly numbered). Transport system A4000 may generally include a rapid bulk or mass transport section A4100 and an interface section 4200. The rapid mass transport section A4100 may have one or more rapid mass transport pathways A4102 (two pathways are shown in the embodiment illustrated in FIG. 55 for example purposes). In the exemplary embodiment, the mass transport pathways A4102 may be configured as to effect mass transport of carriers A5000 within the FAB, such as in a manner similar to that described previously. In the exemplary embodiment, the mass transport pathways A4102 of mass transport section A4100, may also be arranged to transport the carriers traveling the pathways at a substantially constant speed (at least for some portion of the pathways), in the direction of travel of the pathway. The pathways of the mass transport section may be connected to each other in a manner similar to that described previously. The interface section A4200 in the exemplary embodiment shown in FIG. 55, may for example be generally similar to interface section 4200 described before and shown in FIG. 51. In the exemplary embodiment, the interface section A4200 is capable of interfacing carriers between mass transport and process tools. The interface section A4200 may generally have shuttling section(s) A4202 and storage section(s) A4204. As noted previously the storage section(s)

A4204 may be arranged with storage location(s) A4204A, for storing or buffering carriers, for a number of processing tools. The storage locations A4204A may be arranged in any desired manner in order to efficiently buffer carriers for the processing tools. The shuttling section(s) A4202 may have a number of feeder robot(s) A4202 capable of interfacing carriers between storage locations of the storage section A4204 and the load interface(s) (e.g. load ports) of the processing tools. In the exemplary embodiment, the transport system A4000 may have a transport handoff section A4300 capable of interfacing carriers A5000 being transported, for example at a substantially constant rate on the bulk transport section pathways A4100, and the interface section A4200. Hence, in the exemplary embodiment the transport system A4000 may be an asynchronous transport system even for the portions of the transport systems pathways where carriers traveling the pathways are transported at a substantially constant rate. In the exemplary embodiment, the transport handoff section(s) A4300 in effect enable decoupling of the transport rate deterministic operations of carriers, as they are being transported by transport system A4000 from the transport paths A4102 where carriers travel at a substantially constant rate.

Figure 55A:
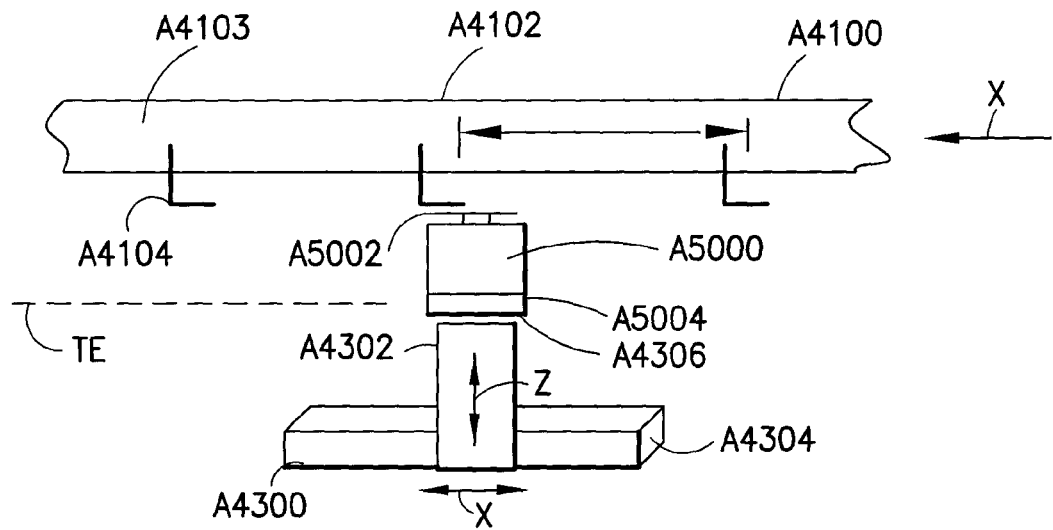
FIGS. 55A-55D respectively are a schematic partial side perspective view of the transport system, partial plan views of the transport system showing a carrier transported by the transport system in different positions, and a side elevation view of an interface portion of the transport system.

Referring still to FIG. 55, the pathways A4102 of the mass or bulk transport section may comprise any desired type of bulk conveyor system. Referring now to FIG. 55A, in the exemplary embodiment illustrated, the pathways A4102 of the mass transport section A4100 are shown as belt or ribbon conveyor A4103 for example purposes only. As may be realized, the belt conveyor A4103 has carrier support or carry surfaces A4604, on which carrier(s) A5000 are supported from (or on) the belt A4103 for transport. As also may be realized, the belt A4103, and hence its carrier carry surfaces, (defined by or depending from the belt) may move at a substantially constant transport rate along the transport direction of the pathway (indicated by arrow X in FIG. 55A. In alternate embodiments, the conveyance system, for conveying carriers along the pathways of the mass transport system section may be of any desired configuration. For example, the pathways may have a solid state conveyor system, as described before, or may have mechanically defined conveyance means such as rollers, fluidic bearings, etc.). In other alternate embodiments, the pathways may be tracks for autonomous or semi-autonomous vehicles. The conveyance system of the pathways may be configured to be operable so that the carriers conveyed by the system are transported at a substantially constant rate, or may be operable so that the transport rate may be variable if desired. In the event, the transport handoff section enables operation of the conveyance system of desired pathways (or portions thereof) to maintain substantially constant transport rate independent of transport rate deterministic operations of carriers transported by the conveyance system.

In the exemplary embodiment shown in FIG. 55A, the mass transport section pathways A4102 are shown as being an overhead system, located overhead the processing tools. In alternate embodiments the mass transport section pathways may be located at any desired elevation relative to the tools and the loading interface LP of the tools. The carriers A5000 in the exemplary embodiment shown in FIGS. 55, 55A-55C are representative. Carriers A5000 may be similar to carriers 2000 described before and shown in FIGS. 36A-36B. In the exemplary embodiment, the carriers A5000 may generally have upper interface section A5002 (e.g. arranged to allow interface and engagement of the carrier generally from above or over the carrier) and lower interface section A5004 (e.g. arranged to provide interface and engagement of the carrier generally from below or under the carrier). The carrier may be side opening, top opening or bottom opening as described previously. In alternate embodiments, the carrier may have any desired arrangement of interface/engagement surfaces (e.g. side engagement) for interfacing the carrier with the transport system and the loading interfaces of the processing tools. The loading interfaces LP, of the processing tools, in the exemplary embodiment shown in FIG. 55 are representative. In the exemplary embodiment, the loading interfaces LP may be arranged to interface with the lower interface section A5004 of the carrier, though in alternate embodiments the tool loading interface may be configured to engage with complementing carrier engagement features on any desired side of the carrier. The location of the tool loading interface LP relative to the transport system A4000, illustrated in FIG. 55 is merely exemplary, and in alternate embodiments the tool loading interface maybe positioned as desired relative to the transport system. In the exemplary embodiment, illustrated in FIGS. 55, 55A, the conveyor system of the mass transport section pathways A4102 may have carrier support A4104 arranged to engage the upper interface section A5002 of the carrier A5000. The configuration of the carrier supports shown in FIGS. 55, 55A is representative, and the carrier supports may have any suitable configuration complementing and operable with engagement features of the carrier upper interface A5002 to releasably capture and hold the carrier from the conveyor during transport. In the exemplary embodiment, the carrier A5000 may be carried by the conveyor of pathways A4102 suspended substantially under the pathway. The carrier lower interface A5004 may be accessible (such as from under, or from the side of the carrier) during transport on pathways A4102. In alternate embodiments, the carrier supports on the conveyor of the pathway may have any desired configuration to engage and support the carrier during conveyance on any desired side or surface of the carrier (e.g. conveyor may engage or interface with the carrier bottom).

Referring still to FIG. 55, and as noted before, the interface section A4200 of the transport system may be an overhead gantry system generally similar to interface systems 3200, 3300, 4200 described previously and shown in FIGS. 41-46 and 51. The interface system A4200 may have a selectably variable number of transporter travel planes (such as defined by gantries A4201) traversed by shuttle(s) and feeder robots A4202. As also noted before, in alternate embodiments, the interface system may have any other desired configuration. In the exemplary embodiment, the gantries A4201 and storage locations A4204 may be nested between the pathways A4102 of the mass transport section. The feeder robots A4204 may be configured to engage the carriers A5000 from the carrier upper interface A5002, and support the carrier from above. Shuttles (not shown) may support the carrier from above or below. In alternate embodiments, the robots and shuttles of the interface section may have any suitable arrangement. As noted before, handoff of carriers between the mass transport section A4100 and the interface section 4200 may be performed with the handoff section A4300 as will be described further below.

Figure 55B:
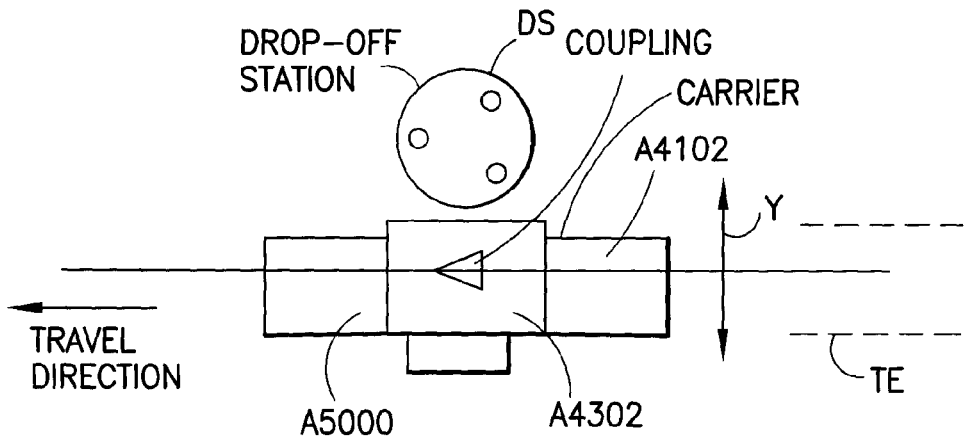
Figure 55C:
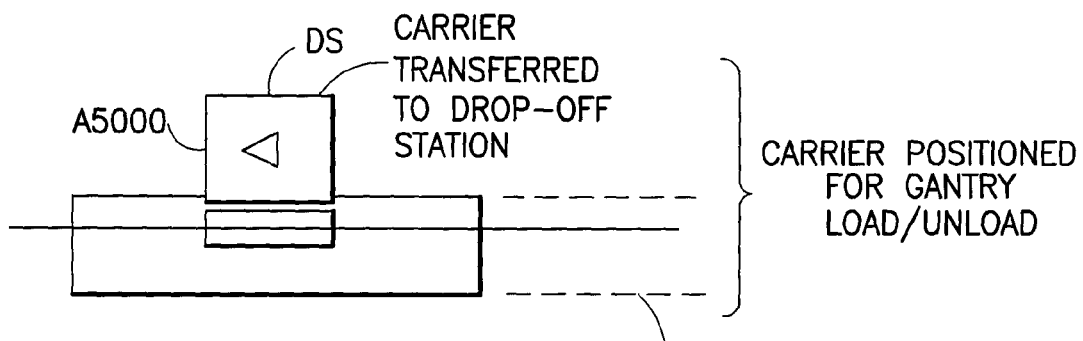
Figure 55D:
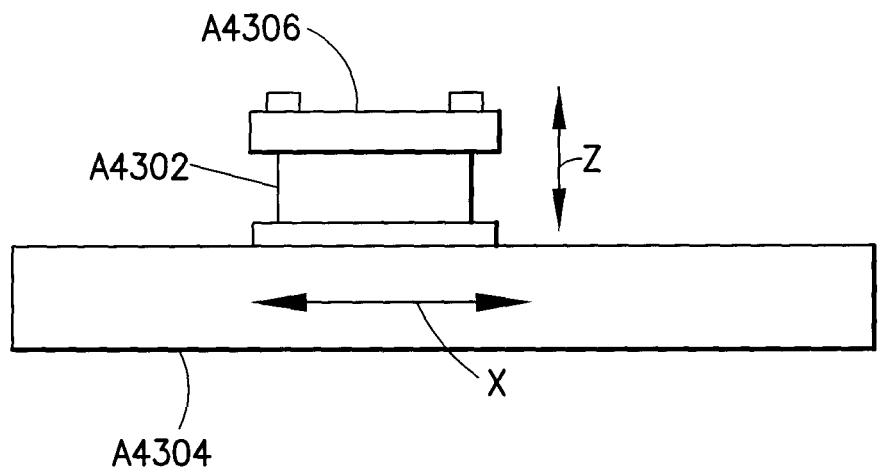

As seen best in FIGS. 55, 55A, the handoff section A4300 generally has a carriage surface capable of accessing and capturing carriers transported along the mass transport pathways (such as at the substantially constant transport rate of the pathway), decoupling the carrier from the pathway and positioning the carrier at a drop station from which the robots/shuttles of the interface section A4200 are capable of accessing the carrier. Referring now also to FIGS. 55B-55D, in the exemplary embodiment, the handoff section A4300 may have a number of carrier(s) A4302 (one is shown for example purposes). As seen in the figures, the carriage A4302 may be a vehicle or any other suitable conveyance mechanism or system, capable of positioning alignment with the carrier, as it is transported on the pathway at the transport rate. Hence, the carriage A4302 may be capable of travel in the transport direction of the pathway (indicated by arrow X) for a sufficient distance to allow carriage coupling to the carrier and decoupling of the carrier from the mass transport conveyance support A4104. In the exemplary embodiment, the carriage A4302 is schematically illustrated as a vehicle riding a track or path A4304. The track A4304 may be located below the pathways A4102 of the mass transport section (see also FIG. 55). For example the track A4304 may be suspended by hangers from the overhead. In the exemplary embodiment shown, the track, and carriage A4302 thereon are also located below the interface section. As noted before, in alternate embodiments, the handoff section carriage may have any other suitable configuration. As may be realized, in the exemplary embodiment, the arrangement of the handoff section allows the carriage to access carriers on the pathways in, for example, discrete portions of the pathways. The handoff section may be distributed at appropriate sections of the pathways. As seen best in FIG. 55D, the carriage A4302 may have a carrier interface A4306 with which to engage and capture the carrier on the pathways. The carrier interface A4306 of the carriage A4302 may have any suitable arrangement. In the exemplary embodiment, the carrier interface A4306 may have engagement features to engage for example the lower interface A5004 of the carrier (see FIG. 55A). For example, the carriage interface A4306 may have kinematic coupling features that complement kinematic coupling features of the carrier resulting in passive alignment at engagement and secure passive lock between carrier and carriage when engaged. In alternate embodiments the carriage interface may have any other desired passive or active coupling or engagement system (e.g. clamps magnetic chuck(s) etc.) to capture the carrier. As seen in FIG. 55B, the carriage A4302 may be supported on the track A4304 so that the carrier interface A4306 of the carriage A4302 may be sufficiently aligned with the carrier A5000 so that coupling may be effected. As may be realized, the carriage track A4304 may be sufficient to allow carriage A4302 to accelerate to match travel rate of pathway A4102, align and capture a desired carrier A5000 conveyed by the pathway and disengage the carrier from the pathway supports A4204. In the exemplary embodiment, the carriage track A4304 may be sufficient to allow the carriage for example to decelerate to a desired speed, to allow handoff to the interface system A4200 at the drop off station DS. In the exemplary embodiment, the drop off station DS may be stationary, though its location may be selectably variable (such as along the hand off section track A4304). In alternate embodiments the carriage may be disposed on the track, such as on an endless loop track, moving at substantially matched travel rates as the pathways.

As seen best in FIGS. 55A, 55D, in the exemplary embodiment the carriage surface of hand off section A4300 may have movement in the Z direction in order to close with the carrier(s) on the pathway, and to load/unload the carriers from the pathway supports. In the exemplary embodiment illustrated, the carriage may be provided with a suitable Z drive (such as lead screw, pneumatic, electro-magnetic) capable of driving the carriage interface A4306 in the Z-direction.

Hence, and by way of example, to unload a carrier from the pathway, the carriage interface A4306 may be raised to contact the carrier interface A5004 (with the carriage and carrier aligned). The carrier interface may be further raised, for example after coupling the carrier to effect release of the carrier A5000 from the pathway (by way of example the carriage travel rate relative to the pathway may be varied, such as advanced/retarded to facilitate carrier release from the pathway supports). The carrier released from the pathway may be lowered by the carriage A4302, so that the carrier clears the transport envelope of carriers conveyed by the pathway. The loading of a carrier onto the pathway with the hand off section A4300 may be accomplished in a substantially similar but opposite manner. In alternate embodiments, Z direction movement of the carriage interface may be effected in any other desired manner, such as the supporting track may have a Z-drive or lift, or may have support surface for the carriage of variable height, such as up and down ramps that raise and lower the carriage to contact the carrier on the pathway. In other alternate embodiments, movement along the axis to close the carrier and carriage may be effected by a suitable drive or other displacement means of the pathway or the carrier (e.g. the pathway supports may have a Z-axis drive). In still other alternate embodiments, the axis of movement or closure axis to close carrier and carriage for coupling and decoupling the carrier to and from the pathway with the hand off section may be in any desired direction (relative to ground reference frame).

As seen best in FIGS. 55, 55B-C, and as noted before the handoff section A4300 has drop station(s) DS positioned for example to be accessible by robots A4202 of the interface section A4200. In the exemplary embodiments, the drop stations DS may be offset from the transport envelope TE of the mass transport section pathways and carriers conveyed thereon, such as in the Y axis (though in alternate embodiments the offset may be along any desired axis). The offset of the drop station(s) DS (seen best in FIGS. 55B-55C), which may be generally referred to as a lateral offset from the longitudinal direction defined by the pathway, facilitates access of the interface section A4200 to the upper carrier interface A5002. Also, in the exemplary embodiment the upper interface A500N of the carrier may be free to be engaged by the interface section A4200 when the carrier is positioned at the drop station DS by the carriage A4302, because the carriage interfaces the carrier at another carrier interface A5002. Hence, in the exemplary embodiment the carrier may be transferred directly between carriage A4302 and interface section robot A4202 without an intervening pick/place action. In alternate embodiments, the hand off system carriage may be arranged to place the carrier in a storage location, and the interface section may access the carrier from the storage location. In other alternate embodiments, the handoff section carriage and interface section robot may interface the carrier at a common interface. In the exemplary embodiment, top access to the carrier enables the interface section to employ its feeder robot(s) A4202 to interface the carrier from the drop station DS. In alternate embodiments, the drop station of the handoff section may be offset from the transport envelope in any suitable direction to allow the interface section to access and interface the carrier at the drop station.

As seen best in FIGS. 55B-55C, in the exemplary embodiment, the carrier A5000 may be moved to and from the drop station DS by the carriage A4302. By way of example, the carriage may have a suitable Y-drive (the drive may be as desired to provide the carriage, or at least the portion interfacing/supporting the carrier freedom of movement in the offset direction) allowing the carriage to move the carrier to the drop station. By way of example, the carriage interface A4306 may be on a movable support capable of movement in the Y-direction. In alternate embodiments, the carriage may be capable of movement, such as a unit with the carrier, in the Y-direction to move the carrier to the drop station. In still other embodiments, the track may be shaped, such as with bends (e.g. endless loop) away from the transport envelope, so that the carriage traveling along the track is guided to the drop station.

Figure 56A:
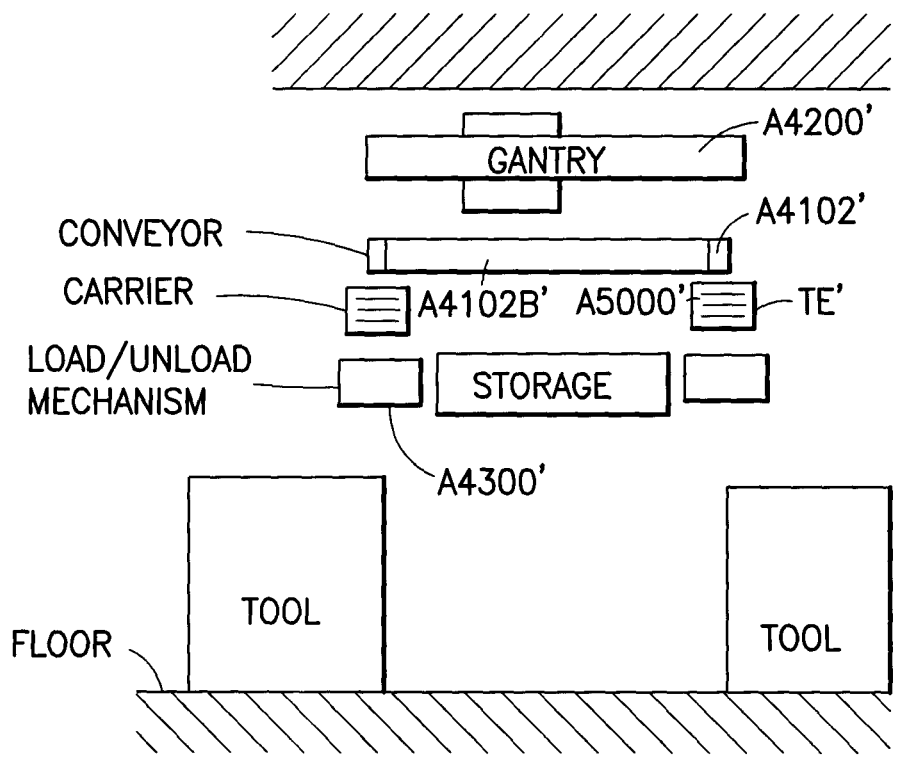
FIGS. 56-56A respectively are schematic plan view and end elevation view of a transport system in accordance with yet still another exemplary embodiment.
Figure 56:
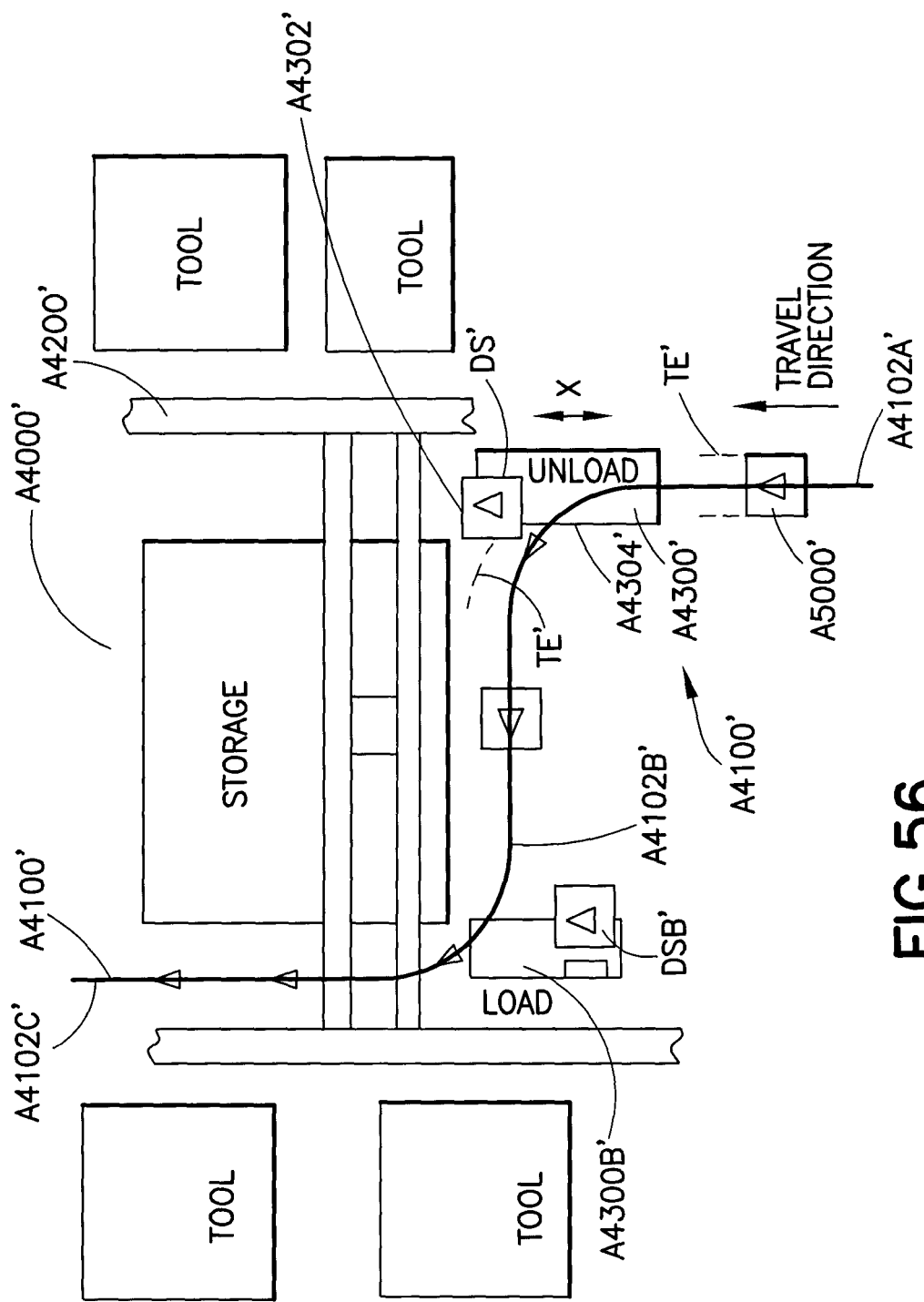

Referring now also to FIGS. 56-56A, there is shown respectively schematic plan and elevation views of a representative transport system A4000' in accordance with another exemplary embodiment. The transport system A4000' in the exemplary embodiment illustrated in FIGS. 56-56A is substantially similar to transport system A4000 described before (similar features being similarly numbered). The transport system A4000' generally has a mass transport section A4100', with a number of pathway(s) A4102', an interface section A4200' (illustrated for example purposes as a gantry) and a hand off section A4300' to hand off carriers A5000' between the mass transport and interface sections and allow carriers conveyed by the desired mass transport section pathways to maintain a substantially constant travel rate. In the exemplary embodiment, separation or offset between the drop station DS' of the hand off section A4300' and the transport envelope TE' of the pathways A4102' (allowing the transport rate deterministic carrier operations/actions to be performed clear of the transport envelope) may be effected by changes in direction of the pathway(s) A4102'. As seen best in FIG. 56, in the exemplary embodiment pathway(s) may have sections A4102A', A4102B', A4102C' with different directions relative to each other. For example this may occur at intersection of shunts/bypass sections, end sections of pathways (see also FIGS. 29A-29B and FIG. 51). Pathways sections A4102A', A4102B', A4102C' with different directions, such as in the example shown in FIG. 56, may also be provided in FAB zones where it may be desired to load/unload carriers from the mass transport system pathways. The arrangement of the pathway sections A4102A', A4102B', A4102C' in the exemplary embodiment illustrated in FIG. 56, generally defines two bends, each of which is of sufficient size to provide desired separation between transport envelope TE' and hand off section to establish a drop station DS. As noted before, the direction and arrangement of the pathway sections shown is merely exemplary. In the exemplary embodiment, each section has a handoff section portion A4300', that may be substantially similar to each other and to handoff section A4300 described before and shown in FIGS. 55A-55D. Each handoff section portion A4300' may have carriage and traversing track A4304' arranged to load/unload carriers A5000' (see also FIG. 56A) from pathway(s) A4102' (in a manner similar to that previously described). Each handoff section portion A4300D' may have a drop station DS' for the carrier. In the exemplary embodiment, the drop station DS' may be substantially in line with the track A4304' (as well as with the transport envelope TE' of the pathway at some downstream or upstream portion as shown in FIG. 56). In the exemplary embodiment, one portion A4300, A4300B of the hand off section may be used to unload carriers from the pathway, and the other portion may be used to load carriers on the pathway. By way of example, portion A4300' may interface and pick carriers from pathway section A4102A'. Unloaded carriers A5000' may be brought to drop station DS', for example located at an end of track A4304', for handoff to the interface section A4200'. Carriers destined for loading onto the pathway may be brought by the interface section A4200' to the drop station DSB' of portion A4300B' for handoff. The handoff section portion A4300B' may then move the carrier, matching transport rate and direction with pathway section A4102C' and load the carriers on the pathway. In alternate embodiments, each portion of the handoff section may be capable of loading and unloading carriers to/from the pathways (e.g. tracks may have multiple drop stations positioned to support carrier load or unload relative to the pathway and/or the carriage may be cycled along the track to effect both loading and unloading. Transport system A4000' may thus be asynchronous.

Factory automation uses wafer identification for example to plan, schedule and track each wafer through the process. The ID is machine readable and is managed with a database on the host server. Wafer identification within the database may be affected by wafer breakage equipment down situations or software error. Hence repetitive reading steps at each process tool may be used to overcome this. Machine reading of wafer typically may occur for example after the carrier is loaded, wafer is removed and then oriented. The ID is reported back to the host for verification then processing begins after authentication. Conventionally if the incorrect wafer is loaded it is not caught until after much time was wasted to identify. In addition, when a tool goes down with an error the wafers must be rescued and re-entered into the carrier/database creating potential for human error. Carriers may posses an onboard writeable data tag which can store the wafer ID's contained within and is read by the loadport. The carriers, in accordance with the exemplary embodiments previously described, may have interlocks that interlock the carrier writeable ID tag with the wafer ID's at the loadport. The writeable ID tag on the carrier incorporates an external digital I/O signal. The signal is tied to a sensor which can detect the removal of a pod door. The sensor may be of any suitable type such as optical, mechanical, acoustic, capacitive etc. By way of example a low voltage signal line may run through electrically conductive pads on both the pod shell and the pod door. The pads are in local contact when the door is closed completing the flow of voltage. When the door is removed the flow of voltage is interrupted and the signal is made to the carrier ID tag.

In accordance with one exemplary embodiment implements wafer reading methods along with a software integrity tag and method to detect if a door has been opened. For example, the integrity tag is written to the writeable carrier ID after the wafers are loaded and the door is locked to the pod. When the pod arrives at the next tool loadport the tag is read along with the integrity tag. If the integrity tag is valid than the wafer ID's are assumed untampered and valid. If the integrity tag is invalid than the door has been removed at some point and the wafer ID accuracy is suspect. Based on this information the host forces a wafer read at the tool to validate integrity.

In accordance with another exemplary embodiment an integral wafer ID reader may be provided into the loadport. The reader is positioned such that ID's can be read during the door opening sequence to minimize cycle time. This embodiment has the advantage of reduced cycle time compared to methods which reside in the process tool and also can execute the entire validation scheme separate from the process tool host communication.

In accordance with another exemplary embodiment a dedicated alph-numeric display(s) for each wafer slot within the carrier may be added to the carrier. The integrated display correlates to the actual wafer ID resident within the carrier. The character height may be sufficiently large to be read from a large distance similar to the length between an operator and a ceiling mounted storage nest. In this embodiment, the display indicates the ID integrity graphically. If the integrity tag is invalid it is shown graphically on the display by a distinguishing character or color.

In accordance with yet another exemplary embodiment integrates an external wafer ID reader. The external wafer ID reader may be located, for example external to the loadport and process tool within the AMHS system. Carriers with suspect wafer ID's are loaded to the external reader and validated. Once the operation is completed the door is locked and the integrity tag is written to the writeable carrier ID. The carrier is now moved to the final destination storage/loadport position. This has the advantage of being performed in parallel to the wafer carrier wait time rather than serial to the tool process time. In addition, the external reader can incorporate a wafer orientation method.

Figure 57:
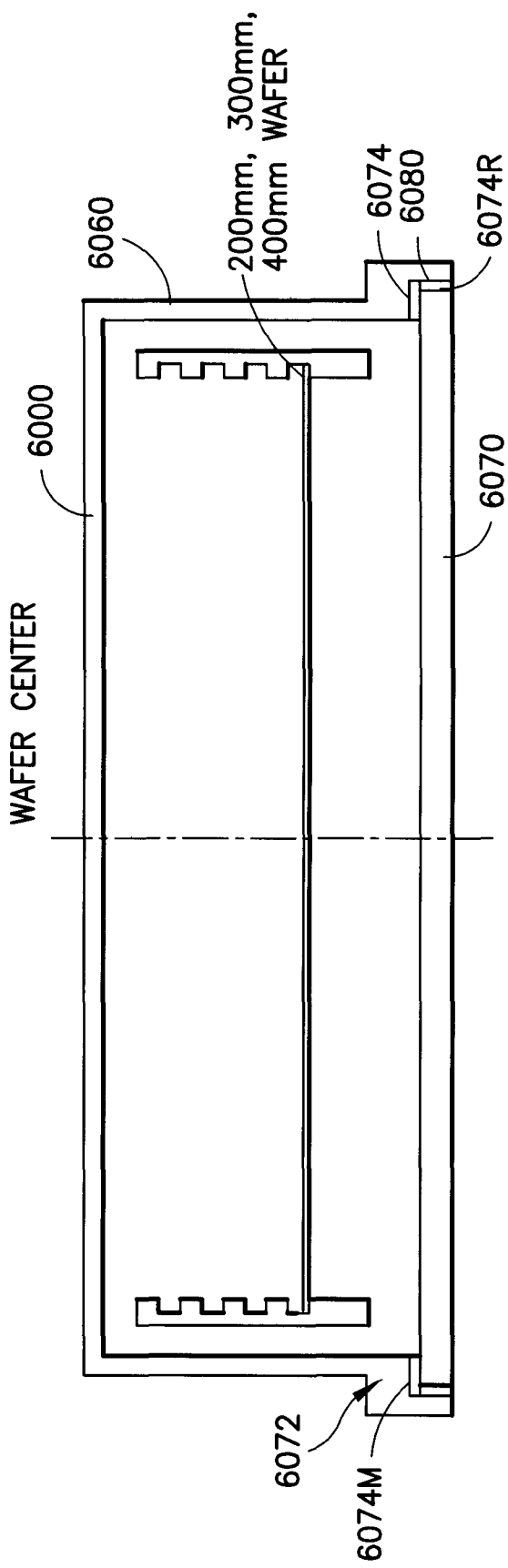
FIG. 57 is a schematic elevation view of a carrier in accordance with yet still another exemplary embodiment.

Referring now to FIG. 57, there is shown a schematic elevation view of a carrier door in accordance with yet still another exemplary embodiment. The carrier door in the exemplary embodiment illustrated in FIG. 57 may be similar to the carriers in the exemplary embodiment described previously and shown in the drawings, except as noted otherwise. The carrier door may for example have a conventionally round or cylindrical shape or perimeter (similar for example to carrier 2000 in FIG. 36 C) though in alternate embodiments the carrier may have any other desired shape, such as with one or more flat perimeter sides. The carrier door 6070, which is removably coupled, as will be described further below, to the carrier shell 6060, to close the wafer (or other work field) opening in the shell and isolate the carrier interior, is shown as being on the bottom of the carrier 6000 for example purposes only. In alternate embodiments, the carrier door may be located on any other side or surface of the carrier. As noted before, the carrier may be made from metallic (nonferrous) material, or from nonmetallic materials such as thermoplastic materials.

Figure 57A:
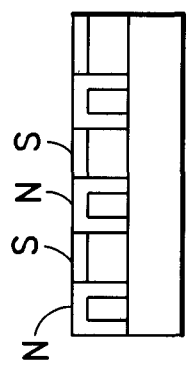
FIG. 57A is a partial schematic view of a portion of a carrier door interface.

As noted before, when the carrier door 6070 is closed, the door 6070 and shell 6060 form a seal 6080, at an interface between carrier door and shell as will be described further below, to isolate the interior of the carrier from outside atmosphere. The carrier door 6070 may be latched to this shell 6060, sufficiently to securely hold the door to the shell and allow desired transport of the carrier, by a latching system 6072. The latching system 6072 may be substantially solid state (i.e. substantially with no moving parts) in the exemplary embodiments, though in alternate embodiments, the latching system may have solid state actuation as well as mechanically actuating parts. In the exemplary embodiment shown in FIG. 57, the latching system 6072 may include a magnetic latching system 6074. The magnetic latching system 6074 may generally have a magnet or field section 6074M and a reactive or platen section 6074R that reacts with the field section to form the latching forces and latching the door to become latched to the shell. In the exemplary embodiment the magnet section 6074M may be distributed substantially around the perimeter of the container shell, or for example the perimeter of the door to shell interface, to generate a substantially uniformly distributed magnetic field at the wafer opening of the carrier shell. In the exemplary embodiment, the magnetic section 6074M may be formed by a flexible (i.e. multipole) magnet strip or ribbon. The flexible magnet strip is schematically illustrated in FIG. 57A. In alternate embodiments, the magnet section or the solid state latch system may be formed in any other suitable manner. The magnet section may be continuous or segmented and may be installed on the carrier to form any desired shape. In the exemplary embodiment shown in FIG. 57A, the multipole magnets may be attached to a flexible non-magnetic material (e.g. electromagnetic material) that may be resilient or pliable. In the exemplary embodiment, the magnet section 6074M is shown as being mounted on a substantially flat surface of the shell. The reactive section 6074R, which may be a suitable ring or segments of the ferrous material, is shown as being mounted on an opposing surface of the carrier door. The alternate embodiments, the magnet section may be mounted to the door, and the reactive section to the shell, and may be positioned on any other desired surface of door and shell. When the door is closed, the reactive section may be biased against the flexible magnets of the magnet section forming a door seal around the opening.

Figure 58:
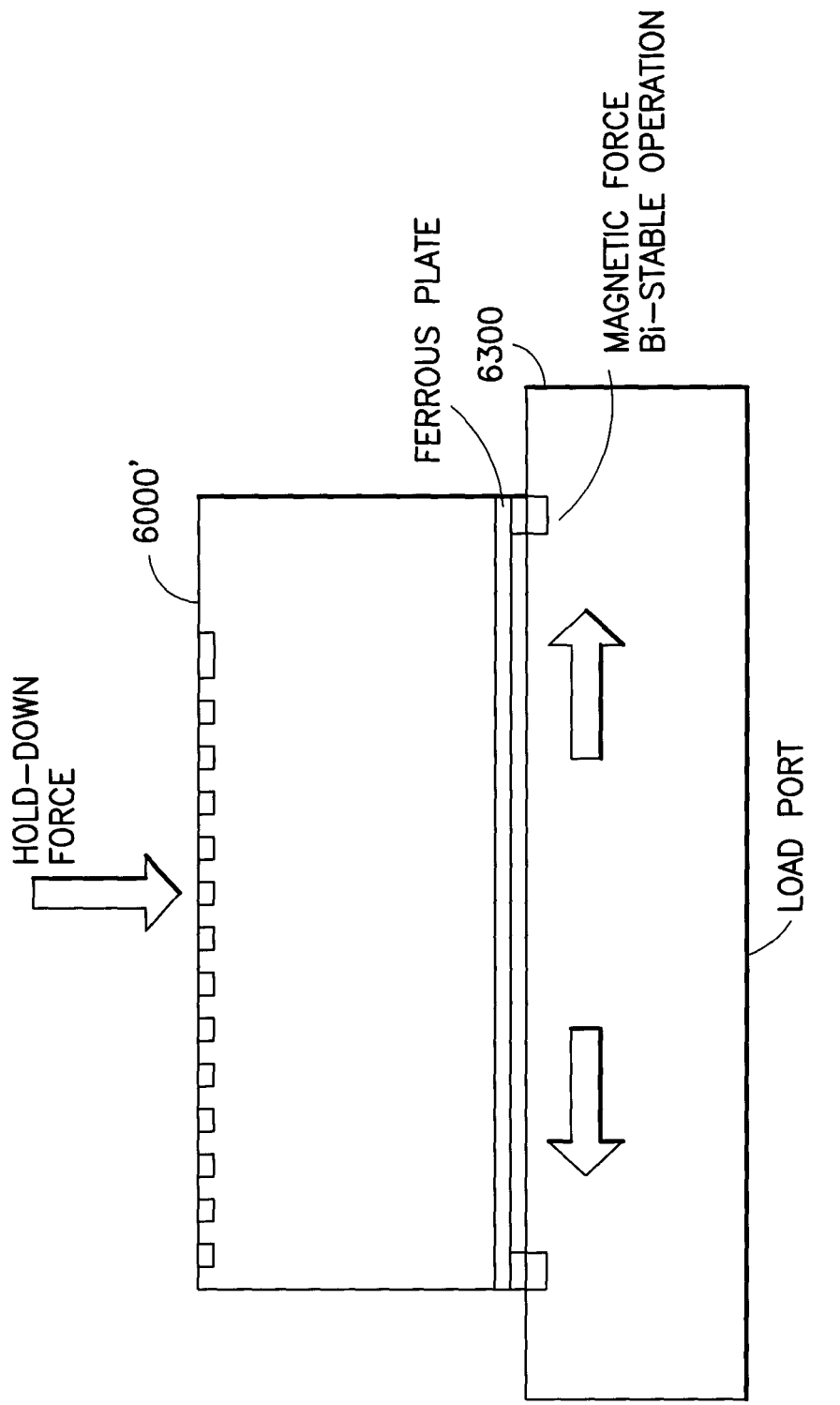
FIG. 58 is yet another schematic elevation view of a carrier in accordance with another exemplary embodiment.
Figure 59A:
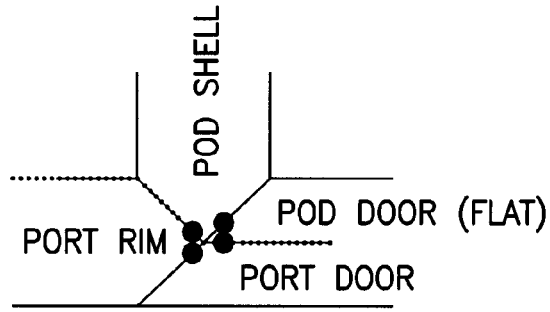
FIGS. 59A-59D are respectively schematic cross sectional views of a carrier to load port interface in accordance with different respective exemplary embodiments.
Figure 59B:
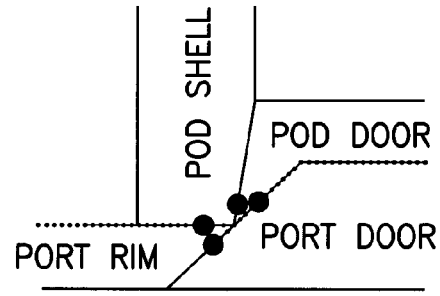
Figure 59C:
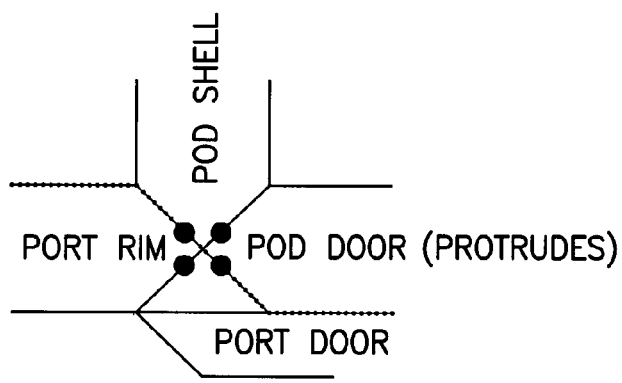
Figure 59D:
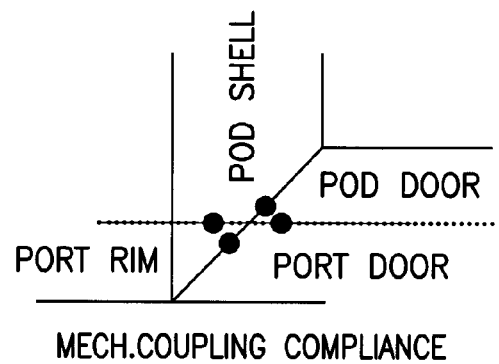

Referring now to FIG. 58, there is shown a schematic elevation view of a carrier 6000' and loadport 6300 in accordance with another exemplary embodiment. The carrier is generally similar to carrier 6000 in FIG. 57. The carrier is shown coupled, or in a position proximate to coupling with the loadport 6300. The loadport 6300, is generally similar to loadports previously described and shown in the drawings, except as otherwise described below. The loadport in the exemplary embodiment may have solid state latching system to lock the carrier to the load port and lock the carrier door to the port door. For example, the load port may have magnets (e.g. electromagnets) that operate on portions of the carrier. Similarly the port door may also have magnets (e.g. electromagnets) that operate on magnetic portions of the carrier door (see for example FIGS. 60-62). In the exemplary embodiments, engagement between load port door and carrier door may cause disengagement of the carrier door from the carrier shell. For example, the magnetic latch between loadport door and carrier door (see FIGS. 60-62) may be of sufficient strength to overpower the magnetic latch between carrier door and carrier so that the carrier door is unlatched and opened by the load port door being opened. Conversely, the carrier door is automatically latched to the carrier, when the port door is returned to the closed position. FIGS. 59A-D illustrate the four way (or "X") interface between the carrier shell, carrier door, loadport shell and loadport door in accordance with a number of different exemplary embodiments.

Figure 62:
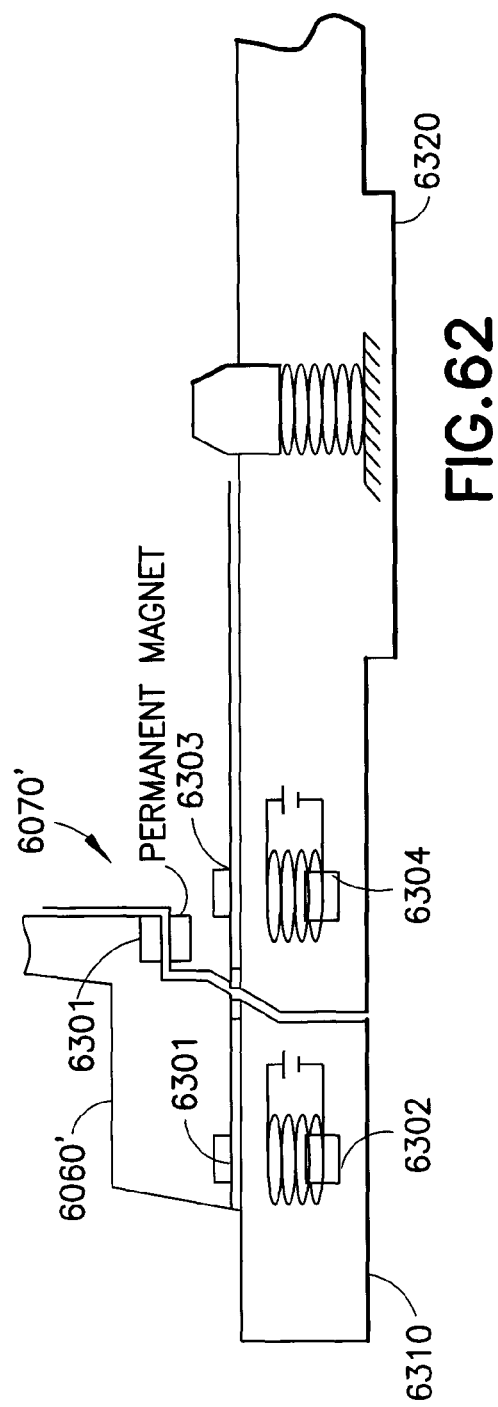

Referring now to FIGS. 60-62 the magnetic interaction between the carrier 6000' and the load port 6300 is shown. As described above, the loadport may include a solid state latching system to lock the carrier 6000' to the loadport rim 6310 and to lock the carrier door 6070' to the loadport door 6320. The solid state latching system may include a magnet such as, for example, electromagnet 6302 that may be located in the loadport rim 6310 that may interact with a ferrous material 6301 in the carrier shell 6060'. In alternate embodiments the magnet 6302 may be any suitable magnet. The ferrous material may be a magnet section substantially similar to section 6074M described above that may run substantially around the perimeter of the carrier shell 6060'. In alternate embodiments, the magnet section may be any suitable ferrous material having any suitable shape. In still other alternate embodiments the magnet section may be continuous or segmented and may be installed on the carrier to form any desired shape. The loadport door 6320 may also include a magnet 6304 substantially similar to magnet 6302 while the carrier door may include a magnet 6303 substantially similar to magnet 6301. In alternate embodiments, the magnets 6302, 6304 may be located in the carrier shell and carrier door while the magnets 6301, 6303 may be located in the loadport rim and loadport door.

The loadport 6300 may include alignment features to guide the Z-axis motion of the carrier onto the loadport. The carrier alignment features may be, for example, a friction plate 6330 or a kinematic pin 6330' that interact with the carrier door 6070'. In alternate embodiments any suitable alignment features may be utilized. In other alternate embodiments the alignment features may interact with any portion of the carrier

6000'. The alignment features may be spring loaded as shown in the drawings or they may be stationary. These alignment features may work in conjunction with the magnets 6301-6304 to align the carrier 6000' with the loadport 6300. In alternate embodiments either the magnets or the alignment features may be used to align the carrier with the loadport. In other alternate embodiments alignment of the carrier and the loadport may be obtained in any suitable manner. It is noted that because the interaction between the carrier 6000' and the loadport 6300 is solid state (e.g. no moving parts to lock the carrier with the loadport), minimal guidance may be needed to align the carrier with the loadport. In addition, minimal force may be utilized to latch the carrier with the loadport due to the solid state latching system. As such, the alignment features may be minimal in size and may contact the carrier 6000' substantially at the same time the carrier contacts the loadport surface. It is also noted that the minimal guidance and minimized alignment features may reduce friction between the carrier and loadport during mating thereby reducing particulate generation.

Figure 63:
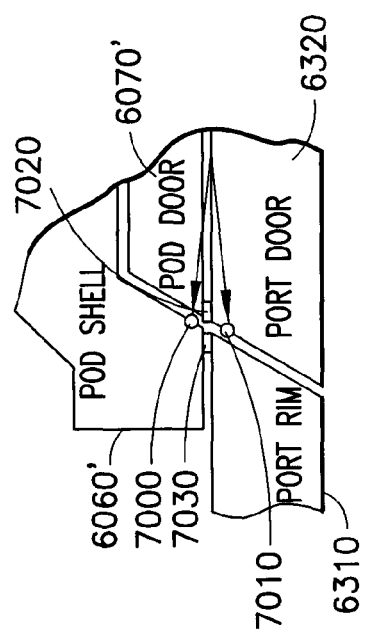
FIG. 63 is a partial schematic cross sectional view of another carrier to load port interface in accordance with another exemplary embodiment.

During operation the magnets 6302, 6304 in the loadport rim 6310 and loadport door 6320 may be inoperable or turned "off". The inoperability of the magnets 6302, 6304 may allow the carrier to be placed on the loadport 6300 without breaking the latch/seal between the carrier shell 6060' and the carrier door 6070' formed by latching system 6074. The magnets 6302, 6304 may be activated or turned "on" substantially at the same time the carrier 6000' contacts the loadport 6300 so that particulate matter is not allowed to enter the carrier. As can be seen in FIG. 63, seals may be provided to isolate the inside of the carrier from, for example, an outside atmosphere. The seals may make contact before the latching system for latching the carrier to the loadport is activated or turned on. The seals may be, for example, flat seals that may be located between the carrier shell 6060' and the loadport rim 6310 and between the carrier door 6070' and the loadport door 6320. The seals may also be in the form of an o-ring as can be seen located between the carrier shell 6060' and the carrier door 6070' and between the loadport rim 6310 and the loadport door 6320. In alternate embodiments any combination of flat seals and or o-rings may be utilized. The seals may be made of a deformable material, such as foam, rubber and the like. In alternate embodiments the seals may be made of any suitable material. In another exemplary embodiment, the seals may be formed by magnets 7040 as can be seen in FIGS. 64C-64E.

Figure 64A:
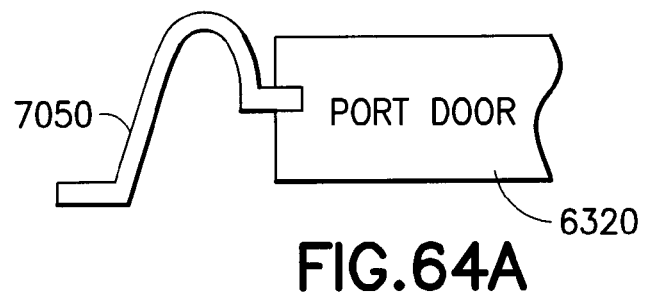
FIGS. 64A-E are schematic cross sectional views of carrier to load port interface in accordance with different respective exemplary embodiments.
Figure 64B:
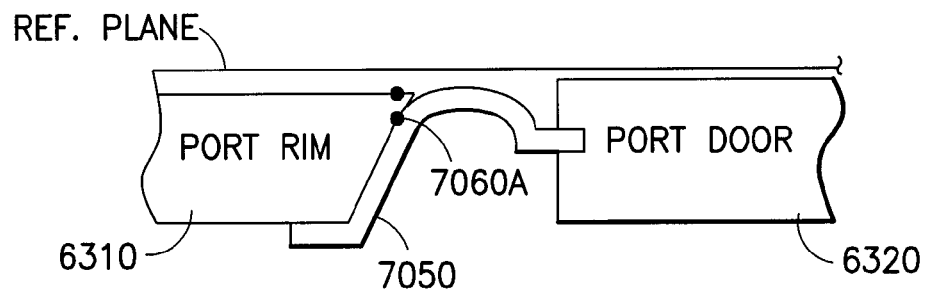
Figure 64C:
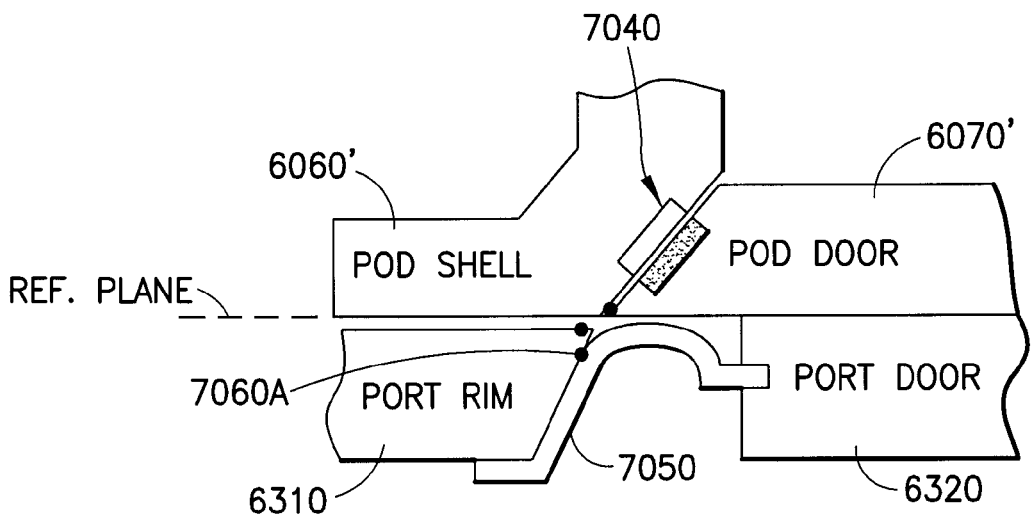
Figure 64D:
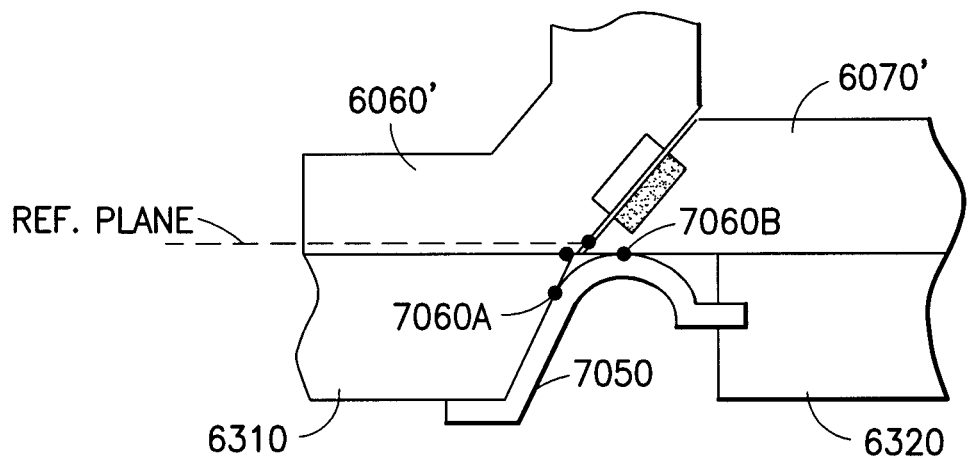
Figure 64E:
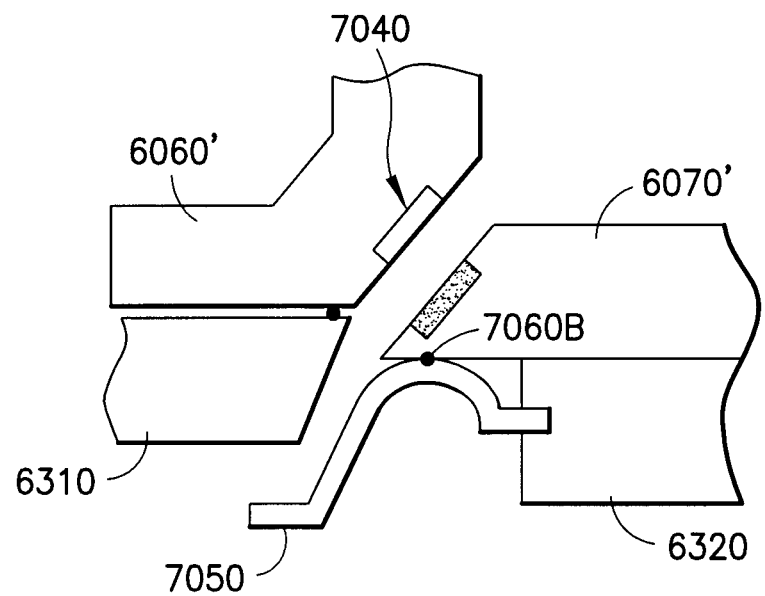

In one exemplary embodiment, and as can be seen in FIGS. 64A-64E, the seals may be in the form of a molded seal 7050 having a shape capable of contacting several surfaces simultaneously. For example, as can be seen in FIG. 64A the seal may have a curved top portion and an angled bottom portion. The seal 7050 may be deformable so that as the carrier 6000' is lowered the curved top portion deforms to contact both the carrier door 6070' and the loadport rim 6310 at points 7060B and 7060A respectively. The seal between the carrier shell 6060' and the loadport rim 6310 and between the carrier shell 6060' and the carrier door 6070' may be provided by magnets, o-rings, flat seals and the like. In alternate embodiments, the seals may be provided in any suitable manner. In addition to the contact point 7060A, the angled lower portion of the seal may contact the loadport rim 6310 when the loadport door 6320 is in a closed position to further isolate the interior of the processing tool/loadport from, for example an outside atmosphere. In the figures, the seal 7050 is shown as being attached to the loadport door 6320 but in alternate embodiments the seal may be attached to any one of the carrier shell 6060', carrier door 6070', loadport rim 6310, loadport door 6320 or in any other suitable location. In alternate embodiments the seal 7050 may have arm like features that extend between the carrier shell 6060'/carrier door 6070 and the loadport. In other alternate embodiments the seal may have any suitable shape. In operation the seal 7050 may isolate the processing tool via the seal formed at point 7060A. As the loadport door 6320 is opened the seal 7040 may be broken allowing the carrier door 6070' to separate from the carrier 6000'. The seal formed by seal 7050 at point 7060B may prevent any contaminants/atmosphere located between the carrier door 6070' and the loadport door 6320 from entering the carrier 6000' or the processing tool/loadport.

The operation of opening the carrier will now be described. The carrier 6000' may arrive at the load port 6300 as described above. The carrier 6000' may be mechanically coupled with loadport 6300 via, for example the Z-axis alignment features 6330, 6330'. The carrier shell 6060' may be allowed to float during mechanical coupling. The alignment features may minimally guide the carrier 6000' during activation of the carrier/loadport latching system. The carrier door 6070' may be latched to the loadport door 6320 via the magnets 6303, 6304. The carrier shell 6060' may be latched to the loadport rim 6310 via the magnets 6301, 6302. The magnets 6303, 6304 may overpower the magnets holding the carrier door 6070' to the carrier shell 6060' so that the carrier door 6070' is unlatched from the carrier shell 6060' and removed from the shell 6060'. The wafers may be lowered out of the carrier 6000' to the robot transfer height. In this exemplary embodiment, a bottom load carrier is utilized, however in alternate embodiments any suitable carrier (e.g. front load, etc.) may be utilized.

To close the carrier, the wafers may be raised from the robot transfer height to the inside of the carrier 6000'. The carrier door 6070' may be inserted into the carrier shell 6060'. The carrier door may be latched via the carrier door/carrier shell latching system described above. The carrier shell 6060' and the carrier door 6070' may unlatch simultaneously by, for example, turning off the magnets 6302, 6304. In alternate embodiments, the carrier shell and carrier door may be released at different times and in any order. The carrier may be ready for departure from the load port.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A semiconductor workpiece processing system comprising:
    at least one substrate processing tool for processing semiconductor substrates;
    a first transport section elongated and defining a travel direction, and having parts, that interface with a substrate holding container, supporting and transporting the substrate holding container along the travel direction;
    a second transport section being separate and distinct from the first transport section, the second transport section interfacing, overhead the at least one substrate processing tool, with the first transport section so that substrate holding container transfer between the first transport section and the second transport section is overhead the the at least one substrate processing tool and being configured to transport the substrate holding container between the first transport section and the at least one substrate processing tool, the second transport section including at least one overhead gantry disposed above the at least one substrate processing tool and defining at least two independent intersecting and horizontally coplanar transport axes effecting transport of the substrate holding container with two degree of freedom motion in a horizontal plane of motion.

2. The semiconductor workpiece processing system of claim 1, where the at least one overhead gantry includes at least one overhead carrier having at least three degrees of freedom.

3. The semiconductor workpiece processing system of claim 2, where the substrate holding container has an access side and the at least one overhead carrier includes a rotational drive configured to rotate the substrate holding container carried by the at least one overhead carrier to change a direction in which the access side faces.

4. The semiconductor workpiece processing system of claim 1, further comprising at least one overhead storage station disposed above the at least one substrate processing tool, the second transport section being configured to transport substrate holding containers to and from the at least one overhead storage station.

5. The semiconductor workpiece processing system of claim 1, wherein the at least one gantry is configured to service opposingly arranged load ports of the at least one substrate processing tool.

6. The semiconductor workpiece processing system of claim 5, wherein the at least one overhead gantry includes at least one carrier configured to rotate a substrate holding container carried by the carrier so that an orientation of the substrate holding container corresponds to an orientation of a respective one of the opposingly arranged load ports.

7. The semiconductor workpiece processing system of claim 6, wherein the at least one carrier is configured for on the fly rotation of the substrate holding container.

8. The semiconductor workpiece processing system of claim 1, where the overhead gantry includes a translation platform and at least one overhead carrier movably supported on the translation platform, the translation platform being configured to translate the at least one overhead carrier in two degrees of freedom along a common plane.

9. A semiconductor workpiece processing system comprising:
    at least one substrate processing tool for processing semiconductor substrates;
    a first transport section configured to transport substrate holding containers overhead the at least one substrate processing tool and defining a travel direction;
    at least one fixed substrate holding container storage disposed above the at least one substrate processing tool;
    an overhead gantry feeder shuttle that interfaces with and crosses the travel direction of the first transport section for transporting the substrate holding containers between the first transport section and the at least one substrate holding container storage;
    a second transport section that is separate and distinct from the first transport section and interfacing, overhead the at least one substrate processing tool, with at least the at least one substrate holding container storage so that substrate holding container transfer between second transport section and the at least one substrate holding container storage is overhead the at least one substrate processing tool, the second transport section being configured to transport substrate holding containers between the at least one substrate holding container storage and the at least one substrate processing tool, the second transport section including at least one overhead gantry disposed above the at least one substrate processing tool and defining at least two independent intersecting and horizontally coplanar transport axes effect transport of the substrate holding container with two degree of freedom motion in a horizontal plane of motion.

10. The semiconductor workpiece processing system of claim 9, wherein the second transport section is disposed above the overhead gantry feeder shuttle such that the second transport carrying a substrate holding container is capable of passing over the overhead gantry feeder shuttle.

11. The semiconductor workpiece processing system of claim 9, where the at least one overhead gantry includes at least one overhead carrier having at least three degrees of freedom.

12. The semiconductor workpiece processing system of claim 11, where the substrate holding container has an access side and the at least one overhead carrier includes a rotational drive configured to rotate a substrate holding container carried by the at least one overhead carrier to change a direction in which the access side faces.

13. The semiconductor workpiece processing system of claim 9, where the overhead gantry feeder shuttle includes a rotational drive configured to rotate a substrate holding container carried by the feeder shuttle.

14. The semiconductor workpiece processing system of claim 9, wherein the at least one gantry is configured to service opposingly arranged load ports of the at least one substrate processing tool.

15. The semiconductor workpiece processing system of claim 14, wherein the at least one overhead gantry includes at least one carrier configured to rotate a substrate holding container carried by the carrier so that an orientation of the substrate holding container corresponds to an orientation of a respective one of the opposingly arranged load ports.

16. The semiconductor workpiece processing system of claim 15, wherein the at least one carrier is configured for on the fly rotation of the substrate holding container.

17. The semiconductor workpiece processing system of claim 9, wherein the overhead gantry feeder shuttle has two independent degrees of freedom.

* * * * *

UNITED STATES PATENT AND TRADEMARK OFFICE
CERTIFICATE OF CORRECTION

| | | |
|---|---|---|
| PATENT NO. | : 9,224,628 B2 | Page 1 of 1 |
| APPLICATION NO. | : 13/625442 | |
| DATED | : December 29, 2015 | |
| INVENTOR(S) | : Bufano et al. | |

It is certified that error appears in the above-identified patent and that said Letters Patent is hereby corrected as shown below:

In the claims

Claim 9, Col. 70, Line 5, delete "between", and insert --between the--, therefor.

Claim 9, Col. 70, Line 15, delete "effect" and insert --effecting--, therefor.

Signed and Sealed this
Nineteenth Day of July, 2016

Michelle K. Lee
*Director of the United States Patent and Trademark Office*